United States Patent
Ueba et al.

(10) Patent No.: US 9,880,472 B2
(45) Date of Patent: Jan. 30, 2018

(54) PATTERN FORMATION METHOD, PATTERN, AND ETCHING METHOD, ELECTRONIC DEVICE MANUFACTURING METHOD, AND ELECTRONIC DEVICE USING SAME

(71) Applicant: FUJIFILM Corporation, Tokyo (JP)

(72) Inventors: Ryosuke Ueba, Shizuoka (JP); Keita Kato, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 47 days.

(21) Appl. No.: 15/011,804

(22) Filed: Feb. 1, 2016

(65) Prior Publication Data

US 2016/0147157 A1    May 26, 2016

Related U.S. Application Data

(63) Continuation of application No. PCT/JP2014/069858, filed on Jul. 28, 2014.

(30) Foreign Application Priority Data

Jul. 31, 2013    (JP) ................................ 2013-158741

(51) Int. Cl.
*G03F 7/40* (2006.01)
*G03F 7/20* (2006.01)
(Continued)

(52) U.S. Cl.
CPC .............. *G03F 7/40* (2013.01); *G03F 7/0035* (2013.01); *G03F 7/0392* (2013.01);
(Continued)

(58) Field of Classification Search
CPC .................................................. G03F 7/2022
See application file for complete search history.

(56) References Cited

U.S. PATENT DOCUMENTS

2001/0014427 A1    8/2001    Suwa et al.
2010/0239984 A1    9/2010    Tsubaki
(Continued)

FOREIGN PATENT DOCUMENTS

JP          3632410 B2      3/2005
JP      2008-281975 A      11/2008
(Continued)

OTHER PUBLICATIONS

Search Report dated Aug. 26, 2014, issued by the International Searching Authority in counterpart International Application No. PCT/JP2014/069858 (PCT/ISA/210).
(Continued)

*Primary Examiner* — Kathleen Duda
(74) *Attorney, Agent, or Firm* — Sughrue Mion, PLLC

(57) ABSTRACT

There is provided a pattern formation method comprising: a step (i) for forming a first negative type pattern by performing the specific steps on a substrate; a step (iii) for forming a lower layer by embedding the specific resin composition (2) which contains a second resin in a region of the substrate in which no film part with the first negative type pattern is formed; a step (iv) for forming an upper layer on the lower layer using the specific actinic ray-sensitive or radiation-sensitive resin composition (3); a step (v) for exposing the upper layer to light; a step (vi) for developing the upper layer using a developer which includes an organic solvent and forming a second negative type pattern on the lower layer; and a step (vii) for removing a portion of the lower layer, in the stated order.

10 Claims, 6 Drawing Sheets

(51) Int. Cl.
*H01L 21/027* (2006.01)
*G03F 7/00* (2006.01)
*G03F 7/32* (2006.01)
*G03F 7/36* (2006.01)
*G03F 7/039* (2006.01)
*G03F 7/11* (2006.01)

(52) U.S. Cl.
CPC .............. *G03F 7/0397* (2013.01); *G03F 7/11* (2013.01); *G03F 7/2002* (2013.01); *G03F 7/325* (2013.01); *G03F 7/36* (2013.01); *H01L 21/0273* (2013.01)

(56) References Cited

U.S. PATENT DOCUMENTS

| | | | |
|---|---|---|---|
| 2011/0052883 A1* | 3/2011 | Jain | G03F 7/2022 428/195.1 |
| 2011/0159693 A1* | 6/2011 | Sun | H01L 21/0337 438/703 |
| 2011/0250543 A1 | 10/2011 | Tsubaki | |
| 2012/0220129 A1* | 8/2012 | Lim | H01L 21/0273 438/694 |
| 2014/0106119 A1 | 4/2014 | Ueba | |
| 2014/0113223 A1 | 4/2014 | Kato et al. | |

FOREIGN PATENT DOCUMENTS

| | | |
|---|---|---|
| JP | 2008-310314 A | 12/2008 |
| JP | 2011-033884 A | 2/2011 |
| JP | 2012-053307 A | 3/2012 |
| JP | 2013-004820 A | 1/2013 |
| JP | 2013-033227 A | 2/2013 |
| TW | 201300942 A1 | 1/2013 |

OTHER PUBLICATIONS

Translation of Written Opinion dated Aug. 26, 2014 by the International Searching Authority in related Application No. PCT/JP2014/069858, (PCT/ISA/237).

Office Action issued by the Taiwanese Patent Office dated Sep. 12, 2017 in counterpart Taiwanese Patent Application No. 103126122.

* cited by examiner

PATTERN FORMATION METHOD, PATTERN, AND ETCHING METHOD, ELECTRONIC DEVICE MANUFACTURING METHOD, AND ELECTRONIC DEVICE USING SAME

CROSS REFERENCE TO RELATED APPLICATION

This is a continuation of International Application No. PCT/JP2014/069858 filed on Jul. 28, 2014, and claims priority from Japanese Patent Application No. 2013-158741 filed on Jul. 31, 2013, the entire disclosures of which are incorporated herein by reference.

BACKGROUND OF THE INVENTION

1. Field of the Invention

The present invention relates to a pattern formation method, a pattern, and an etching method, an electronic device manufacturing method, and an electronic device using the same. In more detail, the present invention relates to a pattern formation method which is favorably used for in steps of manufacturing semiconductors such as IC, manufacturing circuit boards such as liquid crystals and thermal heads, steps of manufacturing MEMS and the like, and other photofabrication lithography steps, as well as an etching method, an electronic device manufacturing method, and an electronic device which use this pattern formation method. In particular, the present invention relates to a pattern formation method and a pattern, which are favorable for exposure using a KrF or ArF exposure apparatus and an ArF liquid immersion type projection exposure apparatus in which far ultraviolet ray light with a wavelength of 300 nm or less is set as the light source, as well as an etching method, an electronic device manufacturing method, and an electronic device which use the pattern formation method and the pattern.

2. Description of the Related Art

Since resists for KrF excimer lasers (248 nm) came into use, a pattern formation method in which chemical amplification is used has been used in order to compensate for decreases in sensitivity due to light absorption. For example, in a positive type chemical amplification method, firstly, a photoacid generator which is included in an exposed section generates an acid due to being decomposed by light irradiation. Then, in a baking (Post Exposure Bake: PEB) process after exposure or the like, an alkali-insoluble group which is included in a photosensitive composition is changed to an alkali-soluble group by a catalytic action of the generated acid. After that, development is performed using, for example, an alkali solution. By doing this, the exposed section is removed to obtain a desired pattern (for example, refer to JP3632410B and the like).

In the method described above, various types of developers have been proposed as alkali developers. For example, a water-based alkali developer of a 2.38 mass % tetramethyl ammonium hydroxide aqueous solution (TMAH) is widely used as the alkali developer.

In order to refine semiconductor elements, the wavelength of the exposure light sources is being shortened and the numerical aperture (high NA) of the projection lens is being increased and, currently, an exposure apparatus in which an ArF excimer laser which has a wavelength of 193 nm is the light source is being developed. As a technique for further increasing the resolving power, a method (that is, a liquid immersion method) has been proposed in which a liquid with a high refractive index (also referred to below as an "immersion liquid") is filled between a projection lens and a sample. In addition, EUV lithography in which exposure is performed with ultraviolet light with an even shorter wavelength (13.5 nm) has also been proposed.

In recent years, a pattern formation method has also been developed in which a developer which includes an organic solvent is used (for example, refer to JP2008-281975A and JP2013-33227A).

SUMMARY OF THE INVENTION

However, in more recent years, along with the demands for variation and increased functionality in electronic devices, for example, there is a demand for forming fine patterns with various shapes by etching or the like and, for example, a technique for producing three-dimensional structural bodies using an inclined rear surface exposure method (refer to Hironobu Sato, "Fabrication of 3-D microstructures using multi-angle inclined lithography and their microfluidic applications", System: new; Ministry of Education Report Number: ko 2033; Type of degree: Doctor (Engineering); Awarded date: 2005/3/3; Waseda University degree registered number: new 3985) and the like are also known.

The present invention was made in consideration of the problems described above and has an object of providing a pattern formation method which is able to form fine (for example, the dimensions of the hole diameters, the dot diameters, the space widths, the line widths, and the like are 500 nm or less) patterns which have a laminated structure with various shapes and patterns which are produced using the pattern formation method, as well as an etching method, an electronic device manufacturing method, and an electronic device which use the pattern formation method and the patterns.

The present invention has the configuration described below and the problems described above of the present invention are solved thereby.

[1]

A pattern formation method including: a step (i) for forming a first negative type pattern by performing steps (i-1), (i-2), and (i-3) below on a substrate in this order, the step (i-1) for forming a first film on the substrate, using an actinic ray-sensitive or radiation-sensitive resin composition (1) which contains a first resin of which, due to a polarity being increased by an action of an acid, a solubility decreases with respect to a developer which includes an organic solvent, the step (i-2) for exposing the first film to light, and the step (i-3) for developing the exposed first film using a developer which includes an organic solvent; a step (iii) for forming a lower layer by embedding a resin composition (2) which contains a second resin in a region of the substrate in which no film part with the first negative type pattern is formed; a step (iv) for forming an upper layer on the lower layer using an actinic ray-sensitive or radiation-sensitive resin composition (3) which contains a third resin of which, due to a polarity being increased by an action of an acid, a solubility decreases with respect to a developer which includes an organic solvent; a step (v) for exposing the upper layer to light; a step (vi) for developing the upper layer using a developer which includes an organic solvent and forming a second negative type pattern on the lower layer; and a step (vii) for removing a portion of the lower layer, in the stated order.

[2]

The pattern formation method according to [1] described above, in which the step (i) for forming the first negative type pattern includes a plurality of pattern forming steps having the steps (i-1), (i-2), and (i-3) in this order.

[3]

The pattern formation method according to [2] described above, further including: a heating step between two continuous pattern forming steps in the plurality of pattern forming steps.

[4]

The pattern formation method according to any one of [1] to [3] described above, further including: a heating step (ii) between the step (i) and the step (iii).

[5]

The pattern formation method according to any one of [1] to [4] described above, further including: a heating step after the step (vi).

[6]

The pattern formation method according to any one of [1] to [5] described above, in which at least one of exposure in the step (i-2) and exposure in the step (v) is exposure using a KrF excimer laser or an ArF excimer laser.

[7]

The pattern formation method according to any one of [1] to [6] described above, in which a film thickness of the first film is 20 nm to 160 nm.

[8]

The pattern formation method according to any one of [1] to [7], in which a film thickness of the lower layer is 20 nm to 160 nm.

[9]

An etching method for performing an etching process with respect to the substrate by setting a pattern formed by the pattern formation method according to any one of [1] to [8] described above as a mask.

[10]

An electronic device manufacturing method including: the pattern formation method according to any one of [1] to [8] described above or the etching method according to [9] described above.

[11]

An electronic device which is manufactured by the electronic device manufacturing method according to [10] described above.

Furthermore, the present invention preferably has the following configurations.

[12]

A pattern formed using the pattern formation method according to any one of [1] to [8] described above.

[13]

The pattern described in [12] described above which is a resist pattern. [14] The pattern described in [12] described above which is a wiring pattern.

[15]

The pattern described in [12] described above which is for a member of a micromechanical electronic system.

[16]

The pattern described in [12] described above which is for a mold.

According to the present invention, there is provided a pattern formation method which is able to form fine (for example, the dimensions of the hole diameters, the dot diameters, the space widths, the line widths, and the like are 500 nm or less) patterns which has a laminated structure with various shapes and patterns which are produced using the pattern formation method, as well as an etching method, and an electronic device manufacturing method, which use the pattern formation method and the patterns.

BRIEF DESCRIPTION OF THE DRAWINGS (a) to (g) in FIG. 1 are respectively schematic perspective diagrams for illustrating a pattern formation method and an etching method according to a first embodiment of the present invention.

(a) to (d) in FIG. 2 are respectively schematic perspective diagrams for illustrating modification examples of the first embodiment of the present invention.

(a) to (g) in FIG. 3 are respectively schematic perspective diagrams for illustrating a pattern formation method and an etching method according to a second embodiment of the present invention.

DESCRIPTION OF THE PREFERRED EMBODIMENTS

Figure 1:
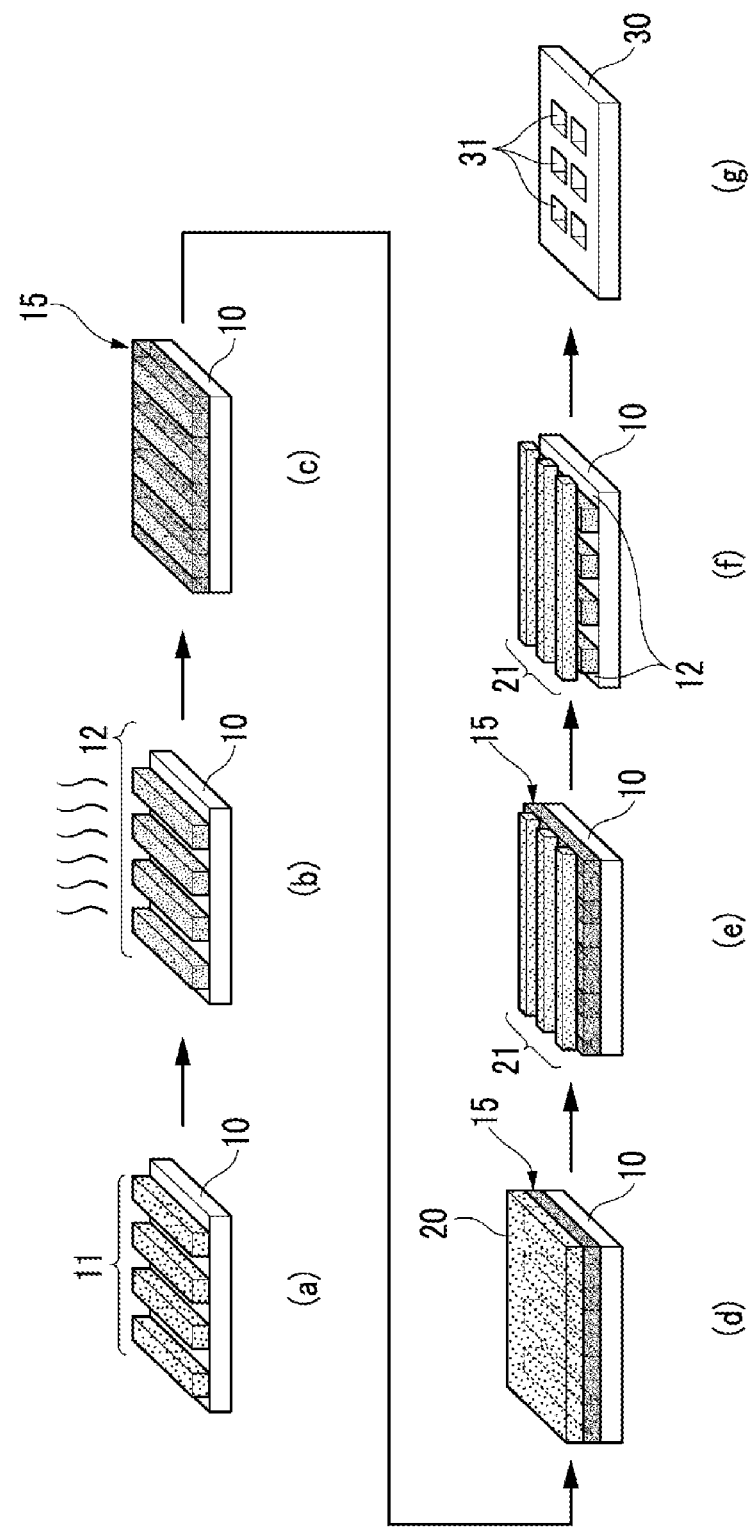

Detailed description will be given below of embodiments of the present invention.

In the notation of the groups (atomic groups) in the present specification, notation which does not indicate whether a group is substituted or unsubstituted encompasses having a substituent group as well as not having a substituent group. For example, an "alkyl group" encompasses not only an alkyl group which does not have a substituent group (an unsubstituted alkyl group), but also an alkyl group which has a substituent group (a substituted alkyl group).

The "actinic ray" or "radiation" in the present specification has the meaning of, for example, the bright line spectrum of a mercury lamp, far ultraviolet rays which are represented by an excimer laser, extreme ultraviolet rays (EUV light), X-rays, electron beams (EB), and the like. In addition, light in the present invention has the meaning of actinic rays or radiation.

In addition, unless otherwise stated, "exposure" in the present specification includes not only exposure using a mercury lamp, far ultraviolet rays which are represented by an excimer laser, extreme ultraviolet rays, X-rays, EUV light, and the like, but also drawing using particle beams such as electron beams and ion beams.

A pattern formation method of the present invention has a step (i) for forming a first negative type pattern on a substrate by performing steps (i-1), (i-2), and (i-3) below in this order, the step (i-1) for forming a first film on the substrate, using an actinic ray-sensitive or radiation-sensitive resin composition (1) which contains a first resin of which, due to a polarity being increased by an action of an acid, a solubility decreases with respect to a developer which includes an organic solvent, the step (i-2) for exposing the first film to light, and the step (i-3) for developing the exposed first film using a developer which includes an organic solvent; a step (iii) for forming a lower layer by embedding a resin composition (2) which contains a second resin in a region of the substrate in which no film part with the first negative type pattern is formed; a step (iv) for forming an upper layer on the lower layer using an actinic ray-sensitive or radiation-sensitive resin composition (3) which contains a third resin of which, due to a polarity being increased by an action of an acid, a solubility decreases with respect to a developer which includes an organic solvent; a step (v) for exposing the upper layer to light; a step (vi) for developing the upper layer using a developer which includes an organic solvent and forming a second negative type pattern on the lower layer; and a step (vii) for removing a portion of the lower layer, in the stated order.

Here, typically, in a case where a first negative type pattern and a second negative type pattern have the same pattern (the sizes and the shapes are the same), the first negative type pattern and the second negative type pattern are formed such that the pattern of the first negative type pattern seen from a direction orthogonal with respect to the substrate and the pattern of the second negative type pattern seen from a direction orthogonal with respect to the substrate are not completely overlapped.

In addition, typically, a portion of a void section (a space section, a hole section, and the like) in the first negative type pattern and a portion of a void section in the second negative type pattern communicate with each other in the direction orthogonal with respect to the substrate.

The reason why it is possible to form fine (for example, the dimensions of the hole diameters, the dot diameters, the space widths, the line widths, and the like are 500 nm or less) patterns which have a laminated structure with various shapes using the pattern formation method described above is assumed to be as follows.

Firstly, the pattern formation method of the present invention contains at least two patternings which include a patterning according to step (i) and a patterning according to steps (iv) to (vi).

Here, since the second negative type pattern which is formed by steps (iv) to (vi) is obtained from an upper layer which is provided above a lower layer which includes the first negative type pattern which is formed by step (i), it is possible to independently design each of the size and the shape of the first negative type pattern and the size and the shape of the second negative type pattern.

Therefore, it is possible to form the fine patterns described above which have a laminated structure with various shapes.

For example, by performing an etching process on a substrate using a laminated pattern which has a pattern which is obtained by the pattern in the first negative type pattern and the pattern in the second negative type pattern being overlapped in a direction orthogonal with respect to the substrate as a mask, it is also possible to form a pattern with various shapes on the substrate compared to a case where the mask is a single layer resist pattern.

Here, in a method for forming a negative type pattern by forming a resist film using an actinic ray-sensitive or radiation-sensitive resin composition which contains a cross-linking agent and, after exposure to light, dissolving an unexposed section in an alkali developer, the exposed section formed of a cross-linked body easily swells due to the alkali developer and it is difficult to form the fine pattern described above.

On the other hand, in the present invention, the resins (1) and (3) in the actinic ray-sensitive or radiation-sensitive resin compositions (1) and (3) are each a resin of which, due to a polarity being increased by an action of an acid, a solubility decreases with respect to a developer which includes an organic solvent (also simply referred to below as an organic-based developer) and it is possible to more reliably form fine patterns since a negative type pattern is formed using the difference of the dissolving speed of the exposed section and the unexposed section with respect to the organic-based developer.

In the pattern formation method of the present invention, it is possible to perform each of step (i) and steps (iii) to (vi) using a method known in the art.

(a) to (g) in FIG. 1 are respectively schematic perspective diagrams for illustrating a pattern formation method and an etching method according to a first embodiment of the present invention.

In the first embodiment of the present invention, as shown in (a) in FIG. 1, the steps (i-1), (i-2), and (i-3) below are performed on a substrate 10 in this order and, for example, a first negative type pattern 11 which is a line and space pattern of which the line width and the space width are 1:1 is formed.

(i-1) A step for forming a first film using the actinic ray-sensitive or radiation-sensitive resin composition (1) which contains a first resin of which, due to a polarity being increased by an action of an acid, a solubility decreases with respect to a developer which includes an organic solvent on the substrate (i-2) A step for exposing the first film to light (i-3) A step for developing the exposed first film using a developer which includes an organic solvent The substrate 10 on which the first film is formed is not particularly limited and it is possible to use substrates which are generally used in steps of manufacturing semiconductors such as IC, such as inorganic substrates of silicon, $SiO_2$, SiN, or the like, or coated inorganic substrates of SOG or the like, steps of manufacturing a circuit board such as liquid crystal or a thermal head, and steps for other types of photofabrication lithography. Furthermore, a lower layer film such as an anti-reflection film may be formed as necessary between the first film and the substrate. It is possible to appropriately select an organic anti-reflection film, an inorganic anti-reflection film, or others as the lower layer film. Lower layer film materials are available from Brewer Science Inc., Nissan Chemical Industries, Ltd., and the like. Examples of lower layer films which are favorable in a developing process using a developer which includes an organic solvent include the lower layer films described in WO2012/039337A.

In the step (i-1) described above, any method may be used for forming the first film using the actinic ray-sensitive or radiation-sensitive resin composition (1) as long as it is possible to coat the actinic ray-sensitive or radiation-sensitive resin composition (1) on the substrate 10, it is possible to use a spin coat method, a spraying method, a roller coat method, a flow coat method, a doctor coat method, a dipping method, or the like which are known in the art, and the coated film is preferably formed by coating a resist composition using the spin coat method.

The film thickness of the first film is preferably 20 nm to 160 nm, more preferably 50 nm to 140 nm, and even more preferably 60 nm to 120 nm.

Heating (preheating; Prebake (PB)) may be carried out as necessary after coating the actinic ray-sensitive or radiation-sensitive resin composition (1), that is, between the step (i-1) and the step (i-2). Due to this, it is possible to evenly form a film from which any insoluble residual solvent is removed. The temperature of the prebake is not particularly limited;

however, 50° C. to 160° C. is preferred, 60° C. to 140° C. is more preferred, and 90° C. to 130° C. is even more preferred.

The heating time is preferably 30 seconds to 300 seconds, more preferably 30 seconds to 180 seconds, even more preferably 30 seconds to 90 seconds, and particularly preferably 45 seconds to 90 seconds.

It is possible to perform the preheating using a means which is provided in a typical exposure apparatus and the preheating may be performed using a hot plate or the like.

Detailed description will be given below of the actinic ray-sensitive or radiation-sensitive resin composition (1).

In exposure of the step (i-2) described above, there is no limit on the light source which is used in the exposure apparatus; however, examples thereof include infrared light, visible light, ultraviolet light, far ultraviolet light, extreme ultraviolet light, X-rays, electron beams, and the like, and far ultraviolet light with a wavelength of preferably 250 nm or less, more preferably 220 nm or less, and particularly preferably 1 nm to 200 nm, specifically, a KrF excimer laser (248 nm), an ArF excimer laser (193 nm), an $F_2$ excimer laser (157 nm), X-rays, EUV (13 nm), electron beams, or the like, and a KrF excimer laser, an ArF excimer laser, EUV, or electron beams are preferred.

In addition, for example, in a case where the light source is a KrF excimer laser, an ArF excimer laser, or EUV, it is preferred to irradiate (that is, carry out the exposure) with the actinic rays or radiation via a mask. The mask is not particularly limited; however, in the first embodiment of the present invention, examples thereof include a mask which has a line and space pattern which has line sections as light shielding sections and space sections as light transmitting parts (representatively, a mask in which the ratio of the width of the line section and the width of the space section is 1:1) (not shown in the diagram).

In addition, it is possible to apply a liquid immersion exposure method in the exposure of the step (i-2).

The liquid immersion exposure method is a technique for increasing the resolving power in which a liquid (also referred to below as an "immersion liquid") with a high refractive index is filled between a projection lens and a sample and exposure is carried out.

As described above, with regard to the "effects of liquid immersion", when $\lambda_0$ is the wavelength of the exposure light in the air, n is the refractive index of the immersion liquid with respect to the air, θ is the convergence half angle of the rays, and $NA_0 = \sin\theta$, when immersed in the liquid, it is possible to represent the resolving power and depth of focus using the following formulas. Here, $k_1$ and $k_2$ are coefficients relating to the process.

(Resolving power)=$k_1 \cdot (\lambda_0/n)/NA_0$ (Depth of focus)=$\pm k_2 \cdot (\lambda_0/n)/NA_0^2$ That is, the effect of liquid immersion is equivalent to using an exposure wavelength where the wavelength is 1/n. In other words, in a case of projection optical systems with the same NA, it is possible to multiply the depth of focus by n times through the liquid immersion. This is effective with respect to all types of pattern shapes and, moreover, it is possible to combine the above with super-resolution techniques such as a phase shift method and modified lighting method which are currently being considered.

In a case of performing liquid immersion exposure, a step for cleaning the surface of the first film with a water-based chemical liquid may be carried out before the step for heating the first film (1) before an exposure step after forming the first film on a substrate and/or (2) after a step for carrying out exposure on the first film via an immersion liquid.

The immersion liquid is preferably a liquid which is transparent with respect to the exposure wavelength and where the temperature coefficient of the refractive index is as small as possible in order to keep the deformation of the optical image which is projected on the first film to a minimum; however, in particular, in a case where the exposure light source is an ArF excimer laser (wavelength; 193 nm), it is preferred to use water in terms of the ease of availability and ease of handling in addition to the points of view described above.

In a case of using water, an additive (a liquid) which increases surface activity in addition to reducing the surface tension of the water may be added at a small ratio. The additive is preferably negligible without dissolving the resist layer on the wafer and without any influence with respect to an optical coating on the lower surface of a lens element.

The additive is preferably, for example, an aliphatic alcohol which has substantially the same refractive index as water and specific examples thereof include methyl alcohol, ethyl alcohol, isopropyl alcohol, and the like. By adding alcohol which has substantially the same refractive index as water, even when the alcohol components in water evaporate and the content concentration changes, it is possible to obtain an advantage in that it is possible to make the refractive index change for the liquid as a whole extremely small.

On the other hand, distilled water is preferred as the water to be used since deformation of the optical image which is projected on the resist is caused in a case where a substance which is opaque with respect to 193 nm light or impurities of which the refractive index is greatly different from water are present. Furthermore, pure water filtered through an ion-exchange filter or the like may be used.

The electrical resistance of the water which is used as the immersion liquid is desirably 18.3 MΩcm or more, the TOC (concentration of organic substance) is desirably 20 ppb or less, and a degassing process is desirably carried out.

In addition, by increasing the refractive index of the immersion liquid, it is possible to increase the lithographic performance. From this point of view, an additive which increases the refractive index may be added to the water, or heavy water ($D_2O$) may be used instead of water.

In a case of exposing the first film which is formed using the actinic ray-sensitive or radiation-sensitive resin composition (1) via a liquid immersion medium, it is possible to further add a hydrophobic resin (D) which will be described below as necessary. The receding contact angle of the surface is improved by the hydrophobic resin (D) being added. The receding contact angle of the first film is preferably 60° to 90° and more preferably 70° or more.

In the liquid immersion exposure step, since it is necessary for the immersion liquid to move on the wafer following the movement of an exposure head scanning on the wafer at high speed and forming exposure patterns, the contact angle of the immersion liquid with respect to the resist film (the first film) in a dynamic state is important and there is a demand for the resist to have a performance which follows the high speed scanning of the exposure head without droplets remaining.

A sparingly immersion liquid-soluble film (also referred to below as a "top coat") may be provided between the first film which is formed using the actinic ray-sensitive or radiation-sensitive resin composition (1) of the present invention and the immersion liquid in order for the film not to directly come into contact with the immersion liquid. Examples of necessary functions for the top coat include coating suitability for a resist upper layer section, transparency with respect to radiation, in particular, radiation with a wavelength of 193 nm, and sparing immersion liquid-solubility. It is preferred that the top coat is not mixed with a resist and, moreover, that the top coat is able to be evenly coated on the resist upper layer.

From the point of view of the transparency at 193 nm, the top coat is preferably a polymer which does not contain an aromatic group.

Specific examples thereof include a hydrocarbon polymer, an acrylic acid ester polymer, a polymethacrylic acid, a polyacrylic acid, a polyvinyl ether, a silicon-containing polymer, a fluorine-containing polymer, and the like. The hydrophobic resin (D) described above is also favorable as a top coat. Since the optical lens is contaminated when impurities elute from the top coat into the immersion liquid, the residual monomer components of the polymer which is included in the top coat are preferably small amounts.

When peeling the top coat, a developer may be used or a separate detaching agent may be used. The detaching agent is preferably a solvent of which the permeation to the first film is small. In terms of being able to carry out the detaching step at the same time as the first film developing process step, it is preferred to be able to carry out the detachment using an organic-based developer. From the point of view of detaching using an organic-based developer, the top coat preferably has a low polarity; however, from the point of view of the property of not intermixing with the first film, it is also possible to use a top coat having a high polarity.

It is preferred that there is no difference or a small difference in the refractive index between the top coat and the immersion liquid. In this case, it is possible to improve the resolving power. In a case where the exposure light source is an ArF excimer laser (wavelength: 193 nm), since it is preferred to use water as the immersion liquid, the top coat for the ArF liquid immersion exposure is preferably close to the refractive index of water (1.44). In addition, the top coat is preferably a thin film from the points of view of the transparency and the refractive index.

It is preferred that the top coat is not mixed with the first film and, moreover, that the top coat is also not mixed with the immersion liquid. From this point of view, in a case where the immersion liquid is water, the solvent which is used for the top coat is preferably sparingly soluble in the solvent which is used for the composition of the present invention as well as being a water-insoluble medium. Furthermore, in a case where the immersion liquid is an organic solvent, the top coat may be water-soluble or may be water-insoluble.

In addition, as the top coat, it is also preferred to apply a top coat which includes not only the resins as described in JP2013-61647A, particularly in OC-5 to OC-11 in Example Table 3 thereof, but also basic compounds (a quencher). The top coat described in this publication, in particular, is considered to be useful in a case of performing pattern forming in a developing step which uses an organic-based developer which will be described below.

The pattern formation method of the present invention also preferably includes a heating step after exposure (PEB; Post Exposure Bake) between step (i-2) and step (i-3).

The PEB is preferably performed at 70° C. to 130° C., and even more preferably at 80° C. to 120° C.

The heating time in the PEB is preferably 30 seconds to 300 seconds, more preferably 30 seconds to 180 seconds, even more preferably 30 seconds to 90 seconds, and particularly preferably 45 seconds to 90 seconds.

It is possible to perform the heating using a means which is provided in a typical exposure and developing apparatus and the heating may be performed using a hot plate or the like.

Due to the baking, the reaction of an exposed section is promoted and the sensitivity or pattern profile is improved.

At least one of the preheating step and the heating step after exposure may include a plurality of heating steps.

In step (i-3), as the developer (the organic-based developer) in the step for developing the first film using a developer which contains an organic solvent, it is possible to use polar solvents such as a ketone-based solvent, an ester-based solvent, an alcohol-based solvent, an amide-based solvent, or an ether-based solvent, and hydrocarbon-based solvents.

Examples of the ketone-based solvents include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methyl cyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, propylene carbonate, and the like.

Examples of the ester-based solvents include methyl acetate, butyl acetate, ethyl acetate, isopropyl acetate, pentyl acetate, isopentyl acetate, amyl acetate, cyclohexyl acetate, isobutyl isobutyrate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, and the like.

Examples of the alcohol-based solvents include alcohols such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol, glycol-based solvents such as ethylene glycol, diethylene glycol, and triethylene glycol, glycol ether-based solvents such as ethylene glycol monomethyl ether, propylene glycol monomethyl ether, ethylene glycol monoethyl ether, propylene glycol monoethyl ether, diethylene glycol monomethyl ether, triethylene glycol monoethyl ether, and methoxy methyl butanol, and the like.

Examples of the ether-based solvents include dioxane, tetrahydrofuran, phenetole, dibutyl ether, and the like other than the glycol ether-based solvents described above.

As the amide-based solvent, it is possible to use, for example, N-methyl-2-pyrrolidone, N,N-dimethyl acetamide, N,N-dimethyl formamide, hexamethylphosphoric triamide, 1,3-dimethyl-2-imidazolidinone, and the like.

Examples of the hydrocarbon-based solvent include aromatic hydrocarbon-based solvents such as toluene and xylene and aliphatic hydrocarbon-based solvents such as pentane, hexane, octane, and decane.

The solvents described above may be used by mixing a plurality thereof or may be used by mixing with a solvent other than the solvents described above or water. However, in order to sufficiently exhibit the effects of the present invention, the moisture content of the developer as a whole is preferably less than 10 mass %, and water is more preferably substantially not contained.

That is, the usage amount of an organic solvent with respect to an organic-based developer is preferably 90 mass % or more to 100 mass % or less with respect to the total amount of the developer and more preferably 95 mass % or more to 100 mass % or less.

In particular, the organic-based developer is preferably a developer which contains at least one type of organic solvent which is selected from a group formed of a ketone-based solvent, an ester-based solvent, an alcohol-based solvent, an amide-based solvent, and an ether-based solvent.

The vapor pressure of the organic-based developer at 20° C. is preferably 5 kPa or less, more preferably 3 kPa or less, and particularly preferably 2 kPa or less. By setting the vapor pressure of an organic-based developer to 5 kPa or less, evaporation of the developer on a substrate or in a developing cup is suppressed, temperature uniformity on the wafer surface is improved, and as a result, the uniformity of the dimensions in the wafer surface is improved.

It is possible to add an appropriate amount of a surfactant to the organic-based developer as necessary.

The surfactant is not particularly limited; however, for example, it is possible to use ionic or non-ionic fluorine-based and/or silicon-based surfactants and the like. Examples of the fluorine-based and/or silicon-based surfactants include the surfactants which are described in JP1987-36663A (JP-S62-36663A), JP1986-226746A (JP-S61-226746A), JP1986-226745A (JP-S61-226745A), JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), U.S. Pat. No. 5,405,720A, U.S. Pat. No. 5,360,692A, U.S. Pat. No. 5,529,881A, U.S. Pat. No. 5,296,330A, U.S. Pat. No. 5,436,098A, U.S. Pat. No. 5,576,143A, U.S. Pat. No. 5,294,511A, and U.S. Pat. No. 5,824,451A, and a non-ionic surfactant is preferred. The non-ionic surfactant is not particularly limited; however, it is more preferred to use a fluorine-based surfactant or a silicon-based surfactant.

The usage amount of the surfactant is generally 0.001 mass % to 5 mass % with respect to the total amount of the developer, preferably 0.005 mass % to 2 mass %, and more preferably 0.01 mass % to 0.5 mass %.

In addition, it is also possible to include a basic compound in the organic-based developer as described particularly in paragraphs "0032" to "0063" in JP2013-11833A. In addition, examples of the basic compound also include a basic compound (N) which will be described below which may be contained in the resin compositions (1) to (3). Due to this, it is possible to expect film-thinning suppression in the pattern forming, contrast improvement, and the like.

In addition, the pattern formation method of the present invention may further have a step for developing using an alkali developer between step (i-2) and step (i-3) or between step (i-3) and step (iii) (between step (i-3) and step (ii) in a case of carrying out step (ii) which will be described below).

In a case where the pattern formation method of the present invention further includes a step for developing using an alkali developer, it is possible to use, an alkali aqueous solution of, for example, inorganic alkalis such as sodium hydroxide, potassium hydroxide, sodium carbonate, sodium silicate, sodium metasilicate, and ammonia water, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, tetramethyl ammonium hydroxide such as tetraalkyl ammonium hydroxide, tetraethyl ammonium hydroxide, tetrapropyl ammonium hydroxide, tetrabutyl ammonium hydroxide, tetrapentyl ammonium hydroxide, tetrahexyl ammonium hydroxide, tetraoctyl ammonium hydroxide, ethyl trimethyl ammonium hydroxide, butyl trimethyl ammonium hydroxide, methyl triamyl ammonium hydroxide, and dibutyl dipentyl ammonium hydroxide, quaternary ammonium salt such as trimethyl phenyl ammonium hydroxide, trimethyl benzyl ammonium hydroxide, and triethyl benzyl ammonium hydroxide, cyclic amines such as pyrrole and piperidine, and the like as an alkali developer. Furthermore, it is also possible to use alcohols and a surfactant in the alkali aqueous solution described above by adding an appropriate amount. The alkali concentration of the alkali developer is generally 0.1 mass % to 20 mass %. The pH of the alkali developer is generally 10.0 to 15.0. It is possible to use the alkali developer after appropriately adjusting the alkali concentration and the pH. The alkali developer may be used by adding a surfactant or an organic solvent thereto.

As the developing method, it is possible to apply, for example, a method for dipping a substrate in a tank which is filled with a developer for a certain time (a dipping method), a method for carrying out developing by raising the developer onto the substrate surface using surface tension and leaving the substrate to stand for a certain time (a paddle method), a method for spraying the developer onto the substrate surface (a spraying method), a method for carrying on discharging the developer onto a substrate which is rotating at a certain speed while scanning a developer discharging nozzle at a certain speed (a dynamic dispensing method), and the like.

In a case where the various types of the developing methods described above include a step for discharging the developer from the developing nozzle of the developing apparatus toward the resist film, the discharge pressure of the discharged developer (the flow rate of the discharged developer per unit area) is preferably 2 mL/sec/mm$^2$ or less, more preferably 1.5 mL/sec/mm$^2$ or less, and even more preferably 1 mL/sec/mm$^2$ or less. There is no particular lower limit on the flow rate; however, when considering throughput, 0.2 mL/sec/mm$^2$ or more is preferred.

It is possible to remarkably reduce the defects of patterns which are derived from the resist residue after developing by setting the discharge pressure of the discharged developer to the ranges described above.

The details of the mechanism are not clear; however, it is considered the mechanism functions because, by setting the discharge pressure to the ranges described above, the pressure which the developer applies to the resist film is small and the resist film or resist pattern is suppressed from being unnecessarily scraped or broken.

Here, the discharge pressure (mL/sec/mm$^2$) of the developer is the value at the developing nozzle opening in the developing apparatus.

Examples of the method for adjusting the discharge pressure of the developer include a method for adjusting the discharge pressure using a pump or the like, a method for changing the pressure by adjusting the pressure in the supply from a pressure tank, or the like.

In addition, after a step for developing using a developer which contains an organic solvent, a step for stopping developing while carrying out substitution with another solvent may be carried out.

The pattern formation method of the present invention preferably includes a step (a rinsing step) for carrying out cleaning using a rinsing liquid which contains an organic solvent between the step (i-3) and the step (iii) (between the step (i-3) and the step (ii) in a case of carrying out the step (ii) which will be described below), that is, after a step for developing using a developer which contains an organic solvent.

The rinsing liquid which is used in the rinsing step after the step for developing using a developer which includes an organic solvent is not particularly limited as long as the rinsing liquid does not dissolve a resist pattern and it is possible to use a solution which includes a general organic solvent. As the rinsing liquid, it is preferred to use a rinsing liquid which contains at least one type of an organic solvent selected from a group formed of a hydrocarbon-based solvent, a ketone-based solvent, an ester-based solvent, an alcohol-based solvent, an amide-based solvent, and an ether-based solvent.

Specific examples of the hydrocarbon-based solvent, the ketone-based solvent, the ester-based solvent, the alcohol-based solvent, the amide-based solvent, and the ether-based solvent include the same examples as described in the developer which includes an organic solvent.

After the step for developing using a developer which includes an organic solvent, more preferably a step for carrying out cleaning using a rinsing liquid which contains at least one type of an organic solvent selected from a group formed of a ketone-based solvent, an ester-based solvent, an alcohol-based solvent, and an amide-based solvent is performed, even more preferably a step for carrying out cleaning using a rinsing liquid which contains an alcohol-based solvent or an ester-based solvent is performed, particularly preferably a step for carrying out cleaning using a rinsing liquid which contains monovalent alcohol is performed, and most preferably a step for carrying out cleaning using a rinsing liquid which contains monovalent alcohol with 5 or more carbon atoms.

Here, examples of the monovalent alcohol which is used in the rinsing step include straight-chain, branched, or cyclic monovalent alcohols and specifically, it is possible to use 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, and the like, and, as particularly preferred monovalent alcohols with 5 or more carbon atoms, it is possible to use 1-hexanol, 2-hexanol, 4-methyl-2-pentanol, 1-pentanol, 3-methyl-1-butanol, and the like.

Each of the components may be used by mixing a plurality thereof or by mixing with components other than the solvents described above.

The moisture content in the rinsing liquid is preferably 10 mass % or less, more preferably 5 mass % or less, and particularly preferably 3 mass % or less. It is possible to obtain favorable developing characteristics by setting the moisture content to 10 mass % or less.

The vapor pressure of the rinsing liquid which is used after the step for developing using a developer which contains an organic solvent is preferably 0.05 kPa or more to 5 kPa or less at 20° C., more preferably 0.1 kPa or more to 5 kPa or less, and most preferably 0.12 kPa or more to 3 kPa or less. By setting the vapor pressure of the rinsing liquid to 0.05 kPa or more to 5 kPa or less, the temperature uniformity on the wafer surface is improved, moreover, swelling which is caused by the permeation of the rinsing liquid is suppressed, and the uniformity of the dimensions in the wafer surface is improved.

The pattern formation method of the present invention also preferably includes a step (a rinsing step) for carrying out cleaning using a rinsing liquid in a case of further having a step for developing using an alkali developer. As the rinsing liquid in this case, it is also possible to use pure water and add an appropriate amount of a surfactant thereto.

The method for the cleaning process in the rinsing step described above is not particularly limited; however, for example, it is possible to apply a method which carries on discharging a rinsing liquid onto a substrate which is rotated at a certain speed (a rotary coating method), a method for dipping a substrate in a tank which is filled with a rinsing liquid for a certain period (a dipping method), a method for spraying a rinsing liquid onto a substrate surface (a spraying method), and the like, and it is preferred to perform the cleaning process using the rotary coating method among these methods, to rotate the substrate at rotation speed of 2,000 rpm to 4,000 rpm after cleaning, and to remove the rinsing liquid from the substrate. In addition, it is also preferred to include a heating step (Post Bake) after the rinsing step. Due to baking, the developer and the rinsing liquid which remain between the patterns and in the patterns are removed. The heating step after the rinsing step is generally performed at 40° C. to 160° C., preferably 70° C. to 95° C., and generally for 10 seconds to 3 minutes, preferably 30 seconds to 90 seconds.

In addition, after the developing process or the rinsing process, it is possible to perform a process of removing the developer or the rinsing liquid which is attached on the patterns using a supercritical fluid.

As shown in the schematic perspective diagram in (b) in FIG. 1, the heating step (ii) (a so-called freezing step) may be further carried out between step (i) and step (iii) which will be described below in detail and due to this, it is possible to further improve the solvent resistance of the first negative type pattern which is formed in step (i), and it is possible to form a first negative type pattern 12 which is not easily damaged even when a liquid formed of the resin composition (2) which contains the second resin is coated in a region of the substrate 10 in which the first negative type pattern is not formed in the subsequent step (iii). The temperature in the heating step is preferably 150° C. or more and more preferably 170° C. or more. The temperature is preferably 250° C. or less. In addition, the heating time in the heating step is preferably 30 seconds to 120 seconds and more preferably 45 seconds to 90 seconds.

The heating step (ii) is also preferably carried out under reduced pressure from the point of view that, by promoting the volatilization of the decomposed residue of organic matter, it is possible to reduce the heating temperature and shorten the heating time.

Here, since the first negative type pattern 12 contains a resin of which, due to a polarity being increased by an action of an acid, a solubility decreases with respect to a developer which includes an organic solvent and has sufficient solvent resistance, the application of a freezing material is not necessary; however, the present invention does not exclude the application of freezing material known in the art with respect to the first negative type pattern 11 or the first negative type pattern 12.

Subsequently, as shown in the schematic perspective diagram in (c) in FIG. 1, a lower layer 15 is formed (step (iii)) by embedding the resin composition (2) which contains the second resin in the regions of the substrate 10 in which a film part of the first negative type pattern 12 is not formed (that is, space sections of the first negative type pattern 12). In other words, the lower layer 15 is configured by the film part of the first negative type pattern 12 and the film of the resin composition (2) which is embedded in the space sections of the first negative type pattern 12.

In step (iii), the method for embedding the resin composition (2) is the same as the method for forming the first film using the actinic ray-sensitive or radiation-sensitive resin composition (1) in step (i-1) described above.

The preferred range of the film thickness of the lower layer 15 is also the same as the preferred range described as the film thickness of the first film. Here, the film thickness of the lower layer 15 refers to the surface of the substrate 10.

Detailed description will be given below of the resin composition (2).

The heating (preheating; Prebake (PB)) may be carried out after forming the lower layer 15 and the various conditions and the like of the heating step are the same as described for PB which may be carried out after forming the first film.

Subsequently, as shown in the schematic perspective diagram in (d) in FIG. 1, an upper layer 20 is formed on the lower layer 15 using the actinic ray-sensitive or radiation-sensitive resin composition (3) which contains the third resin of which, due to a polarity being increased by an action of an acid, a solubility decreases with respect to a developer which includes an organic solvent (step (iv)).

In step (iv), the method for forming the upper layer 20 using the actinic ray-sensitive or radiation-sensitive resin composition (3) is the same as the method for forming the first film using the actinic ray-sensitive or radiation-sensitive resin composition (1) in step (i-1) described above.

The preferred range of the film thickness of the upper layer is also the same as described for the preferred range of the first film thickness.

Detailed description will be given below of the actinic ray-sensitive or radiation-sensitive resin composition (3).

In the first embodiment of the present invention, it is also preferred to carry out the preheating step (PB; Prebake) between step (iv) and step (v).

In addition, in the first embodiment of the present invention, it is also preferred to carry out the heating step after exposure (PEB; Post Exposure Bake) between step (v) and step (vi).

Both PB and PEB are preferably performed at the heating temperature of 70° C. to 130° C. and more preferably performed at 80° C. to 120° C.

The heating time is preferably 30 seconds to 300 seconds, more preferably 30 seconds to 180 seconds, and even more preferably 30 seconds to 90 seconds.

It is possible to perform the heating using a means which is provided in a typical exposure and developing machine and the heating may be performed using a hot plate and the like.

Due to the baking, the reaction of an exposed section is promoted and the sensitivity or pattern profile is improved.

At least one of the preheating step and the heating step after exposure may include a plurality of heating steps.

Subsequently, the upper layer 20 is exposed (step (v)). In the same manner as described above, for example, in a case where the light source is a KrF excimer laser, an ArF excimer laser, or EUV, it is preferred to irradiate (that is, expose) actinic rays or radiation via a mask (not shown in the diagram). The mask pattern in the mask is not particularly limited; however, in the first embodiment of the present invention, the mask which is used in step (i-2) described above is used in a state of being rotated by 90° from the arranged position in step (i-2) described above.

With regard to the method for exposure in step (v), it is possible to adopt the method described in the exposure in step (i-2) in the same manner.

Subsequently, the exposed upper layer 20 is developed using a developer which includes an organic solvent and, as shown in the schematic perspective diagram in (e) in FIG. 1, a second negative type pattern 21 is formed on the lower layer 15 (step (vi)).

With regard to the organic-based developer in step (vi), it is possible to use the developer described as the organic-based developer in step (i-3) in the same manner.

In addition, in the first embodiment, a step for developing using an alkali developer may be carried out between step (v) and step (vi) or after step (vi).

With regard to the alkali developer, it is possible to use the developer described in the step for developing using an alkali developer described above which may be carried out between step (i-2) and step (i-3), or step (i-3) and step (iii) (between the step (i-3) and the step (ii) in a case of carrying out the step (ii)) in the same manner.

With regard to the developing method in step (vi) and in the step for developing using an alkali developer which may be carried out before or after step (vi), it is possible to adopt the method described in step (i-3) in the same manner.

In addition, the pattern formation method of the present invention preferably includes a step (a rinsing step) for carrying out cleaning using a rinsing liquid which contains an organic solvent after step (vi), that is, after a step for developing using a developer which contains an organic solvent. As the rinsing liquid in this case, it is possible to use the described rinsing liquid in the step (a rinsing step) for carrying out cleaning using a rinsing liquid which contains an organic solvent which may be carried out after the step for developing using a developer which contains an organic solvent in the same manner.

In addition, the pattern formation method of the present invention preferably includes a step (a rinsing step) for carrying out cleaning using a rinsing liquid between step (v) and step (vi) or after step (vi), and after the step for developing using an alkali developer in a case of further having a step for developing using an alkali developer. As the rinsing liquid in this case, it is also possible to use pure water and add an appropriate amount of a surfactant thereto.

Examples of the method for the cleaning process in the rinsing step include the methods described above in the same manner.

A heating step may be further carried out after the step (vi). Due to this, since it is possible to further improve the solvent resistance of the second negative type pattern which is formed in the step (vi), it is possible to form a second negative type pattern which is not easily damaged when removing a portion of the lower layer 15 in the subsequent step (vii). The various conditions and the like of the heating step are the same as described for the heating step (ii) described above.

Subsequently, a portion of the lower layer 15 is removed (step (vii)). In more detail, step (vii) is carried out such that at least the first negative type pattern 12 remains.

The removing method for removing a portion of the lower layer 15 in step (vii) is not particularly limited and it is possible to use any method known in the art; however, for example, it is possible to carry out the removal using the wet processes described in JP2002-158200A, JP2003-249477A, "Takeshi Hattori: "Chapter 6 Sheet Cleaning Technique", Electronics Cleaning Technique, Technical Information Association, pp. 157 to 193 (2007)", and the like. The liquid which is used in the wet processes is not particularly limited; however, an organic solvent is preferred and a solvent which the resin composition (2) may contain (which will be described in detail below) is more preferred. In addition, the liquid which is used in the wet processes may be the same as or may be different from the organic-based developer in step (vi); however, by being the same, it is also possible to make step (vi) and step (vii) into a series (a batch) of steps.

In a case where the second resin in the resin composition (2) is not a resin of which, due to a polarity being increased by an action of an acid, a solubility decreases with respect to a developer which includes an organic solvent, by carrying out step (vii), as shown in the schematic perspective diagram in (f) in FIG. 1, a region other than the film part of the first negative type pattern 12 which configures the lower layer 15 is removed.

On the other hand, in a case where the second resin in the resin composition (2) is a resin of which, due to a polarity being increased by an action of an acid, a solubility decreases with respect to a developer which includes an organic solvent (in particular, in addition to this, in a case where the resin composition (2) contains a compound which generates an acid when irradiated with actinic rays or radiation), "a region which is a region of the lower layer 15 other than the film part of the first negative type pattern 12 and which is positioned between the film part of the second negative type pattern 21 and the substrate 10 (that is, a region of the lower layer 15 which is positioned below the film part of the second negative type pattern 21)" has a tendency not to be removed by step (vii) since the solubility of the second resin with respect to an organic-based developer is decreased due to the exposure in step (v).

As the resin composition (2), it is possible to adopt any of the forms described above according to the use, purpose, and the like.

As described above, the second negative type pattern 21 which is a line and space pattern is formed on the first negative type pattern 12 which is a line and space pattern in a state where the line direction makes a right angle with the line direction in the first negative type pattern 12.

Subsequently, an etching process is performed with respect to the substrate 10 using a pattern which is formed as described above (that is, a laminated pattern which has the first negative type pattern 12 and the second negative type pattern 21) as a mask.

By carrying out the etching process, as shown in the schematic perspective diagram in (g) in FIG. 1, a hole is punched at the position of the substrate 10 which corresponds to "a region in a laminated pattern in which the space section in the first negative type pattern 12 and the space section in the second negative type pattern 21 are formed to communicate in the direction orthogonal with respect to the substrate 10" and a substrate 30 provided with a hole section 31 is formed.

The method for the etching process is not particularly limited, it is possible to use any method known in the art, and various conditions and the like are appropriately determined according to the type, use, and the like of the substrate. For example, it is possible to carry out the etching process on the basis of the Proceedings of The International Society for Optical Engineering (Proc. of SPIE) Vol. 6924, 692420 (2008), JP2009-267112A, and the like.

Description was given above of the first embodiment of the present invention; however, at least one of the exposure in step (i-2) and the exposure in step (v) is preferably exposure by a KrF excimer laser or an ArF excimer laser.

In addition, in the first embodiment of the present invention, a third negative type pattern may be formed on the second negative type pattern by forming a separate layer on the upper layer using an actinic ray-sensitive or radiation-sensitive resin composition (4) which contains a fourth resin of which, due to a polarity being increased by an action of an acid, a solubility decreases with respect to a developer which includes an organic solvent and performing the same exposure and developing as in steps (v) and (vi) with respect to the separate layer between step (v) and step (vi).

Here, examples of the fourth resin and the actinic ray-sensitive or radiation-sensitive resin composition (4) include the same examples described for the third resin and the actinic ray-sensitive or radiation-sensitive resin composition (3) which will be described below respectively.

In addition, by the developer which is used for developing with respect to the separate layer described above and the organic-based developer in step (vi) being the same, it is also possible to make the developing step with respect to the separate layer described above and step (vi) into a series (a batch) of steps.

By applying the methods above, it is also possible to further form one layer or two or more layers of negative type patterns on the third negative type pattern.

In addition, the first negative type pattern in the first embodiment of the present invention may be formed by carrying out resist film patterning two or more times. In other words, step (i) for forming the first negative type pattern may include a pattern forming step which has step (i-1), step (i-2), and step (i-3) in this order a plurality of times (this form is also referred to as a "modification example").

In this case, in the plurality of pattern forming steps, a heating step may further be provided between two continuous pattern forming steps.

Description will be given below of the modification examples described above.

Figure 2:
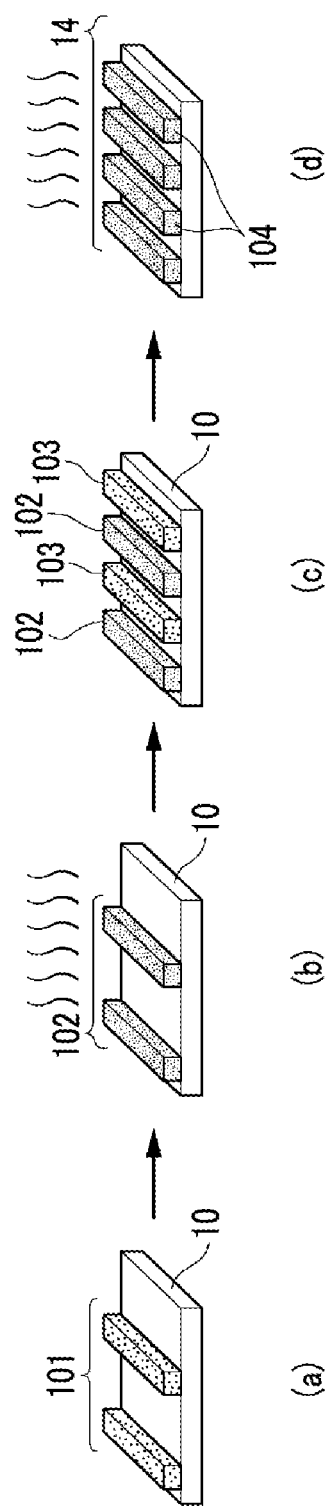

(a) to (d) in FIG. 2 are respectively schematic perspective diagrams for illustrating modification examples of the first embodiment of the present invention.

Firstly, by carrying out step (i-1), step (i-2), and step (i-3) in this order using the same method as the method described in the first embodiment, as shown in the schematic perspective diagram in (a) in FIG. 2, for example, a line and space pattern 101 of which the line width and the space width are 1:3 on the substrate 10 is formed as the negative type pattern.

Subsequently, as shown in the schematic perspective diagram in (b) in FIG. 2, a heating step (a so-called freezing step) may be carried out and, due to this, it is possible to improve the solvent resistance of the line and space pattern 101 more, and subsequently, it is possible to form a line and space pattern 102 which is not easily damaged even when a liquid formed of another actinic ray-sensitive or radiation-sensitive resin composition (1) is coated in a region of the substrate 10 in which a film part of the line and space pattern is not formed.

As the various conditions and the like of the heating step, it is possible to adopt those described for the heating step (ii) in the first embodiment.

Subsequently, as shown in the schematic perspective diagram in (c) in FIG. 2, for example, a line and space pattern 103 of which the line width and the space width are 1:3 is formed on the substrate 10 (in more detail, a region of the substrate 10 in which a film part of the line and space pattern 102 is subsequently not formed) as a negative type pattern by carrying out step (i-1), step (i-2), and step (i-3) in this order.

As a result, for example, a first negative type pattern of which the line width and the space width are 1:1 and which is configured by the line and space pattern 102 and the line and space pattern 103 is formed on the substrate 10.

Subsequently, as shown in the schematic perspective diagram in (d) in FIG. 2, a heating step (a so-called freezing step) may be carried out and, due to this, it is possible to improve the solvent resistance of the line and space pattern 103 more, and subsequently, it is possible to form a first negative type pattern 14 which has the line and space pattern 104 which is not easily damaged even when a liquid formed of the resin composition (2) which contains the second resin is coated in a region of the substrate 10 in which a film part of the first negative type pattern is not formed. As the various conditions and the like of the heating step, it is possible to adopt those described for the heating step (ii) in the first embodiment.

Then, by performing the process described after (c) in FIG. 1 with respect to the first negative type pattern 14, it is possible to carry out the pattern formation method of the present invention.

As described above, in a case where step (i) for forming the first negative type pattern has a pattern forming step which has step (i-1), step (i-2), and step (i-3) in this order, for example, two times as in the modification example described above, it is possible to form a 1:1 line and space pattern by setting the space width to be three times the line width in one patterning.

For this reason, according to the modification example described above, since it is possible to set the space width in one patterning to be wider than the line width, it is possible to compensate for the lack of resolving power, which is likely to occur in a case of forming a pattern which has a fine line width using a negative tone imaging process, by improving the mask bias. Thus, in a negative tone imaging process which has promise with regard to the future designs of electronic devices (in particular, forming fine trenches or fine holes), the modification example described above is effective in a case of forming high density patterns which the negative tone imaging process is poor at forming (typically an ultrafine (for example, having a line width of 40 nm or less) line and space pattern), and the like. In addition, for example, since it is possible to integrate material of a resist composition for forming fine trenches or fine holes and a resist composition for forming a high density pattern, the modification example described above is also effective in reducing costs or in the application of techniques in pattern forming.

Figure 3:
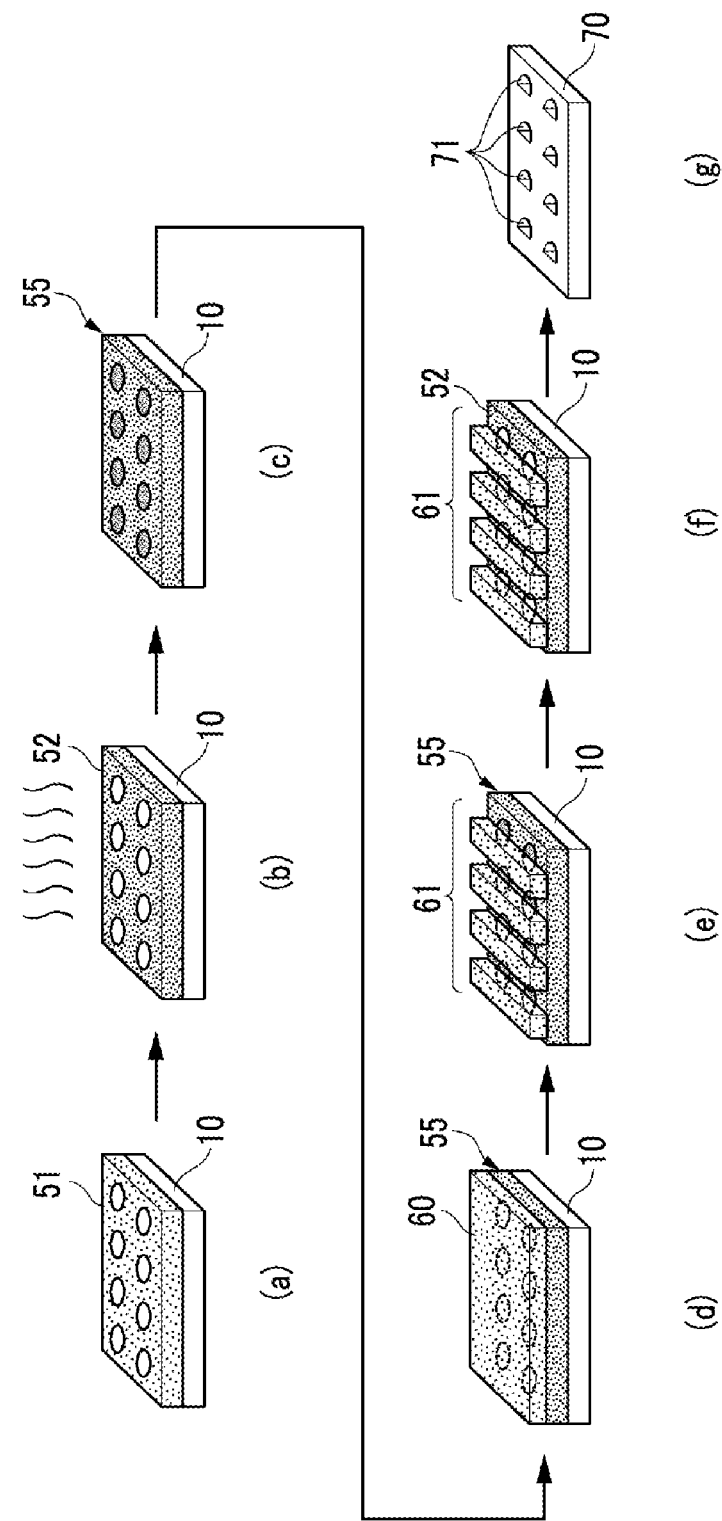

(a) to (g) in FIG. 3 are each a schematic perspective diagram for illustrating a pattern formation method and an etching method according to a second embodiment of the present invention.

In the second embodiment of the present invention, as shown in the schematic perspective diagram in (a) in FIG. 3, a first negative type pattern 51 which has a hole pattern in which a plurality of hole sections are arranged in the line direction and the row direction at equal intervals is formed on the substrate 10 by performing step (i-1), step (i-2), and step (i-3) in this order. The first negative type pattern 51 is favorably formed on the basis of the method described in the first embodiment, for example, except that the mask in the first embodiment is changed to a hole pattern mask which has a hole section as a light shielding section.

As shown in the schematic perspective diagram in (b) in FIG. 3, the heating step (ii) (a so-called freezing step) may be further carried out between step (i) described above and step (iii) described above and, due to this, it is possible to further improve the solvent resistance of the first negative type pattern which is formed in step (i), and it is possible to form a first negative type pattern 52 which is not easily damaged even when a liquid formed of the resin composition (2) which contains the second resin is coated in a region of the substrate 10 in which a film part of the first negative type pattern is not formed in the subsequent step (iii).

As the various conditions and the like of the heating step, it is possible to adopt those described for the heating step (ii) in the first embodiment.

Here, since the first negative type pattern 52 contains a resin of which, due to a polarity being increased by an action of an acid, a solubility decreases with respect to a developer which includes an organic solvent and has sufficient solvent resistance, the application of a freezing material is not necessary; however, the present invention does not exclude the application of freezing material known in the art with respect to the first negative type pattern 51 or the first negative type pattern 52.

Subsequently, as shown in the schematic perspective diagram in (c) in FIG. 3, a lower layer 55 is formed (step (iii)) by embedding the resin composition (2) which contains the second resin in a region of the substrate 10 in which a film part of the first negative type pattern 52 is not formed (that is, a hole section). In other words, the lower layer 55 is configured by the film part of the first negative type pattern 52 and the film of the resin composition (2) which is embedded in the hole section of the first negative type pattern 52.

In step (iii), the method for embedding the resin composition (2) is the same as the method for forming the first film using the actinic ray-sensitive or radiation-sensitive resin composition (1) in step (i-1) of the first embodiment.

The preferred range of the film thickness of the lower layer is the same as described as the preferred range of the film thickness of the first film and the same as described in the first embodiment.

Detailed description will be given below of the resin composition (2).

The heating (preheating; Prebake (PB)) may be carried out after forming the lower layer 55 and the various conditions and the like of the heating step are the same as described for the PB which may be carried out after forming the first film in the first embodiment.

Subsequently, as shown in the schematic perspective diagram in (d) in FIG. 3, an upper layer 60 is formed on the lower layer 55 using the actinic ray-sensitive or radiation-sensitive resin composition (3) which contains the third resin of which, due to a polarity being increased by an action of an acid, a solubility decreases with respect to a developer which includes an organic solvent (step (iv)).

In step (iv), the method for forming the upper layer 60 using the actinic ray-sensitive or radiation-sensitive resin composition (3) is the same as the method for forming the first film using the actinic ray-sensitive or radiation-sensitive resin composition (1) in step (i-1) in the first embodiment.

The preferred range of the film thickness of the upper layer is also the same as described as the preferred range of the first film thickness in the first embodiment.

Detailed description will be given below of the actinic ray-sensitive or radiation-sensitive resin composition (3).

In the second embodiment of the present invention, it is also preferred to carry out the preheating step (PB; Prebake) between step (iv) and step (v).

In addition, in the second embodiment of the present invention, it is also preferred to carry out the heating step after exposure (PEB; Post Exposure Bake) between step (v) and step (vi).

With regard to the heating temperature, the heating time, the heating means, and the like in PB and PEB, it is possible to adopt those described for PB which may be carried out between step (iv) and step (v) in the first embodiment and PEB which may be carried out between step (v) and step (vi) in the same manner.

At least one of the preheating step and the heating step after exposure may include a plurality of heating steps.

Subsequently, the upper layer 60 is exposed (step (v)). In the same manner as described above, for example, in a case where the light source is a KrF excimer laser, an ArF excimer laser, or EUV, it is preferred to irradiate (that is, expose) actinic rays or radiation via a mask. The mask pattern in the mask is not particularly limited; however, in the second embodiment of the present invention, "a mask which is a mask which has a line and space pattern which has a line section as a light shielding section and a space section as a light transmitting part and of which the ratio of the width of the line section and the width of the space section is 1:1" (not shown in the diagram) is used in a state where the light shielding section of the mask covers a semicircular region of each of the hole patterns in which the resin composition (2) is embedded in the lower layer 55.

With regard to the method for exposure in step (v), it is possible to adopt the method described in the exposure in step (i-2) of the first embodiment in the same manner.

Subsequently, as shown in the schematic perspective diagram in (e) in FIG. 3, a second negative type pattern 61 is formed on the lower layer 55 by developing the exposed upper layer 60 using a developer which includes an organic solvent (step (vi)).

With regard to the organic-based developer in step (vi), it is possible to use the developer described in the organic-based developer in step (i-3) of the first embodiment in the same manner.

According to step (vi), the semicircular region of each of the hole sections in which the resin composition (2) is embedded in the lower layer 55 is in a state of being covered with the line section in the second negative type pattern 61.

In addition, in the second embodiment, a step for developing using an alkali developer may be carried out between step (v) and step (vi) or after step (vi).

With regard to the alkali developer, it is possible to use the developer described in the step for developing using an alkali developer described above in the first embodiment which may be carried out between step (i-2) and step (i-3), or step (i-3) and step (iii) (between step (i-3) and step (ii) in a case of carrying out step (ii)) in the same manner.

With regard to the developing method in step (vi) and in the step for developing using an alkali developer which may be carried out before or after the step (vi), it is possible to adopt the method described in step (i-3) of the first embodiment in the same manner.

In addition, in the second embodiment, it is preferred to carry out a step (a rinsing step) for carrying out cleaning using a rinsing liquid which contains an organic solvent after the step (vi), that is, after a step for developing using a developer which contains an organic solvent. As the rinsing liquid in this case, it is possible to use the rinsing liquid described in the step (a rinsing step) for carrying out cleaning using a rinsing liquid which contains an organic solvent which may be carried out after the step for developing using a developer which contains an organic solvent in the first embodiment in the same manner.

In addition, in the second embodiment, in a case of carrying out a step for developing using an alkali developer between step (v) and step (vi) or after the step (vi), a step (a rinsing step) for carrying out cleaning using a rinsing liquid is preferably included after the step for developing using an alkali developer. As the rinsing liquid in this case, it is also possible to use pure water and add an appropriate amount of a surfactant thereto.

Examples of the method for the cleaning process in the rinsing step include the method described above in the first embodiment in the same manner.

A heating step may be further carried out after the step (vi). Due to this, since it is possible to further improve the solvent resistance of the second negative type pattern which is formed in the step (vi), it is possible to form a second negative type pattern which is not easily damaged when removing a portion of the lower layer 55 in the subsequent step (vii). The various conditions and the like of the heating step are the same as described for the heating step (ii) described above.

Subsequently, a portion of the lower layer 55 is removed (step (vii)). In more detail, step (vii) is carried out such that at least the first negative type pattern 52 remains.

With regard to the removal method for removing a portion of the lower layer 55 in step (vii), it is possible to adopt the method described in step (vii) of the first embodiment in the same manner and the liquid which is used in the wet process is not particularly limited; however, an organic solvent is preferred and a solvent (which will be described in detail) which may be contained in the resin composition (2) is more preferred. Alternatively, by the liquid which is used in the wet process being the organic-based developer in step (vi), it is also possible to make step (vi) and step (vii) into a series (a batch) of steps.

In a case where the second resin in the resin composition (2) is not a resin of which, due to a polarity being increased by an action of an acid, a solubility decreases with respect to a developer which includes an organic solvent, by carrying out step (vii), a region other than the film part of the first negative type pattern 52 which configures the lower layer 55 is easily removed.

On the other hand, in a case where the second resin in the resin composition (2) is a resin of which, due to a polarity being increased by an action of an acid, a solubility decreases with respect to a developer which includes an organic solvent (in particular, in addition to this, in a case where the resin composition (2) contains a compound which generates an acid when irradiated with actinic rays or radiation), "a region which is a region of the lower layer 55 other than the film part of the first negative type pattern 52 and which is positioned between the film part of the second negative type pattern 61 and the substrate 10 (that is, a region of the lower layer 55 which is positioned below the film part of the second negative type pattern 61)" has a tendency not to be removed by step (vii) since the solubility of the second resin with respect to an organic-based developer is decreased due to the exposure in step (v).

As the resin composition (2), it is possible to adopt any of the forms described above according to the use, purpose, and the like.

As described above, the second negative type pattern 61 which is a line and space pattern is formed on the first negative type pattern 52 which is the hole pattern such that the line section covers the semicircular region of each of the hole sections.

Subsequently, an etching process is performed with respect to the substrate 10 using a pattern which is formed as described above (that is, a laminated pattern which has the first negative type pattern 52 and the second negative type pattern 61) as a mask.

By carrying out the etching process, as shown in the schematic perspective diagram in (g) in FIG. 3, a hole is punched at the position of the substrate 10 which corresponds to "a region in a laminated pattern in which the hole section in the first negative type pattern 52 and the space section in the second negative type pattern 61 are formed to communicate in the direction orthogonal with respect to the substrate 10" and a substrate 70 provided with a hole section 71 of which the cross-section is a semicircle shape is formed.

With regard to the etching method, it is possible to adopt the method described in the first embodiment in the same manner.

Description was given above of the pattern formation method and the etching method according to the first and second embodiments of the present invention; however, according to the embodiments of the present invention, it is possible to form a fine pattern (for example, the dimensions of the hole diameters, the dot diameters, the space widths, the line widths, and the like are 500 nm or less) with various shapes with respect to a substrate.

The patterns which are eventually obtained by the pattern formation method of the present invention are generally used for "mask" applications in so-called etching process or ion implantation processes. However, the present invention does not exclude applications to other uses. Examples of other uses include guide pattern forming in Directed Self-Assembly (DSA) (for example, refer to ACS Nano Vol. 4 No. 8 Page 4815 to 4823), use as a core material (core) in a so-called spacer process (for example, refer to JP1991-270227A (JP-H03-270227A), JP2013-164509A, and the like), and the like.

<Resin Compositions (1) to (3)>

Description will be given below of the resin compositions (1) to (3) which are used in the pattern formation method of the present invention.

Out of the resin compositions (1) to (3) according to the present invention, at least the resin compositions (1) and (3) are used for negative type developing (developing by which, when exposed, the solubility decreases with respect to the organic solvent developer, the exposed section remains as a pattern, and the unexposed section is removed).

The resin compositions (1) and (3) in the present invention are actinic ray-sensitive or radiation-sensitive resin compositions and each thereof contains a first resin of which, due to a polarity being increased by an action of an acid, a solubility decreases with respect to a developer which includes an organic solvent and a third resin of which, due to a polarity being increased by an action of an acid, a solubility decreases with respect to a developer which includes an organic solvent.

The actinic ray-sensitive or radiation-sensitive resin compositions (1) and (3) are typically actinic ray-sensitive or radiation-sensitive resin compositions which further contain compounds which generate acid when irradiated with actinic rays or radiation which will be described below, that is, chemical amplification type actinic ray-sensitive or radiation-sensitive resin compositions, and more preferably chemical amplification type resist compositions.

In addition, the resin composition (2) may or may not contain a resin of which, due to a polarity being increased by an action of an acid, a solubility decreases with respect to a developer which includes an organic solvent; however, the resin composition (2) may contain a resin of which, due to a polarity being increased by an action of an acid, a solubility decreases with respect to a developer which includes an organic solvent in order to be used in negative type developing. In this case, the resin composition (2) may be a chemical amplification type actinic ray-sensitive or radiation-sensitive resin composition (more preferably a chemical amplification type resist composition) which contains a resin of which, due to a polarity being increased by an action of an acid, a solubility decreases with respect to a developer which includes an organic solvent and a compound which generates acid when irradiated with actinic rays or radiation which will be described below.

The resin compositions (1) to (3) may include other components than a resin of which, due to a polarity being increased by an action of an acid, a solubility decreases with respect to a developer which includes an organic solvent and a compound which generates acid when irradiated with actinic rays or radiation. Description will be given below of these components.

In the present invention, the resin compositions (1) to (3) may be the same as or may be different from each other; however, from the point of view of suppressing coated films which are formed from the resin compositions from intermixing and the like, the resin compositions (1) to (3) are preferably different from each other.

A resin which is contained in the resin compositions (1) to (3) may be a resin which is configured by appropriately selecting each repeating unit which will be described below. For example, the resin may be a copolymer of each repeating unit which will be described below in [Preferred Resin Aspect (1)] (a repeating unit which has an aromatic ring which will be described below and the like) and each repeating unit which will be described below in [Preferred Resin Aspect (2)] (a repeating unit which is represented by General Formula (AAI) which will be described below and the like).

[1] (A) Resin

As described above, the resin compositions (1) and (3) each contain a first resin of which, due to a polarity being increased by an action of an acid, a solubility decreases with respect to a developer which includes an organic solvent and a third resin of which, due to a polarity being increased by an action of an acid, a solubility decreases with respect to a developer which includes an organic solvent (also referred to together below as "resins of which, due to a polarity being increased by an action of an acid, a solubility decreases with respect to a developer which includes an organic solvent"). The first resin and the third resin may be the same as each other and may be different from each other.

In addition, the resin composition (2) contains a second resin. The second resin which the resin composition (2) contains is not particularly limited; however, as described above, the second resin may be a resin of which, due to a polarity being increased by an action of an acid, a solubility decreases with respect to a developer which includes an organic solvent.

A resin in each of the resin compositions (1) to (3) is also commonly referred to below as a resin (A).

The resin of which, due to a polarity being increased by an action of an acid, a solubility decreases with respect to a developer which includes an organic solvent is preferably a resin (also simply referred to below as an "acid-decomposable resin") which has a group which generates a polar group by being decomposed by an action of an acid (also simply referred to below as an "acid-decomposable group").

Examples of the acid-decomposable resin include a resin which has an acid-decomposable group in the main chain or the side chain of the resin or both the main chain and the side chain.

The acid-decomposable resin preferably has a repeating unit which has an acid-decomposable group.

Here, the acid-decomposable resin is also a resin of which, due to a polarity being increased by an action of an acid, a solubility increases with respect to an alkali developer.

[Repeating Unit which has an Acid-Decomposable Group]

The acid-decomposable group preferably has a structure which is protected by a group which decomposes and desorbs a polar group by an action of an acid.

The polar group is not particularly limited as long as the polar group is a group which is sparingly soluble or insoluble in a developer which includes an organic solvent; however, examples thereof include acidic groups such as a carboxyl group and a sulfonic acid group (a group which is dissociated in a 2.38 mass % tetramethyl ammonium hydroxide aqueous solution which is used as a developer for resists in the related art), an alcoholic hydroxyl group, and the like.

Here, the alcoholic hydroxyl group is a hydroxyl group which is bonded with a hydrocarbon group and refers to hydroxyl groups other than hydroxyl groups (phenolic hydroxyl groups) which are directly bonded with an aromatic ring and aliphatic alcohol groups (for example, a fluorinated alcohol group (a hexafluoroisopropanol group and the like)) in which the α-position is substituted with an electron-withdrawing group such as a fluorine atom as an acidic group are excluded. The alcoholic hydroxyl group is preferably a hydroxyl group with a pKa of 12 or more to 20 or less.

A preferred group as the acid-decomposable group is a group where hydrogen atoms of the groups are substituted with groups which are desorbed by an acid.

Examples of the groups which are desorbed by an acid include —C($R_{36}$)($R_{37}$)($R_{38}$), —C($R_{36}$)($R_{37}$)(O$R_{39}$), —C($R_{01}$)($R_{02}$)(O$R_{39}$), and the like.

In the formula, $R_{36}$ to $R_{39}$ each independently represent an alkyl group, a cycloalkyl group, an aryl group, an aralkyl group, or an alkenyl group. $R_{36}$ and $R_{37}$ may bond with each other to form a ring.

$R_{01}$ and $R_{02}$ each independently represent a hydrogen atom, an alkyl group, a cycloalkyl group, an aryl group, an aralkyl group, or an alkenyl group.

The alkyl groups of $R_{36}$ to $R_{39}$, $R_{01}$, and $R_{02}$ are preferably alkyl groups with 1 to 8 carbon atoms and examples thereof include a methyl group, an ethyl group, a propyl group, an n-butyl group, a sec-butyl group, a hexyl group, an octyl group, and the like.

The cycloalkyl groups of $R_{36}$ to $R_{39}$, $R_{01}$, and $R_{02}$ may be a monocyclic type or may be a polycyclic type. The monocyclic type is preferably a cycloalkyl group with 3 to 8 carbon atoms and the polycyclic type is preferably a cycloalkyl group with 6 to 20 carbon atoms. Here, at least one carbon atom in the cycloalkyl group may be substituted with a hetero atom such as an oxygen atom.

The aryl groups of $R_{36}$ to $R_{39}$, $R_{01}$, and $R_{02}$ are preferably aryl groups with 6 to 10 carbon atoms.

The aralkyl groups of $R_{36}$ to $R_{39}$, $R_{01}$, and $R_0^2$ are preferably aralkyl groups with 7 to 12 carbon atoms and examples thereof include a benzyl group, a phenethyl group, a naphthylmethyl group, and the like.

Alkenyl groups of $R_{36}$ to $R_{39}$, $R_{01}$, and $R_{02}$ are preferably alkenyl groups with 2 to 8 carbon atoms and examples thereof include a vinyl group, an allyl group, a butenyl group, a cyclohexenyl group, and the like.

A ring which is formed by $R_{36}$ and $R_{37}$ bonding with each other is preferably a cycloalkyl group (monocyclic or polycyclic).

[Preferred Resin Aspect (1)]

One example of the embodiments of the present invention includes the resin (A) being a resin of a preferred resin aspect (1) which will be described below.

Examples of resins of the preferred resin aspect (1) include a resin which contains a repeating unit which has an aromatic ring and the resin may be preferably applied to KrF exposure. Examples of the repeating unit which has an aromatic ring include a repeating unit which is represented by General Formula (VI) which will be described below, a repeating unit which is represented by General Formula (IIB) which will be described below, a repeating unit which has an aromatic group which will be described below, and the like.

The resin of the preferred resin aspect (1) is preferably a resin which is configured by at least one repeating unit selected from a group formed of a repeating unit which is represented by General Formula (AI) or (AI') below, a repeating unit which is represented by General Formula (VI) which will be described below, a repeating unit which is represented by General Formula (IIB) which will be described below, and a repeating unit which has an aromatic group which will be described below, and at least one repeating unit selected from each of the repeating units which will be described below in [Other repeating units] as necessary.

A repeating unit which has an acid-decomposable group contained in the resin (A) as the resin of the preferred resin aspect (1) is preferably a repeating unit which is represented by General Formula (AI) or (AI') below.

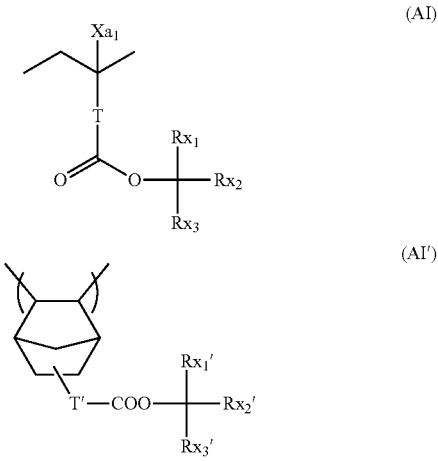

In General Formula (AI), $Xa_1$ represents a hydrogen atom, a methyl group which may have a substituent group, or a group which is represented by —$CH_2$—$R_9$. $R_9$ represents a hydroxyl group or a monovalent organic group and examples of the monovalent organic group include an alkyl group with 5 or less carbon atoms and an acyl group with 5 or less carbon atoms, of which an alkyl group with 3 or less carbon atoms is preferred, and a methyl group is more preferred. $Xa_1$ preferably represents a hydrogen atom, a methyl group, a trifluoromethyl group, or a hydroxymethyl group.

T represents a single bond or a divalent linking group.

$Rx_1$ to $Rx_3$ each independently represent an alkyl group (in a straight-chain form or a branched form) or a cycloalkyl group (monocyclic or polycyclic).

Two of $Rx_1$ to $Rx_3$ may bond with each other to form a cycloalkyl group (monocyclic or polycyclic).

In General Formula (AI'),

T' represents a single bond or a divalent linking group. $Rx_1'$ to $Rx_3'$ each independently represent an alkyl group (in a straight-chain form or a branched form) or a cycloalkyl group (monocyclic or polycyclic).

Two of $Rx_1'$ to $Rx_3'$ bond with each other to form a cycloalkyl group (monocyclic or polycyclic).

Examples of the divalent linking group of T include an alkylene group, a —COO-Rt- group, a —O-Rt- group, and the like. In the formulas, Rt represents an alkylene group or a cycloalkylene group.

T is preferably a single bond or a —COO-Rt- group and more preferably a single bond. Rt is preferably an alkylene group with 1 to 5 carbon atoms and more preferably a —$CH_2$— group, a —$(CH_2)_2$— group, and a —$(CH_2)_3$— group.

As the alkyl groups of $Rx_1$ to $Rx_3$, an alkyl group with 1 to 4 carbon atoms such as a methyl group, an ethyl group, an n-propyl group, an isopropyl group, an n-butyl group, an isobutyl group, and a t-butyl group is preferred.

As the cycloalkyl groups of $Rx_1$ to $Rx_3$, monocyclic cycloalkyl groups such as a cyclopentyl group and a cyclohexyl group, and polycyclic cycloalkyl groups such as a norbornyl group, a tetracyclodecanyl group, a tetracyclododecanyl group, and an adamantyl group are preferred.

As a cycloalkyl group which is formed by two of $Rx_1$ to $Rx_3$ bonding with each other, monocyclic cycloalkyl groups such as a cyclopentyl group and a cyclohexyl group, and polycyclic cycloalkyl groups such as a norbornyl group, a tetracyclodecanyl group, a tetracyclododecanyl group, and an adamantyl group are preferred. A monocyclic cycloalkyl group with 5 or 6 carbon atoms is particularly preferred.

An aspect in which $Rx_1$ is a methyl group or an ethyl group and $Rx_2$ and $Rx_3$ are bonded with each other to form the cycloalkyl group described above is also preferred.

Among these, $Rx_1$ to $Rx_3$ are preferably each independently an alkyl group in a straight-chain form or a branched form, more preferably an alkyl group with 1 to 4 carbon atoms in a straight-chain form or a branched form, and examples thereof include a methyl group, an ethyl group, an n-propyl group, an isopropyl group, an n-butyl group, an isobutyl group, and a tert-butyl group.

In a case where $Rx_1$ to $Rx_3$ are each independently an alkyl group in a straight-chain form or a branched form, a methyl group, an ethyl group, an n-propyl group, and an n-butyl group are preferred as $Rx_1$ and a methyl group and an ethyl group are more preferred, and a methyl group is particularly preferred. A methyl group, an ethyl group, an n-propyl group, an isopropyl group, and an n-butyl group are preferred as $Rx_2$, a methyl group and an ethyl group are more preferred, and a methyl group is particularly preferred. A methyl group, an ethyl group, an n-propyl group, an isopropyl group, an n-butyl group, an isobutyl group, and a tert-butyl group are preferred as $Rx_3$, a methyl group, an ethyl group, an isopropyl group, and an isobutyl group are more preferred, and a methyl group, an ethyl group, and an isopropyl group are particularly preferred.

Specific examples and preferred examples of T', $Rx_1'$ to $Rx_3'$, and the cycloalkyl group which two $Rx_1'$ to $Rx_3'$ may bond with each other to form are respectively the same as the examples described in the specific examples and preferred examples of T, $Rx_1$ to $Rx_3$, and the cycloalkyl group which two $Rx_1$ to $Rx_3$ may bond with each other to form.

In a case where T is a single bond and $Rx_1$ to $Rx_3$ are each independently an alkyl group in a straight-chain form or a branched form (in this case, two of $Rx_1$ to $Rx_3$ do not bond with each other to form a cycloalkyl group) and in a case where T' is a single bond and $Rx_1'$ to $Rx_3'$ are each independently an alkyl group in a straight-chain form or a branched form (in this case, two of $Rx_1'$ to $Rx_3'$ do not bond with each other to form a cycloalkyl group), it is possible to obtain a pattern formation method which has excellent roughness performance, uniformity of the local pattern dimensions, and exposure latitude and which is able to further suppress decreases in the film thickness of a pattern section which is formed by exposure, that is, film loss.

Each of the groups described above may have a substituent group and examples of the substituent group include an alkyl group (with 1 to 4 carbon atoms), a halogen atom, a hydroxyl group, an alkoxy group (with 1 to 4 carbon atoms), a carboxyl group, an alkoxycarbonyl group (with 2 to 6 carbon atoms), and the like and the number of carbon atoms is preferably 8 or less. Among these, from the point of view of further improving the dissolution contrast with respect to a developer which contains an organic solvent before and after being decomposed by an acid, a substituent group which does not have a hetero atom such as an oxygen atom, a nitrogen atom, and a sulfur atom is more preferred (for example, a substituent group which is not an alkyl group or the like which is substituted with a hydroxyl group is more preferred), a group which is only formed of hydrogen atoms and carbon atoms is even more preferred, and a straight-chain or branched alkyl group and a cycloalkyl group are particularly preferred.

Preferred specific examples of a repeating unit which has an acid-decomposable group will be shown below; however, the present invention is not limited thereto.

In the specific examples, Rx and $Xa_1$ represent a hydrogen atom, $CH_3$, $CF_3$, or $CH_2OH$. Rxa and Rxb each represent an alkyl group with 1 to 4 carbon atoms. Z represents a substituent group and a plurality of Z may be the same as or may be different from each other in a case where a plurality are present. p represents 0 or a positive integer. Specific examples and preferred examples of Z are the same as the specific examples and preferred examples of the substituent group which each group such as $Rx_1$ to $Rx_3$ may have.

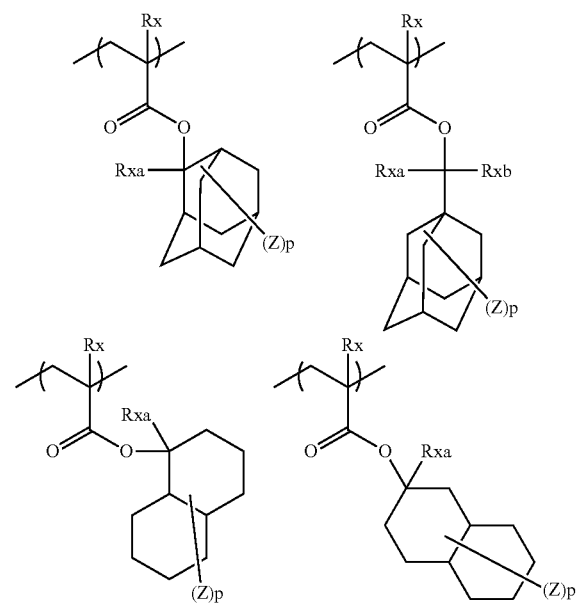

-continued
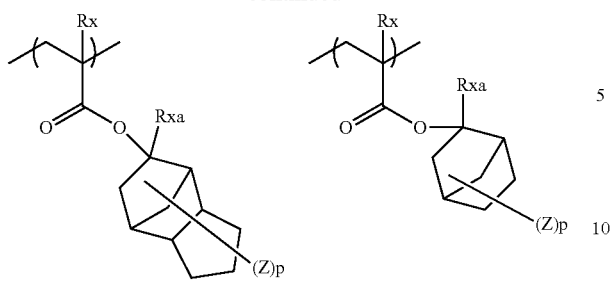
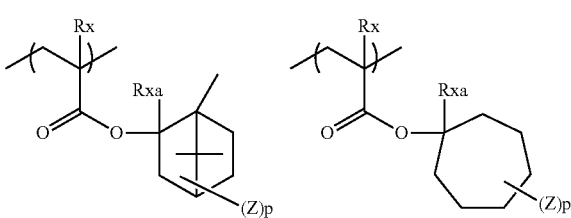
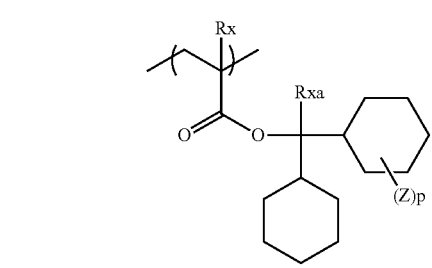
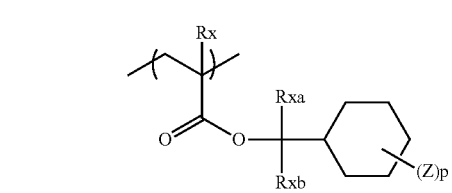
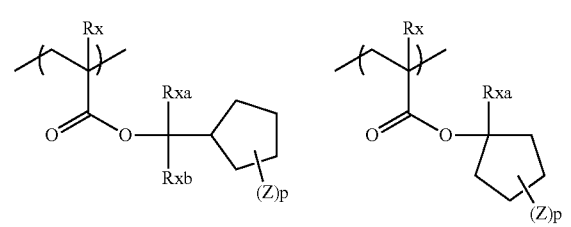
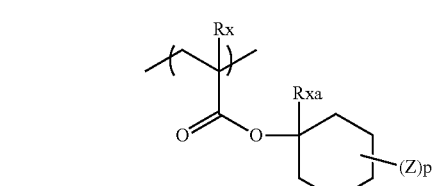
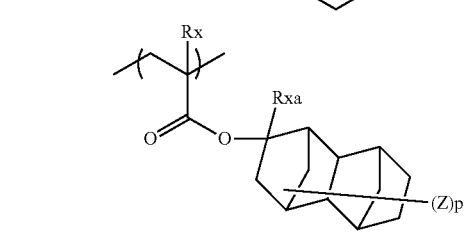
-continued
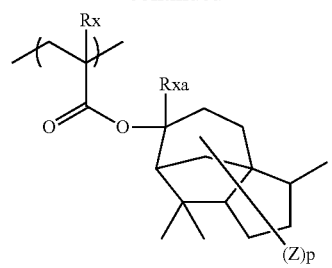
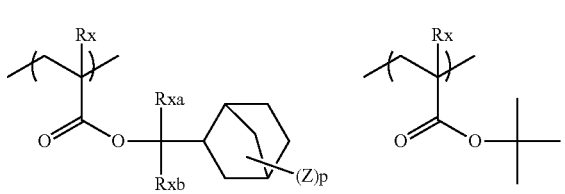
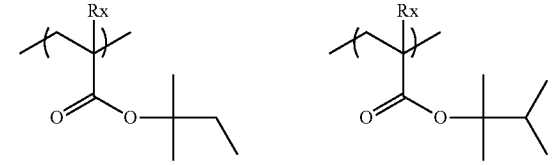
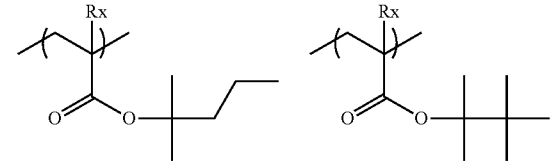
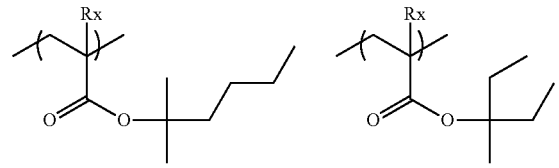
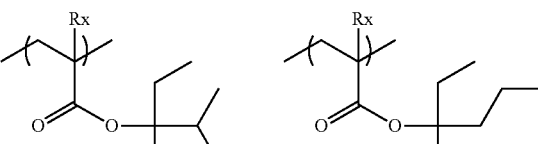
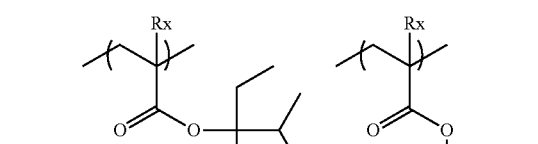
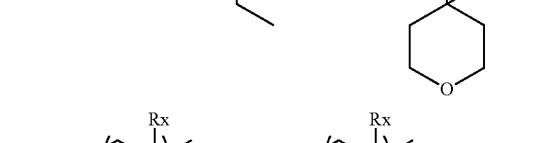
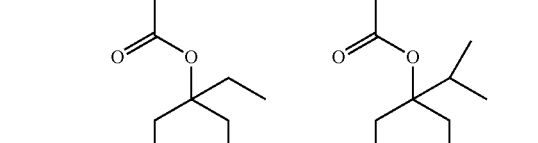
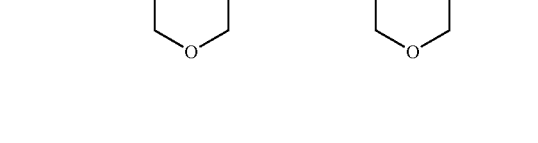

-continued
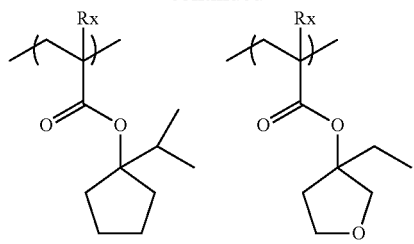
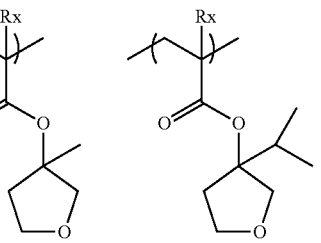
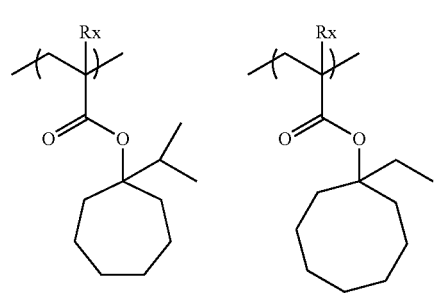
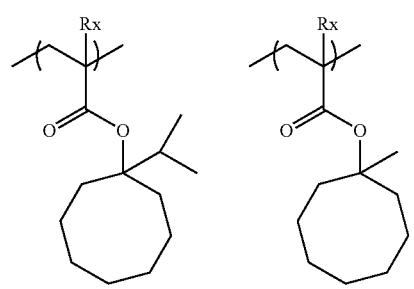
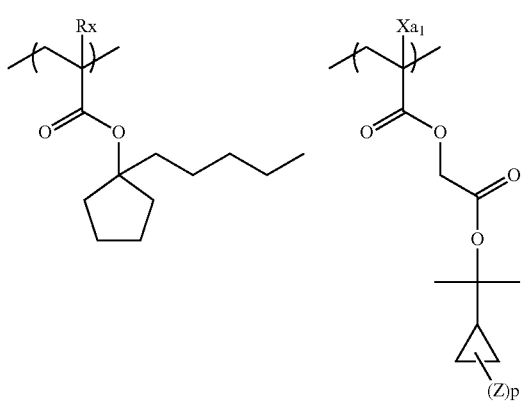
-continued
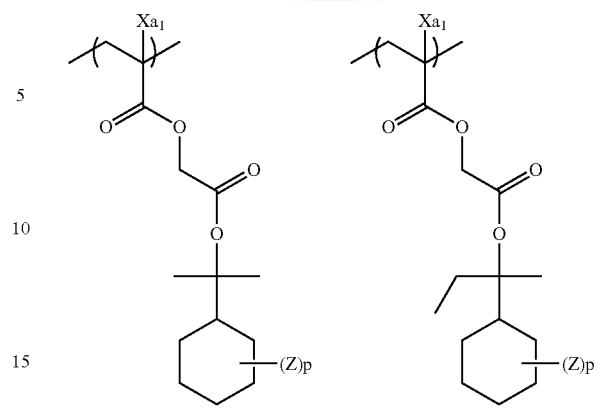
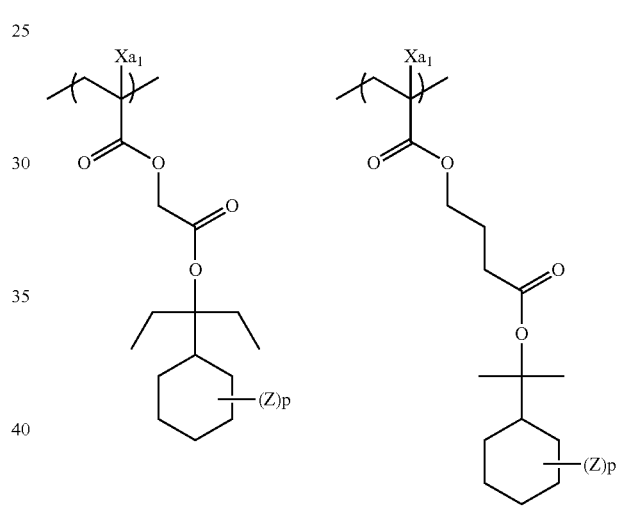
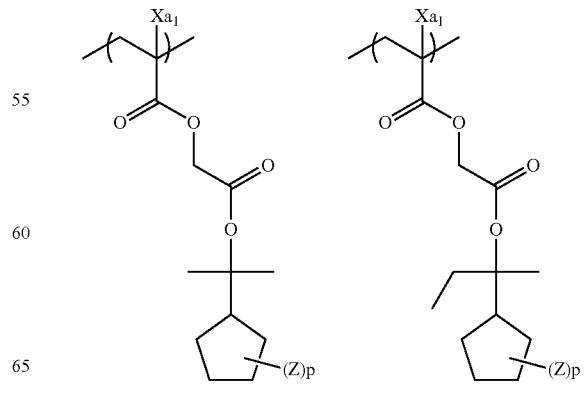

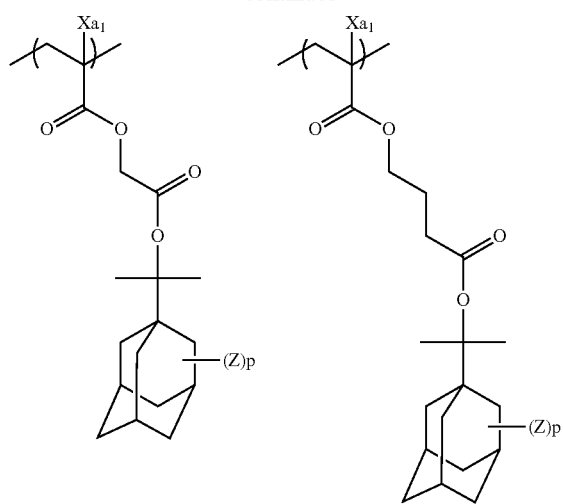
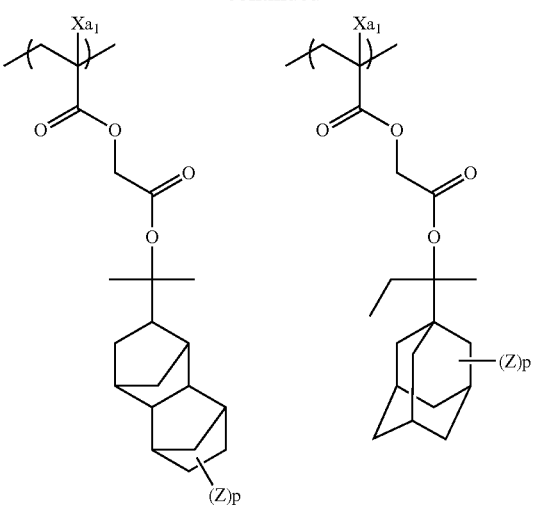
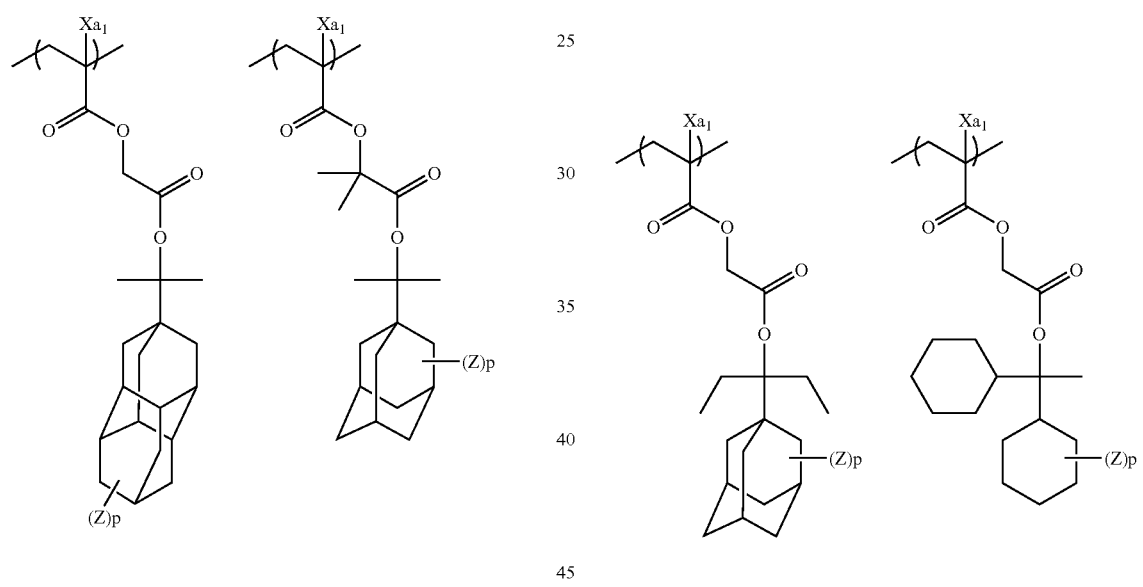
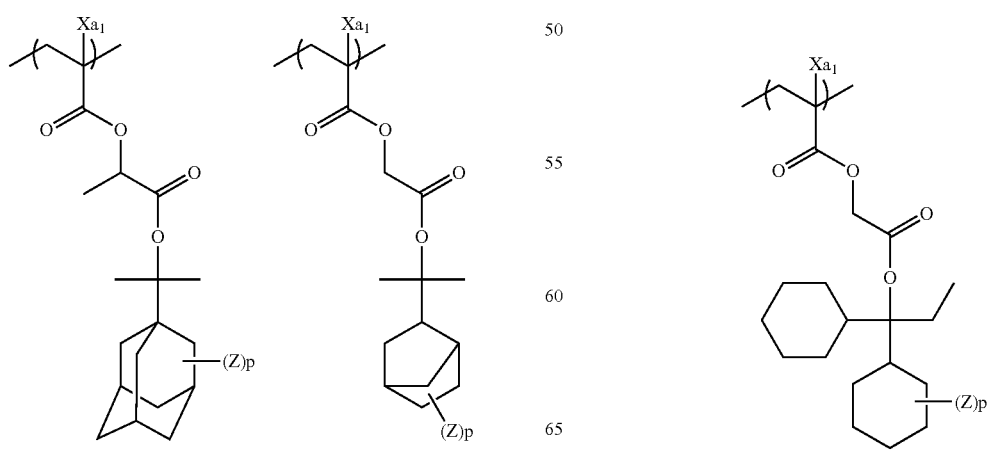

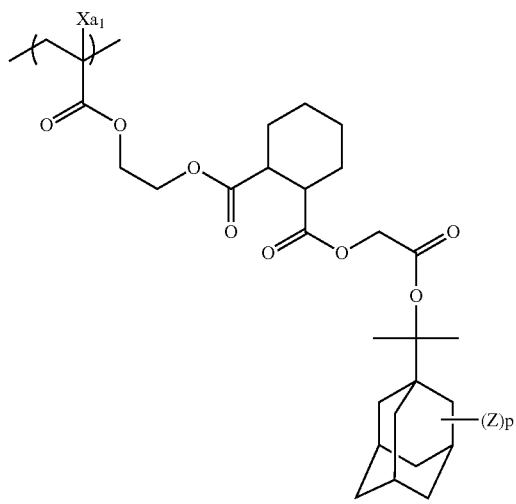
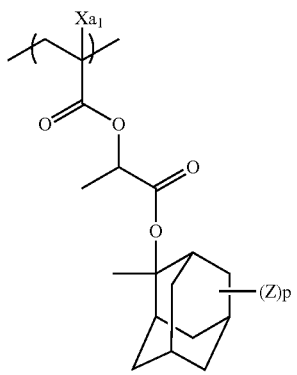
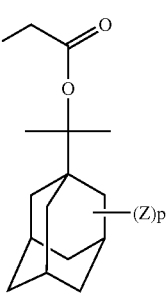
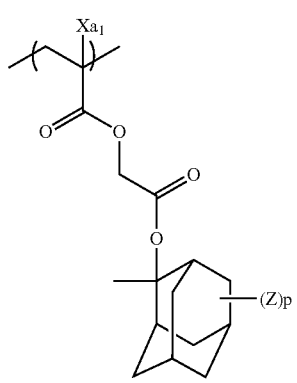
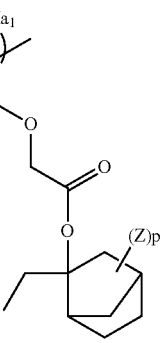
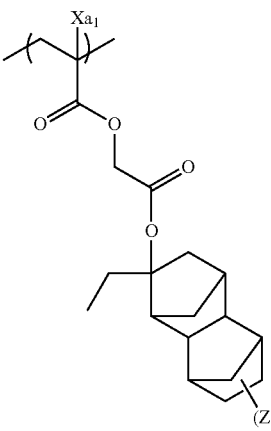
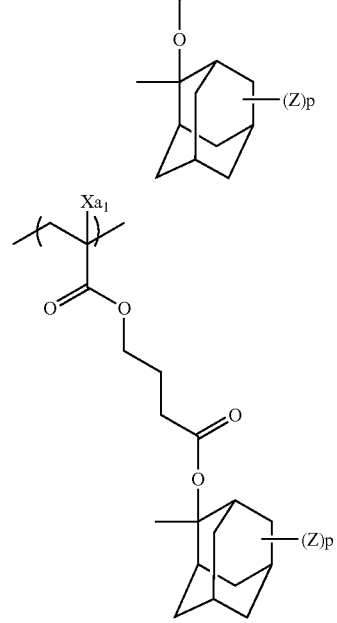
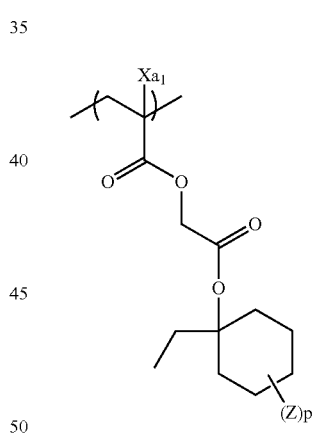
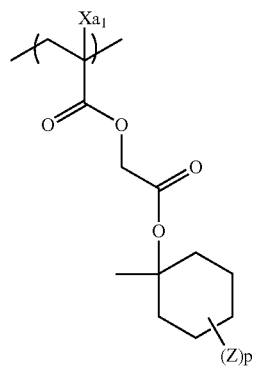
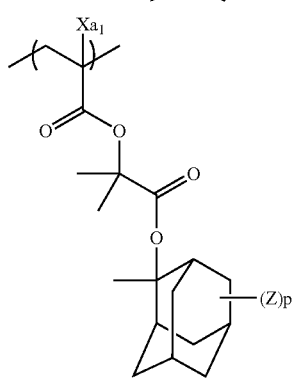
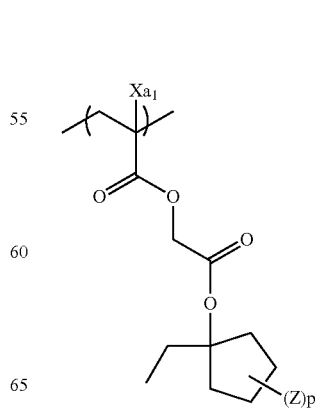
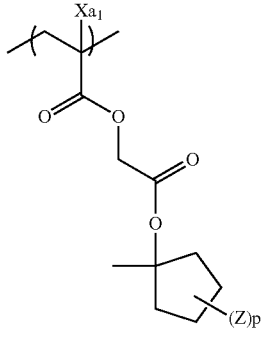

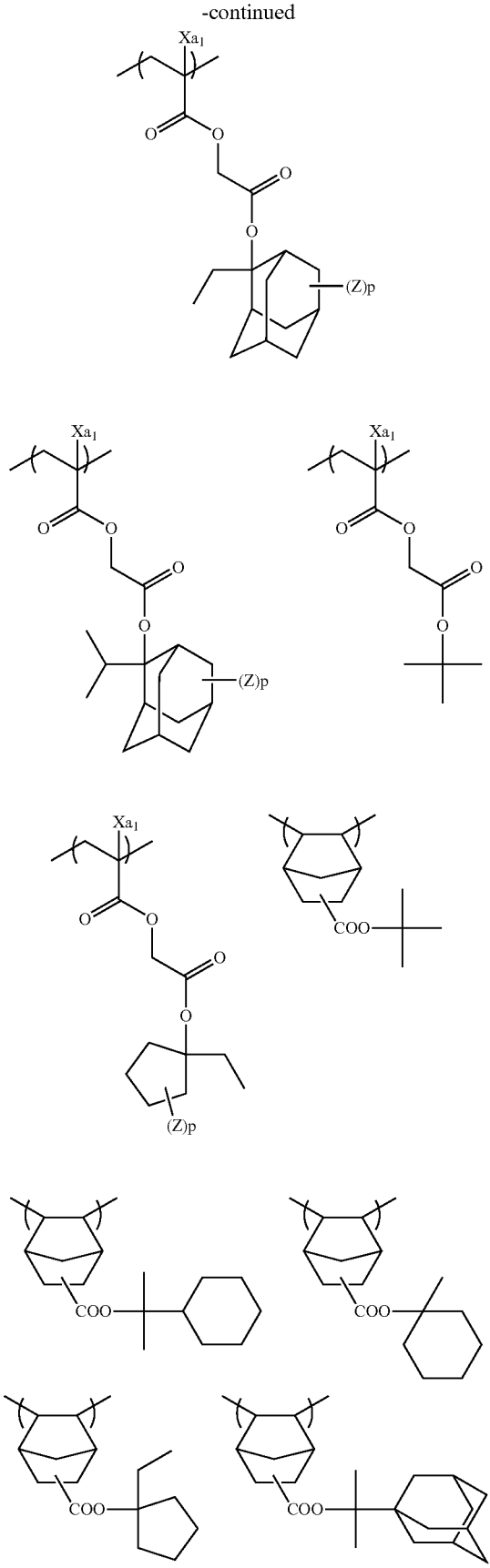
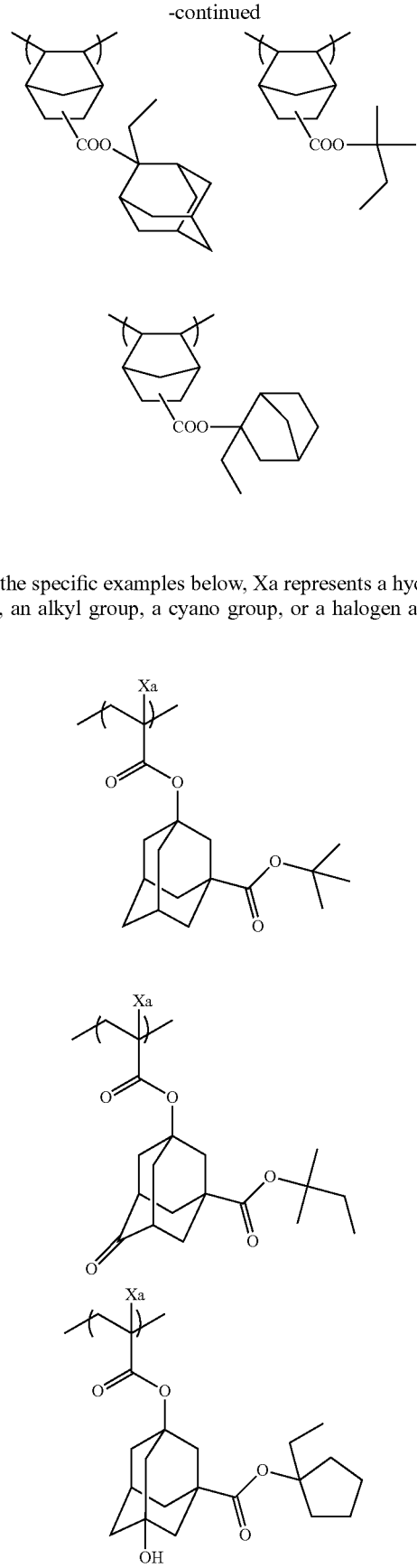
In the specific examples below, Xa represents a hydrogen atom, an alkyl group, a cyano group, or a halogen atom.

39
-continued
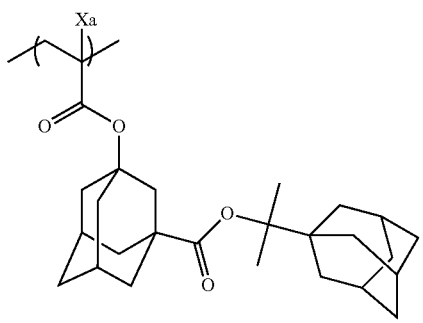
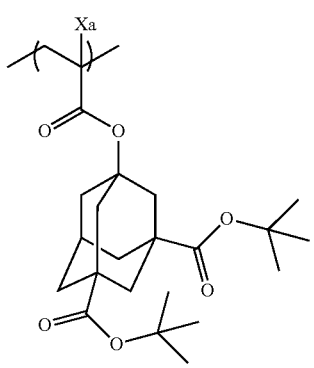
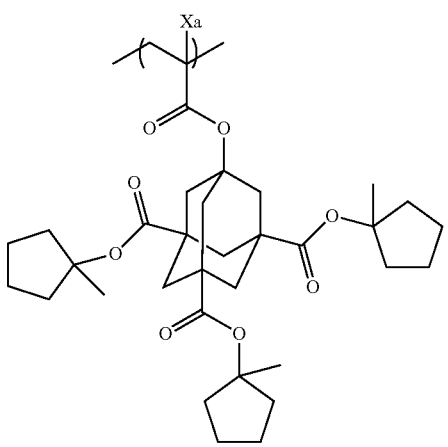
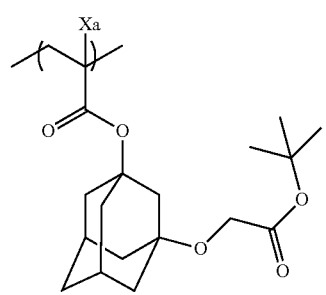
40
-continued
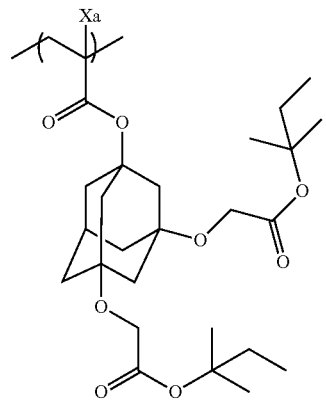
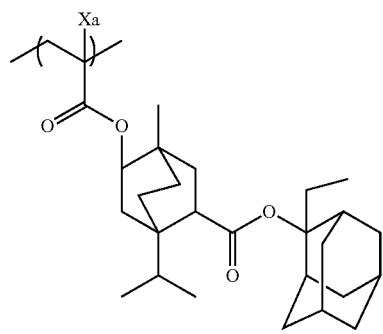
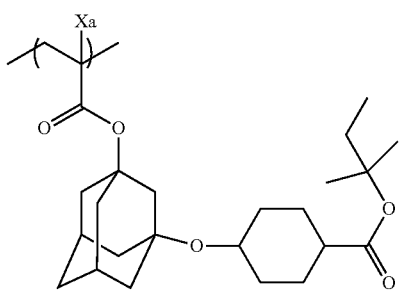
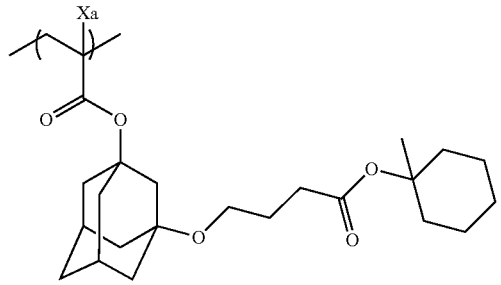
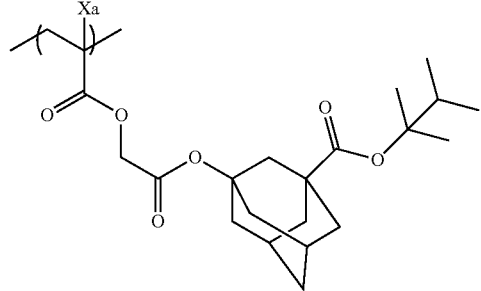

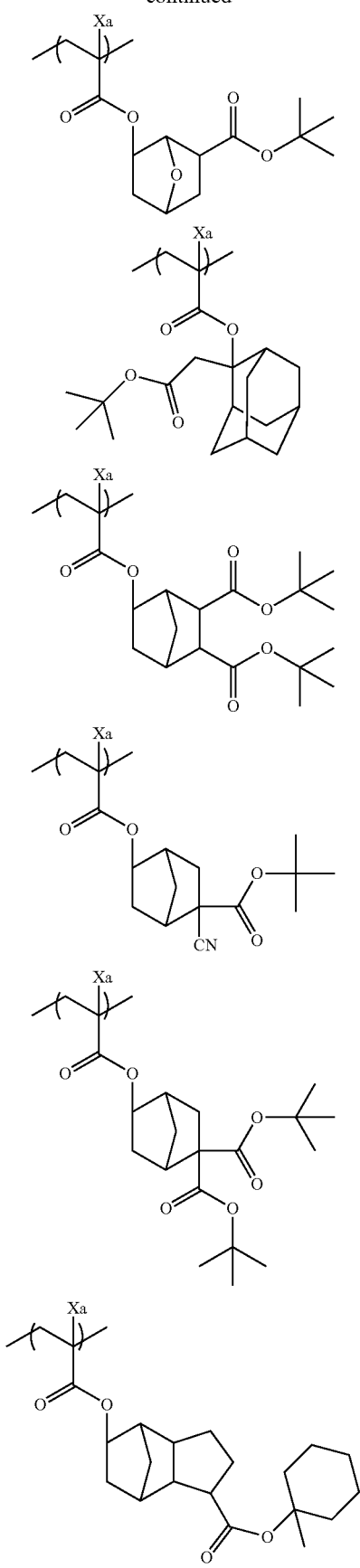
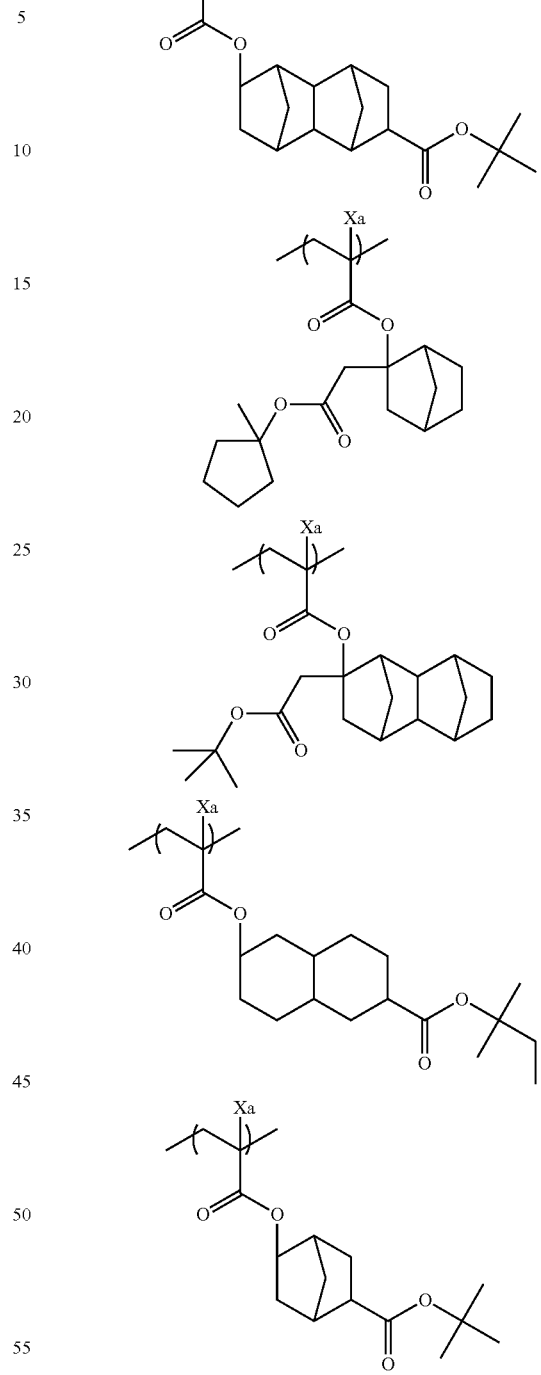

The repeating unit of the resin (A) which has an acid-decomposable group may be one type, or two or more types may be used together.

A combination in a case where the resin (A) includes two types of the repeating units which have an acid-decomposable group is not particularly limited; however, examples thereof include the following. In the following formula, R each independently represents a hydrogen atom or a methyl group.

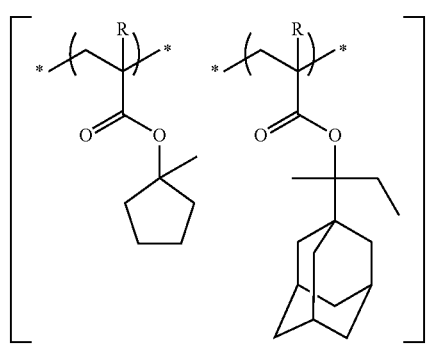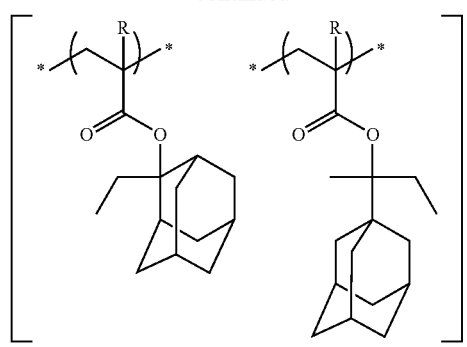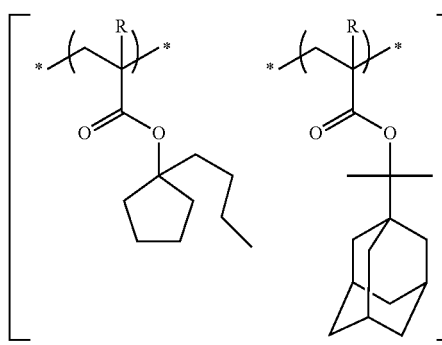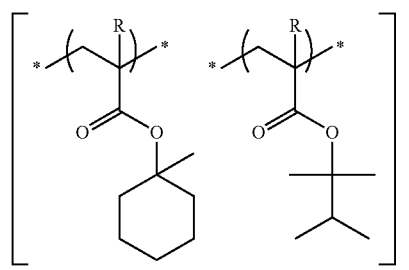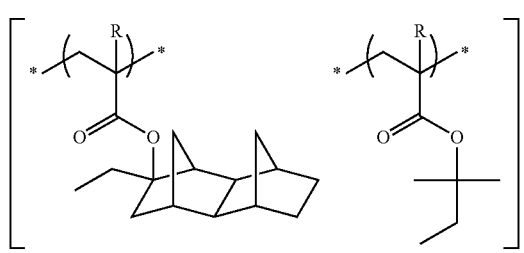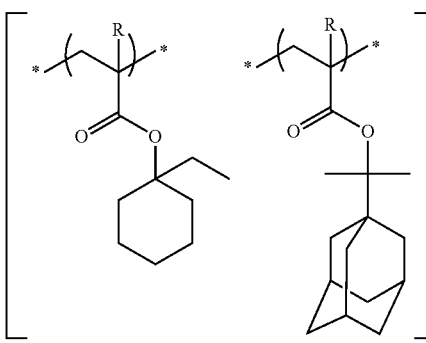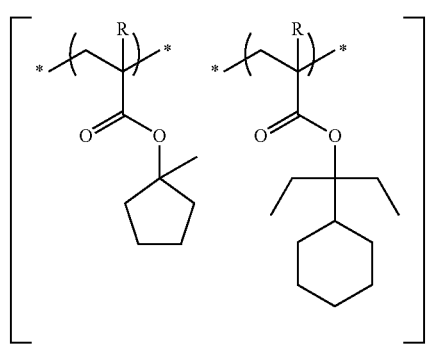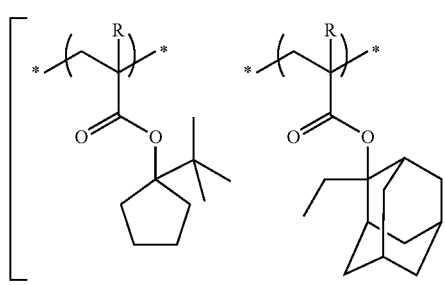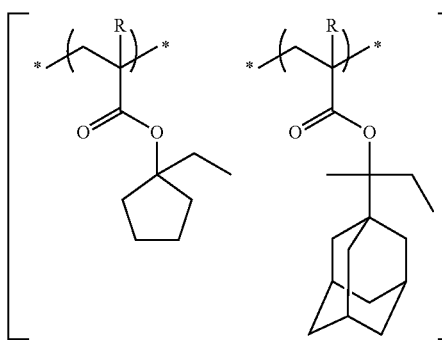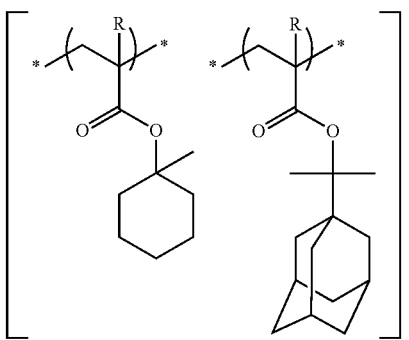

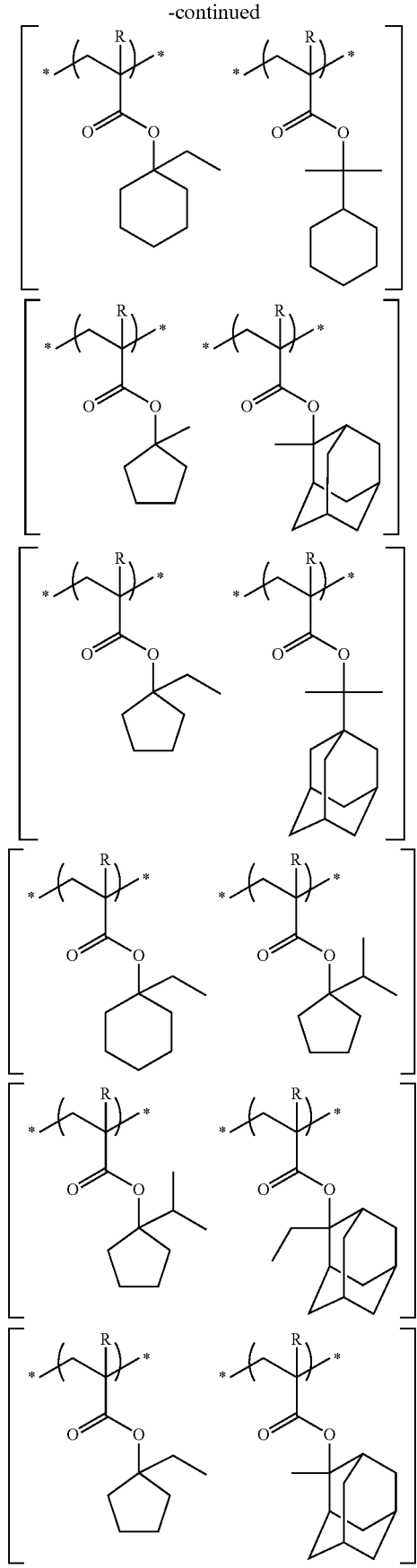
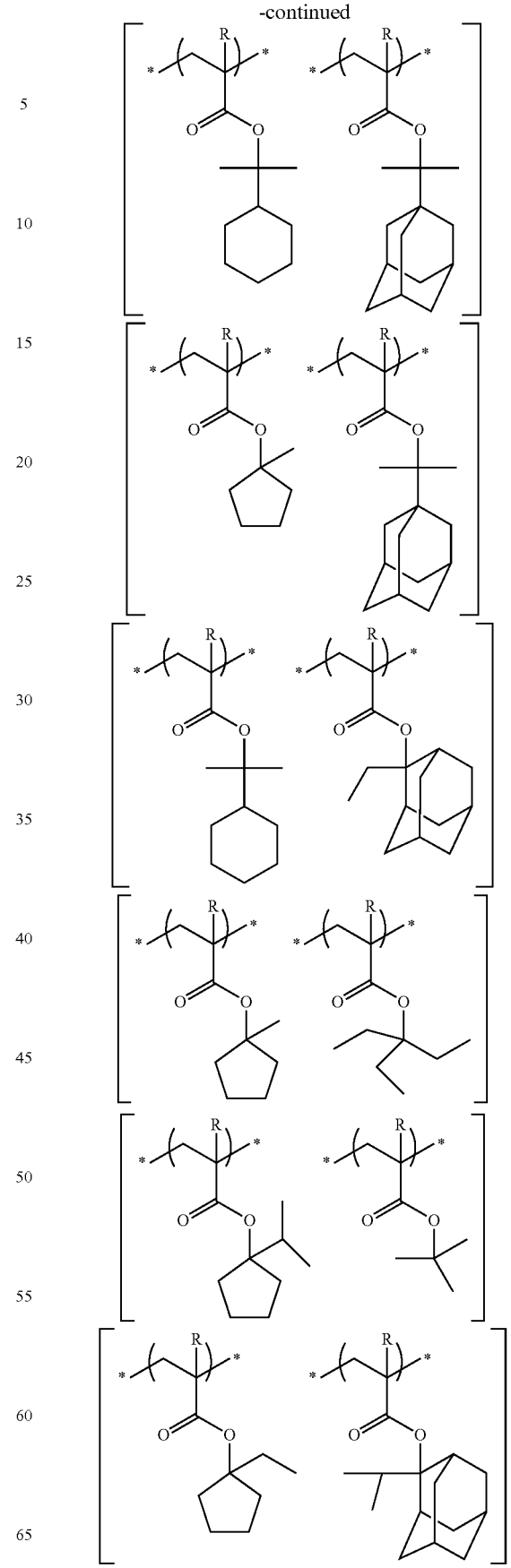

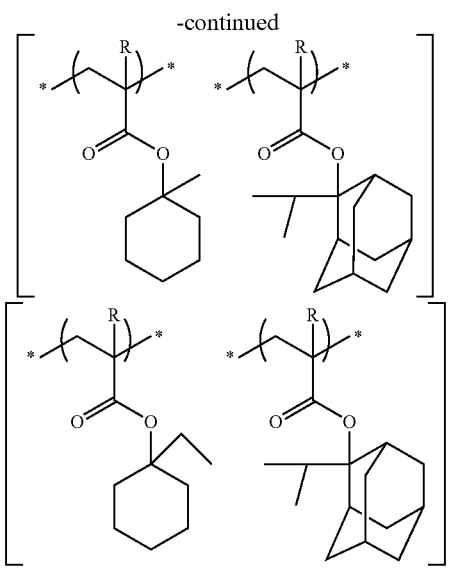

In the resin (A) in the present invention, from the point of view of sufficiently maintaining the solubility of the unexposed section and improving the dissolution contrast while sufficiently decreasing the solubility of the exposed section with respect to the organic-based developer, the content (the total in a case of containing a plurality of types) of the repeating units which have an acid-decomposable group in the resin of the preferred resin aspect (1) (preferably repeating units which are represented by General Formula (AI) or (AI')) is preferably 20 mol % to 90 mol % or more with respect to all of the repeating units in the resin (A), more preferably 25 mol % to 85 mol %, and particularly preferably 30 mol % to 80 mol %.

The resin (A) may include a repeating unit which is represented by General Formula (VI) below.

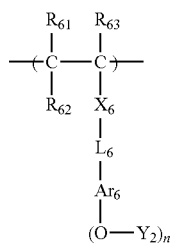

In General Formula (VI), $R_{61}$, $R_{62}$, and $R_{63}$ each independently represent a hydrogen atom, an alkyl group, a cycloalkyl group, a halogen atom, a cyano group, or an alkoxycarbonyl group. $R_{62}$ may form a ring by bonding with $Ar_6$ and $R_{62}$ in this case represents an alkylene group.

$X_6$ represents a single bond, —COO—, or —CONR$_{64}$—. $R_{64}$ represents a hydrogen atom or an alkyl group.

$L_6$ represents a single bond or an alkylene group.

$Ar_6$ represents an (n+1)valent aromatic ring group and represents an (n+2)valent aromatic ring group in a case of forming a ring by bonding with $R_{62}$.

$Y_2$ represents a hydrogen atom or a group which is desorbed by an action of an acid and a plurality of $Y_2$ may be the same as each other or may be different from each other in a case where a plurality of $Y_2$ are present. However, at least one $Y_2$ represents a group which is desorbed by an action of an acid.

n represents an integer of 1 to 4.

More detailed description will be given of General Formula (VI).

Examples of the alkyl group of $R_{61}$ to $R_{63}$ in General Formula (VI) preferably include an alkyl group with 20 or less carbon atoms which may have a substituent group and more preferably include an alkyl group with 8 or less carbon atoms.

The alkyl group which is included in the alkoxycarbonyl group is preferably the same as the alkyl group in the $R_{61}$ to $R_{63}$ described above.

The cycloalkyl group may be a monocyclic type or may be a polycyclic type and preferred examples thereof include a monocyclic type cycloalkyl group with 3 to 8 carbon atoms such as a cyclopropyl group, a cyclopentyl group, and a cyclohexyl group, which may have a substituent group.

Examples of the halogen atom include a fluorine atom, a chlorine atom, a bromine atom, and an iodine atom, and a fluorine atom is more preferred.

In a case where $R_{62}$ represents an alkylene group, examples of the alkylene group preferably include an alkylene group with 1 to 8 carbon atoms which may have a substituent group.

Examples of an alkyl group of $R_{64}$ in —CONR$_{64}$— ($R_{64}$ represents a hydrogen atom or an alkyl group) which is represented by $X_6$ include the same examples as the alkyl group of $R_{61}$ to $R_{63}$.

$X_6$ is preferably a single bond, —COO—, and —CONH—, and more preferably a single bond or —COO—.

Examples of an alkylene group in $L_6$ preferably include an alkylene group with 1 to 8 carbon atoms. A ring which is formed by $R_{62}$ and $L_6$ bonding with each other is particularly preferably a ring with 5 or 6 members.

$Ar_6$ represents an (n+1)valent aromatic ring group. A divalent aromatic ring group in a case where n is 1 may have a substituent group and examples thereof include an arylene group with 6 to 18 carbon atoms such as a phenylene group, a tolylene group, and a naphthylene group or a divalent aromatic ring group which includes a heterocyclic ring of, for example, thiophene, furan, pyrrole, benzothiophene, benzofuran, benzopyrrole, triazine, imidazole, benzimidazole, triazole, thiadiazole, thiazole, and the like.

Specific examples of an (n+1)valent aromatic ring group in a case where n is an integer of 2 or more favorably include a group formed by removing (n−1) arbitrary hydrogen atoms from the specific examples of the divalent aromatic ring group described above.

The (n+1) aromatic ring group may further have a substituent group.

Examples of substituent groups which the alkyl group, the cycloalkyl group, the alkoxycarbonyl group, the alkylene group, and the (n+1)valent aromatic ring group described above may include an alkyl group, a cycloalkyl group, an aryl group, an amino group, an amide group, an ureide group, a urethane group, a hydroxyl group, a carboxyl group, a halogen atom, an alkoxy group, a thioether group, an acyl group, an acyloxy group, an alkoxycarbonyl group, a cyano group, a nitro group, and the like and the number of carbon atoms of the substituent group is preferably 8 or less.

n is preferably 1 or 2 and more preferably 1.

n of $Y_2$ each independently represent a hydrogen atom or a group which is desorbed by an action of an acid. However, at least one of n represents a group which is desorbed by an action of an acid.

Examples of a group $Y_2$ which is desorbed by an action of an acid include —$C(R_{36})(R_{37})(R_{38})$, —$C(=O)$—O—C $(R_{36})(R_{37})(R_{38})$, —$C(R_{01})(R_{02})(OR_{39})$, —$C(R_{01})(R_{02})$—C $(=O)$—O—$C(R_{36})(R_{37})(R_{38})$, —$CH(R_{36})(Ar)$, and the like.

In the formula, $R_{36}$ to $R_{39}$ each independently represent an alkyl group, a cycloalkyl group, a monovalent aromatic ring group, a group where an alkylene group and a monovalent aromatic ring group are combined, or an alkenyl group. $R_{36}$ and $R_{37}$ may bond with each other to form a ring.

$R_{01}$ and $R_{02}$ each independently represent a hydrogen atom, an alkyl group, a cycloalkyl group, a monovalent aromatic ring group, a group where an alkylene group and a monovalent aromatic ring group are combined, or an alkenyl group.

Ar represents a monovalent aromatic ring group.

The alkyl group of $R_{36}$ to $R_{39}$, $R_{01}$, and $R_{02}$ is preferably an alkyl group with 1 to 8 carbon atoms.

The cycloalkyl groups of $R_{36}$ to $R_{39}$, $R_{01}$, and $R_{02}$ may be a monocyclic type or may be a polycyclic type. The monocyclic type is preferably a cycloalkyl group with 3 to 8 carbon atoms. The polycyclic type is preferably a cycloalkyl group with 6 to 20 carbon atoms. Here, some of the carbon atoms in the cycloalkyl group may be substituted with hetero atoms such as an oxygen atom.

The monovalent aromatic ring group of $R_{36}$ to $R_{39}$, $R_{01}$, $R_{02}$, and Ar is preferably a monovalent aromatic ring group with 6 to 10 carbon atoms and examples thereof include aryl groups such as a phenyl group, a naphthyl group, and anthryl group and a divalent aromatic ring group which includes a heterocyclic ring such as thiophene, furan, pyrrole, benzothiophene, benzofuran, benzopyrrole, triazine, imidazole, benzimidazole, triazole, thiadiazole, and thiazole.

The group of $R_{36}$ to $R_{39}$, $R_{01}$, and $R_{02}$ where an alkylene group and a monovalent aromatic ring group are combined is preferably an aralkyl group with 7 to 12 carbon atoms and examples thereof include a benzyl group, a phenethyl group, a naphthylmethyl group, and the like.

The alkenyl groups of $R_{36}$ to $R_{39}$, $R_{01}$, and $R_{02}$ are preferably alkenyl groups with 2 to 8 carbon atoms and examples thereof include a vinyl group, an allyl group, a butenyl group, a cyclohexenyl group, and the like.

The ring which $R_{36}$ and $R_{37}$ bond with each other to form may be a monocyclic type or may be a polycyclic type. The monocyclic type is preferably a cycloalkyl structure with 3 to 8 carbon atoms. The polycyclic type is preferably a cycloalkyl structure with 6 to 20 carbon atoms. Here, one or more carbon atoms in the cycloalkyl structure may be substituted with hetero atoms such as an oxygen atom.

Each of the groups described above as $R_{36}$ to $R_{39}$, $R_{01}$, $R_{02}$, and Ar may have a substituent group and examples thereof include an alkyl group, a cycloalkyl group, an aryl group, an amino group, an amide group, an ureide group, a urethane group, a hydroxyl group, a carboxyl group, a halogen atom, an alkoxy group, a thioether group, an acyl group, an acyloxy group, an alkoxycarbonyl group, a cyano group, a nitro group, and the like and the number of carbon atoms of the substituent group is preferably 8 or less.

As the group $Y_2$ which is desorbed by an action of an acid, the structure which is represented by General Formula (VI-A) below is more preferred.

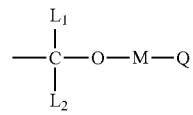

(VI-A)

Here, $L_1$ and $L_2$ each independently represent a hydrogen atom, an alkyl group, a cycloalkyl group, a monovalent aromatic ring group, or a group where an alkylene group and a monovalent aromatic ring group are combined.

M represents a single bond or a divalent linking group.

Q represents an alkyl group, a cycloalkyl group which may include a hetero atom, a monovalent aromatic ring group which may include a hetero atom, an amino group, an ammonium group, a mercapto group, a cyano group, or an aldehyde group.

At least two of Q, M, and $L_1$ may bond with each other to form a ring (preferably a ring with 5 members or 6 members).

Examples of the alkyl group as $L_1$ and $L_2$ preferably include an alkyl group with 1 to 8 carbon atoms.

Examples of the cycloalkyl group as $L_1$ and $L_2$ preferably include a cycloalkyl group with 3 to 15 carbon atoms.

The monovalent aromatic ring group as $L_1$ and $L_2$ is, for example, an aryl group with 6 to 15 carbon atoms and preferred examples thereof specifically include a phenyl group, a tolyl group, a naphthyl group, an anthryl group, and the like.

Examples of the group where an alkylene group and a monovalent aromatic ring group are combined as $L_1$ and $L_2$ include an aralkyl group with 6 to 20 carbon atoms such as a benzyl group and a phenethyl group.

The divalent linking group as M is, for example, an alkylene group, a cycloalkylene group, an alkenylene group, a divalent aromatic ring group (for example, a phenylene group, a tolylene group, a naphthylene group, and the like), —S—, —O—, —CO—, —$SO_2$—, —$N(R_0)$—, and a divalent linking group where a plurality thereof are combined. $R_0$ is a hydrogen atom or an alkyl group (for example, an alkyl group with 1 to 8 carbon atoms).

The alkyl group as Q is the same as each of the groups as $L_1$ and $L_2$ described above.

In the cycloalkyl group which may include a hetero atom and the monovalent aromatic ring group which may include a hetero atom as Q, examples of the aliphatic hydrocarbon ring group which does not include a hetero atom and the monovalent aromatic ring group which does not include a hetero atom include the cycloalkyl group, the monovalent aromatic ring group, and the like as $L_1$ and $L_2$ described above, and the number of carbon atoms is preferably 3 to 15.

Examples of the cycloalkyl group which includes a hetero atom and the monovalent aromatic ring group which includes a hetero atom include a group which has a heterocyclic ring structure such as thiirane, cyclothiolane, thiophene, furan, pyrrole, benzothiophene, benzofuran, benzopyrrole, triazine, imidazole, benzimidazole, triazole, thiadiazole, thiazole, and pyrrolidone; however, the present invention is not limited thereto as long as the structure is a structure which is generally called a heterocyclic ring (a ring which is formed of carbon atoms and hetero atoms or a ring which is formed of hetero atoms).

Examples of the ring which at least two of Q, M, and $L_1$ may bond with each other to form include a case where at least two of Q, M, and $L_1$ bond with each other to form, for example, a propylene group and a butylene group so as to form a ring with 5 members or 6 members which contains an oxygen atom.

Each of the groups which are represented by $L_1$, $L_2$, M, and Q in General Formula (VI-A) may have a substituent group and examples thereof include the examples described as the substituent group which $R_{36}$ to $R_{39}$, $R_{01}$, $R_{02}$, and Ar may have and the number of carbon atoms of the substituent group is preferably 8 or less.

As the group which is represented by -M-Q, a group which is configured by 1 to 30 carbon atoms is preferred and a group which is configured by 5 to 20 carbon atoms is more preferred.

Specific examples of the repeating unit which is represented by General Formula (VI) will be shown below; however, the present invention is not limited thereto.

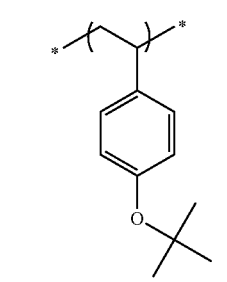
(VI-1)

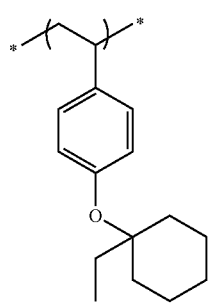
(VI-2)

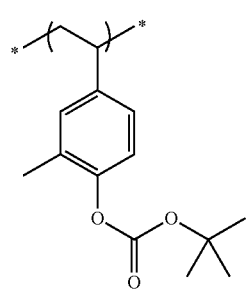
(VI-3)

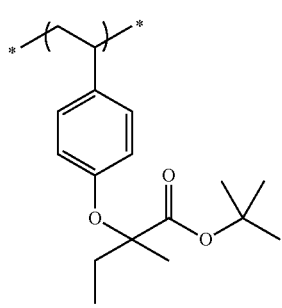
(VI-4)

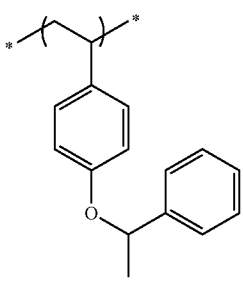
(VI-5)

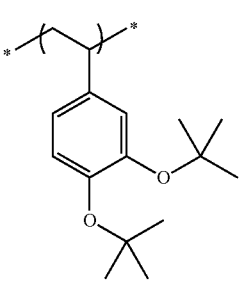
(VI-6)

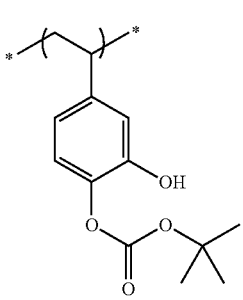
(VI-7)

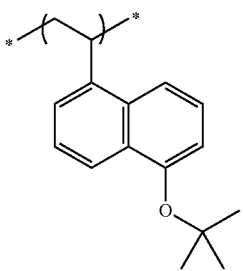
(VI-8)

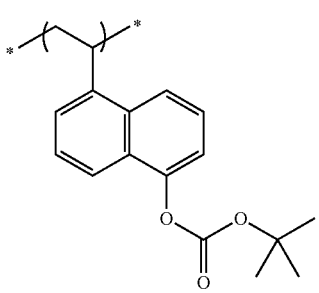
(VI-9)

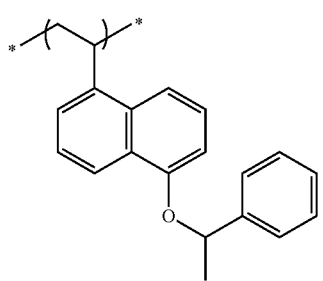 (VI-10)
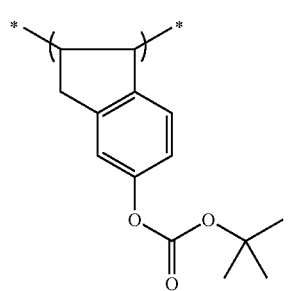 (VI-11)
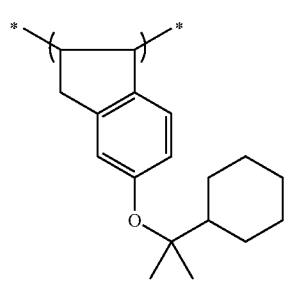 (VI-12)
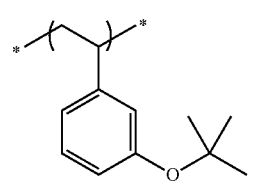 (VI-13)
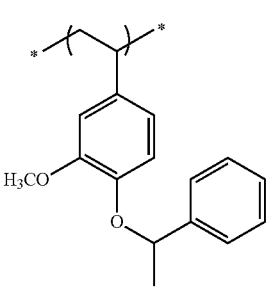 (VI-14)
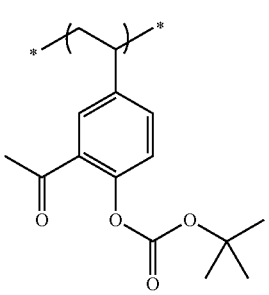 (VI-15)
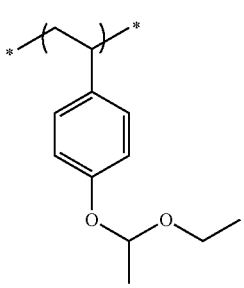 (VI-16)
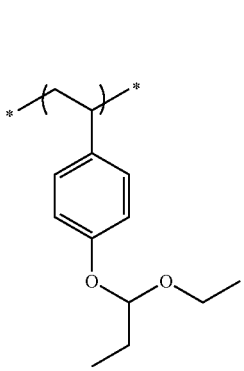 (VI-17)
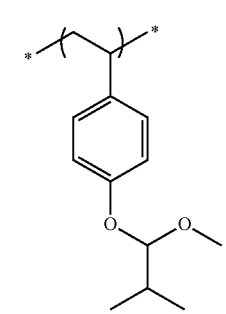 (VI-18)
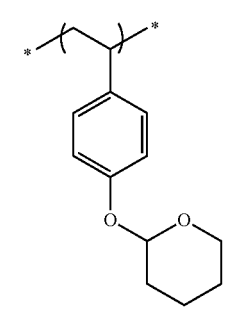 (VI-19)
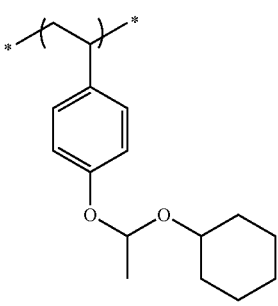 (VI-20)

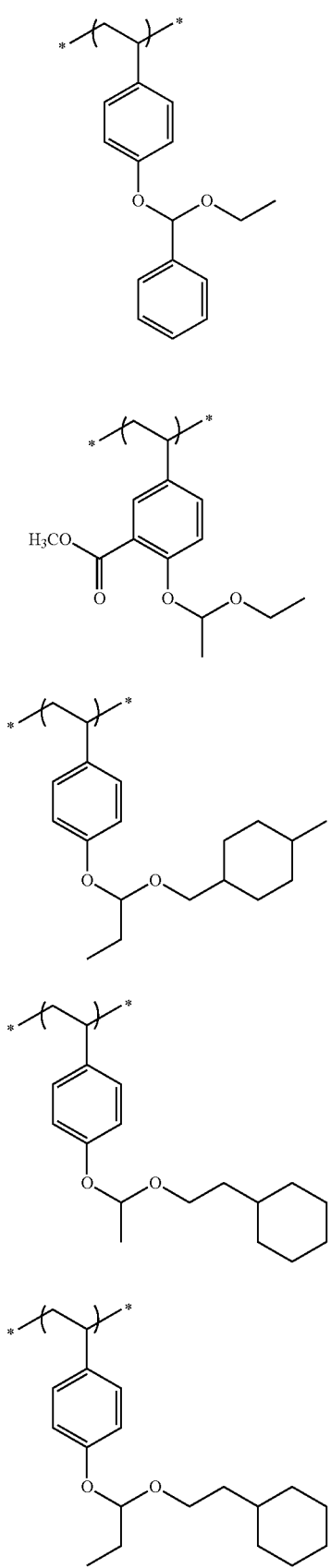
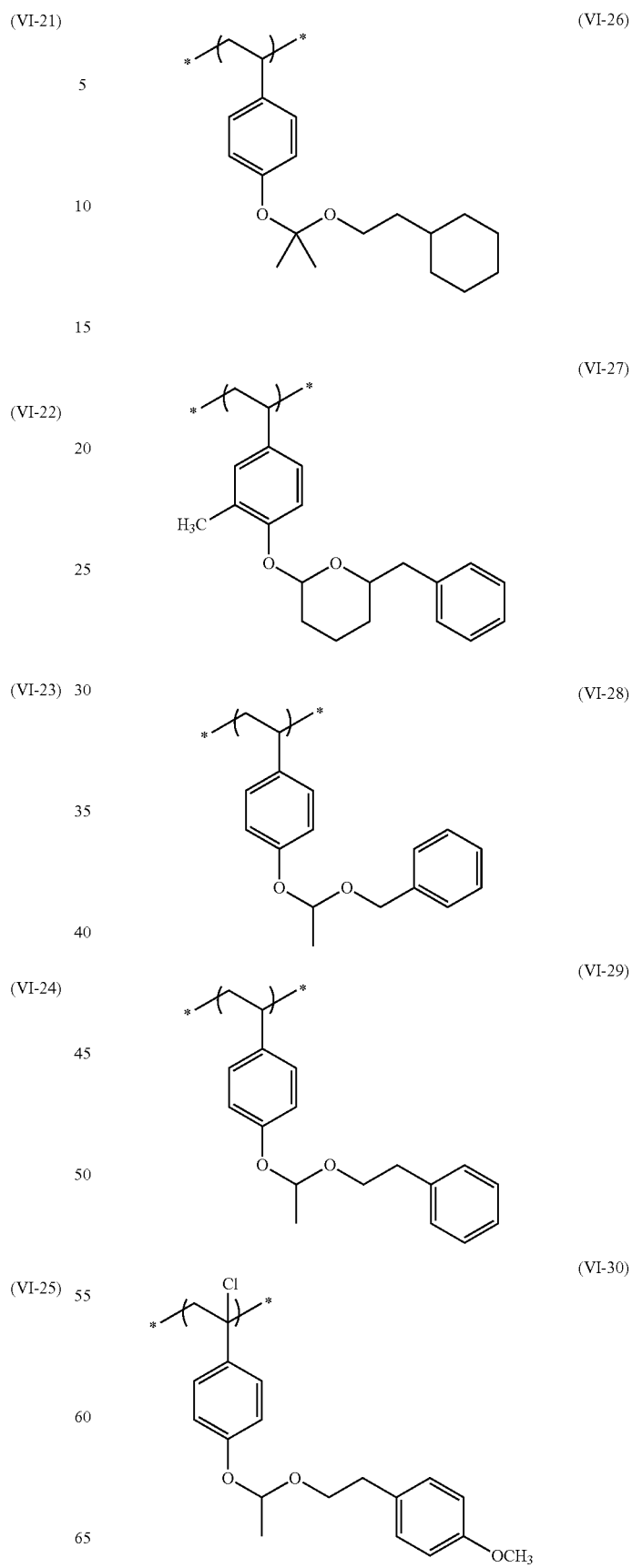

(VI-31)
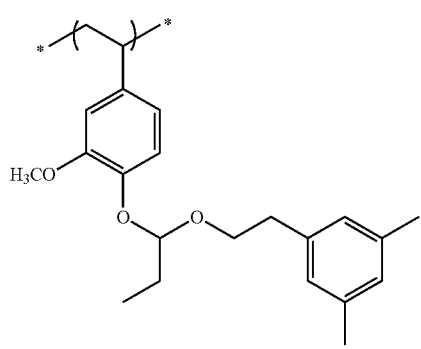
(VI-32)
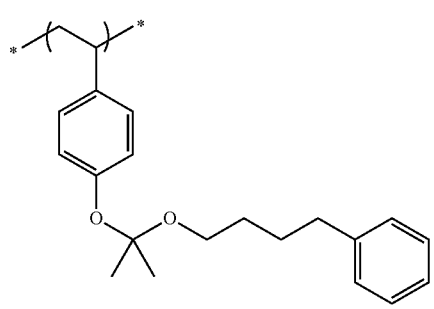
(VI-33)
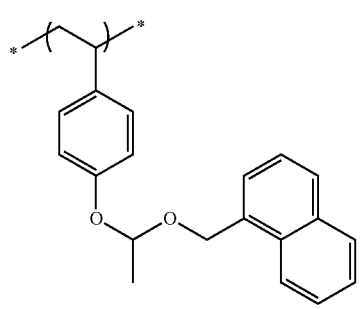
(VI-34)
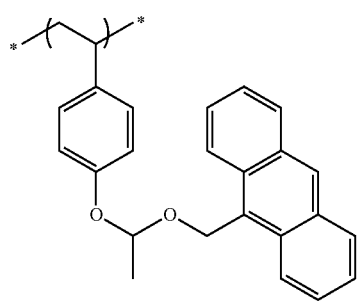
(VI-35)
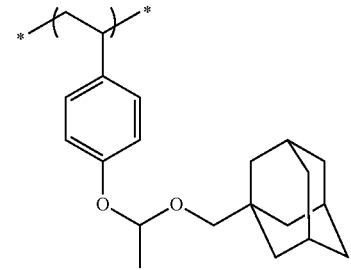
(VI-36)
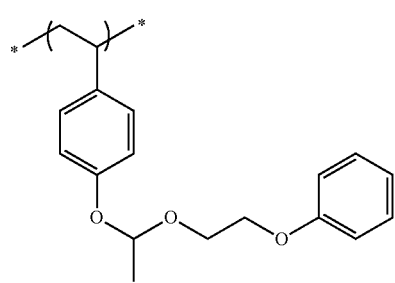
(VI-37)
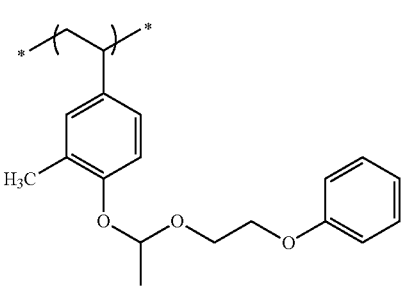
(VI-38)
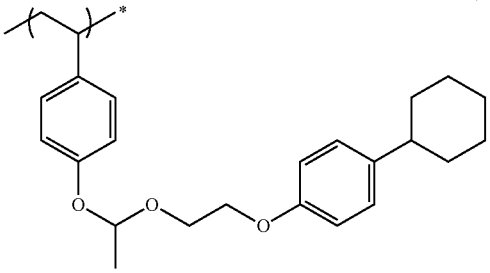
(VI-39)
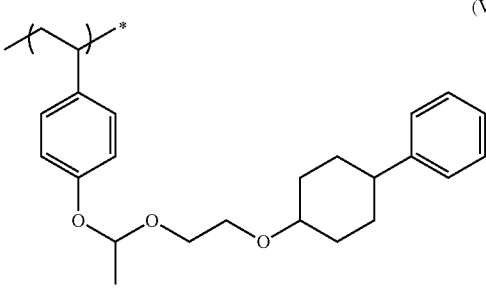
(VI-40)
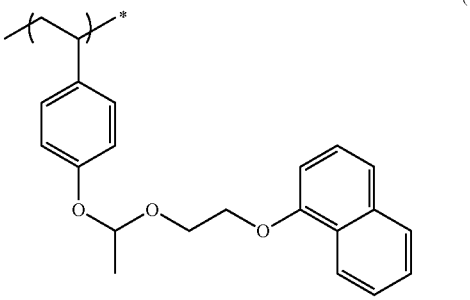

(VI-41)
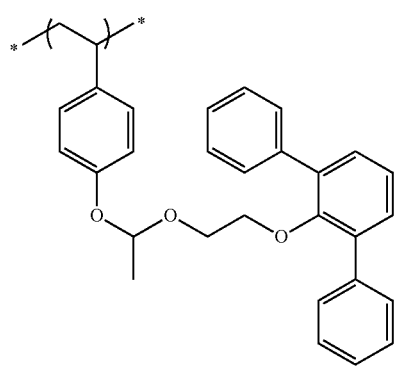
(VI-42)
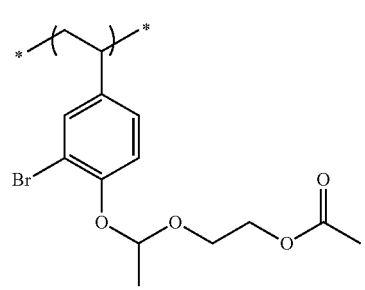
(VI-43)
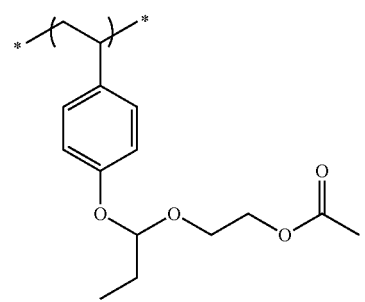
(VI-44)
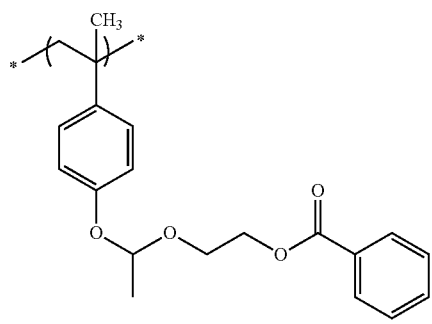
(VI-45)
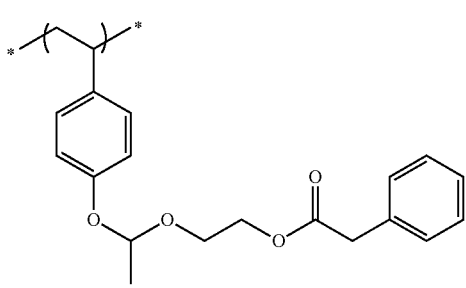
(VI-46)
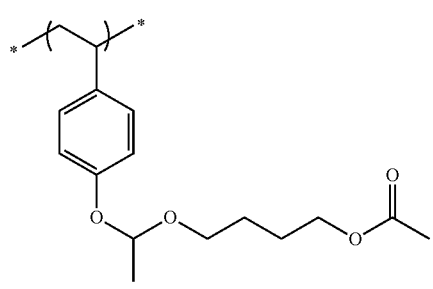
(VI-47)
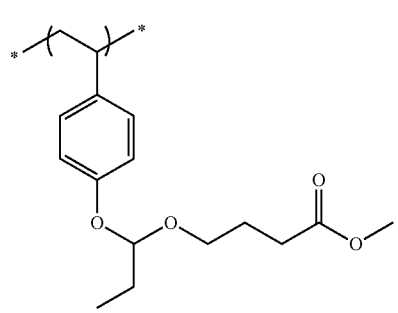
(VI-48)
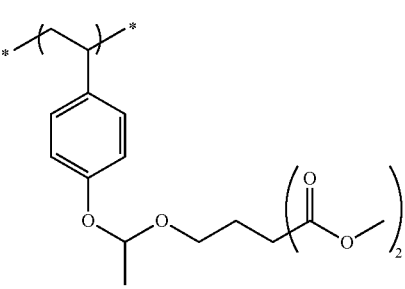
(VI-49)
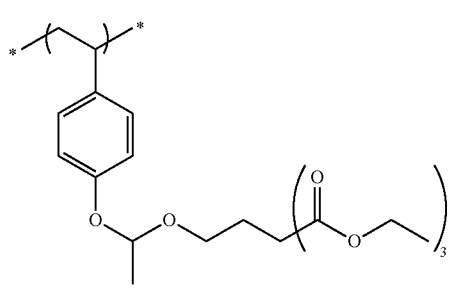
(VI-50)
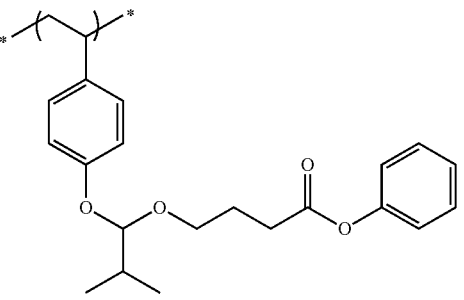

(VI-51)
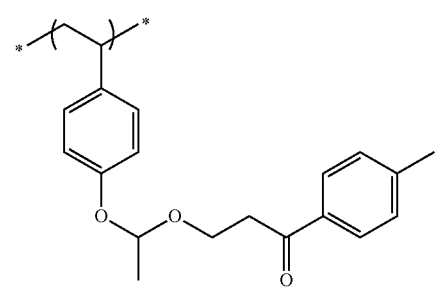
(VI-52)
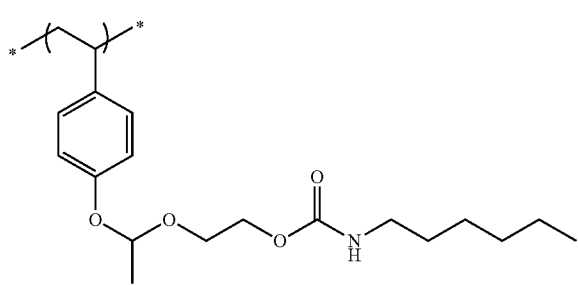
(VI-53)
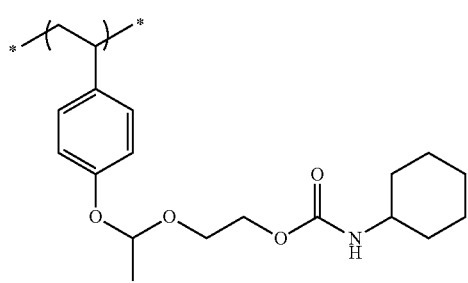
(VI-54)
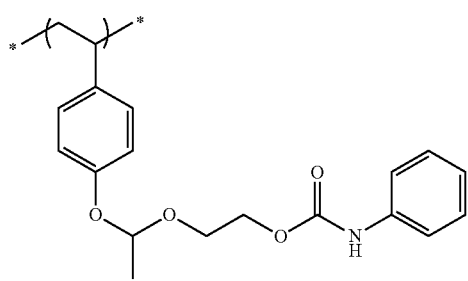
(VI-55)
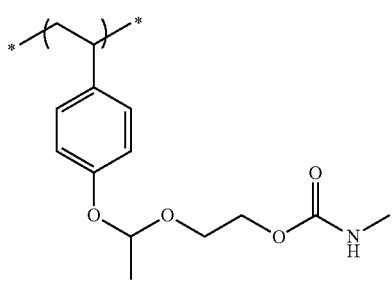
(VI-56)
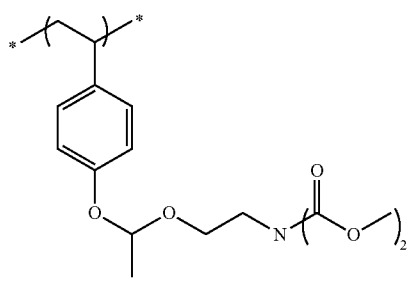
(VI-57)
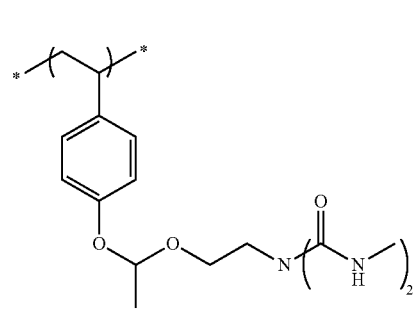
(VI-58)
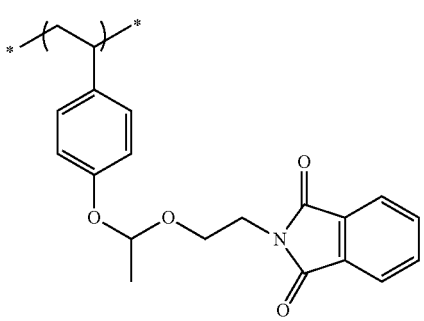
(VI-59)
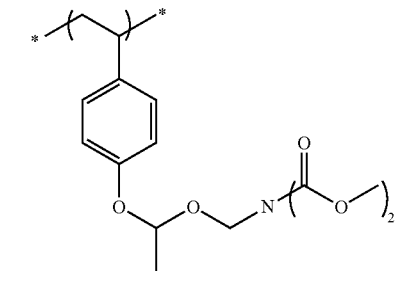
(VI-60)
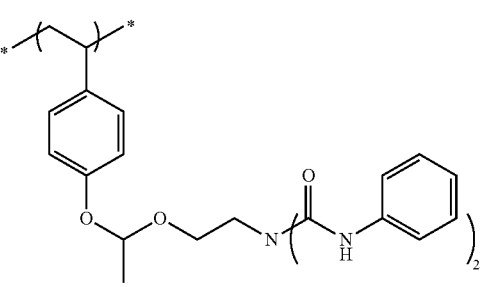

(VI-61)
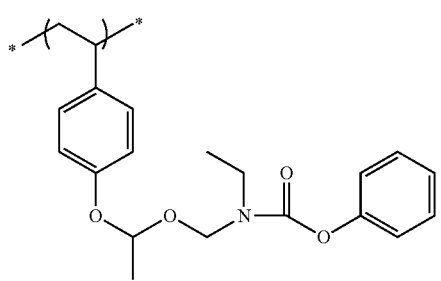
(VI-62)
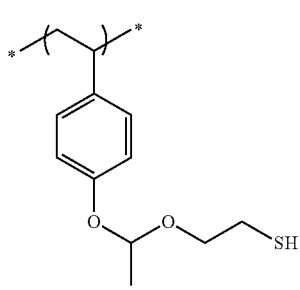
(VI-63)
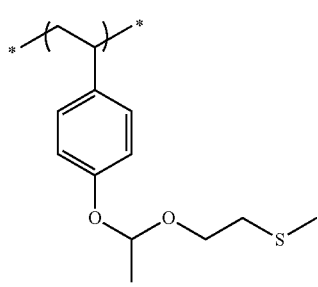
(VI-64)
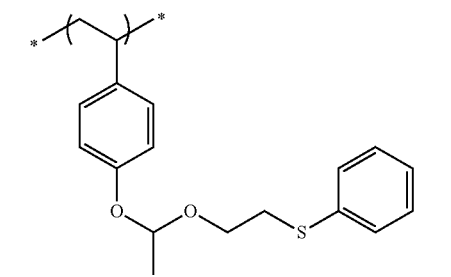
(VI-65)
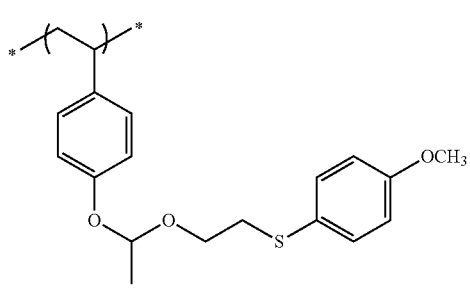
(VI-66)
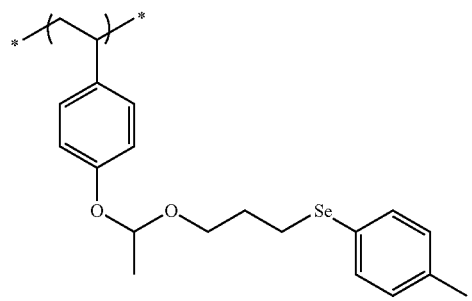
(VI-67)
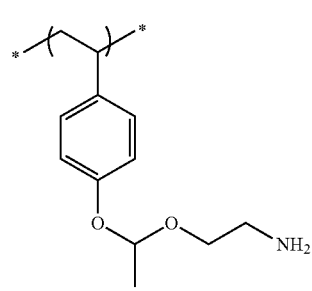
(VI-68)
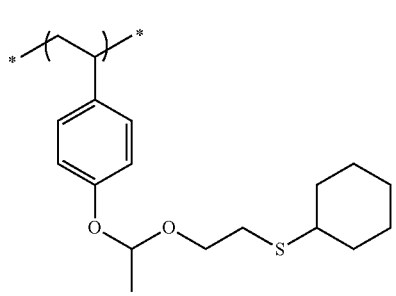
(VI-69)
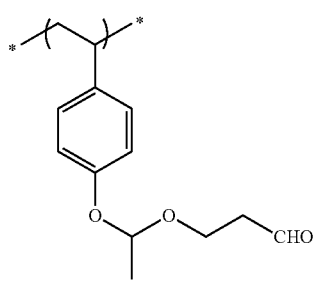
(VI-70)
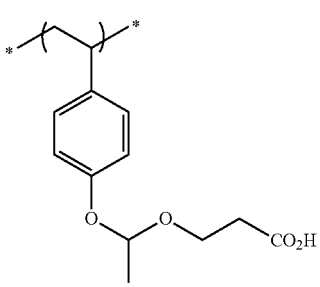

(VI-71) 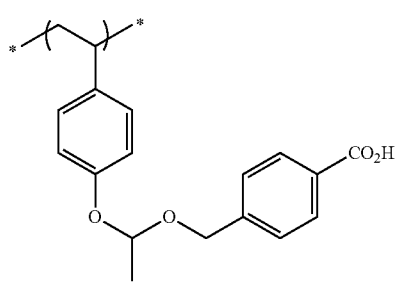
(VI-72) 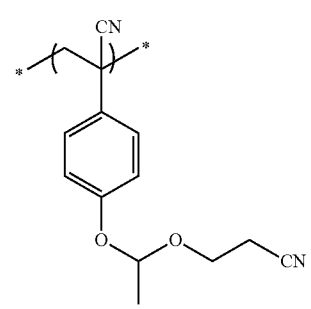
(VI-73) 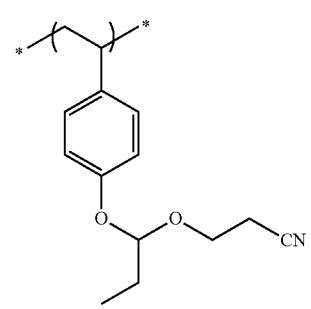
(VI-74) 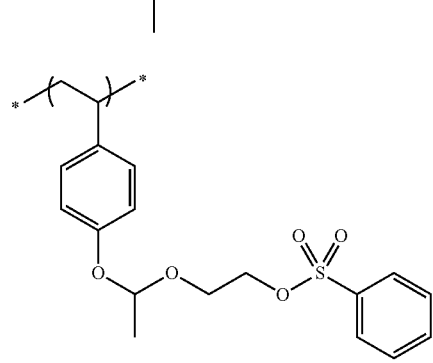
(VI-75)
(VI-76) 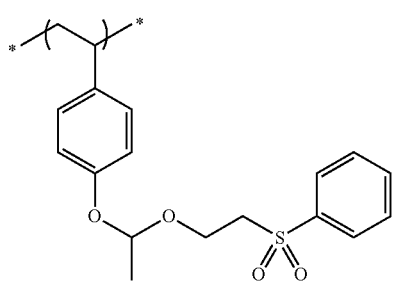
(VI-77) 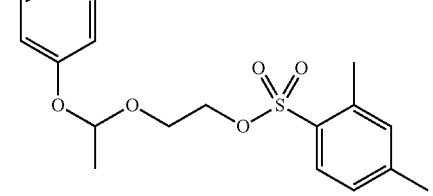
(VI-78) 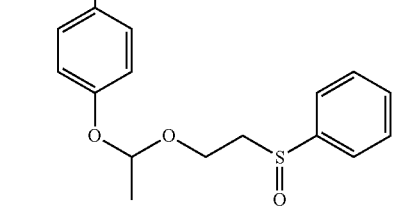
(VI-79) 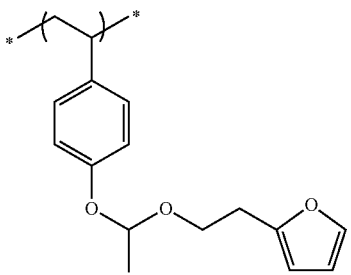
(VI-80) 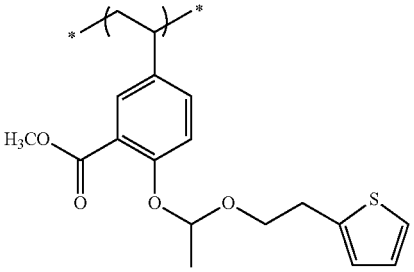

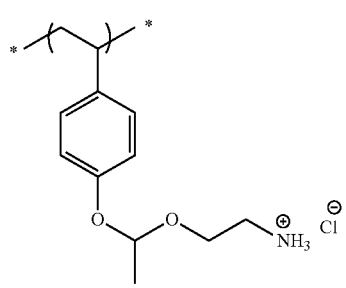
(VI-81)
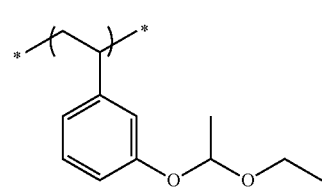
(VI-82)
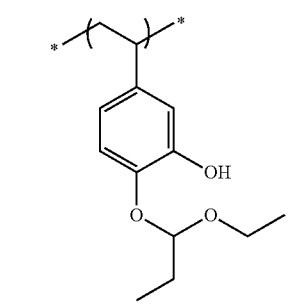
(VI-83)
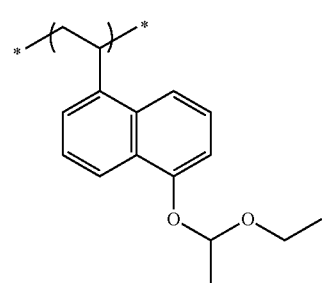
(VI-84)
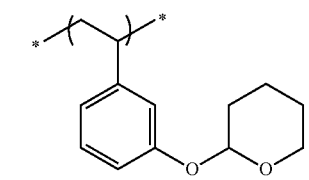
(VI-85)
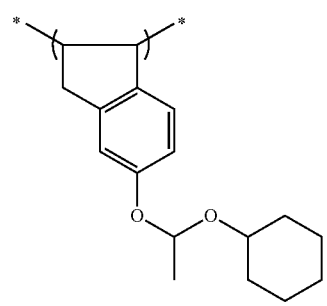
(VI-86)
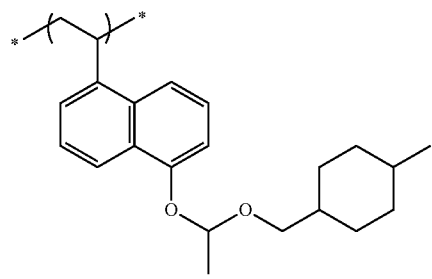
(VI-87)
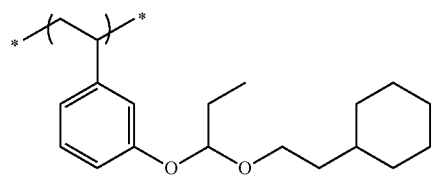
(VI-88)
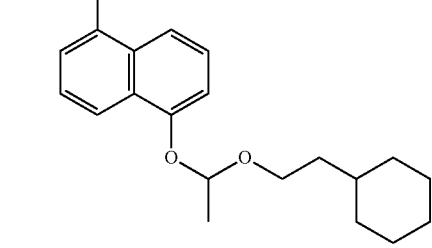
(VI-89)
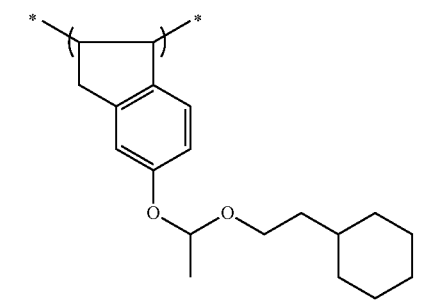
(VI-90)
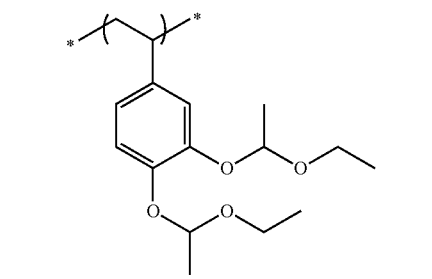
(VI-91)
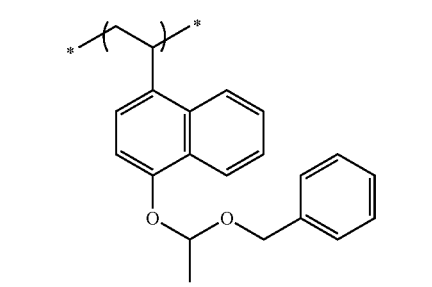
(VI-92)

(VI-93)
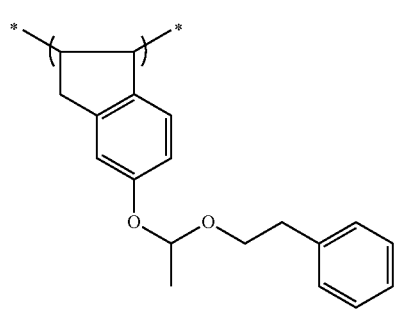
(VI-94)
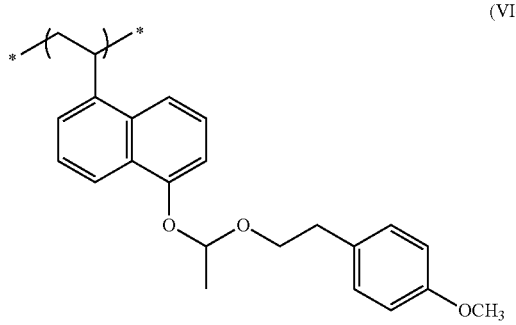
(VI-95)
(VI-96)
(VI-97)
(VI-98)
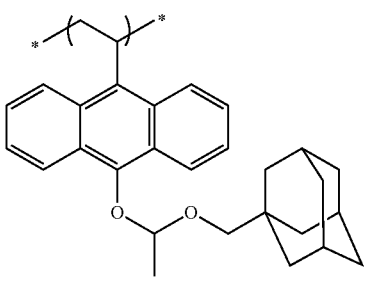
(VI-99)
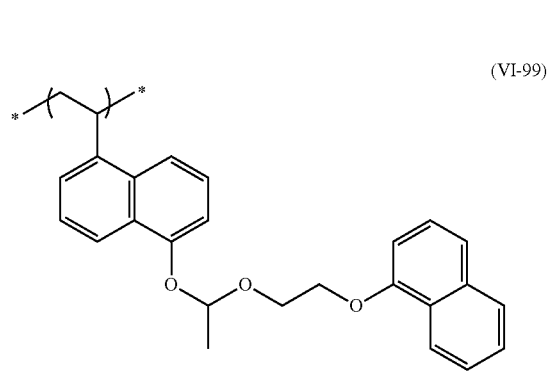
(VI-100)
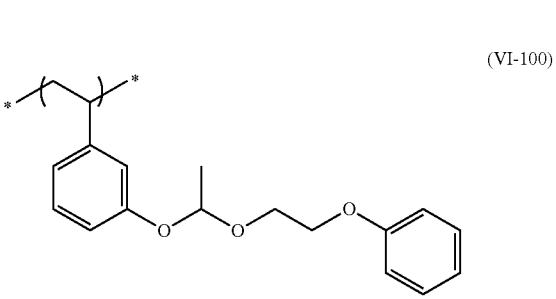
(VI-101)
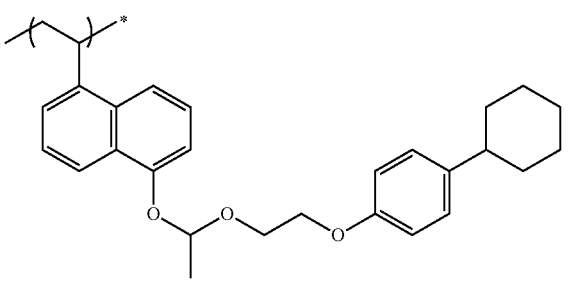
(VI-102)
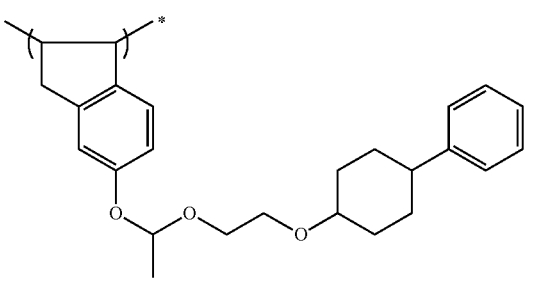

-continued
(VI-103)
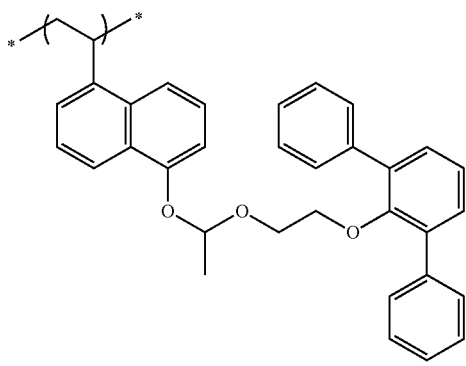
(VI-104)
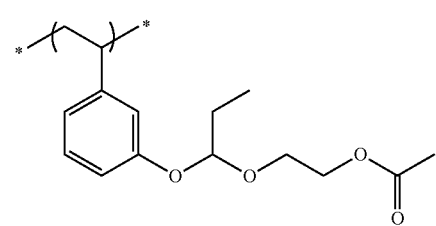
(VI-105)
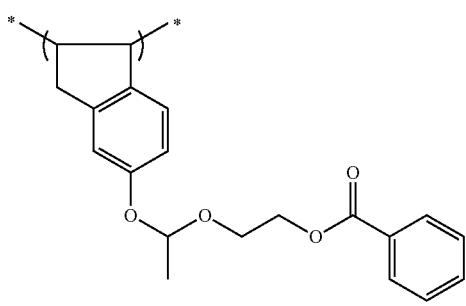
(VI-106)
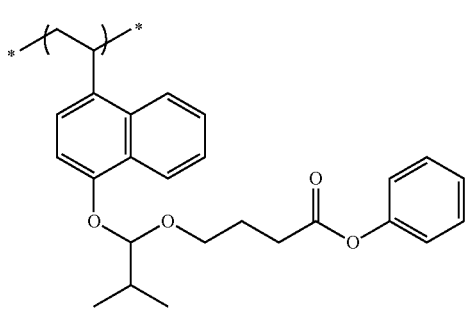
(VI-107)
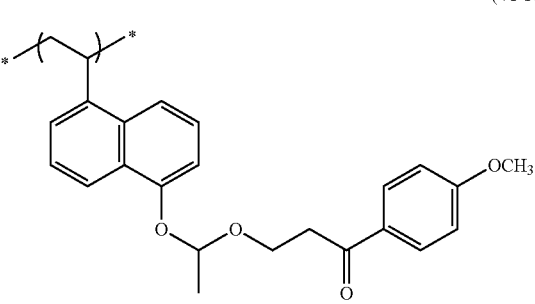
-continued
(VI-108)
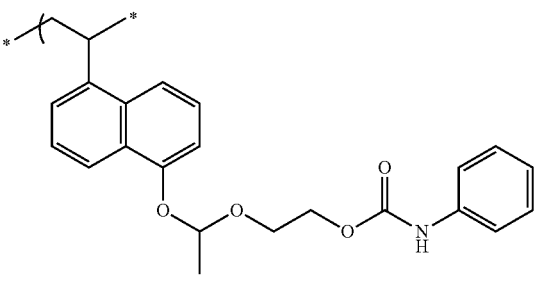
(VI-113)
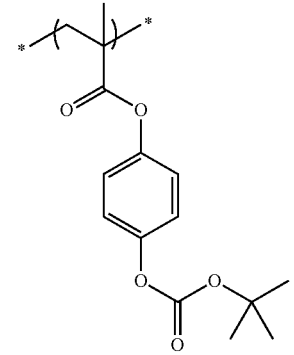
(VI-114)
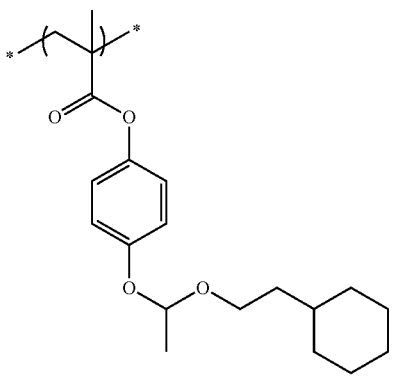
(VI-115)
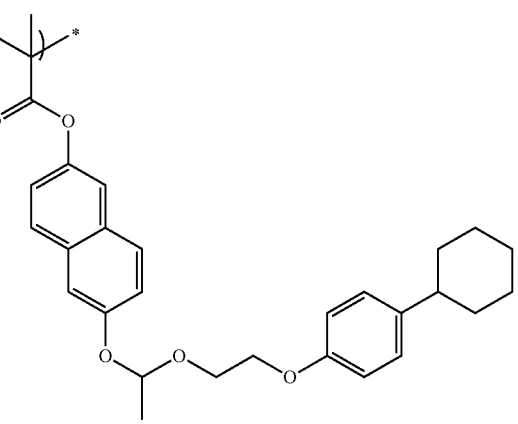

-continued (VI-116)

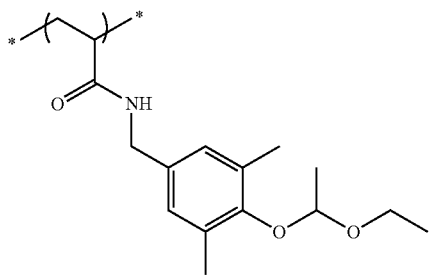

The resin (A) may include two or more types of repeating units which are represented by General Formula (VI).

The content of the repeating units which are represented by General Formula (VI) is preferably 5 mol % to 50 mol % with respect to all of the repeating units in the resin (A), more preferably 10 mol % to 40 mol %, and even more preferably 15 mol % to 35 mol %.

The resin (A) may include a repeating unit which is represented by General Formula (IIB) below.

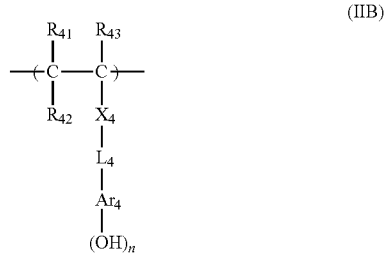

(IIB)

In the general formula described above, $R_{41}$, $R_{42}$, and $R_{43}$ each independently represent a hydrogen atom, an alkyl group, a halogen atom, a cyano group, or an alkoxycarbonyl group.

$X_4$ represents a single bond, —COO—, or —CONR$_{64}$— and $R_{64}$ represents a hydrogen atom or an alkyl group.

$L_4$ represents a single bond or an alkylene group.

$Ar_t$ represents an (n+1)valent aromatic ring group.

n represents an integer of 1 to 4.

Specific examples of the alkyl group, the cycloalkyl group, the halogen atom, the alkoxycarbonyl group of $R_{41}$, $R_{42}$, and $R_{43}$ in Formula (IIB), and the substituent group which these groups may have include the same specific examples as each of the groups in General Formula (VI).

$Ar_4$ represents an (n+1)valent aromatic ring group. A divalent aromatic ring group in a case where n is 1 may have a substituent group and preferred examples thereof include an arylene group with 6 to 18 carbon atoms such as a phenylene group, a tolylene group, a naphthylene group, and an anthracenylene group or a divalent aromatic ring group which includes a heterocyclic ring such as, for example, thiophene, furan, pyrrole, benzothiophene, benzofuran, benzopyrrole, triazine, imidazole, benzimidazole, triazole, thiadiazole, and thiazole.

Specific examples of an (n+1)valent aromatic ring group in a case where n is an integer of 2 or more favorably include a group formed by removing (n−1) arbitrary hydrogen atoms from the specific examples of the divalent aromatic ring group described above.

The (n+1) valent aromatic ring group may further have a substituent group.

Examples of the preferred substituent group in each of the groups described above include alkoxy groups such as an alkyl group, a methoxy group, an ethoxy group, a hydroxyethoxy group, a propoxy group, a hydroxypropoxy group, and a butoxy group, and aryl groups such as a phenyl group.

Examples of the alkyl group of $R_{64}$ in —CONR$_{64}$— ($R_{64}$ represents a hydrogen atom and an alkyl group) which is represented by $X_4$ include the same examples as the alkyl group of $R_{61}$ to $R_{63}$.

As $X_4$, a single bond, —COO—, and —CONH— are preferred and a single bond and —COO— are more preferred.

Preferred examples of the alkylene group in $L_4$ include an alkylene group with 1 to 8 carbon atoms such as a methylene group, an ethylene group, a propylene group, a butylene group, a hexylene group, and an octylene group, which may have a substituent group.

As $Ar_4$, an arylene group with 6 to 18 carbon atoms which may have a substituent group is more preferred and a benzene ring group, a naphthalene ring group, and a biphenylene ring group are particularly preferred.

The repeating unit which is represented by General Formula (IIB) is preferably provided with a hydroxystyrene structure. That is, $Ar_4$ is preferably a biphenylene ring group.

Specific examples of the repeating unit which is represented by General Formula (IIB) will be shown below; however, the present invention is not limited thereto. In the formulas, a represents 1 or 2.

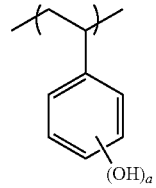

(B-1)

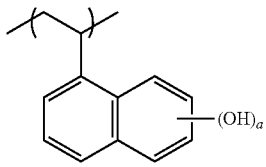

(B-2)

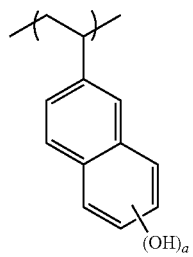

(B-3)

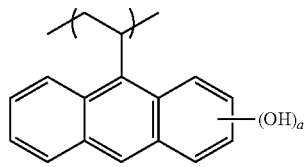

(B-4)

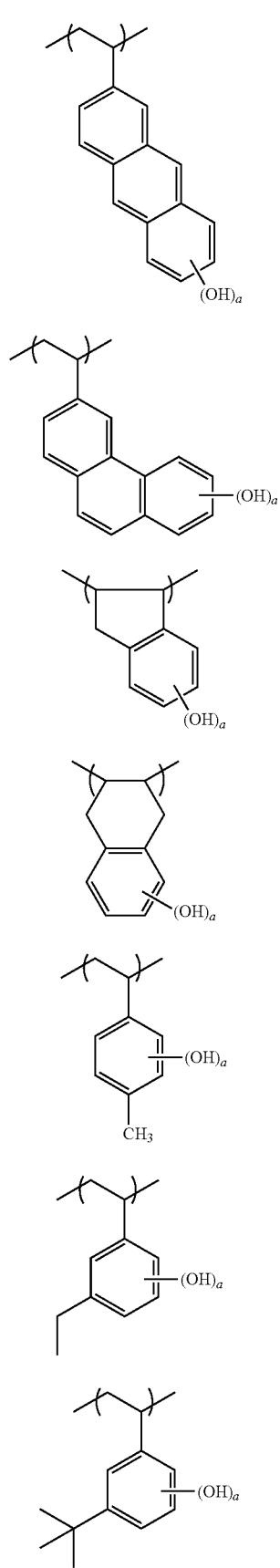
(B-5)
(B-6)
(B-7)
(B-8)
(B-9)
(B-10)
(B-11)
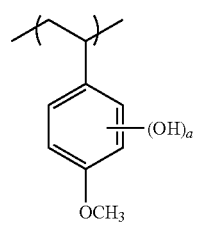
(B-12)
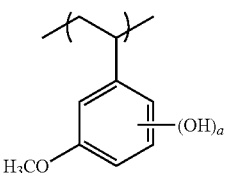
(B-13)
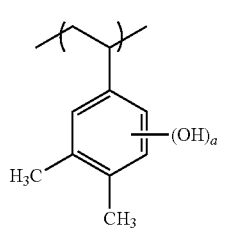
(B-14)
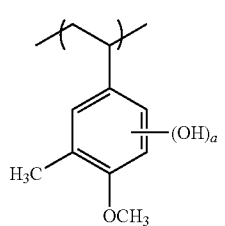
(B-15)
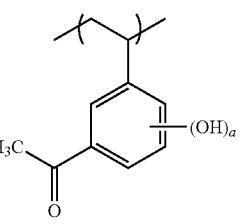
(B-16)
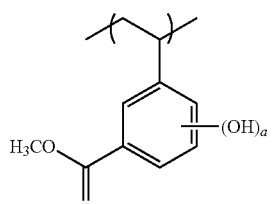
(B-17)
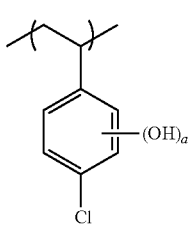
(B-18)

-continued
(B-19)
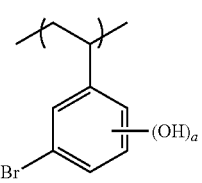
(B-20)
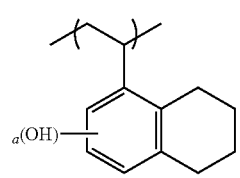
(B-21)
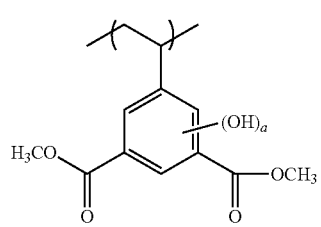
(B-22)
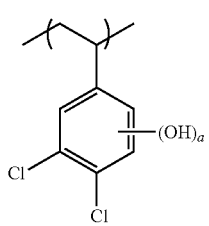
(B-23)
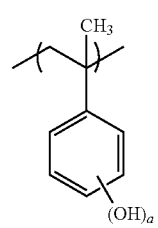
(B-24)
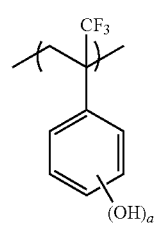
(B-25)
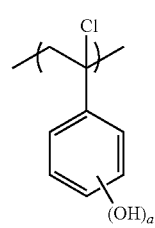
-continued
(B-26)
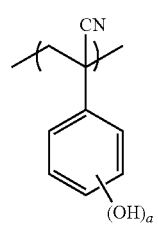
(B-27)
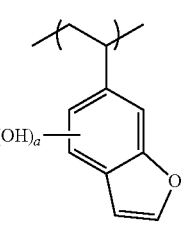
(B-28)
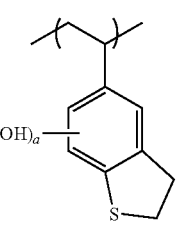
(B-29)
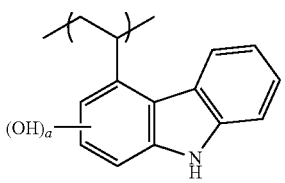
(B-30)
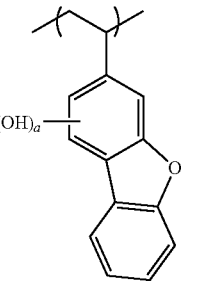
(B-31)
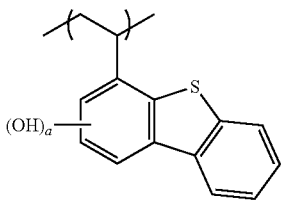
(B-32)
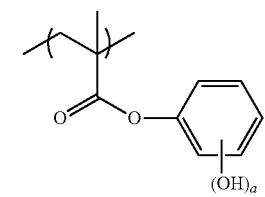

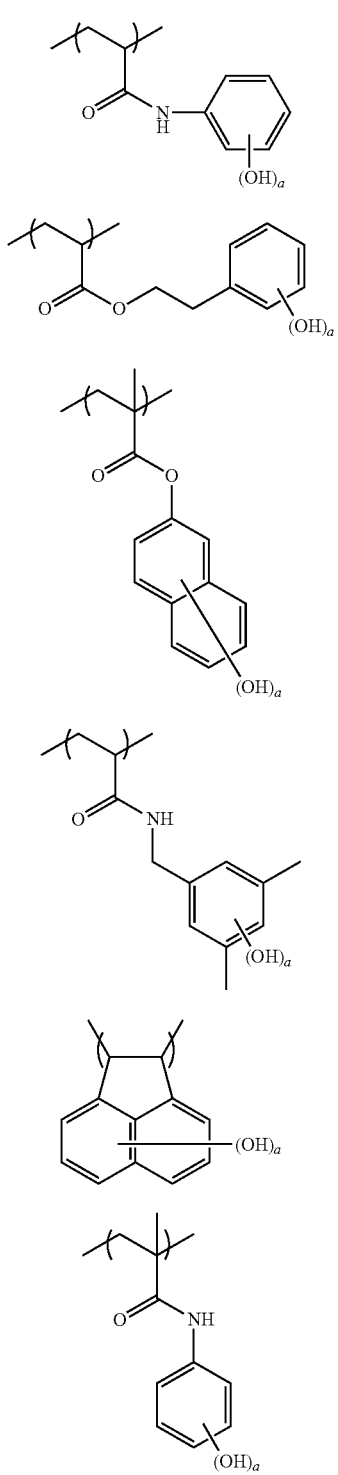

(B-33)
(B-34)
(B-35)
(B-36)
(B-37)
(B-38)

The resin (A) may include two or more types of repeating units which are represented by General Formula (IIB).

The content of the repeating units which are represented by General Formula (IIB) is preferably 5 mol % to 60 mol % with respect to all of the repeating units in the resin (A), more preferably 10 mol % to 50 mol %, and even more preferably 20 mol % to 40 mol %.

[Repeating Unit which has an Aromatic Group]

In the present invention, the resin (A) may have a repeating unit which has an aromatic group and the repeating unit which has an aromatic group may be a repeating unit which has a non-phenolic aromatic group.

Here, the "repeating unit which has a non-phenolic aromatic group" refers to a repeating unit which has an aromatic group which has a phenolic hydroxyl group, and a repeating unit which has an aromatic group which does not have a phenolic hydroxyl group other than a repeating unit which has an aromatic group which has a group which is derived from a phenolic hydroxyl group (for example, a group which is protected by a group which is decomposed and desorbed by an action of an acid or the like). There are cases where such repeating units are preferred, for example, in terms of the solubility in the solvent which includes the resin composition, the affinity with an organic solvent developer which is used in the developing (achieving an appropriate developing speed), or the like.

The aromatic group such as the non-phenolic aromatic group may have a substituent group and an aryl group with 6 to 10 carbon atoms is preferred and examples thereof include a phenyl group and a naphthyl group.

Examples of the substituent group include an alkyl group with 1 to 4 carbon atoms in a straight-chain form or a branched form, a cycloalkyl group with 3 to 10 carbon atoms, an aryl group with 6 to 10 carbon atoms, a halogen atom such as a fluorine atom, a cyano group, an amino group, a nitro group, a carboxyl group, and the like. As the substituent group, the alkyl group with 1 to 4 carbon atoms in a straight-chain form or a branched chain form, the cycloalkyl group with 3 to 10 carbon atoms, and the aryl group with 6 to 10 carbon atoms may further have a substituent group and examples of the further substituent group include a halogen atom such as a fluorine atom and the like.

In a case where the aromatic group such as the non-phenolic aromatic group is a phenyl group and the phenyl group has a substituent group, the substituent group is preferably substituted at the four position of the phenyl group.

The aromatic group such as the non-phenolic aromatic group is preferably a phenyl group which may have a substituent group in terms of the etching resistance.

In the present invention, the repeating unit which has an aromatic group is preferably a repeating unit which is represented by General Formula (II) below.

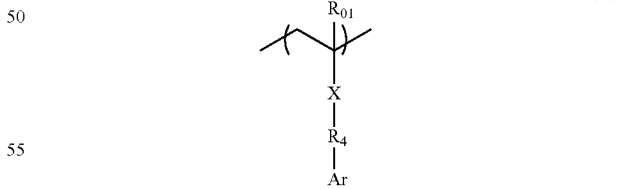

(II)

In General Formula (II) described above, $R_{01}$ represents a hydrogen atom or a straight-chain or branched alkyl group.

X represents a single bond or a divalent linking group.

Ar represents an aromatic group.

$R_4$ represents a single bond or an alkylene group.

Specific examples and preferred examples of the straight-chain or branched alkyl group with regard to $R_{01}$ include the same examples as the examples described as the specific examples and preferred examples of the straight-chain or branched alkyl group regarding $Xa_1$ in General Formula (AI) described above.

X is preferably a divalent linking group. Examples of the divalent linking group preferably include —COO—, —CONH—, and the like.

Specific examples and preferred examples of the aromatic group Ar include the same examples as described above as the specific examples and preferred examples of the aromatic group. One of preferred aspects is that the aromatic group Ar is a non-phenolic aromatic group.

The alkylene group regarding $R_4$ may have a substituent group and an alkylene group with 1 to 4 carbon atoms is preferred and examples thereof include a methylene group, an ethylene group, a propylene group, and the like. Examples of a substituent group which the alkylene group with regard to $R_4$ may have include an alkyl group with 1 to 4 carbon atoms, a halogen atom such as a fluorine atom, and the like.

The substituent group which the alkylene group with regard to $R_4$ may have and a substituent group which the aromatic group Ar may have may bond with each other to form a ring and examples of the group which forms the ring include an alkylene group (for example, an ethylene group and a propylene group).

$R_4$ is preferably a single bond or a methylene group which may be substituted with a substituent group from the point of view of a favorable glass transition temperature (Tg) of a resin in pattern forming.

In the resin (A) in the present invention, from the point of view of sufficiently maintaining the solubility of the unexposed section and improving the dissolution contrast while sufficiently decreasing the solubility of the exposed section with respect to the organic-based developer and the point of view of applying etching resistance, the content (the total in a case of containing a plurality of types) of the repeating units which have the aromatic group (preferably repeating units which are represented by General Formula (II)) is preferably 10 mol % to 60 mol % or more with respect to all of the repeating units in the resin (A), more preferably 15 mol % to 50 mol %, and particularly preferably 20 mol % to 40 mol %.

[Preferred Resin Aspect (2)]

One of the embodiments of the present invention is the resin (A) being a resin of the preferred resin aspect (2) which will be described below.

Examples of the resin of the preferred resin aspect (2) include a resin which includes a (meth)acrylate-based repeating unit and may be preferably applied to ArF exposure. The content of the (meth)acrylate-based repeating units is generally 50 mol % or more in all of the repeating units in the resin and preferably 75 mol % or more. All of the repeating units are more preferably resins which are configured by (meth)acrylate-based repeating units.

The resin of the preferred resin aspect (2) is more preferably a resin which is configured by at least one repeating unit which has an acid-decomposable group selected from a group formed of the repeating unit which is represented by General Formula (AI) or (AI') described above described in [Preferred Resin Aspect (1)] and the repeating unit which is represented by General Formula (AAI) which will be described below and as necessary, at least one repeating unit selected from each repeating unit which will be described below in [Other repeating units].

The resin (A) preferably contains a repeating unit which has an acid-decomposable group and the repeating unit which has an acid-decomposable group regarding the resin of the preferred resin aspect (2) is preferably a repeating unit which is represented by General Formula (AI) or (AI') described above.

In addition, the repeating unit which has an acid-decomposable group is also preferably a repeating unit which generates a carboxyl group by being decomposed by an acid and which is represented by General Formula (AAI) below and, due to this, it is possible to obtain a pattern formation method which has excellent roughness performance such as line width roughness, uniformity of the local pattern dimensions, and exposure latitude and which is able to further suppress decreases in the film thickness of a pattern section which is formed by exposure, that is, film loss.

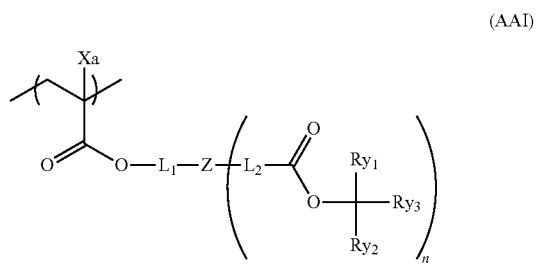

(AAI)

In the formula, Xa represents a hydrogen atom, an alkyl group, a cyano group, or a halogen atom.

$Ry_1$ to $Ry_3$ each independently represent an alkyl group or a cycloalkyl group. Two out of $Ry_1$ to $Ry_3$ may link with each other to form a ring.

Z represents an (n+1)valent linking group which has a polycyclic hydrocarbon structure which may have a hetero atom as a ring member.

$L_1$ and $L_2$ each independently represent a single bond or a divalent linking group.

n represents an integer of 1 to 3.

When n is 2 or 3, a plurality of $L_2$, a plurality of $Ry_1$, a plurality of $Ry_2$, and a plurality of $Ry_3$ may be each the same or may be different.

The alkyl group of Xa may have a substituent group and examples of the substituent group include a hydroxyl group and a halogen atom (preferably a fluorine atom).

The alkyl group of Xa is preferably an alkyl group with 1 to 4 carbon atoms and examples thereof include a methyl group, an ethyl group, a propyl group, a hydroxymethyl group, a trifluoromethyl group, and the like; however, a methyl group is preferred.

Xa is preferably a hydrogen atom or a methyl group.

The alkyl group of $Ry_1$ to $Ry_3$ may be in a chain form or a branched form and is preferably an alkyl group with 1 to 4 carbon atoms.

The cycloalkyl group of $Ry_1$ to $Ry_3$ may be monocyclic or may be polycyclic.

The ring which is formed by two out of $Ry_1$ to $Ry_3$ bonding with each other may be monocyclic or may be polycyclic and a monocyclic hydrocarbon ring with 5 or 6 carbon atoms is particularly preferred.

$Ry_1$ to $Ry_3$ are preferably each independently an alkyl group and more preferably an alkyl group with 1 to 4 carbon atoms in a chain form or a branched form. In addition, the total number of the carbon atoms of the alkyl group in a chain form or a branched form as $Ry_1$ to $Ry_3$ is preferably 5 or less.

$Ry_1$ to $Ry_3$ may further have a substituent group and examples thereof include an alkyl group (with 1 to 4 carbon atoms), a cycloalkyl group (with 3 to 8 carbon atoms), a halogen atom, an alkoxy group (with 1 to 4 carbon atoms), a carboxyl group, an alkoxycarbonyl group (with 2 to 6 carbon atoms), and the like and the number of carbon atoms is preferably 8 or less. Among these, from the point of view of further improving the dissolution contrast with respect to a developer which contains an organic solvent before and after being decomposed by an acid, a substituent group which does not have a hetero atom such as an oxygen atom, a nitrogen atom, and a sulfur atom is more preferred (for example, a substituent group which is not an alkyl group or the like which is substituted with a hydroxyl group is more preferred), a group which is only formed of hydrogen atoms and carbon atoms is even more preferred, and a straight-chain or branched alkyl group and a cycloalkyl group are particularly preferred.

As the linking group of Z which has a polycyclic hydrocarbon structure, a ring-aggregated hydrocarbon group and a cross-linked cyclic hydrocarbon group are included and examples thereof respectively include a group formed by removing (n+1) arbitrary hydrogen atoms from a ring-aggregated hydrocarbon ring and a group formed by removing (n+1) arbitrary hydrogen atoms from a cross-linked cyclic hydrocarbon ring.

Examples of the ring-aggregated hydrocarbon group include a 2-cyclic hydrocarbon ring group, a 3-cyclic hydrocarbon ring group, a 4-cyclic hydrocarbon ring group, and the like. In addition, a fused ring group where a plurality of cycloalkane ring groups with 5 to 8 members are condensed is also included in the cross-linked cyclic hydrocarbon group.

Examples of a preferred cross-linked cyclic hydrocarbon group include a norbornane ring group, an adamantane ring group, a bicyclooctane ring group, a tricyclo[5,2,1,0$^{2,6}$] decane ring group, and the like. Examples of a more preferred cross-linked cyclic hydrocarbon group include a norbornane ring group and an adamantane ring group.

The linking group which has a polycyclic hydrocarbon structure which is represented by Z may have a substituent group. Examples of the substituent which Z may have include a substituent group of an alkyl group, a hydroxyl group, a cyano group, a keto group (=O), an acyloxy group, —COR, —COOR, —CON(R)$_2$, —SO$_2$R, —SO$_3$R, —SO$_2$N(R)$_2$, and the like. Here, R represents a hydrogen atom, an alkyl group, a cycloalkyl group, or an aryl group.

The alkyl group, the alkylcarbonyl group, the acyloxy group, —COR, —COOR, —CON(R)$_2$, —SO$_2$R, —SO$_3$R, and —SO$_2$N(R)$_2$ as a substituent group which Z may have may further have a substituent group and examples of the substituent group include a halogen atom (preferably a fluorine atom).

In the linking group which has a polycyclic hydrocarbon structure which is represented by Z, carbons which configure the polycyclic ring (carbons which contribute to the ring forming) may be carbonyl carbon. In addition, the polycyclic ring may have a hetero atom such as an oxygen atom and a sulfur atom as a ring member as described above.

Examples of the linking group which is represented by L$_1$ and L$_2$ include —COO—, —OCO—, —CONH—, —NHCO—, —CO—, —O—, —S—, —SO—, —SO$_2$—, an alkylene group (preferably with 1 to 6 carbon atoms), a cycloalkylene group (preferably with 3 to 10 carbon atoms), an alkenylene group (preferably with 2 to 6 carbon atoms), or a linking group where a plurality thereof are combined, and the like and a linking group with 12 or less of the total carbon atoms is preferred.

L$_1$ is preferably a single bond, an alkylene group, —COO—, —OCO—, —CONH—, —NHCO—, -an alkylene group —COO—, -an alkylene group —OCO—, -an alkylene group —CONH—, -an alkylene group —NHCO—, —CO—, —O—, —SO$_2$—, and -an alkylene group —O— and a single bond, an alkylene group, -an alkylene group —COO—, or -an alkylene group —O— is more preferred. L$_2$ is preferably a single bond, an alkylene group, —COO—, —OCO—, —CONH—, —NHCO—, a —COO— alkylene group-, an —OCO— alkylene group-, a —CONH— alkylene group-, a —NHCO— alkylene group-, —CO—, —O—, —SO$_2$—, —O— an alkylene group-, and —O— a cycloalkylene group- are preferred and a single bond, an alkylene group, —COO— an alkylene group-, —O— an alkylene group-, or —O— a cycloalkylene group- is more preferred.

In the description method described above, a direct bond "—" on the left end has the meaning of connecting with an ester bond on a main chain side in L$_1$ and with Z in L$_2$ and a direct bond "—" on the right end has the meaning of bonding with Z in L$_1$ and with an ester bond which is connected with a group which is represented by (Ry$_1$)(Ry$_2$)(Ry$_3$)C— in L$_2$.

Here, L$_1$ and L$_2$ may bond with the same atom which configures a polycyclic ring in Z.

n is preferably 1 or 2 and more preferably 1.

Specific examples of the repeating unit which is represented by General Formula (AAI) will be given below; however, the present invention is not limited thereto. In the specific examples below, Xa represents a hydrogen atom, an alkyl group, a cyano group, or a halogen atom.

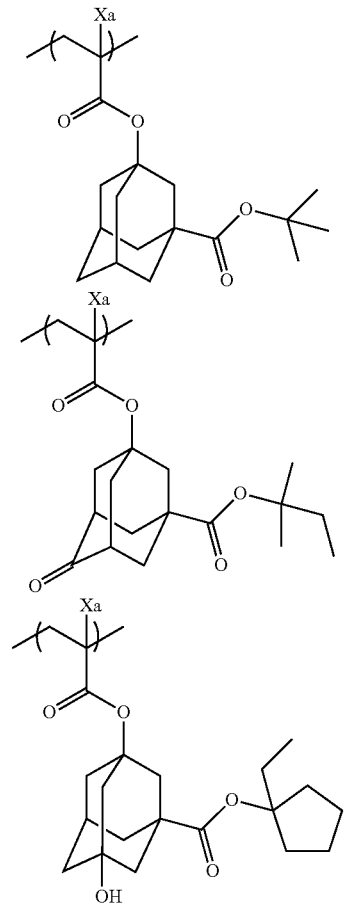

85
-continued
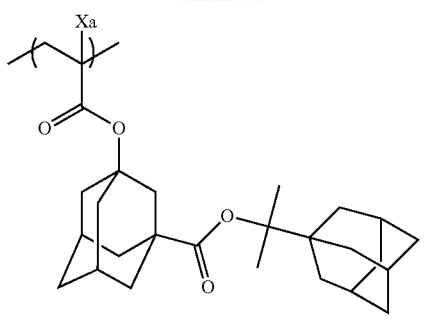
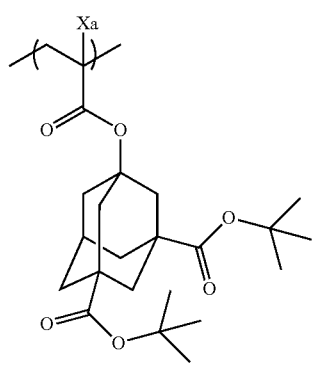
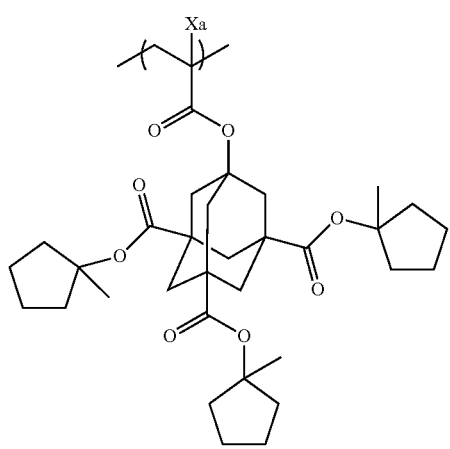
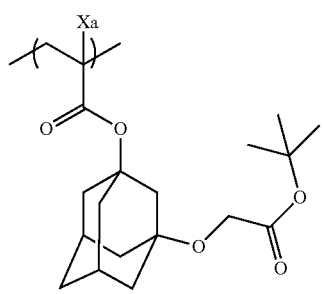
86
-continued
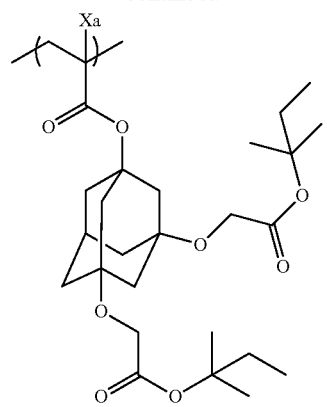
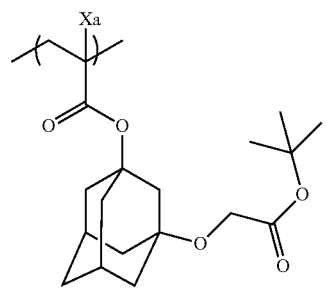
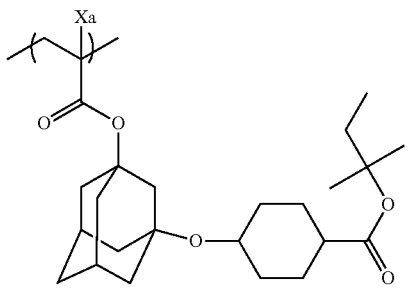
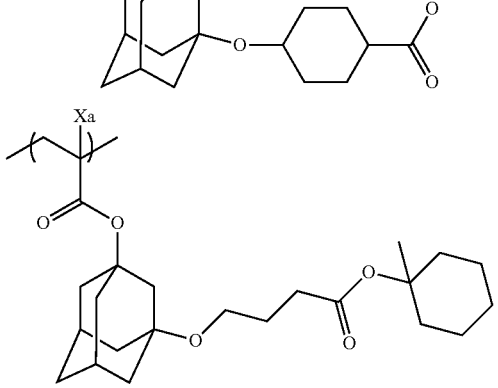
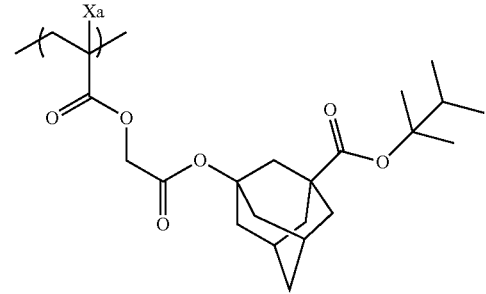

87
-continued
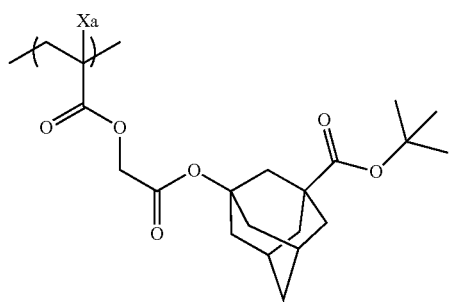
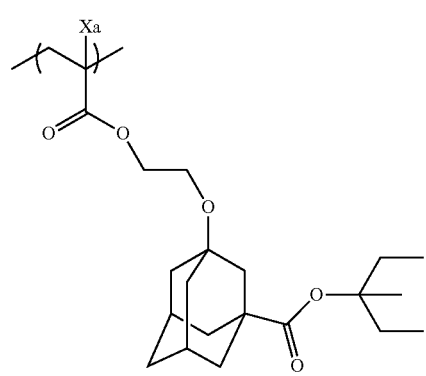
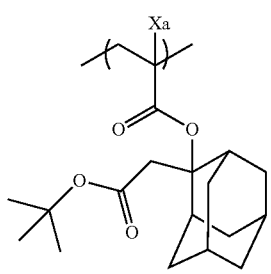
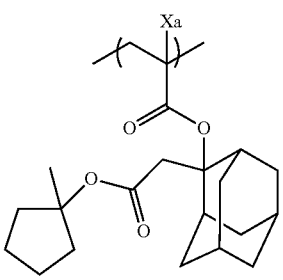
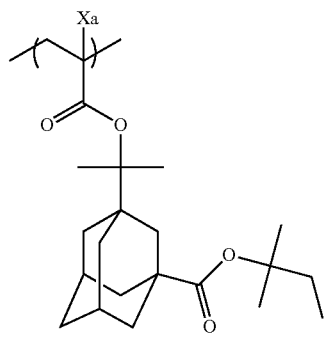
88
-continued
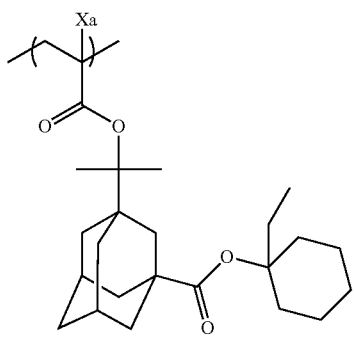
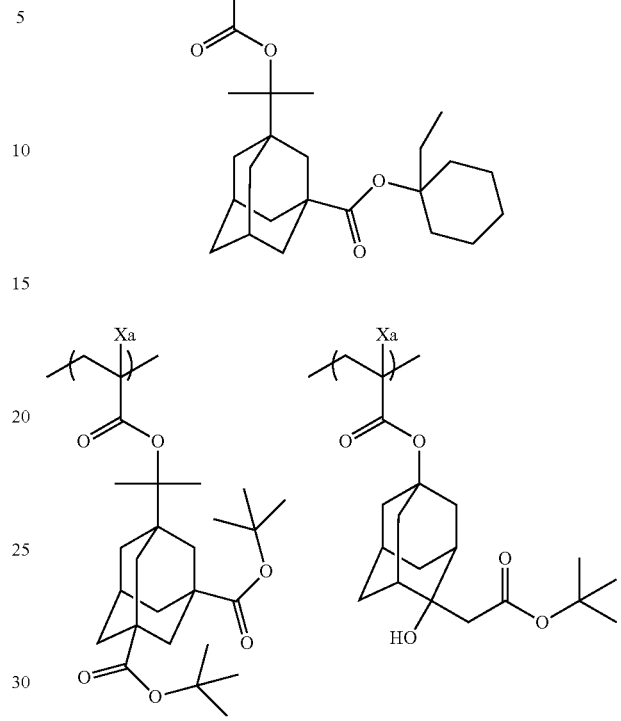

89
-continued
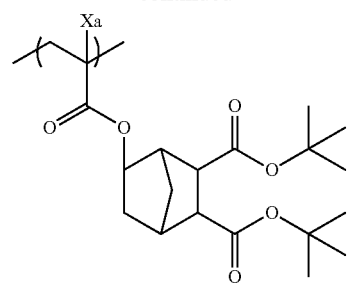
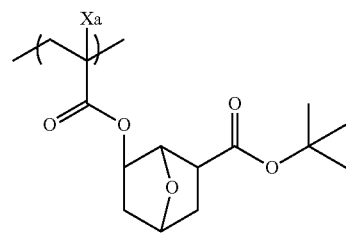
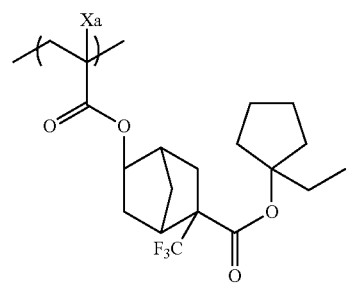
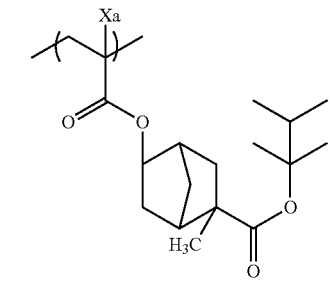
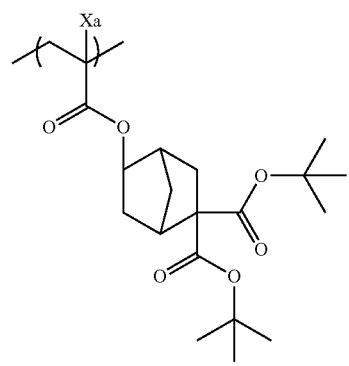
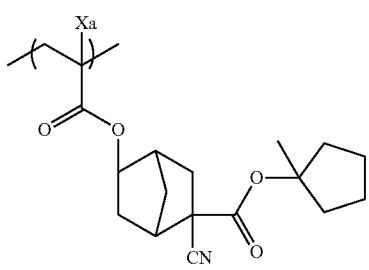
90
-continued
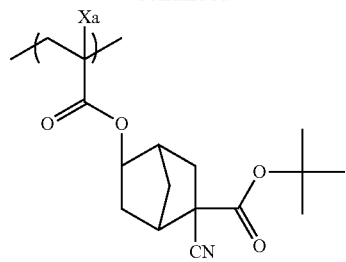
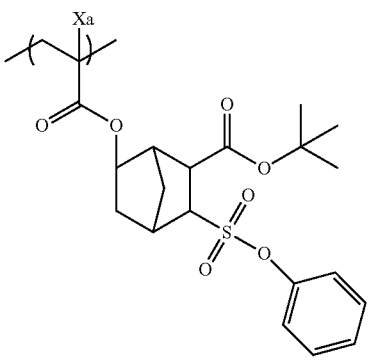
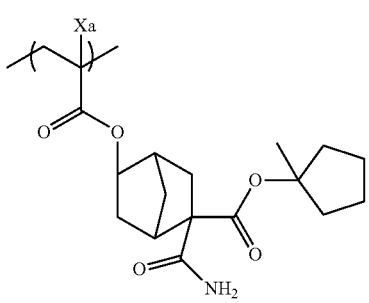
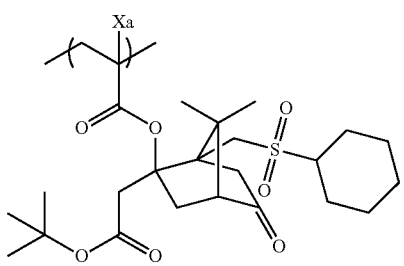
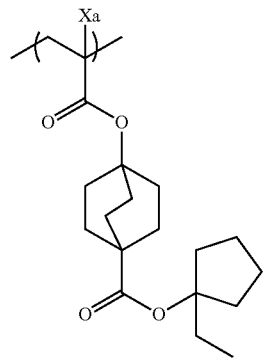

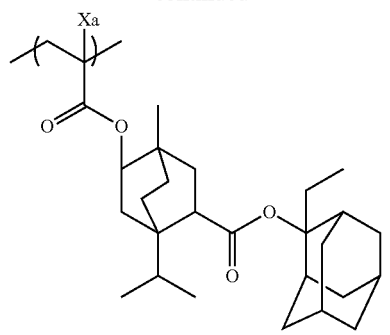

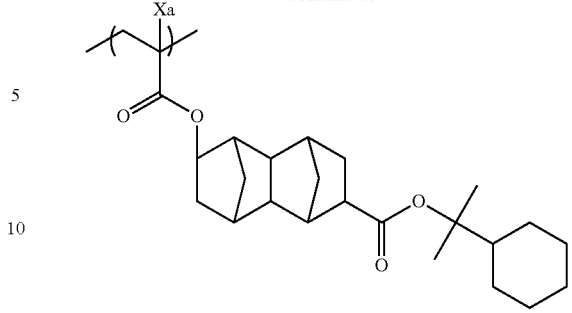

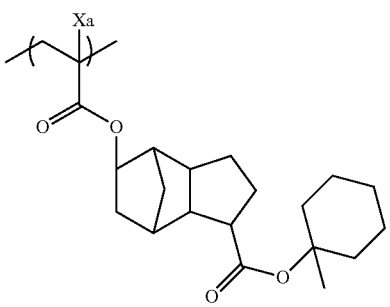

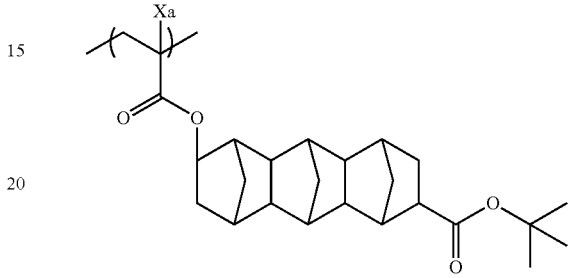

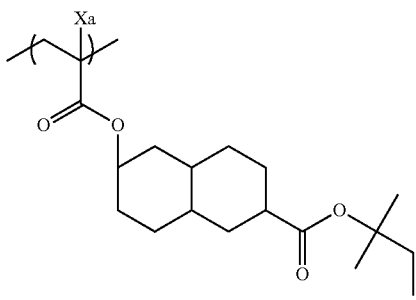

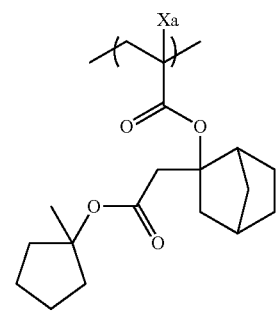

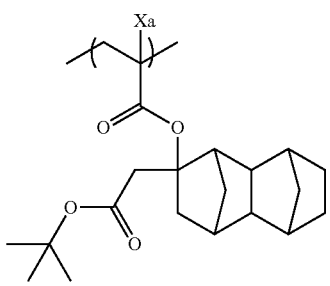

A repeating unit, which has an acid-decomposable group, of the resin (A) as a resin of the preferred resin aspect (2) may be one type or two or more types may be used together.

In the present invention, the resin (A) as a resin of the preferred resin aspect (2) preferably has 50 mol % or more of repeating units (the total in a case of containing a plurality types) which have the acid-decomposable group where molecular weight (the weighted average value of the molecular weight by molar fraction (also referred to below as the molar average value) in a case where a plurality of types of leaving products are generated)) of the leaving products which are generated by a group (an acid-decomposable group), which generates a polar group by being decomposed by an action of an acid, being decomposed is 140 or less with respect to all of the repeating units in the resin. Due to this, since an exposed section remains as a pattern in a case of forming a negative type image, it is possible to prevent a decrease in the film thickness of the pattern section by reducing the molecular weight of the leaving products.

In the present invention, the "leaving products which are generated by an acid-decomposable group being decomposed" refers to products which are decomposed and desorbed by an action of an acid and which corresponds to a group which is decomposed and desorbed by an action of an acid.

In the present invention, the molecular weight (the molar average value in a case where a plurality of types of leaving products are generated) of the leaving products which are generated by an acid-decomposable group being decomposed is preferably 100 or less from the point of view of preventing a decrease in the film thickness of the pattern section.

In addition, there is no particular limit on the lower limit of the molecular weight (the molar average value in a case where a plurality of types of leaving products are generated) of the leaving products which are generated by the acid-decomposable group being decomposed; however, from the point of view that the acid-decomposable group exhibits the functions thereof, 45 or more is preferred and 55 or more is more preferred.

In the present invention, from the view point of more reliably maintaining the film thickness of the pattern section which is an exposed section, it is preferred to have 60 mol % or more of the repeating units (the total thereof in a case where a plurality of types are contained) which have an acid-decomposable group for which the molecular weight of the leaving products which are generated by an acid-decomposable group being decomposed is 140 or less, with respect to all of the repeating units in the resin, it is more preferred to have 65 mol % or more, and it is even more preferred to have 70 mol % or more. In addition, there is no particular limit on the upper limit; however, 90 mol % or less is preferred and 85 mol % or less is more preferred.

The content as the total of the repeating units which have an acid-decomposable group of the resin (A) as a resin of the preferred resin aspect (2) is preferably 20 mol % or more with respect to all of the repeating units in the resin (A) and more preferably 30 mol % or more.

In addition, the content as the total of repeating units which have an acid-decomposable group is preferably 90 mol % or less with respect to all of the repeating units in the resin (A), and more preferably 85 mol % or less.

In a case where the repeating unit which has an acid-decomposable group is a repeating unit which is represented by General Formula (AI) or (AI') described above and, in particular, in a case where $Rx_1$ to $Rx_3$ are each independently an alkyl group in a straight-chain form or a branched form, the content of the repeating units which are represented by General Formula (AI) or (AI') is preferably 45 mol % or more with respect to all of the repeating units in the resin (A), more preferably 50 mol % or more, and particularly preferably 55 mol % or more. In addition, from the point of view of forming a favorable pattern, the upper limit is preferably 90 mol % or less and more preferably 85 mol % or less. Due to this, it is possible to make a pattern formation method which has superior roughness performance, uniformity of the local pattern dimensions, and exposure latitude and which is able to further suppress decreases in the film thickness of a pattern section which is formed by exposure, that is, film loss.

[Other Repeating Units]

The resin (A) may further have a repeating unit which has a lactone structure. The repeating unit which has a lactone structure is more preferably a repeating unit which is represented by General Formula (AII) below.

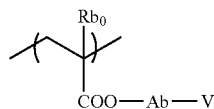

(AII)

In General Formula (AII), $Rb_0$ represents a hydrogen atom, a halogen atom, or an alkyl group (preferably with 1 to 4 carbon atoms) which may have a substituent group.

Examples of a preferred substituent group which the alkyl group of $Rb_0$ may have include a hydroxyl group and a halogen atom. Examples of the halogen atom of $Rb_0$ include a fluorine atom, a chlorine atom, a bromine atom, and an iodine atom. $Rb_0$ is preferably a hydrogen atom, a methyl group, a hydroxymethyl group, or a trifluoromethyl group, and particularly preferably a hydrogen atom and a methyl group.

Ab represents a single bond, an alkylene group, a divalent linking group which has a monocyclic or polycyclic cycloalkyl structure, an ether bond, an ester bond, a carbonyl group, or a divalent linking group combining the above. Ab is preferably a single bond and a divalent linking group which is represented by $-Ab_1-CO_2-$.

$Ab_1$ is a straight-chain or branched alkylene group and a monocyclic or polycyclic cycloalkylene group and preferably a methylene group, an ethylene group, a cyclohexylene group, an adamantylene group, and a norbornylene group.

V represents a group which has a lactone structure.

As the group which has a lactone structure, it is possible to use any group as long as the group has a lactone structure; however, a cyclic lactone structure with 5 to 7 members is preferred and a group where another ring structure is condensed in a form which forms a bicyclo structure and a spiro structure in the cyclic lactone structure with 5 to 7 members is preferred. It is more preferred to have a repeating unit which has a lactone structure which is represented by any of General Formulas (LC1-1) to (LC1-17) below. In addition, the lactone structure may be directly bonded with a main chain. The preferred lactone structure is (LC1-1), (LC1-4), (LC1-5), (LC1-6), (LC1-8), (LC1-13), and (LC1-14).

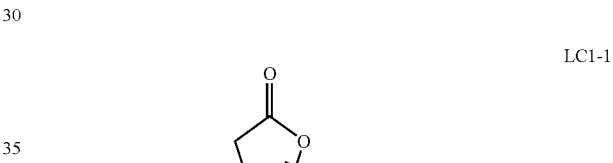

LC1-1

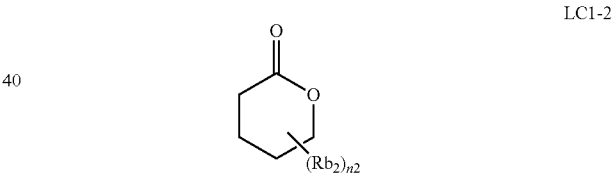

LC1-2

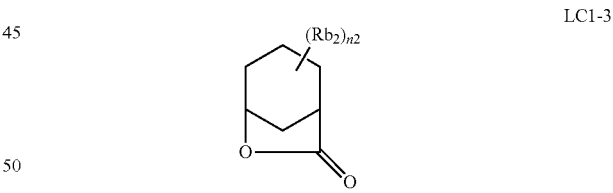

LC1-3

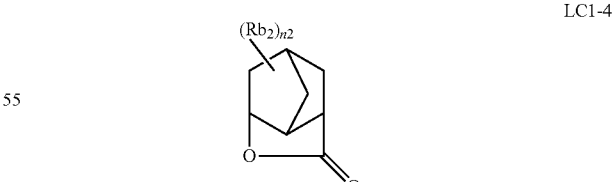

LC1-4

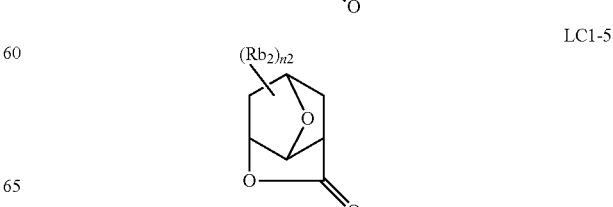

LC1-5

LC1-6 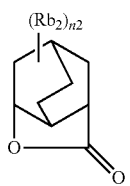

LC1-7 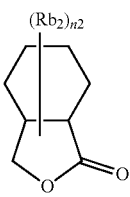

LC1-8 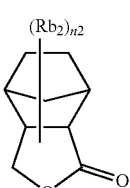

LC1-9 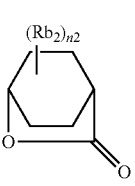

LC1-10 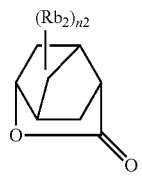

LC1-11 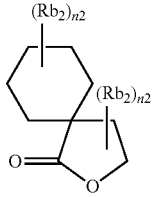

LC1-12 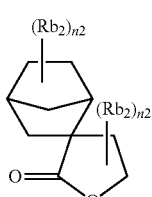

LC1-13 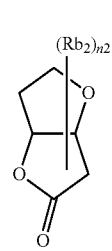

LC1-14 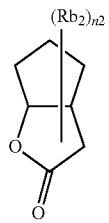

LC1-15 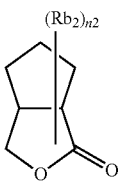

LC1-16 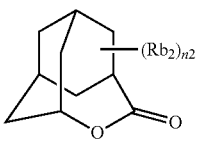

LC1-17 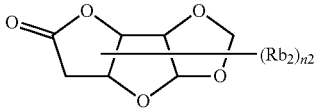

The lactone structure portion may have or may not have a substituent group ($Rb_2$). Examples of a preferred substituent group ($Rb_2$) include an alkyl group with 1 to 8 carbon atoms, a monovalent cycloalkyl group with 4 to 7 carbon atoms, an alkoxy group with 1 to 8 carbon atoms, an alkoxycarbonyl group with 2 to 8 carbon atoms, a carboxyl group, a halogen atom, a hydroxyl group, a cyano group, an acid-decomposable group, and the like. An alkyl group with 1 to 4 carbon atoms, a cyano group, and an acid-decomposable group are more preferred. $n_2$ represents an integer of 0 to 4. When $n_2$ is 2 or more, the plurality of the substituent groups ($Rb_2$) may be the same or may be different and moreover, the plurality of the substituent groups ($Rb_2$) may bond with each other to form a ring.

In a repeating unit which has a lactone group, an optical isomer is generally present; however, any optical isomer may be used. In addition, one type of optical isomer may be used individually or a plurality of optical isomers may be used in a mixture. In a case of mainly using one type of optical isomer, the optical purity (ee) thereof is preferably 90% or more, and more preferably 95% or more.

The resin (A) may or may not contain a repeating unit which has a lactone structure; however, in a case of containing a repeating unit which has a lactone structure, the content of the repeating units of the resin (A) is preferably 0.5 mol % to 80 mol % with respect to all of the repeating units, more preferably 1 mol % to 75 mol %, and even more preferably 3 mol % to 70 mol %. The repeating units may be one type, or two or more types may be used in combination. By using a specific lactone structure, the resolution of the pattern is improved and the rectangular profile is favorable.

Specific examples of the repeating units which have a lactone structure in the resin (A) will be shown below; however, the present invention is not limited thereto. In the formulas, Rx represents H, $CH_3$, $CH_2OH$, or $CF_3$.

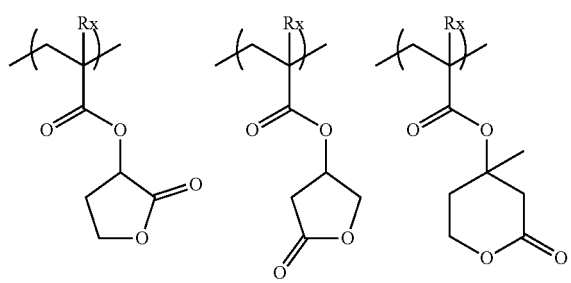
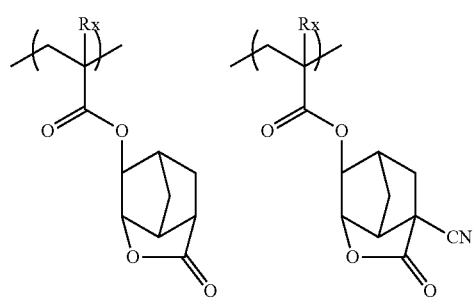
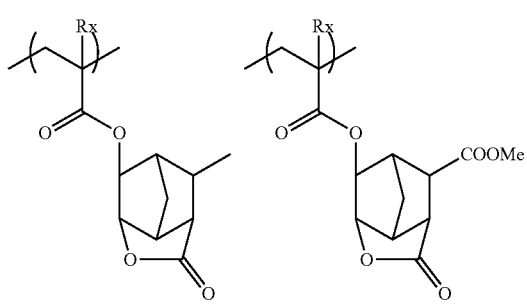
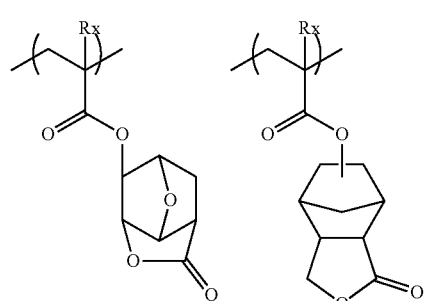
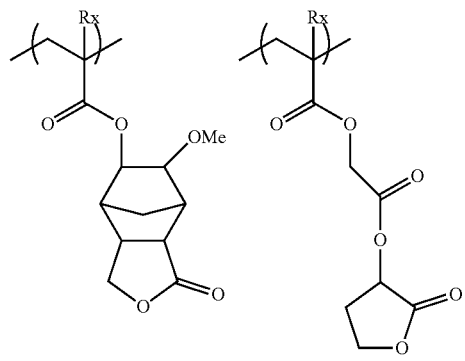
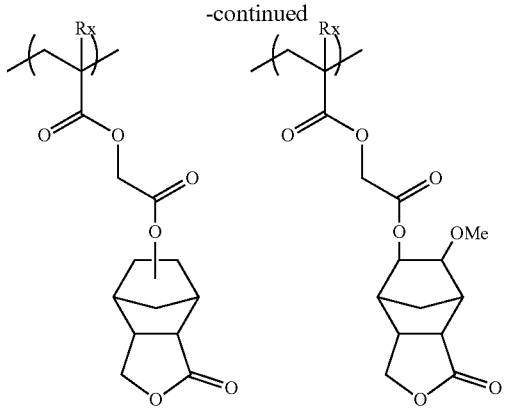
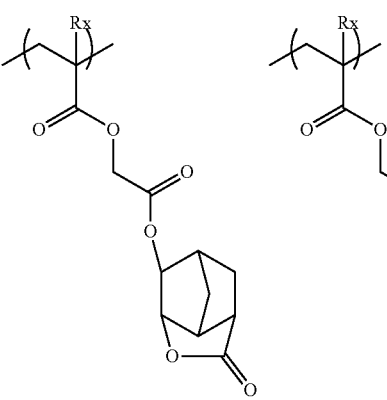

The resin (A) may have a repeating unit which has an acid group. Examples of the acid group include a carboxyl group, a sulfonamide group, a sulfonyl imide group, a bissulfonyl imide group, and an aliphatic alcohol group (for example, a hexafluoroisopropanol group) in which the α-position is substituted with an electron-withdrawing group, and it is more preferred to have a repeating unit which has a carboxyl group. The resolution in contact hole use and the like is increased by containing a repeating unit which has an acid group. As the repeating unit which has an acid group, any of a repeating unit where an acid group is directly bonded with the main chain of a resin such as a repeating unit by an acrylic acid and a methacrylic acid, or a repeating unit where an acid group is bonded with the main chain of a resin via a linking group, and moreover, using a polymerization initiator or a chain transfer agent which has an acid group during the polymerization and introducing the polymerization initiator or the chain transfer agent to the terminal of a polymer chain is preferred, and the linking group may have a monocyclic or polycyclic cyclic hydrocarbon structure. A repeating unit by an acrylic acid and a methacrylic acid is particularly preferred.

Specific examples of the repeating unit which has an acid group will be shown below; however, the present invention is not limited thereto.

In the specific examples, Rx represents H, $CH_3$, $CH_2OH$, or $CF_3$.

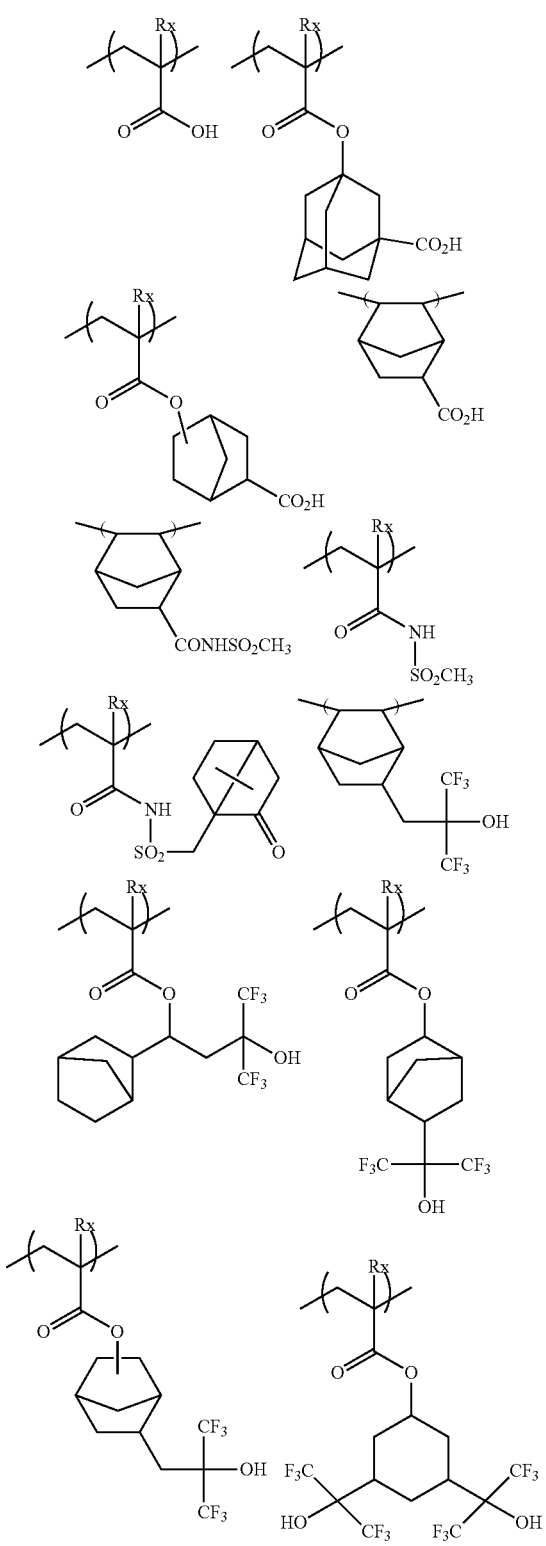

The resin (A) may or may not contain a repeating unit which has an acid group; however, in a case where the resin (A) contains a repeating unit which has an acid group, the content of the repeating units is preferably 1 mol % to 35 mol % with respect to all of the repeating units in the resin (A), more preferably 1 mol % to 30 mol %, and even more preferably 3 mol % to 25 mol %.

The resin (A) may further have a repeating unit which is a repeating unit other than the repeating units described above and which has a hydroxyl group or a cyano group. Due to this, it is possible to improve the substrate adhesiveness and developer affinity. The repeating unit which has a hydroxyl group or a cyano group is preferably a repeating unit which has an alicyclic hydrocarbon structure which is substituted with a hydroxyl group or a cyano group, and preferably does not have an acid-decomposable group. An alicyclic hydrocarbon structure in the alicyclic hydrocarbon structure which is substituted with a hydroxyl group or a cyano group is preferably an adamantyl group, a diamantyl group, and a norbornane group, and more preferably an adamantyl group. In addition, the alicyclic hydrocarbon structure is preferably substituted with a hydroxyl group and more preferably contains a repeating unit which has an adamantyl group which is substituted with at least one hydroxyl group.

In particular, from the point of view of suppressing diffusion of a generated acid, the resin (A) most preferably contains a repeating unit which has a hydroxyadamantyl group or a dihydroxyadamantyl group. The alicyclic hydrocarbon structure which is substituted with a hydroxyl group or a cyano group is preferably a partial structure which is represented by General Formulas (VIIa) to (VIId) below and more preferably a partial structure which is represented by General Formula (VIIa) below.

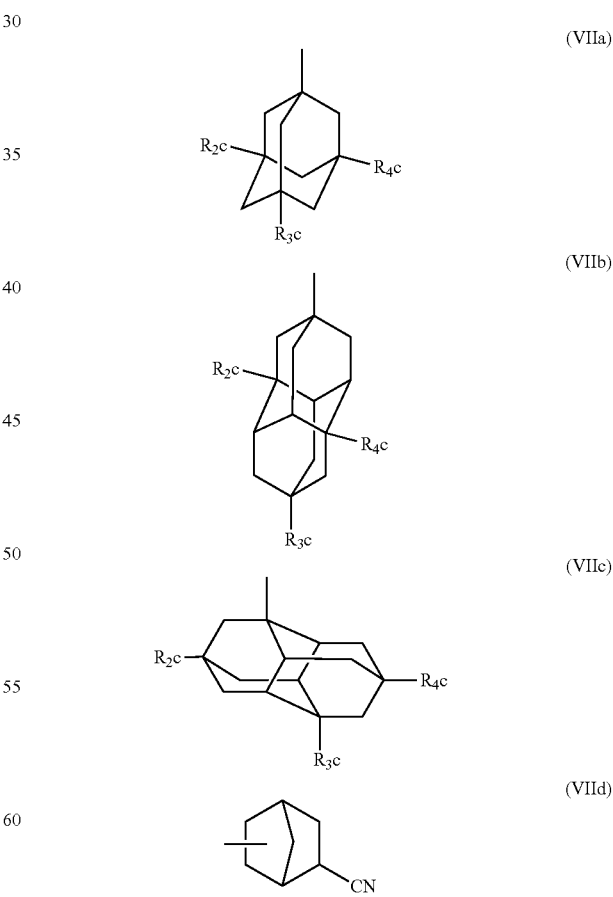

In General Formulas (VIIa) to (VIIc), $R_2c$ to $R_4c$ each independently represent a hydrogen atom, a hydroxyl group, or a cyano group. However, at least one of $R_2c$ to $R_4c$ represents a hydroxyl group or a cyano group. Preferably, one or two out of $R_2c$ to $R_4c$ are hydroxyl groups and the remainder are hydrogen atoms. In General Formula (VIIa), more preferably, two out of $R_2c$ to $R_4c$ are hydroxyl groups and the remainder are hydrogen atoms.

Examples of a repeating unit which has a partial structure which is represented by General Formulas (VIIa) to (VIId) include a repeating unit which is represented by General Formulas (AIIa) to (AIId) below.

(AIIa)
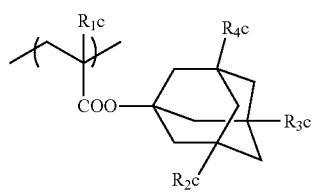

(AIIb)
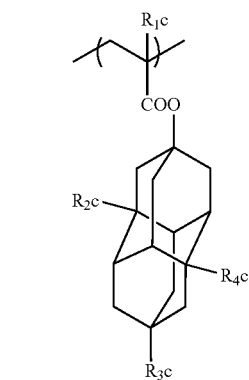

(AIIc)
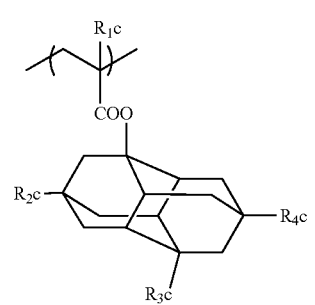

(AIId)
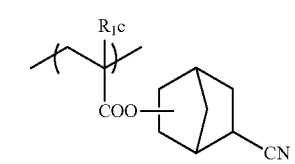

In General Formulas (AIIa) to (AIId), $R_1c$ represents a hydrogen atom, a methyl group, a trifluoromethyl group, or a hydroxymethyl group.

$R_2c$ to $R_4c$ have the same meaning as $R_2c$ to $R_4c$ in General Formulas (VIIa) to (VIIc).

Specific examples of the repeating unit which has a hydroxyl group or a cyano group will be given below; however, the present invention is not limited thereto.

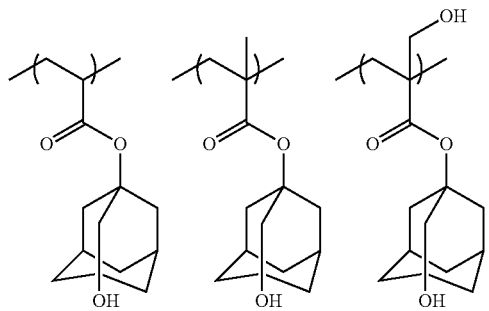

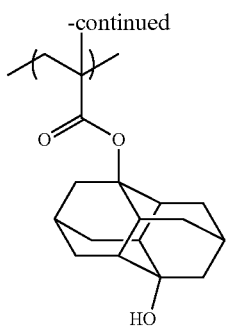

The resin (A) may contain or may not contain a repeating unit which has a hydroxyl group or a cyano group; however, in a case where the resin (A) contains a repeating unit which has a hydroxyl group or a cyano group, the content of the repeating units is preferably 1 mol % to 70 mol % with respect to all of the repeating units in the resin (A), more preferably 3 mol % to 65 mol %, and even more preferably 5 mol % to 60 mol %.

The resin (A) in the present invention is able to further have a repeating unit which has an alicyclic hydrocarbon structure which does not have a polar group (for example, the acid group, the hydroxyl group, and the cyano group) and which is not acid-decomposable. Due to this, it is possible to appropriately adjust the solubility of a resin when developing using a developer which includes an organic solvent. Examples of the repeating unit include a repeating unit which is represented by General Formula (IV).

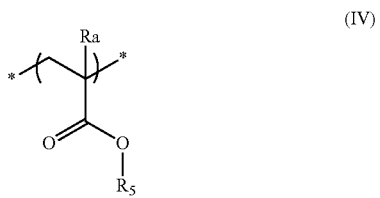

In General Formula (IV), $R_5$ represents a hydrocarbon group which has at least one ring structure and does not have a polar group.

Ra represents a hydrogen atom, an alkyl group, or a —CH2-O—$Ra_2$ group. In the formula, $Ra_2$ represents a hydrogen atom, an alkyl group, or an acyl group. Ra is preferably a hydrogen atom, a methyl group, a hydroxymethyl group, and a trifluoromethyl group, and particularly preferably a hydrogen atom and a methyl group.

A monocyclic hydrocarbon group and a polycyclic hydrocarbon group are included in the ring structure of $R_5$. Examples of the monocyclic hydrocarbon group include a cycloalkyl group with 3 to 12 carbon atoms such as a cyclopentyl group, a cyclohexyl group, a cycloheptyl group, and a cyclooctyl group, and a cycloalkenyl group with 3 to 12 carbon atoms such as a cyclohexenyl group. A preferred monocyclic hydrocarbon group is a monocyclic hydrocarbon group with 3 to 7 carbon atoms and examples thereof more preferably include a cyclopentyl group and a cyclohexyl group.

A ring-aggregated hydrocarbon group and a cross-linked cyclic hydrocarbon group are included in a polycyclic hydrocarbon group and examples of the ring-aggregated hydrocarbon group include a bicyclohexyl group, a perhydronaphthalenyl group, and the like. Examples of the cross-linked cyclic hydrocarbon ring include a 2-cyclic hydrocarbon ring such as norbornane, a 3-cyclic hydrocarbon ring such as tricyclo[5.2.1.0$^{2,6}$]decane, a 4-cyclic hydrocarbon ring such as tetracyclo[4.4.0.1$^{2,5}$.1$^{7,10}$]dodecane, and the like. In addition, a condensed cyclic hydrocarbon ring, for example, a fused ring where a plurality of cycloalkane rings with 5 to 8 members such as perhydronaphthalene (decaline), perhydroanthracene, perhydrophenanthrene, perhydroacenaphthene, perhydrofluorene, perhydroindene, and perhydrophenalene ring are condensed are also included in the cross-linked cyclic hydrocarbon ring.

Examples of a preferred cross-linked cyclic hydrocarbon ring include a norbornyl group, an adamantyl group, a bicyclooctanyl group, a tricyclo[5,2,1,0$^{2,6}$]decanyl group, and the like. Examples of a more preferred cross-linked cyclic hydrocarbon ring include a norbornyl group and an adamantyl group.

The alicyclic hydrocarbon groups may have a substituent group and examples of the preferred substituent group include a halogen atom, an alkyl group, a hydroxyl group where a hydrogen atom is substituted, an amino group where a hydrogen atom is substituted, and the like. Examples of the preferred halogen atom include a bromine atom, a chlorine atom, and a fluorine atom. The alkyl groups described above may further have a substituent group and examples of the substituent group which the alkyl groups may further have include a halogen atom, an alkyl group, a hydroxyl group where a hydrogen atom is substituted, and an amino group where a hydrogen atom is substituted.

Examples of the substituent of the hydrogen atom described above include an alkyl group, a cycloalkyl group, an aralkyl group, a substituted methyl group, a substituted ethyl group, an alkoxycarbonyl group, and an aralkyloxy carbonyl group.

The resin (A) may or may not contain a repeating unit which has an alicyclic hydrocarbon structure which does not have a polar group and which does not exhibit acid-decomposability; however, in a case where the resin (A) contains a repeating unit which has an alicyclic hydrocarbon structure which does not have a polar group and which does not exhibit acid-decomposability, the content of the repeating units is preferably 1 mol % to 60 mol % with respect to all of the repeating units in the resin (A), and more preferably 1 mol % to 50 mol %.

Specific examples of the repeating unit which has an alicyclic hydrocarbon structure which does not have a polar group and which does not exhibit acid-decomposability will be given below; however, the present invention is not limited thereto. In the formulas, Ra represents H, $CH_3$, $CH_2OH$, or $CF_3$.

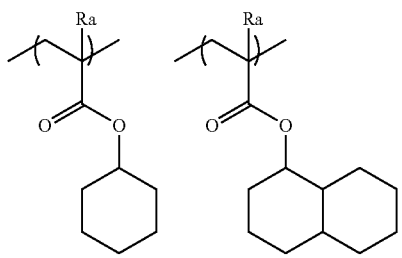

105
-continued
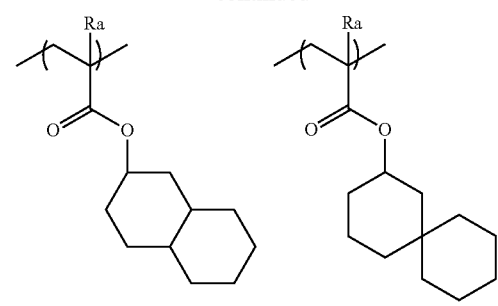
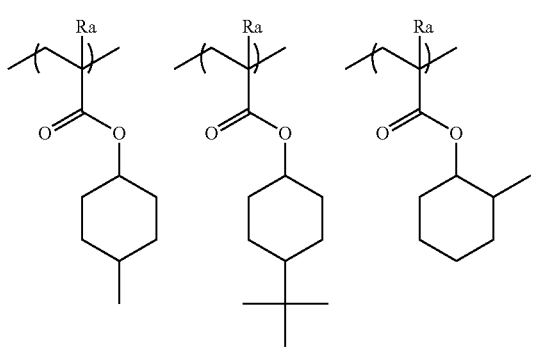
106
-continued
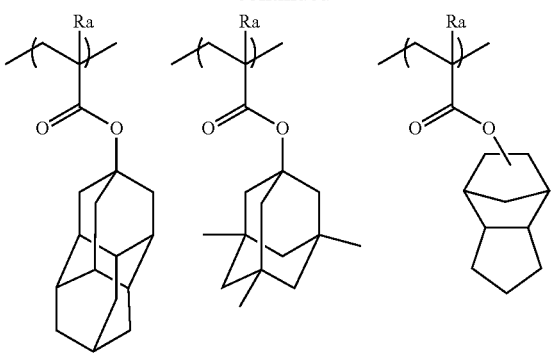
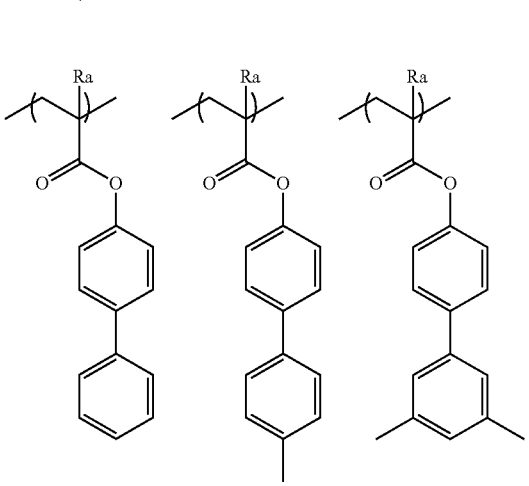
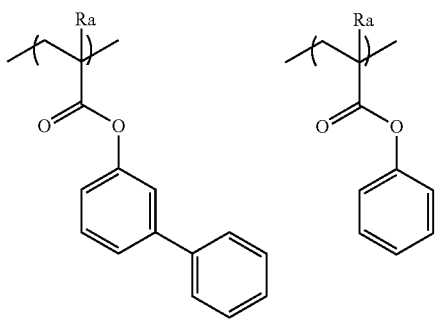
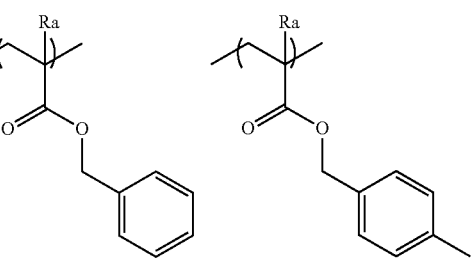
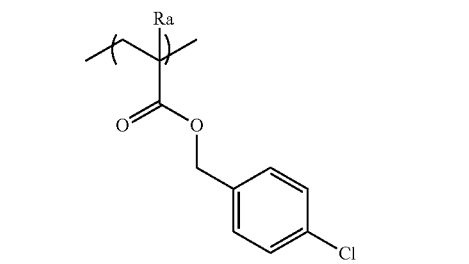

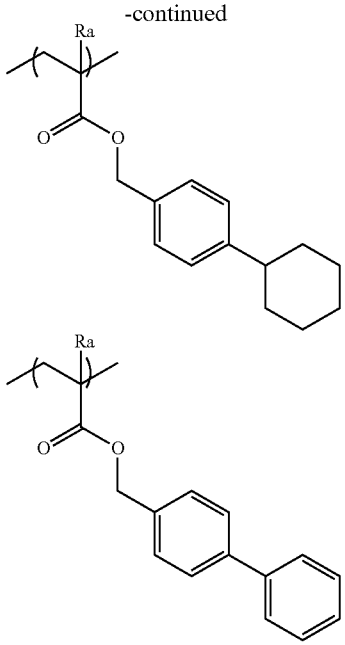

The resin (A) which is used for the composition of the present invention is able to have various types of repeating structure units other than the repeating structure units described above for the purpose of adjusting the dry etching resistance or standard developer aptitude, the substrate adhesiveness, the resist profile, and moreover, resolving power, heat resistance, sensitivity, and the like which are typical necessary characteristics for the resin composition.

Examples of the repeating structure unit include the repeating structure units below which are equivalent to a monomer; however, the present invention is not limited thereto.

Due to this, it is possible to carry out fine adjustment of the performances which are demanded in the resin which is used for the composition of the present invention, in particular, (1) solubility with respect to a coating solvent,
(2) film-forming property (glass transition temperature),
(3) alkali developing characteristics,
(4) film loss (selecting hydrophilic-hydrophobic properties and alkali-soluble groups),
(5) adhesiveness of an unexposed section to a substrate,
(6) dry etching resistance, and the like.

Examples of the monomer include a compound and the like which have one addition polymerizable unsaturated bond which is selected from, for example, acrylic acid esters, methacrylic acid esters, acrylamides, methacrylamides, allyl compounds, vinylethers, vinylesters, styrenes, crotonate esters, and the like.

Apart from the above, copolymerizing may be carried out in the case of an addition polymerizable unsaturated compound which is able to be copolymerized with a monomer which is equivalent to the various types of repeating structure units described above.

In the resin (A) which is used for the composition of the present invention, the content molar fraction of each repeating structure unit is appropriately set in order to adjust the dry etching resistance or standard developer aptitude, the substrate adhesiveness, and the resist profile of the resin composition, and moreover, the resolving power, heat resistance, sensitivity, and the like which are typical necessary characteristics for resists.

The form of the resin (A) in the present invention may be any form of a random type, a block type, a comb type, or a star type. It is possible to synthesize the resin (A), for example, by radical, cation, or anion polymerization of the unsaturated monomer which corresponds to each structure. In addition, it is also possible to obtain a desired resin by performing a polymer reaction after carrying out polymerization using unsaturated monomers which correspond to the precursor of each structure.

It is possible to synthesize the resin (A) in the present invention using typical methods (for example, radical polymerization). Examples of typical synthesizing methods include a collective polymerization method for performing polymerization by dissolving monomers and an initiator in a solvent and heating the result, a dripping polymerization method for dropwise adding a solution of monomers and an initiator to a heated solvent over 1 hour to 10 hours, and the like, and the dripping polymerization method is preferred. Examples of a reaction solvent include ethers such as tetrahydrofuran, 1,4-dioxane, and diisopropylether, ketones such as methyl ethyl ketone and methyl isobutyl ketone, ester solvents such as ethyl acetate, amide solvents such as dimethylformamide and dimethylacetamide, and moreover, solvents which dissolve the composition of the present invention such as propylene glycol monomethyl ether acetate, propylene glycol monomethyl ether, and cyclohexanone which will be described below. More preferably, it is preferred to carry out polymerization using the same solvent as the solvent which is used for the resin composition in the present invention. Due to this, it is possible to suppress particles from being generated during storage.

The polymerization reaction is preferably performed in an inert gas atmosphere such as nitrogen and argon. Polymerization is initiated using a commercially available radical initiator (an azo-based initiator, peroxide, or the like) as a polymerization initiator. The radical initiator is preferably an azo-based initiator and preferably an azo-based initiator which has an ester group, a cyano group, or a carboxyl group. Examples of a preferred initiator include azobisisobutyronitrile, azobisdimethylvaleronitrile, dimethyl 2,2'-azobis(2-methylpropionate), and the like. As desired, an initiator is added or added in parts and, after the reaction ends, a desired polymer is collected by a method such as powder or solid collection by introduction into a solvent. The reaction concentration is 5 mass % to 50 mass % and preferably 10 mass % to 30 mass %. The reaction temperature is generally 10° C. to 150° C., preferably 30° C. to 120° C., and more preferably 60° C. to 100° C.

After the reaction ends, the resultant is left to cool to room temperature and purified. With regard to the purification, it is possible to apply general methods such as a liquid extraction method which removes residual monomers or oligomer components by washing with water or combining appropriate solvents, a method for purifying in a solution state such as ultrafiltration which only extracts and removes substances with a specific molecular weight or less, a method for purifying in a solid state such as a re-precipitation method which removes residual monomers and the like by solidifying resins in a weak solvent by dripping a resin solution in the weak solvent, or cleaning a filtered and separated resin slurry using the weak solvent. For example, the resin is educted as a solid matter by the resin described above being made to contact a sparingly soluble or insoluble solvent (a weak solvent) in a volume amount of 10 times or less that of the reaction solution, preferably a volume amount of 10 times to 5 times.

It is sufficient if a solvent (a precipitation or re-precipitation solvent) which is used during precipitation or re-precipitation operation from a polymer solution is a weak solvent of the polymer and it is possible to use a solvent appropriately selected from hydrocarbons, halogenated hydrocarbons, nitro compounds, ethers, ketones, esters, carbonates, alcohols, carboxylic acid, water, a mixed solvent which includes these solvents, or the like according to the type of the polymer.

It is possible to appropriately select the usage amount of the educted or re-educted solvent in consideration of the efficiency, yield, and the like; however, the usage amount is generally 100 parts by mass to 10,000 parts by mass with respect to 100 parts by mass of the polymer solution, preferably 200 parts by mass to 2,000 parts by mass, and even more preferably 300 parts by mass to 1,000 parts by mass.

It is possible to appropriately select the temperature during precipitation or re-precipitation in consideration of the efficiency or operability; however, the temperature is generally approximately 0° C. to 50° C. and preferably approximately room temperature (for example, approximately 20° C. to 35° C.). It is possible to perform the precipitation or re-precipitation operation by methods known in the art such as a batch type method and a continuous type method using a common mixture container such as a stirring tank.

The polymer which is educted or re-educted is generally used after being filtered, subjected to a common type of solid-liquid separation such as centrifugal separation, and dried. The filtration is preferably performed under pressure using a filter material with solvent resistance. The drying is performed under normal pressure or reduced pressure (preferably under reduced pressure), at a temperature of approximately 30° C. to 100° C., preferably 30° C. to 50° C.

Here, after educting and separating the resin once and dissolving the resin in a solvent again, the resin may be brought into contact with a sparingly soluble or insoluble solvent. That is, the method may be a method which includes educting a resin by bringing a polymer into contact with a sparingly soluble or insoluble solvent after the radical polymerization reaction ends (step a), separating the resin from the solution (step b), preparing a resin solution A by carrying out dissolution in a solvent again (step c), and then educting resin solid matter by the resin coming into contact with the sparingly soluble or insoluble solvent in the resin solution A in a volume amount of less than 10 times of the resin solution A (preferably a volume amount of 5 times or less) (step d), and separating the educted resin (step e).

In addition, in order to suppress the resin from aggregating after the preparation of the composition, for example, as described in JP2009-037108A, a step may be added in which the synthesized resins are dissolved in a solvent to make a solution and the solution is heated at approximately 30° C. to 90° C. for approximately 30 minutes to 4 hours.

The weight average molecular weight of the resin (A) which is used for the composition in the present invention is preferably 1,000 to 200,000 as a polystyrene converted value using the GPC method, more preferably 2,000 to 100,000, even more preferably 3,000 to 70,000, and particularly preferably 5,000 to 50,000. By setting the weight average molecular weight to 1,000 to 200,000, it is possible to prevent deterioration in the heat resistance or dry etching resistance and it is possible to prevent the developing characteristics from deteriorating or the film-forming property from deteriorating due to the viscosity being increased.

The dispersity (molecular weight distribution) is normally in the range of 1.0 to 3.0, preferably 1.0 to 2.6, more preferably 1.2 to 2.4, and particularly preferably 1.4 to 2.2 is used. When the molecular weight distribution satisfies the ranges described above, the resolution and the resist shape are excellent, the side wall of a resist pattern is smooth, and the roughness property is excellent.

In the present specification, it is possible to obtain the weight average molecular weight (Mw) and the dispersity of the resin using, for example, HLC-8120 (manufactured by Tosoh Corporation), using TSK gel Multipore HXL-M (manufactured by Tosoh Corporation, 7.8 mm HD×30.0 cm) as a column, and using tetrahydrofuran (THF) as an eluant.

In each of the resin compositions (1) to (3) in the present invention, the content of the resin (A) in the entire composition is preferably 30 mass % to 99 mass % with respect to the total solid content of the composition and more preferably 60 mass % to 95 mass %.

In addition, in the present invention, the resin (A) may be used as one type in each of the resin compositions (1) to (3) or a plurality of resins may be used together.

[2] Compound (B) which generates an acid when irradiated with actinic rays or radiation The resin compositions (1) and (3) each preferably contains a compound (B) which generates an acid when irradiated with actinic rays or radiation (also referred to below as an "acid generating agent").

In addition, the resin composition (2) may not contain an acid generating agent; however, it is preferred to contain an acid generating agent in a case of containing a resin of which, due to a polarity being increased by an action of an acid, a solubility decreases with respect to a developer which includes an organic solvent.

The compound (B) which generates an acid when irradiated with actinic rays or radiation may take the form of a low molecular compound or may take the form of being combined with a portion of a polymer. In addition, a form of a low molecular compound and a form of being combined with a portion of a polymer may be used together.

In a case where the compound (B) which generates an acid when irradiated with actinic rays or radiation takes the form of a low molecular compound, the molecular weight is preferably 3,000 or less, more preferably 2,000 or less, and even more preferably 1,000 or less.

In a case where the compound (B) which generates an acid when irradiated with actinic rays or radiation takes the form of being combined with a portion of a polymer, the compound may be combined with a portion of the acid-decomposable resin described above or may be combined with a different resin from the acid-decomposable resin.

In the present invention, the compound (B) which generates an acid when irradiated with actinic rays or radiation preferably takes the form of a low molecular compound.

As the acid generating agent, it is possible to appropriately select and use a photo-cationic polymerization photoinitiator, a photo-radical polymerization photoinitiator, a light decolorant for dyes, a photodiscoloration agent, a compound known in the art which generates an acid when irradiated with actinic rays or radiation which is used for microresists and the like, or mixtures thereof.

Examples thereof include diazonium salt, phosphonium salt, sulfonium salt, iodonium salt, imide sulfonate, oxime sulfonate, diazo disulfone, disulfone, and o-nitrobenzyl sulfonate.

Examples of preferred compounds among the acid generating agents include the compounds which are represented by General Formulas (ZI), (ZII), and (ZIII) below.

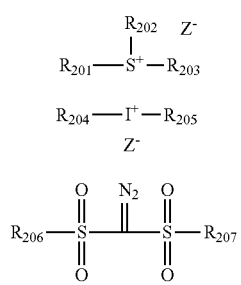

In General Formula (ZI) described above, $R_{201}$, $R_{202}$, and $R_{203}$ each independently represent an organic group.

The number of carbon atoms of an organic group as $R_{201}$, $R_{202}$, and $R_{203}$ is generally 1 to 30 and preferably 1 to 20.

In addition, two out of $R_{201}$ to $R_{203}$ may bond with each other to form a ring structure and an oxygen atom, a sulfur atom, an ester bond, an amide bond, and a carbonyl group may be included in the ring. Examples of a group which two out of $R_{201}$ to $R_{203}$ bond with each other to form include an alkylene group (for example, a butylene group and a pentylene group).

$Z^-$ represents a non-nucleophilic anion.

Examples of the non-nucleophilic anion as $Z^-$ include a sulfonic acid anion, a carboxylic acid anion, a sulfonylimide anion, a bis(alkylsulfonyl)imide anion, a tris(alkylsulfonyl) methyl anion, and the like.

The non-nucleophilic anion is an anion of which the ability to cause a nucleophilic reaction is remarkably low and an anion which is able to suppress decomposition over time due to an intramolecular nucleophilic reaction. Due to this, the stability over time of the actinic ray-sensitive or radiation-sensitive resin composition is improved.

Examples of the sulfonic acid anion include an aliphatic sulfonic acid anion, an aromatic sulfonic acid anion, a camphor sulfonic acid anion, and the like.

Examples of the carboxylic acid anion include an aliphatic carboxylic acid anion, an aromatic carboxylic acid anion, an aralkyl carboxylic acid anion, and the like.

An aliphatic site in the aliphatic sulfonic acid anion and the aliphatic carboxylic acid anion may be an alkyl group or may be a cycloalkyl group and examples thereof preferably include an alkyl group with 1 to 30 carbon atoms and a cycloalkyl group (which may be monocyclic or may be polycyclic) with 3 to 30 carbon atoms.

The aromatic group in the aromatic sulfonic acid anion and the aromatic carboxylic acid anion are preferably an aryl group with 6 to 14 carbon atoms and examples thereof include a phenyl group, a tolyl group, a naphthyl group, and the like.

The alkyl group, the cycloalkyl group, and the aryl group in the aliphatic sulfonic acid anion and the aromatic sulfonic acid anion may have a substituent group. Examples of the substituent group of the alkyl group, the cycloalkyl group, and the aryl group in the aliphatic sulfonic acid anion and the aromatic sulfonic acid anion include a nitro group, a halogen atom (a fluorine atom, a chlorine atom, a bromine atom, and an iodine atom), a carboxyl group, a hydroxyl group, an amino group, a cyano group, an alkoxy group (preferably with 1 to 15 carbon atoms), a cycloalkyl group with (preferably with 3 to 15 carbon atoms), an aryl group (preferably with 6 to 14 carbon atoms), an alkoxycarbonyl group (preferably with 2 to 7 carbon atoms), an acyl group (preferably with 2 to 12 carbon atoms), an alkoxycarbonyloxy group (preferably with 2 to 7 carbon atoms), an alkylthio group (preferably with 1 to 15 carbon atoms), an alkylsulfonyl group (preferably with 1 to 15 carbon atoms), an alkyliminosulfonyl group (preferably with 1 to 15 carbon atoms), an aryloxysulfonyl group (preferably with 6 to 20 carbon atoms), an alkylaryloxysulfonyl group (preferably with 7 to 20 carbon atoms), a cycloalkylaryloxysulfonyl group (preferably with 10 to 20 carbon atoms), an alkyloxyalkyloxy group (preferably with 5 to 20 carbon atoms), a cycloalkylalkyloxyalkyloxy group (preferably with 8 to 20 carbon atoms), and the like. Regarding the aryl group and ring structure of each group, examples of a substituent group further include an alkyl group (preferably with 1 to 15 carbon atoms) and a cycloalkyl group (preferably with 3 to 15 carbon atoms).

The aralkyl group in the aralkyl carboxylic acid anion is preferably an aralkyl group with 7 to 12 carbon atoms and examples thereof include a benzyl group, a phenethyl group, a naphthylmethyl group, a naphthylethyl group, a naphthylbutyl group, and the like.

The alkyl group, the cycloalkyl group, the aryl group, and the aralkyl group in the aliphatic carboxylic acid anion, the aromatic carboxylic acid anion, and the aralkyl carboxylic acid anion may have a substituent group. Examples of the substituent group include a halogen atom, an alkyl group, a cycloalkyl group, an alkoxy group, an alkylthio group, and the like which are the same as in the aromatic sulfonic acid anion.

Examples of the sulfonylimide anion include a saccharin anion.

An alkyl group in the bis(alkylsulfonyl)imide anion and the tris(alkylsulfonyl) methide anion is preferably an alkyl group with 1 to 5 carbon atoms and examples thereof include a methyl group, an ethyl group, a propyl group, an isopropyl group, an n-butyl group, an isobutyl group, a sec-butyl group, a pentyl group, a neopentyl group, and the like.

Two alkyl groups in the bis(alkylsulfonyl)imide anion bond with each other to form an alkylene group (preferably 2 to 4 carbon atoms) and may form a ring with an imide group and two sulfonyl groups. Substituent groups which the alkylene group formed by two alkyl groups bonding with each other in the alkyl groups and the bis(alkylsulfonyl) imide anion may have include a halogen atom, an alkyl group which is substituted with a halogen atom, an alkoxy group, an alkylthio group, an alkyloxysulfonyl group, an aryloxysulfonyl group, a cycloalkylaryloxysulfonyl group, and the like, and an alkyl group which is substituted with a fluorine atom is preferred.

Examples of other non-nucleophilic anions include fluorinated phosphorus (for example, $PF_6^-$), fluorinated boron (for example, $BF_4^-$), fluorinated antimony (for example, $SbF_6^-$), and the like.

As the non-nucleophilic anion of $Z^-$, an aliphatic sulfonic acid anion where at least the α-position of the sulfonic acid is substituted with a fluorine atom, an aromatic sulfonic acid anion which is substituted with a fluorine atom or a group which has a fluorine atom, a bis(alkylsulfonyl)imide anion where an alkyl group is substituted with a fluorine atom, and a tris(alkylsulfonyl) methide anion where an alkyl group is substituted with a fluorine atom are preferred. The non-nucleophilic anion is more preferably a perfluoro aliphatic sulfonic acid anion with 4 to 8 carbon atoms and a benzene sulfonic acid anion which has a fluorine atom, and even more preferably a nonafluorobutan sulfonic acid anion, a perfluorooctan sulfonic acid anion, a pentafluorobenzene sulfonic acid anion, and a 3,5-bis(trifluoromethyl)benzene sulfonic acid anion.

The acid generating agent is preferably a compound which generates an acid which is represented by General Formula (V) or (VI) below when irradiated with actinic rays or radiation. Since the compound which generates an acid which is represented by General Formula (V) or (VI) below has a cyclic organic group, it is possible to make the resolution and roughness performance superior.

The non-nucleophilic anion is able to be an anion which generates an organic acid which is represented by General Formula (V) or (VI) below.

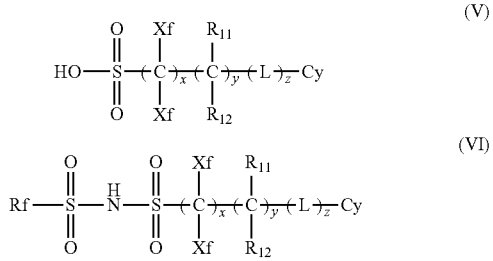

In the general formula described above,

Xf each independently represent a fluorine atom or an alkyl group which is substituted with at least one fluorine atom.

$R_{11}$ and $R_{12}$ each independently represent a hydrogen atom, a fluorine atom, or an alkyl group.

L each independently represent a divalent linking group.

Cy represents a cyclic organic group.

Rf is a group which includes a fluorine atom.

x represents an integer of 1 to 20.

y represents an integer of 0 to 10.

z represents an integer of 0 to 10.

Xf represents a fluorine atom or an alkyl group which is substituted with at least one fluorine atom. The number of carbon atoms of the alkyl group is preferably 1 to 10 and more preferably 1 to 4. In addition, the alkyl group which is substituted with at least one fluorine atom is preferably a perfluoroalkyl group.

Xf is preferably a fluorine atom or a perfluoroalkyl group with 1 to 4 carbon atoms and more preferably a fluorine atom or $CF_3$. In particular, both Xf are preferably fluorine atoms.

$R_{11}$ and $R_{12}$ are each independently a hydrogen atom, a fluorine atom, or an alkyl group. The alkyl group may have a substituent group (preferably a fluorine atom) and a substituent group with 1 to 4 carbon atoms is preferred. A perfluoroalkyl group with 1 to 4 carbon atoms is more preferred. As specific examples of the alkyl group of $R_{11}$ and $R_{12}$ which has a substituent group, for example, $CF_3$ is preferred.

L represents a divalent linking group. Examples of the divalent linking group include —COO—, —OCO—, —CONH—, —NHCO—, —CO—, —O—, —S—, —SO—, —SO$_2$—, an alkylene group (preferably with 1 to 6 carbon atoms), a cycloalkylene group (preferably with 3 to 10 carbon atoms), an alkenylene group (preferably with 2 to 6 carbon atoms), or a divalent linking group where a plurality thereof are combined, and the like. Among these, —COO—, —OCO—, —CONH—, —NHCO—, —CO—, —O—, —SO$_2$—, —COO— an alkylene group-, —OCO— an alkylene group-, —CONH— an alkylene group-, or —NHCO— an alkylene group- is preferred, and —COO—, —OCO—, —CONH—, —SO$_2$—, a —COO— alkylene group-, or —OCO— an alkylene group- is more preferred.

Cy represents a cyclic organic group. Examples of the cyclic organic group include an alicyclic group, an aryl group, and a heterocyclic ring group.

The alicyclic group may be monocyclic or may be polycyclic. Examples of the monocyclic alicyclic groups include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among these, an alicyclic group which has a bulky structure with 7 or more carbon atoms such as a norbornyl group, a tricyclodecanyl group, a tetracyclodecanyl group, a tetracyclododecanyl group, and an adamantyl group is preferred from the point of view of suppression of the in-film diffusibility in the PEB (heating after exposure) step and improvement of Mask Error Enhancement Factor (MEEF).

The aryl group may be monocyclic or may be polycyclic. Examples of the aryl group include a phenyl group, a naphthyl group, a phenanthryl group, and an anthryl group. Among these, a naphthyl group with relatively low light absorbance at 193 nm is preferred.

The heterocyclic ring group may be a monocyclic type or may be a polycyclic type; however, a polycyclic type is better able to suppress acids from diffusing. In addition, the heterocyclic ring group may have aromaticity or may not have aromaticity. Examples of a heterocyclic ring which has aromaticity include a furan ring, a thiophene ring, a benzofuran ring, a benzothiophene ring, a dibenzofuran ring, a dibenzothiophene ring, and a pyridine ring. Examples of a heterocyclic ring which does not have aromaticity include a tetrahydropyran ring, a lactone ring, a sultone ring, and a decahydroisoquinoline ring. A heterocyclic ring in the heterocyclic ring group is particularly preferably a furan ring, a thiophene ring, a pyridine ring, or a decahydroisoquinoline ring. In addition, examples of the lactone ring and the sultone ring include the lactone structure or sultone which were exemplified in the resin (A) described above.

The cyclic organic groups described above may have a substituent group. Examples of the substituent group include an alkyl group (may be any of straight-chain or branched, preferably with 1 to 12 carbon atoms), a cycloalkyl group (may be any of monocyclic, polycyclic, or a spiro ring, preferably with 3 to 20 carbon atoms), an aryl group (preferably with 6 to 14 carbon atoms), a hydroxyl group, an alkoxy group, an ester group, an amide group, an urethane group, an ureide group, a thioether group, a sulfonamide group, and a sulfonic acid ester group. Here, carbons which configure the cyclic organic group (carbons which contribute to the ring forming) may be carbonyl carbons.

x is preferably 1 to 8 and among these, 1 to 4 is preferred and 1 is particularly preferred. y is preferably 0 to 4 and 0 is more preferred. z is preferably 0 to 8 and among these, 0 to 4 is preferred.

Examples of the group which includes a fluorine atom which is represented by Rf include an alkyl group which has at least one fluorine atom, a cycloalkyl group which has at least one fluorine atom, and an aryl group which has at least one fluorine atom.

The alkyl group, the cycloalkyl group, and the aryl group may be substituted with a fluorine atom or may be substituted with another substituent group which includes a fluorine atom. In a case where Rf is a cycloalkyl group which has at least one fluorine atom or an aryl group which has at least one fluorine atom, examples of other substituent groups which include a fluorine atom include an alkyl group which is substituted with at least one fluorine atom.

In addition, the alkyl group, the cycloalkyl group, and the aryl group may be further substituted with a substituent group which does not include a fluorine atom. Examples of the substituent group include substituent groups which do not include a fluorine atom out of the substituent groups previously described with regard to Cy.

Examples of the alkyl group which has at least one fluorine atom which is represented by Rf include the same examples as previously described as the alkyl group which is substituted with at least one fluorine atom which is represented by Xf. Examples of the cycloalkyl group which has at least one fluorine atom which is represented by Rf include a perfluorocyclopentyl group and a perfluorocyclohexyl group. Examples of the aryl group which has at least one fluorine atom which is represented by Rf include a perfluorophenyl group.

In addition, the non-nucleophilic anion is also preferably an anion which is represented by any of General Formulas (B-1) to (B-3) below.

Firstly, description will be given of an anion which is represented by General Formula (B-1) below.

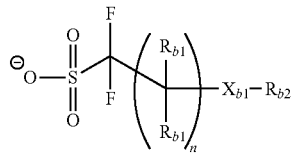

(B-1)

In General Formula (B-1) described above, $R_{b1}$ each independently represent a hydrogen atom, a fluorine atom, or a trifluoromethyl group ($CF_3$).

n represents an integer of 1 to 4.

n is preferably an integer of 1 to 3 and more preferably 1 or 2.

$X_{b1}$ represents a single bond, an ether bond, an ester bond (—OCO— or —COO—), or a sulfonic acid ester bond (—OSO$_2$— or —SO$_3$—).

$X_{b1}$ is preferably an ester bond (—OCO— or —COO—) or a sulfonic acid ester bond (—OSO$_2$— or —SO$_3$—).

$R_{b2}$ represents a substituent group with 6 or more carbon atoms.

The substituent group with 6 or more carbon atoms regarding $R_{b2}$ is preferably a bulky group and examples thereof include an alkyl group, an alicyclic group, an aryl group, a heterocyclic ring group, and the like with 6 or more carbon atoms.

The alkyl group with 6 or more carbon atoms regarding $R_{b2}$ may have a straight-chain form or may have a branched form and is preferably a straight-chain or branched alkyl group with 6 to 20 carbon atoms and examples thereof include a straight-chain or branched hexyl group, a straight-chain or branched heptyl group, a straight-chain or branched octyl group, and the like. From the point of view of bulkiness, a branched alkyl group is preferred.

The alicyclic group with 6 or more carbon atoms regarding $R_{b2}$ may be monocyclic or may be polycyclic. Examples of the monocyclic alicyclic group include monocyclic cycloalkyl groups such as a cyclohexyl group and a cyclooctyl group. Examples of the polycyclic alicyclic groups include polycyclic cycloalkyl groups such as a norbornyl group, a tricyclododecanyl group, a tetracyclodecanyl group, a tetracyclododecanyl group, and an adamantyl group. Among these, an alicyclic group which has a bulky structure with 7 or more carbon atoms such as a norbornyl group, a tricyclodecanyl group, a tetracyclodecanyl group, a tetracyclododecanyl group, and an adamantyl group is preferred from the point of view of suppression of the in-film diffusion in the PEB (heating after exposure) step and improvement of Mask Error Enhancement Factor (MEEF).

The aryl group with 6 or more carbon atoms regarding $R_{b2}$ may be monocyclic or may be polycyclic. Examples of the aryl group include a phenyl group, a naphthyl group, a phenanthryl group, and an anthryl group. Among these, a naphthyl group with relatively low light absorbance at 193 nm is preferred.

The heterocyclic ring group with 6 or more carbon atoms regarding $R_{b2}$ may be monocyclic or may be polycyclic; however, the polycyclic type is better able to suppress acids from diffusing. In addition, the heterocyclic ring group may have aromaticity or may not have aromaticity. Examples of a heterocyclic ring which has aromaticity include a benzofuran ring, a benzothiophene ring, a dibenzofuran ring, and a dibenzothiophene ring. Examples of a heterocyclic ring which does not have aromaticity include a tetrahydropyran ring, a lactone ring, and a decahydroisoquinoline ring. A heterocyclic ring in the heterocyclic ring group is particularly preferably a benzofuran ring or a decahydroisoquinoline ring. In addition, examples of the lactone ring include the lactone structure which was exemplified in the resin (P) described above.

The substituent group with 6 or more carbon atoms regarding $R_{b2}$ may further have a substituent group. Examples of the further substituent group include an alkyl group (may be any of straight-chain or branched, preferably with 1 to 12 carbon atoms), a cycloalkyl group (may be any of monocyclic, polycyclic, and a spiro ring, preferably with 3 to 20 carbon atoms), an aryl group (preferably with 6 to 14 carbon atoms), a hydroxy group, an alkoxy group, an ester group, an amide group, an urethane group, an ureide group, a thioether group, a sulfonamide group, and a sulfonic acid ester group. Here, the carbon atoms which configure the alicyclic group, the aryl group, or the heterocyclic ring group described above (carbon atoms which contribute to the ring forming) may be carbonyl carbons.

Specific examples of an anion which is represented by General Formula (B-1) will be given below; however, the present invention is not limited thereto.

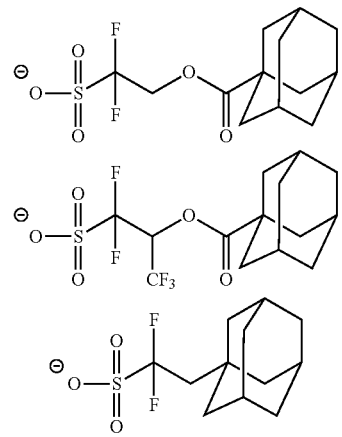

-continued

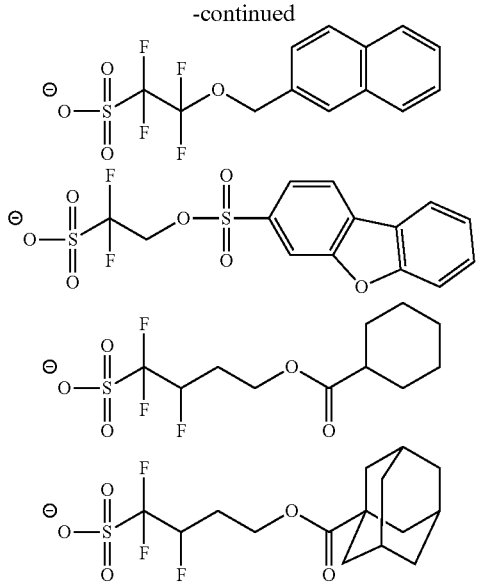

Next, description will be given of an anion which is represented by General Formula (B-2) below.

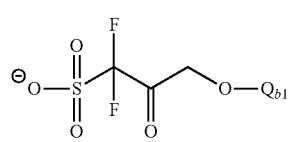
(B-2)

In General Formula (B-2) described above, $Q_{b1}$ represents a group which has a lactone structure, a group which has a sultone structure, or a group which has a cyclic carbonate structure.

Examples of the lactone structure and the sultone structure regarding $Q_{b1}$ include the same examples as for the lactone structure and the sultone structure in the repeating unit which has a lactone structure and a sultone structure previously described in the section about the resin (P). In more detail, examples thereof include the lactone structure which is represented by any of General Formulas (LC1-1) to (LC1-17) described above or the sultone structure which is represented by any of General Formulas (SL1-1) to (SL1-3).

The lactone structure or the sultone structure may be directly bonded with an oxygen atom of an ester group in General Formula (B-2) described above; however, the lactone structure or the sultone structure may be bonded with an oxygen atom of an ester group via an alkylene group (for example, a methylene group or an ethylene group). In this case, it is possible to say that the group which has the lactone structure or the sultone structure is an alkyl group which has the lactone structure or the sultone structure as a substituent group.

A cyclic carbonate structure regarding $Q_{b1}$ is preferably a cyclic carbonate structure of a ring with 5 to 7 members and examples thereof include 1,3-dioxolan-2-one, 1,3-dioxan-2-one, and the like.

The cyclic carbonate structure may be directly bonded with an oxygen atom of an ester group in General Formula (B-2) described above; however, the cyclic carbonate structure may be bonded with an oxygen atom of an ester group via an alkylene group (for example, a methylene group or an ethylene group). In this case, it is possible to say that a group which has the cyclic carbonate structure is an alkyl group which has the cyclic carbonate structure as a substituent group.

Specific examples of an anion which is represented by General Formula (B-2) will be given below; however, the present invention is not limited thereto.

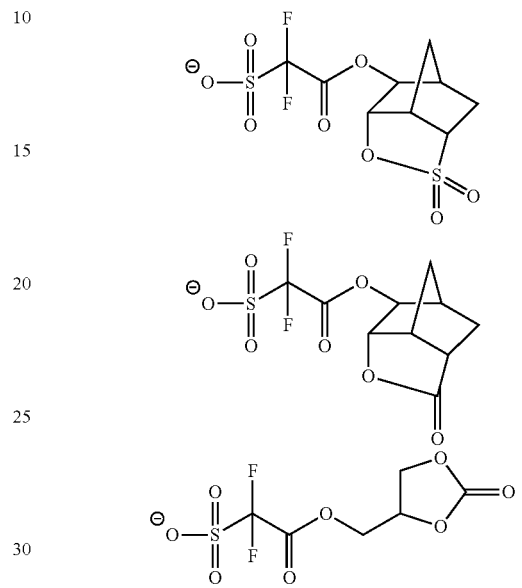

Next, description will be given of an anion which is represented by General Formula (B-3) below.

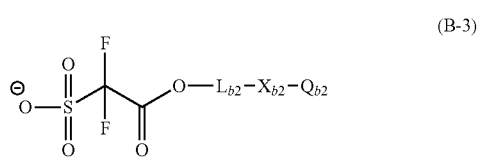
(B-3)

In General Formula (B-3) described above, $L_{b2}$ represents an alkylene group with 1 to 6 carbon atoms and examples thereof include a methylene group, an ethylene group, a propylene group, a butylene group, and the like and an alkylene group with 1 to 4 carbon atoms is preferred.

$X_{b2}$ represents an ether bond or an ester bond (—OCO— or —COO—).

$Q_{b2}$ represents an alicyclic group or a group which contains an aromatic ring.

The alicyclic group regarding $Q_{b2}$ may be monocyclic or may be polycyclic. Examples of the monocyclic alicyclic groups include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among these, an alicyclic group which has a bulky structure with 7 or more carbon atoms such as a norbornyl group, a tricyclodecanyl group, a tetracyclodecanyl group, a tetracyclododecanyl group, and an adamantyl group is preferred.

The aromatic ring in the group which contains an aromatic ring regarding $Q_{b2}$ is preferably an aromatic ring with 6 to 20 carbon atoms and examples thereof include a benzene ring, a naphthalene ring, a phenanthrene ring, an anthracene ring, and the like and a benzene ring or a naphthalene ring is more preferred. The aromatic ring may be substituted with at least one fluorine atom and examples of the aromatic group which is substituted with at least one fluorine atom include a perfluorophenyl group and the like.

The aromatic ring may be directly bonded with $X_{b2}$; however, the aromatic ring may be bonded with $X_{b2}$ via an alkylene group (for example, a methylene group and an ethylene group). In this case, it is possible to say that a group which contains the aromatic ring is an alkyl group which has the aromatic ring as a substituent group.

Specific examples of an anion structure which is represented by General Formula (B-3) will be given below; however, the present invention is not limited thereto.

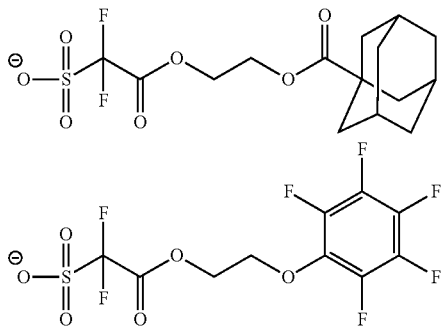

Examples of an organic group which is represented by $R_{201}$, $R_{202}$, and $R_{203}$ include corresponding groups in the compounds (ZI-1), (ZI-2), (ZI-3), and (ZI-4) which will be described below.

Here, the compound may be a compound which has a plurality of structures which are represented by General Formula (ZI). For example, the compound may be a compound which has a structure in which at least one of $R_{201}$ to $R_{203}$ of compounds which are represented by General Formula (ZI) is bonded with at least one of $R_{201}$ to $R_{203}$ of another compound which is represented by General Formula (ZI) via a single bond or a linking group.

Examples of more preferred (ZI) components include the compounds (ZI-1), (ZI-2), (ZI-3), and (ZI-4) which will be described below.

The compound (ZI-1) is an arylsulfonium compound where at least one of $R_{201}$ to $R_{203}$ of General Formula (ZI) described above is an aryl group, that is, a compound which has arylsulfonium as a cation.

With regard to the arylsulfonium compound, all of $R_{201}$ to $R_{203}$ may be aryl groups or some of $R_{201}$ to $R_{203}$ may be aryl group and the remainder may be an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound, and an aryldicycloalkylsulfonium compound.

An aryl group of the arylsulfonium compound is preferably a phenyl group or a naphthyl group, and more preferably a phenyl group. The aryl group may be an aryl group which has a heterocyclic ring structure which has an oxygen atom, a nitrogen atom, a sulfur atom, or the like. Examples of the heterocyclic ring structure include a pyrrole residue, a furan residue, a thiophene residue, an indole residue, a benzofuran residue, a benzothiophene residue, and the like. In a case where the arylsulfonium compound has two or more aryl groups, the two or more aryl groups may be the same or may be different.

The alkyl group or the cycloalkyl group which the arylsulfonium compound has as necessary is preferably a straight-chain or branched alkyl group with 1 to 15 carbon atoms or a cycloalkyl group with 3 to 15 carbon atoms and examples thereof include a methyl group, an ethyl group, a propyl group, an n-butyl group, a sec-butyl group, a t-butyl group, a cyclopropyl group, a cyclobutyl group, a cyclohexyl group, and the like.

The aryl group, the alkyl group, and the cycloalkyl group of $R_{201}$ to $R_{203}$ may have an alkyl group (for example, with 1 to 15 carbon atoms), a cycloalkyl group (for example, with 3 to 15 carbon atoms), an aryl group (for example, with 6 to 14 carbon atoms), an alkoxy group (for example, with 1 to 15 carbon atoms), a halogen atom, a hydroxyl group, or a phenylthio group as a substituent group. The preferred substituent group is a straight-chain or branched alkyl group with 1 to 12 carbon atoms, a cycloalkyl group with 3 to 12 carbon atoms, and a straight-chain, branched, or cyclic alkoxy group with 1 to 12 carbon atoms, and more preferably an alkyl group with 1 to 4 carbon atoms and an alkoxy group with 1 to 4 carbon atoms. The substituent group may be substituted with any one out of three $R_{201}$ to $R_{203}$ or may be substituted with all three. In addition, in a case where $R_{201}$ to $R_{203}$ are aryl groups, the substituent group is preferably substituted at the p-position of the aryl group.

Next, description will be given of the compound (ZI-2).

The compound (ZI-2) is a compound where $R_{201}$ to $R_{203}$ in Formula (ZI) each independently represent an organic group which does not have an aromatic ring. Here, the aromatic ring also encompasses an aromatic ring which contains a hetero atom.

The number of carbon atoms of the organic group which does not have an aromatic ring as $R_{201}$ to $R_{203}$ is generally 1 to 30 and preferably 1 to 20.

$R_{201}$ to $R_{203}$ are each independently preferably an alkyl group, a cycloalkyl group, an allyl group, and a vinyl group, more preferably a straight-chain or branched 2-oxoalkyl group, a 2-oxocycloalkyl group, and an alkoxycarbonylmethyl group, and particularly preferably a straight-chain or branched 2-oxoalkyl group.

Examples of the alkyl group and the cycloalkyl group of $R_{201}$ to $R_{203}$ preferably include a straight-chain or branched alkyl group with 1 to 10 carbon atoms (for example, a methyl group, an ethyl group, a propyl group, a butyl group, and a pentyl group) and a cycloalkyl group with 3 to 10 carbon atoms (a cyclopentyl group, a cyclohexyl group, and a norbornyl group). Examples of the alkyl group more preferably include a 2-oxoalkyl group and an alkoxycarbonylmethyl group. Examples of the cycloalkyl group more preferably include a 2-oxocycloalkyl group.

The 2-oxoalkyl group may be any of straight-chain or branched and preferred examples thereof include a group which has >C=O at the 2-position of the alkyl group described above.

Preferred examples of the 2-oxocycloalkyl group include a group which has >C=O at 2-position of the cycloalkyl group described above.

Preferred examples of the alkoxy group in the alkoxycarbonylmethyl group include an alkoxy group with 1 to 5 carbon atoms (a methoxy group, an ethoxy group, a propoxy group, a butoxy group, and a pentoxy group).

$R_{201}$ to $R_{203}$ may be further substituted with a halogen atom, an alkoxy group (for example, with 1 to 5 carbon atoms), a hydroxyl group, a cyano group, or a nitro group.

Next, description will be given of the compound (ZI-3).

The compound (ZI-3) is a compound which is represented by General Formula (ZI-3) below and which has a phenacylsulfonium salt structure.

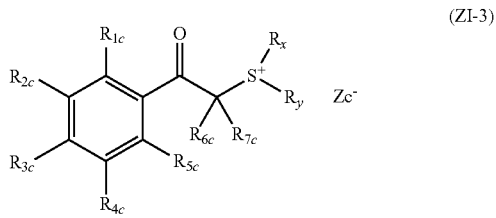

(ZI-3)

In General Formula (ZI-3), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ each independently represent a hydrogen atom, an alkyl group, a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

Any two or more in $R_{1c}$ to $R_{5c}$, $R_{5c}$ and $R_{6c}$, $R_{6c}$ and $R_{7c}$, $R_{5c}$ and $R_x$, and $R_x$ and $R_y$ may each bond with each other to form a ring structure and the ring structure may include an oxygen atom, a sulfur atom, a ketone group, an ester bond, and an amide bond.

Examples of the ring structure described above include an aromatic or non-aromatic hydrocarbon ring, an aromatic or non-aromatic heterocyclic ring, or a polycyclic fused ring formed by two or more of the rings being combined. Examples of the ring structure include a ring with 3 to 10 members, and a ring with 4 to 8 members is preferred and a ring with 5 or 6 members is more preferred.

Examples of the group which any two or more in $R_{1c}$ to $R_{5c}$, $R_{6c}$ and $R_{1c}$, and $R_x$ and $R_y$ bond with each other to form include a butylene group, a pentylene group, and the like.

The group which $R_{5c}$ and $R_{6c}$ and $R_{5c}$ and $R_x$ bond with each other to form is preferably a single bond or an alkylene group and examples of the alkylene group include a methylene group, an ethylene group, and the like.

$Zc^-$ represents a non-nucleophilic anion and examples thereof include the same non-nucleophilic anion as $Z^-$ in General Formula (ZI).

The alkyl group as $R_{1c}$ to $R_{7c}$ may be any of straight-chain or branched and examples thereof include an alkyl group with 1 to 20 carbon atoms, preferably a straight-chain or branched alkyl group with 1 to 12 carbon atoms (for example, a methyl group, an ethyl group, a straight-chain or branched propyl group, a straight-chain or branched butyl group, and a straight-chain or branched pentyl group) and examples of the cycloalkyl group include a cycloalkyl group with 3 to 10 carbon atoms (for example, a cyclopentyl group and a cyclohexyl group).

The aryl group as $R_{1c}$ to $R_{5c}$ is preferably an aryl group with 5 to 15 carbon atoms and examples thereof include a phenyl group and a naphthyl group.

The alkoxy group as $R_{1c}$ to $R_{5c}$ may be any of straight-chain, branched, and cyclic and examples thereof include an alkoxy group with 1 to 10 carbon atoms, preferably a straight-chain or branched alkoxy group with 1 to 5 carbon atoms (for example, a methoxy group, an ethoxy group, a straight-chain or branched propoxy group, a straight-chain or branched butoxy group, and a straight-chain or branched pentoxy group) and a cyclic alkoxy group with 3 to 10 carbon atoms (for example, a cyclopentyloxy group and a cyclohexyloxy group).

Specific examples of the alkoxy group in the alkoxycarbonyl group as $R_{1c}$ to $R_{5c}$ are the same as the specific examples of the alkoxy group as the $R_{1c}$ to $R_{5c}$.

Specific examples of the alkyl group in the alkoxycarbonyloxy group and the alkylthio group as $R_{1c}$ to $R_{5c}$ are the same as the specific examples of the alkyl group as the $R_{1c}$ to $R_{5c}$.

Specific examples of the cycloalkyl group in the cycloalkylcarbonyloxy group as $R_{1c}$ to $R_{5c}$ are the same examples as for the specific examples of the cycloalkyl group as $R_{1c}$ to $R_{5c}$.

Specific examples of an aryl group in the aryloxy group and the arylthio group as $R_{1c}$ to $R_{5c}$ are the same examples as for the specific examples of the aryl group as the $R_{1c}$ to $R_{5c}$.

Any out of $R_{1c}$ to $R_{5c}$ are preferably straight-chain or branched alkyl groups, a cycloalkyl group, or a straight-chain, branched, or cyclic alkoxy group, and the total number of carbon atoms of $R_{1c}$ to $R_{5c}$ is more preferably 2 to 15. Due to this, the solvent solubility is further improved and the generation of particles during storage is suppressed.

Preferred examples of a ring structure which any two or more of $R_{1c}$ to $R_{5c}$ may bond with each other to form include a ring with 5 members of 6 members and particularly preferably include a ring with 6 members (for example, a phenyl ring).

Examples of a ring structure which $R_{5c}$ and $R_{6c}$ may bond with each other to form include a ring with 4 or more members (particularly preferably a ring with 5 or 6 members) which a carbonyl carbon atom in General Formula (ZI-3) forms with a carbon atom by $R_{5c}$ and $R_{6c}$ bond with each other to configure a single bond or an alkylene group (a methylene group, an ethylene group, and the like).

The aryl group as $R_{6c}$ and $R_{7c}$ is preferably an aryl group with 5 to 15 carbon atoms and examples thereof include a phenyl group and a naphthyl group.

An aspect of $R_{6c}$ and $R_{7c}$ is preferably a case where both thereof are alkyl groups. In particular, a case where $R_{6c}$ and $R_{7c}$ are each a straight-chain or branched alkyl group with 1 to 4 carbon atoms is preferred and in particular, a case where both are a methyl group is preferred.

In addition, in a case where $R_{6c}$ and $R_{7c}$ bond with each other to form a ring, the ring which $R_{6c}$ and $R_{7c}$ bond with each other to form is preferably an alkylene group with 2 to 10 carbon atoms and examples thereof include an ethylene group, a propylene group, a butylene group, a pentylene group, a hexylene group, or the like. In addition, the ring which $R_{6c}$ and $R_{7c}$ bond with each other to form may have a hetero atom such as an oxygen atom in a ring.

Examples of the alkyl group and the cycloalkyl group as $R_x$ and $R_y$ include the same alkyl groups and the cycloalkyl groups in $R_{1c}$ to $R_{7c}$.

Examples of the 2-oxoalkyl group and the 2-oxocycloalkyl group as $R_x$ and $R_y$ include a group which has >C=O at the 2-position of the alkyl group and the cycloalkyl group as $R_{1c}$ to $R_{7c}$.

Examples of the alkoxy group in the alkoxycarbonylalkyl group as $R_x$ and $R_y$ include the same alkoxy groups in $R_{1c}$ to $R_{5c}$ and examples of the alkyl group include an alkyl group with 1 to 12 carbon atoms and preferably include a straight-chain alkyl group with 1 to 5 carbon atoms (for example, a methyl group and an ethyl group).

There is no particular limit on the allyl group as $R_x$ and $R_y$; however, an unsubstituted allyl group or an allyl group which is substituted with a monocyclic or polycyclic cycloalkyl group (preferably a cycloalkyl group with 3 to 10 carbon atoms) is preferred.

There is no particular limit on the vinyl group as $R_x$ and $R_y$; however, an unsubstituted vinyl group or a vinyl group which is substituted with a monocyclic or polycyclic cycloalkyl group (preferably a cycloalkyl group with 3 to 10 carbon atoms) is preferred.

Examples of the ring structure which $R_{5c}$ and $R_x$ may bond with each other to form include a ring with 5 or more members (particularly preferably a ring with 5 members) which is formed with a sulfur atom and a carbonyl carbon atom in General Formula (ZI-3) by $R_{5c}$ and $R_x$ bond with each other to configure a single bond or an alkylene group (a methylene group, an ethylene group, and the like).

Examples of the ring structure which $R_x$ and $R_y$ may bond with each other to form include a ring with 5 members or 6 members which the divalent $R_x$ and $R_y$ (for example, a methylene group, an ethylene group, a propylene group, and the like) form with a sulfur atom in General Formula (ZI-3) and particularly preferably include a ring with 5 members (that is, a tetrahydrothiophene ring).

$R_x$ and $R_y$ are preferably an alkyl group or a cycloalkyl group with 4 or more carbon atoms, more preferably with 6 or more carbon atoms, and even more preferably an alkyl group or a cycloalkyl group with 8 or more carbon atoms.

$R_{1c}$ to $R_{7c}$, $R_x$, and $R_y$ may further have a substituent group and examples of the substituent group include a halogen atom (for example, a fluorine atom), a hydroxyl group, a carboxyl group, a cyano group, a nitro group, an alkyl group, a cycloalkyl group, an aryl group, an alkoxy group, an aryloxy group, an acyl group, an arylcarbonyl group, an alkoxyalkyl group, an aryloxyalkyl group, an alkoxycarbonyl group, an aryloxycarbonyl group, an alkoxycarbonyloxy group, an aryloxycarbonyloxy group, and the like.

In General Formula (ZI-3) described above, it is more preferred that $R_{1c}$, $R_{2c}$, $R_{4c}$, and $R_{5c}$ each independently represent a hydrogen atom and that $R_{1c}$ represents a group other than a hydrogen atom, that is, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

Examples of the cation of the compound which is represented by General Formula (ZI-2) or (ZI-3) in the present invention include the specific examples below.

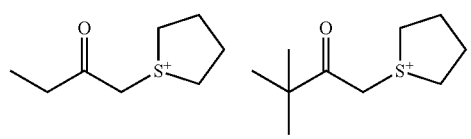

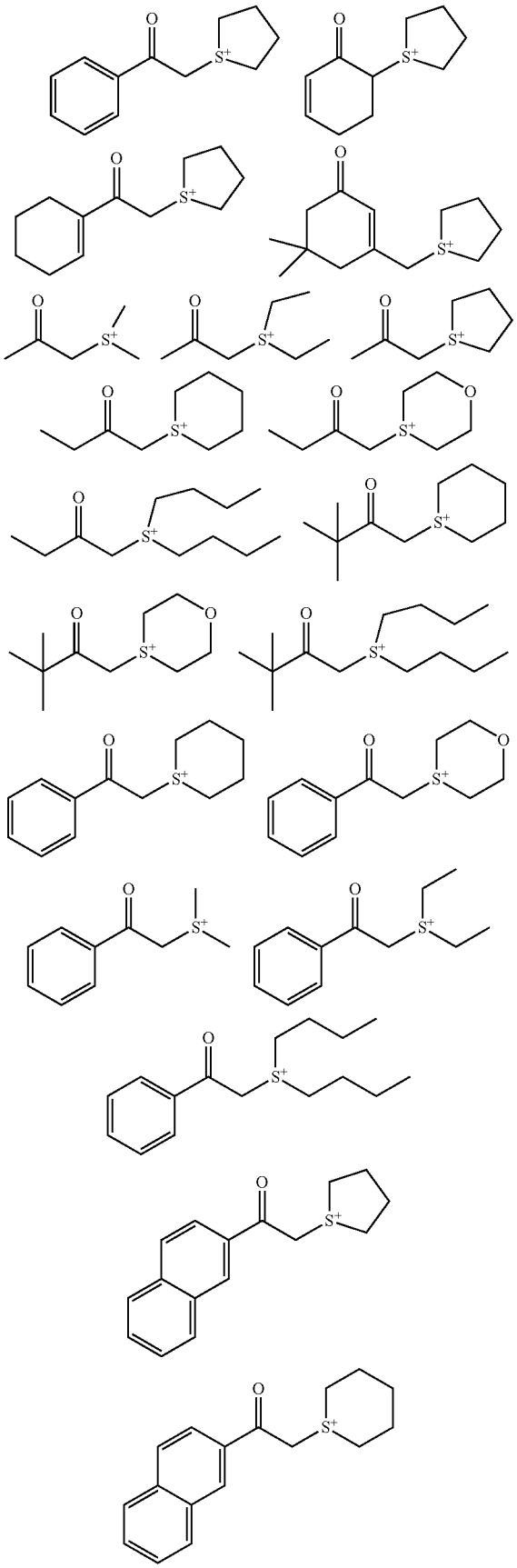

125
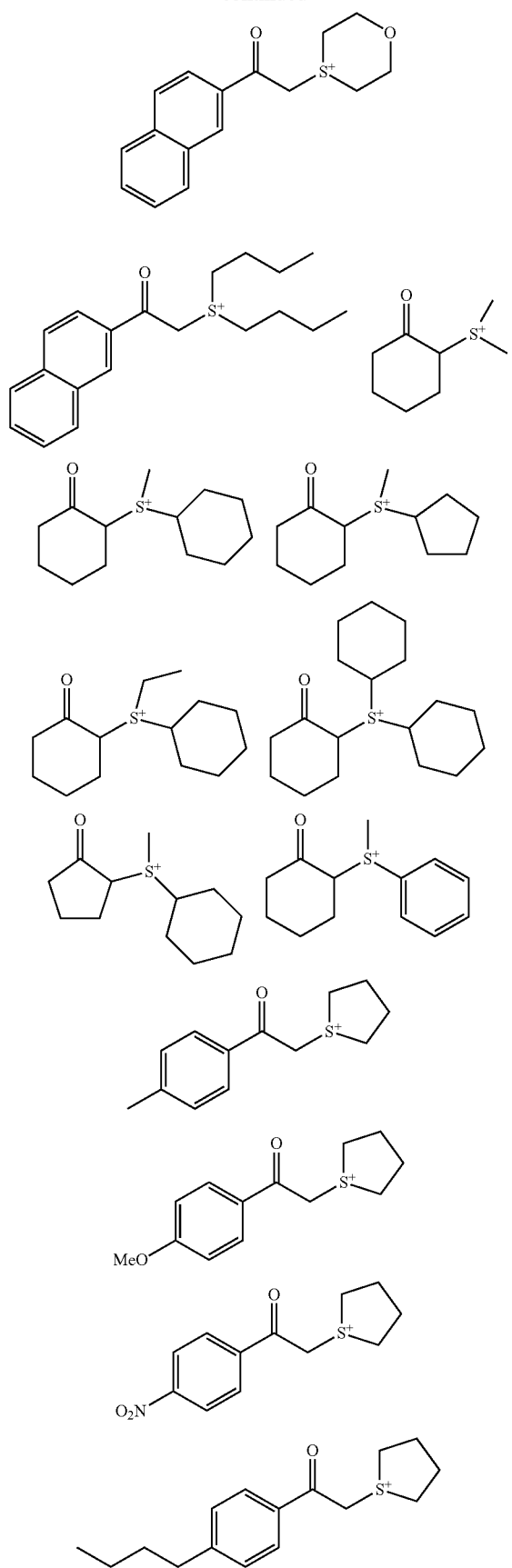
126
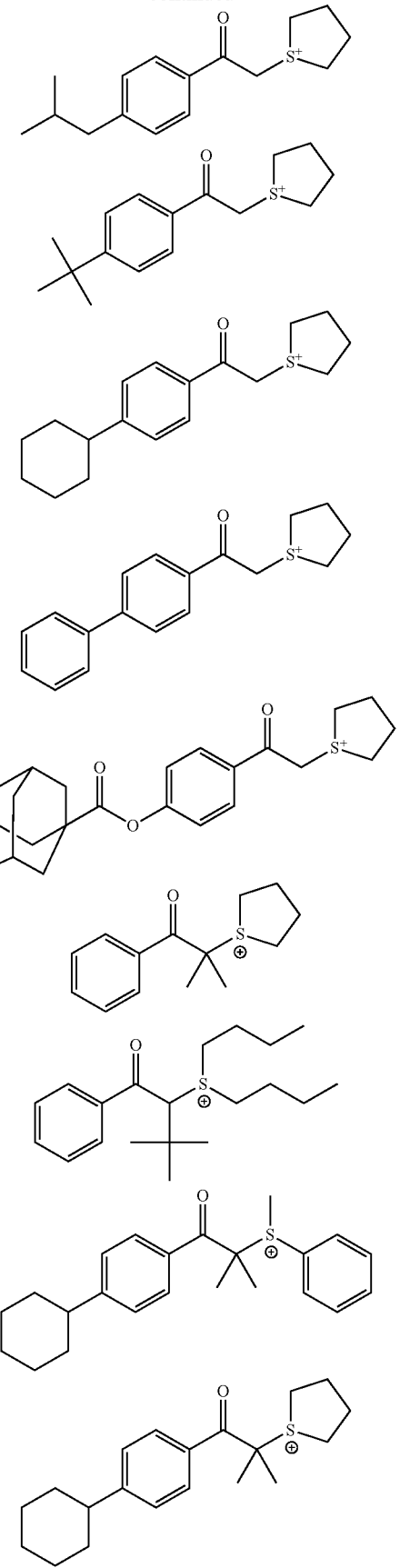

127
-continued
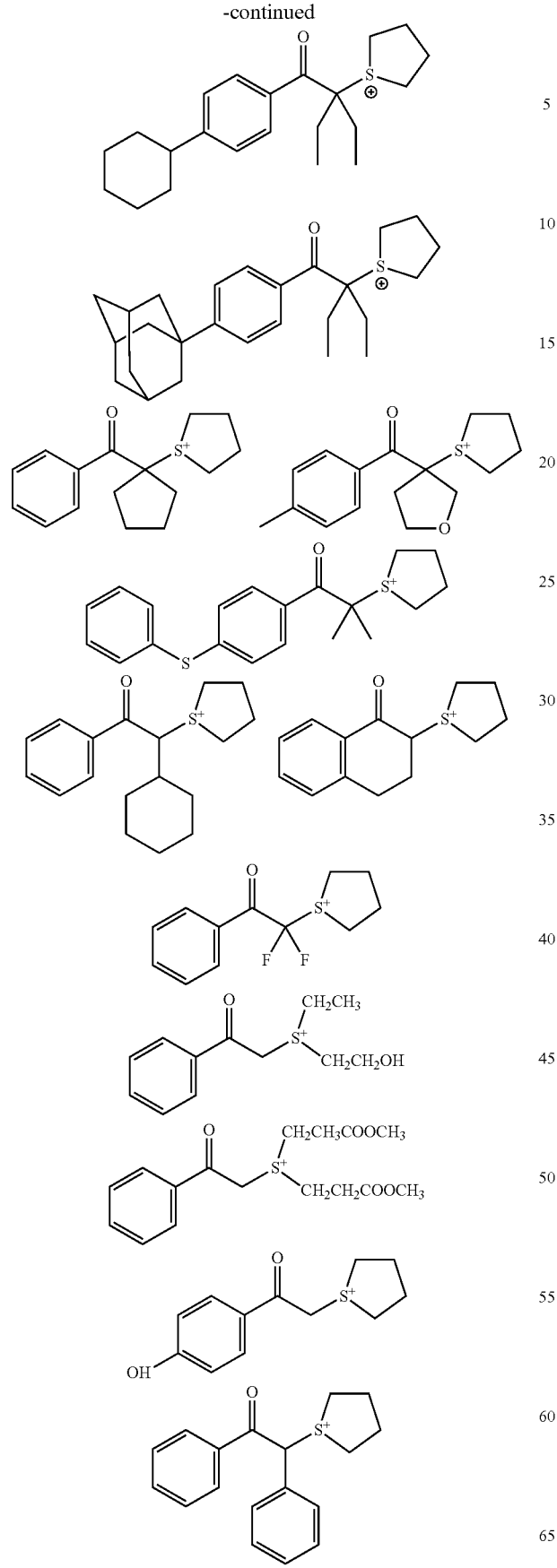
128
-continued
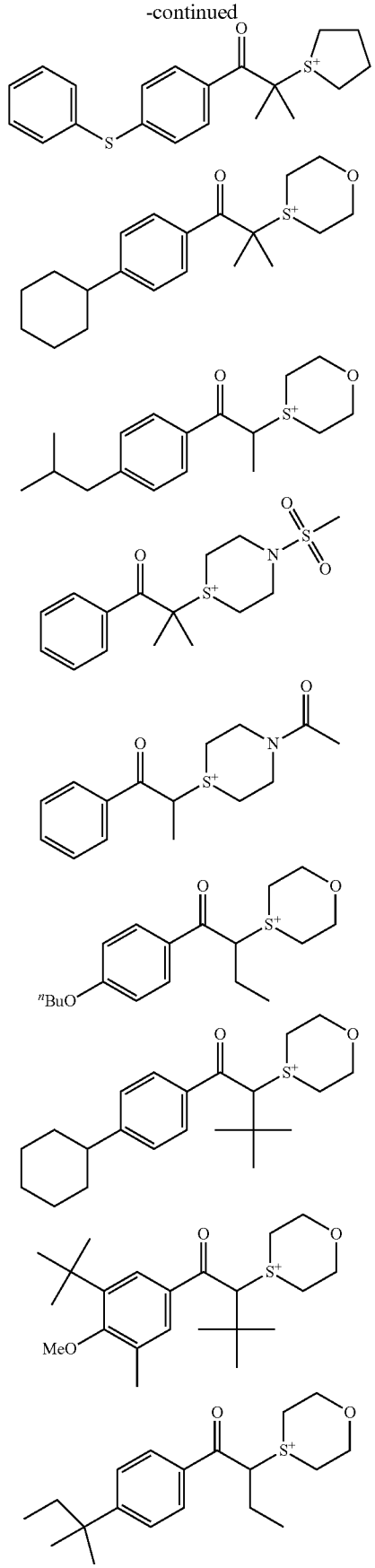

-continued

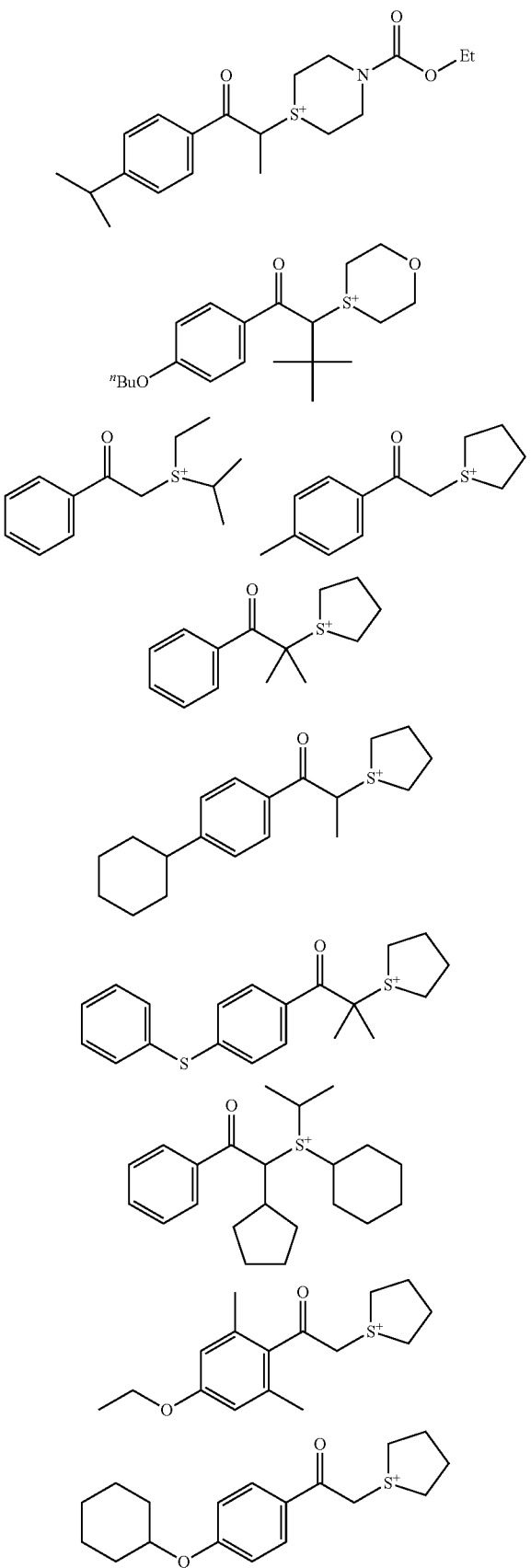

-continued

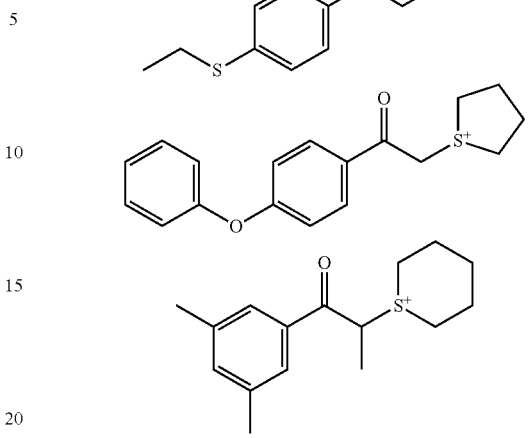

Next, description will be given of the compound (ZI-4).
The compound (ZI-4) is represented by General Formula (ZI-4) below.

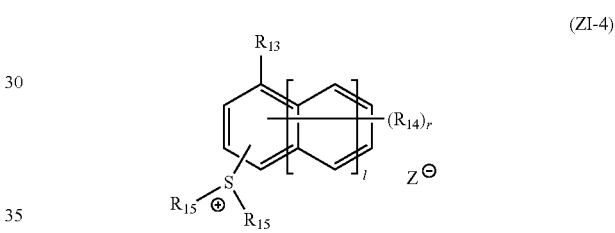

(ZI-4)

In General Formula (ZI-4), $R_{13}$ represents a hydrogen atom, a fluorine atom, a hydroxyl group, an alkyl group, a cycloalkyl group, an alkoxy group, an alkoxycarbonyl group, or a group which has a cycloalkyl group. These groups may have a substituent group.

In a case where a plurality of $R_{14}$ are present, $R_{14}$ each independently represent a hydroxyl group, an alkyl group, a cycloalkyl group, an alkoxy group, an alkoxycarbonyl group, an alkylcarbonyl group, an alkylsulfonyl group, a cycloalkylsulfonyl group, or a group which has a cycloalkyl group. These groups may have a substituent group.

$R_{15}$ each independently represent an alkyl group, a cycloalkyl group, or a naphthyl group. Two $R_{15}$ may bond with each other to form a ring. These groups may have a substituent group.

l represents an integer of 0 to 2.

r represents an integer of 0 to 8.

$Z^-$ represents a non-nucleophilic anion and examples thereof include the same non-nucleophilic anion as $Z^-$ in General Formula (ZI).

In General Formula (ZI-4), the alkyl group of $R_{13}$, $R_{14}$, and $R_{15}$ is in a straight-chain form or a branched form, preferably an alkyl group with 1 to 10 carbon atoms, and preferably a methyl group, an ethyl group, an n-butyl group, a t-butyl group, or the like.

Examples of the cycloalkyl group of $R_{13}$, $R_{14}$, and $R_{15}$ include a monocyclic or polycyclic cycloalkyl group (preferably a cycloalkyl group with 3 to 20 carbon atoms) and cyclopropyl, cyclopentyl, cyclohexyl, cycloheptyl, and cyclooctyl are particularly preferred.

The alkoxy group of $R_{13}$ and $R_{14}$ is in a straight-chain form or a branched form, preferably an alkoxy group with 1 to 10 carbon atoms, and preferably a methoxy group, an ethoxy group, an n-propoxy group, an n-butoxy group, or the like.

The alkoxycarbonyl group of $R_{13}$ and $R_{14}$ is in a straight-chain form or a branched form, preferably an alkoxycarbonyl group with 2 to 11 carbon atoms, and preferably a methoxycarbonyl group, an ethoxycarbonyl group, an n-butoxycarbonyl group, or the like.

Examples of the group which has a cycloalkyl group of $R_{13}$ and $R_{14}$ include a monocyclic or polycyclic cycloalkyl group (preferably a cycloalkyl group with 3 to 20 carbon atoms) and examples thereof include a monocyclic or polycyclic cycloalkyloxy group and an alkoxy group which has a monocyclic or polycyclic cycloalkyl group. The groups may further have a substituent group.

The monocyclic or polycyclic cycloalkyloxy group of $R_{13}$ and $R_{14}$ preferably has 7 or more carbon atoms in total, more preferably has 7 or more to 15 or less carbon atoms in total, and moreover, preferably has a monocyclic cycloalkyl group. The monocyclic cycloalkyloxy group with 7 or more of all of the carbon atoms is a monocyclic cycloalkyloxy group which arbitrarily has a substituent group such as an alkyl group, a hydroxyl group, a halogen atom (fluorine, chlorine, bromine, and iodine), a nitro group, a cyano group, an amide group, a sulfonamide group, an alkoxy group, an alkoxycarbonyl group, an acyl group, an acyloxy group, and a carboxy group in a cycloalkyloxy group such as a cyclopropyloxy group, a cyclobutyloxy group, a cyclopentyloxy group, a cyclohexyloxy group, a cycloheptyloxy group, a cyclooctyloxy group, and a cyclododecanyloxy group and represents a monocyclic cycloalkyloxy group where the total number of carbon atoms including the number of carbon atoms of the arbitrary substituent group on the cycloalkyl group is 7 or more.

In addition, examples of the polycyclic cycloalkyloxy group with 7 or more of all of the carbon atoms include a norbornyloxy group, a tricyclodecanyloxy group, a tetracyclodecanyloxy group, an adamantyloxy group, and the like.

The alkoxy group which has a monocyclic or polycyclic cycloalkyl group of $R_{13}$ and $R_{14}$ preferably has 7 or more carbon atoms in total, more preferably has 7 or more to 15 or less carbon atoms in total, and moreover, is preferably an alkoxy group which has a monocyclic cycloalkyl group. The alkoxy group with 7 or more of the total carbon atoms which has a monocyclic cycloalkyl group is an alkoxy group where the monocyclic cycloalkyl group which may have a substituent group described above is substituted with an alkoxy group such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy, and iso-amyloxy and represents an alkoxy group where the total number of carbon atoms including a substituent group is 7 or more. For example, a cyclohexylmethoxy group is preferred.

In addition, the alkoxy group which has a polycyclic cycloalkyl group with 7 or more of the total number of carbon atoms is preferably a norbornylmethoxy group, a norbornylethoxy group, and the like.

Examples of the alkyl group of the alkylcarbonyl group of $R_{14}$ include the same specific examples as the alkyl group as $R_{13}$ to $R_{15}$ described above.

The alkylsulfonyl group and the cycloalkylsulfonyl group of $R_{14}$ are in a straight-chain form, a branched form, and a cyclic form and preferably a group with 1 to 10 carbon atoms.

Examples of the substituent group which each of the groups described above may have include a halogen atom (for example, a fluorine atom), a hydroxyl group, a carboxyl group, a cyano group, a nitro group, an alkoxy group, an alkoxyalkyl group, an alkoxycarbonyl group, an alkoxycarbonyloxy group, and the like.

Examples of the alkoxy group include a cyclic alkoxy group with 1 to 20 carbon atoms in a straight-chain form, a branched form, or a cyclic form and the like.

Examples of the alkoxyalkyl group include an alkoxyalkyl group with 2 to 21 carbon atoms in a straight-chain form, a branched form, or a cyclic form and the like.

Examples of the alkoxycarbonyl group include an alkoxycarbonyl group with 2 to 21 carbon atoms in a straight-chain form, a branched form, or a cyclic form and the like.

Examples of the alkoxycarbonyloxy group include an alkoxycarbonyloxy group with 2 to 21 carbon atoms in a straight-chain form, a branched form, or a cyclic form and the like.

Examples of the ring structure which two of $R_{15}$ may bond with each other to form include a ring with 5 members or 6 members which two of $R_{15}$ form with a sulfur atom in General Formula (ZI-4) and particularly preferably include a ring with 5 members (that is, a tetrahydrothiophene ring) and the ring structure may be condensed with an aryl group or a cycloalkyl group. The two $R_{15}$'s may have a substituent group and examples of the substituent group include a hydroxyl group, a carboxyl group, a cyano group, a nitro group, an alkyl group, a cycloalkyl group, an alkoxy group, an alkoxyalkyl group, an alkoxycarbonyl group, an alkoxycarbonyloxy group, and the like. A plurality of the substituent groups may be present in the ring structure and also may bond with each other to form a ring (an aromatic or non-aromatic hydrocarbon ring, an aromatic or non-aromatic heterocyclic ring, or a polycyclic fused ring formed by two or more of the rings being combined).

$R_{15}$ in General Formula (ZI-4) is preferably a methyl group, an ethyl group, a naphthyl group, a divalent group where two $R_{15}$'s may bond with each other to form a tetrahydrothiophene ring structure with a sulfur atom, and the like.

The substituent group which $R_{13}$ and $R_{14}$ may have is preferably a hydroxyl group, an alkoxy group, an alkoxycarbonyl group, and a halogen atom (in particular, a fluorine atom).

l is preferably 0 or 1 and more preferably 1.

r is preferably 0 to 2.

Examples of the cation of the compound which is represented by General Formula (ZI-4) in the present invention include the specific examples below.

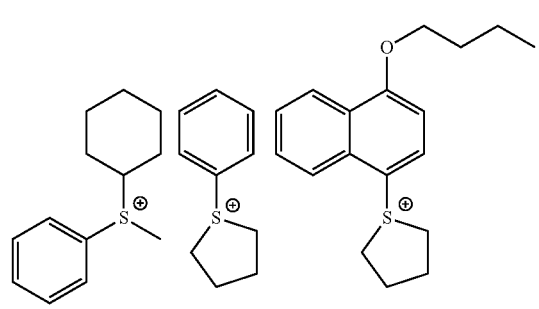

133
-continued
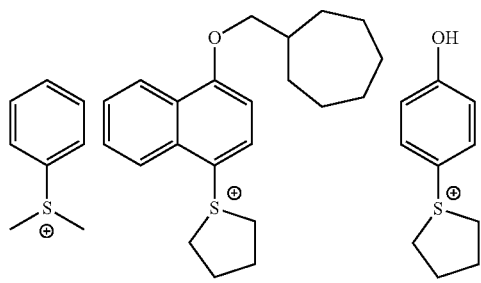
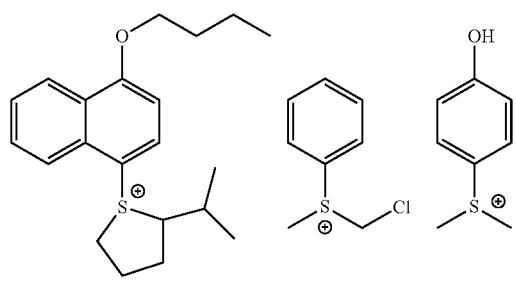
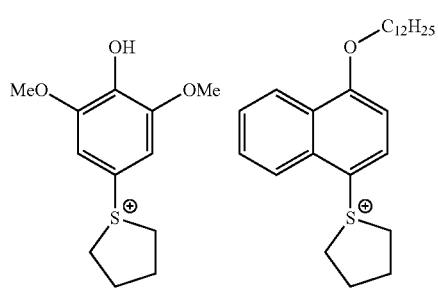
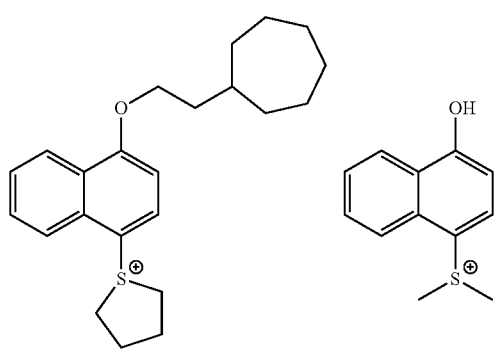
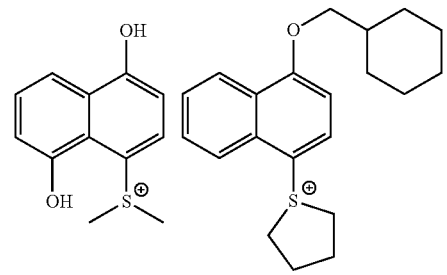
134
-continued
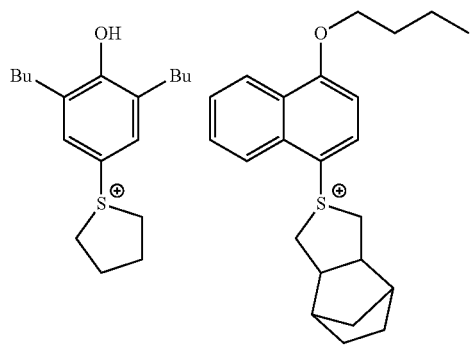
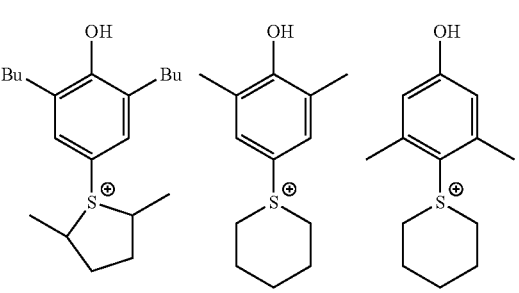
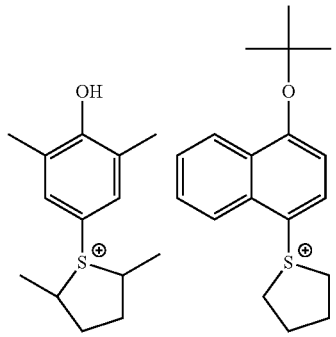
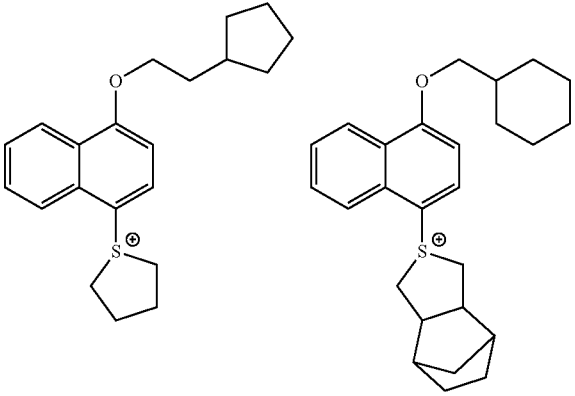
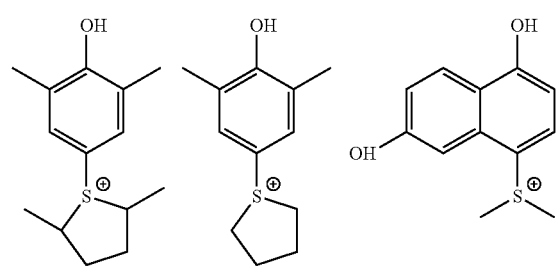

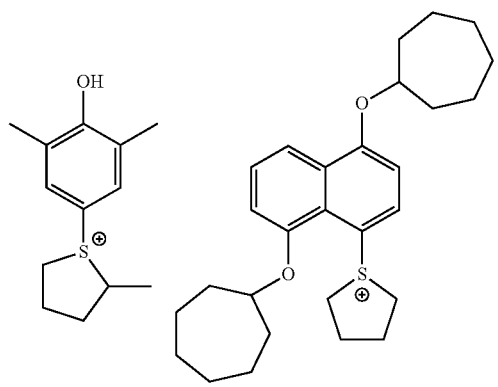
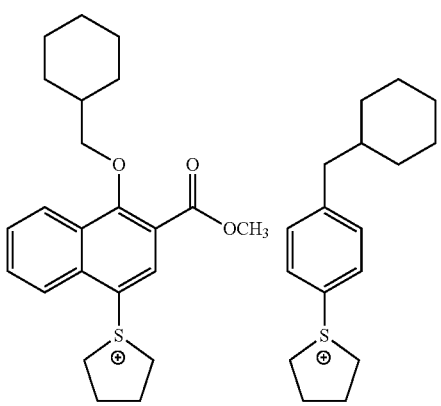
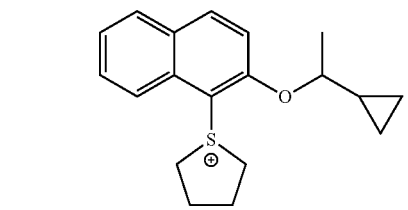
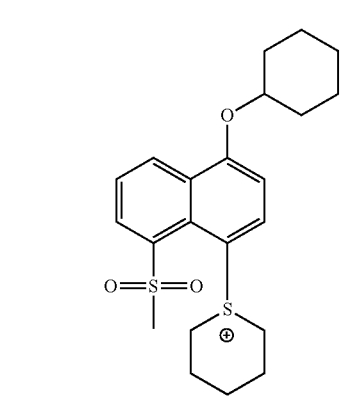
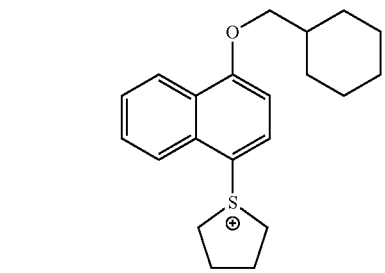
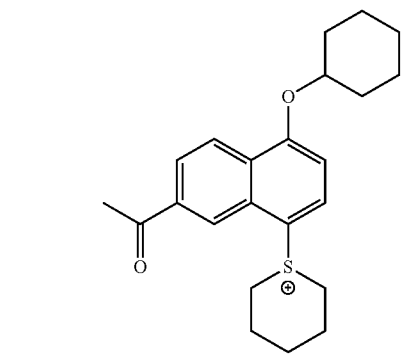
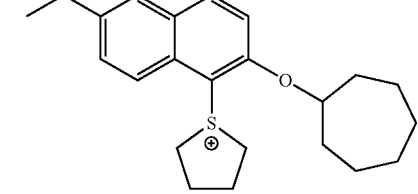
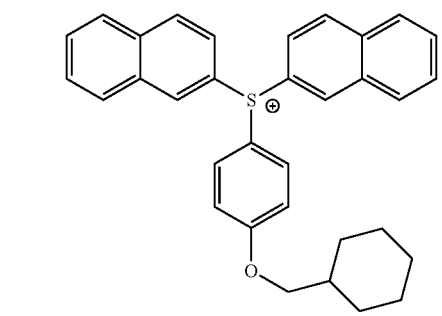
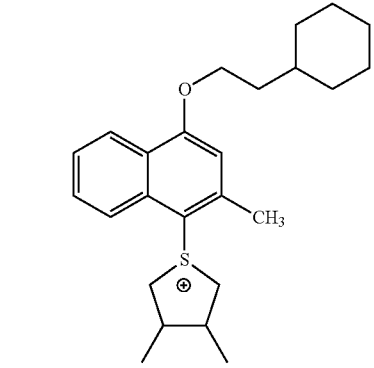

-continued

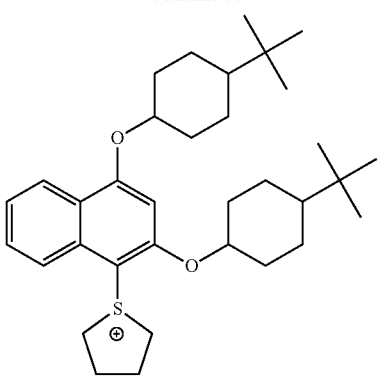

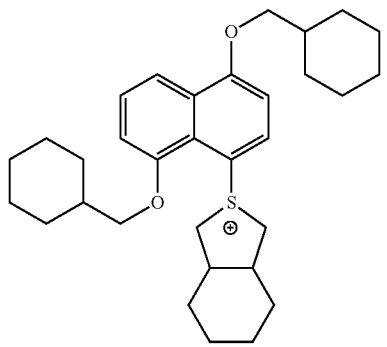

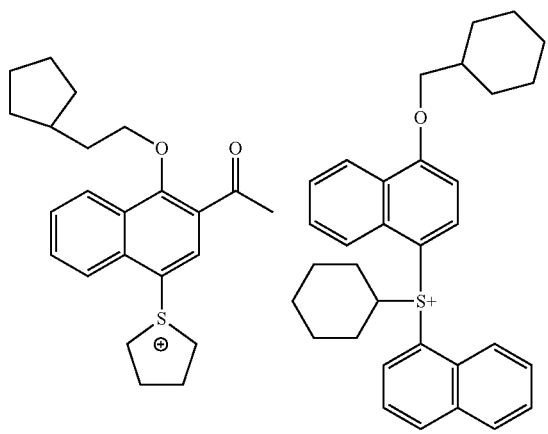

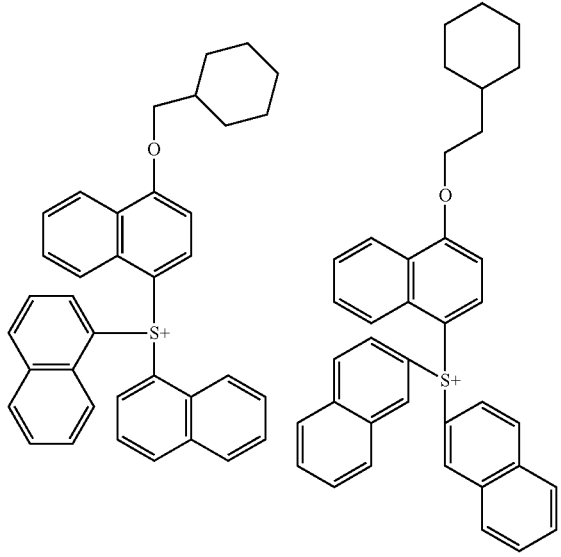

-continued

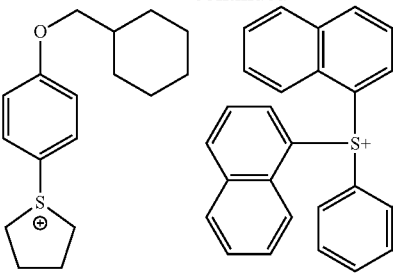

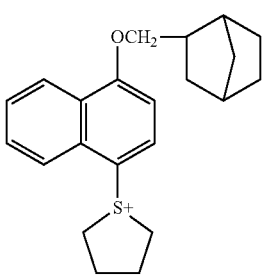

Next, description will be given of General Formulas (ZII) and (ZIII).

In General Formulas (ZII) and (ZIII), $R_{204}$ to $R_{207}$ each independently represent an aryl group, an alkyl group, or a cycloalkyl group.

The aryl group of $R_{204}$ to $R_{207}$ is preferably a phenyl group and a naphthyl group and more preferably a phenyl group. The aryl group of $R_{204}$ to $R_{207}$ may be an aryl group which has a heterocyclic ring structure which has an oxygen atom, a nitrogen atom, a sulfur atom, and the like. Examples of a skeleton of an aryl group which has a heterocyclic ring structure include pyrrole, furan, thiophene, indole, benzofuran, benzothiophene, and the like.

Examples of the alkyl group and the cycloalkyl group in $R_{204}$ to $R_{207}$ preferably include a straight-chain or branched alkyl group with 1 to 10 carbon atoms (for example, a methyl group, an ethyl group, a propyl group, a butyl group, and a pentyl group) and a cycloalkyl group with 3 to 10 carbon atoms (a cyclopentyl group, a cyclohexyl group, and a norbornyl group).

The aryl group, the alkyl group, and the cycloalkyl group of $R_{204}$ to $R_{207}$ may have a substituent group. Examples of the substituent group which the aryl group, the alkyl group, and the cycloalkyl group of $R_{204}$ to $R_{207}$ may have include an alkyl group (for example, with 1 to 15 carbon atoms), a cycloalkyl group (for example, with 3 to 15 carbon atoms), an aryl group (for example, with 6 to 15 carbon atoms), an alkoxy group (for example, with 1 to 15 carbon atoms), a halogen atom, a hydroxyl group, a phenylthio group, and the like.

$Z^-$ represents a non-nucleophilic anion and examples thereof include the same examples as the non-nucleophilic anion of $Z^-$ in General Formula (ZI).

Examples of the acid generating agent also further include the compounds which are represented by General Formulas (ZIV), (ZV), and (ZVI) below.

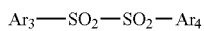 (ZIV)

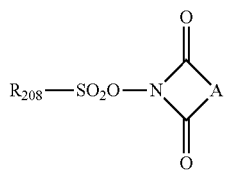 (ZV)

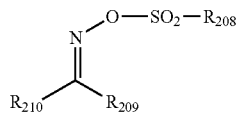 (ZVI)

In General Formulas (ZIV) to (ZVI), $Ar_3$ and $Ar_4$ each independently represent an aryl group.

$R_{208}$, $R_{209}$, and $R_{210}$ each independently represent an alkyl group, a cycloalkyl group, or an aryl group.

A represents an alkylene group, an alkenylene group, or an arylene group.

Specific examples of the aryl group of $Ar_3$, $Ar_4$, $R_{208}$, $R_{209}$, and $R_{210}$ include the same examples as the specific examples of the aryl group as $R_{201}$, $R_{202}$, and $R_{203}$ in General Formula (ZI-1) described above.

Specific examples of the alkyl group and the cycloalkyl group of $R_{208}$, $R_{209}$, and $R_{210}$ respectively include the same examples as the specific examples of the alkyl group and the cycloalkyl group as $R_{201}$, $R_{202}$, and $R_{203}$ in General Formula (ZI-2) described above.

Examples of the alkylene group of A include an alkylene group with 1 to 12 carbon atoms (for example, a methylene group, an ethylene group, a propylene group, an isopropylene group, a butylene group, an isobutylene group, and the like), examples of the alkenylene group of A include an alkenylene group with 2 to 12 carbon atoms (for example, an ethenylene group, a propenylene group, a butenylene group, and the like), and examples of the arylene group of A include an arylene group with 6 to 10 carbon atoms (for example, a phenylene group, a tolylene group, a naphthylene group, and the like).

Out of the acid generating agents, a compound which is represented by General Formulas (ZI) to (ZIII) is more preferred.

In addition, an acid generating agent is preferably a compound which generates acid which has one sulfonic acid group or imide group, more preferably a compound which generates a monovalent perfluoroalkane sulfonic acid, a compound which generates an aromatic sulfonic acid which is substituted with a monovalent fluorine atom or a group which contains a fluorine atom, or a compound which generates an imide acid which is substituted with a monovalent fluorine atom or a group which contains a fluorine atom, and even more preferably fluorinated substituted alkane sulfonic acid, fluorine-substituted benzene sulfonic acid, fluorine-substituted imide acid, or sulfonium salt of fluorine-substituted methide acid. The usable acid generating agent is particularly preferably fluorinated substituted alkane sulfonic acid, fluorinated substituted benzene sulfonic acid, or fluorinated substituted imide acid of which the pKa of the generated acid is −1 or less, by which the sensitivity is improved.

Particularly preferred examples among acid generating agents will be given below.

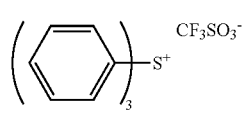 (z1)

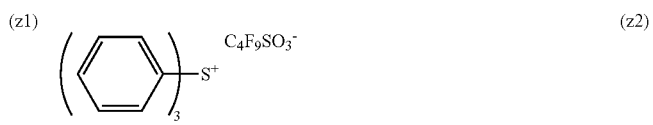 (z2)

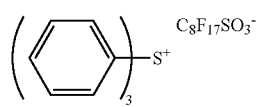 (z3)

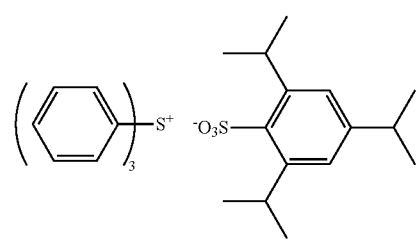 (z4)

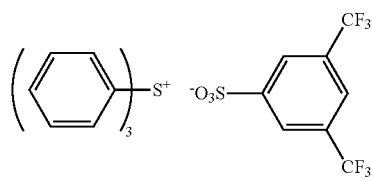 (z5)

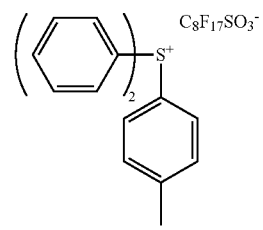 (z6)

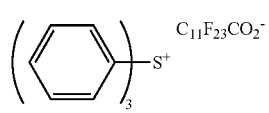 (z7)

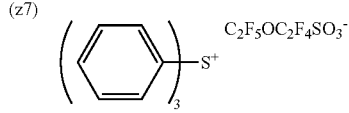 (z8)

-continued
(z9) 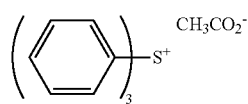
(z10) 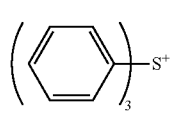
(z11) 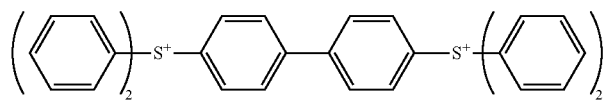
(z12) 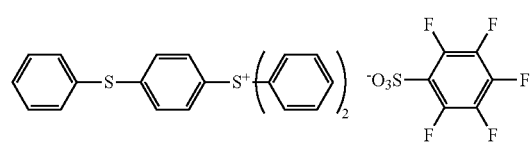
(z13) 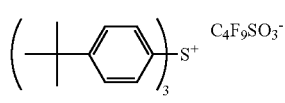
(z14) 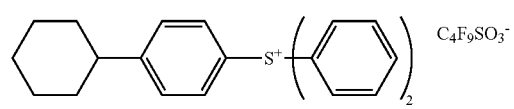
(z15) 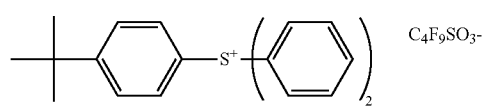
(z16) 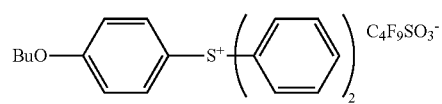
z(17) 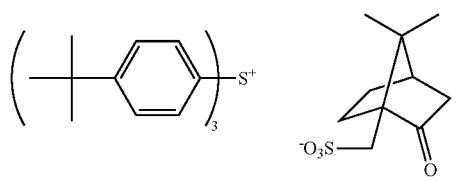
(z18) 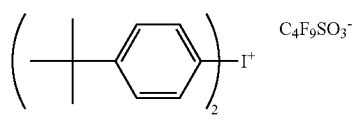
(z19) 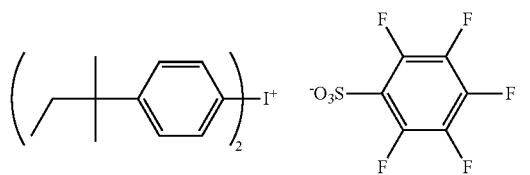
(z20) 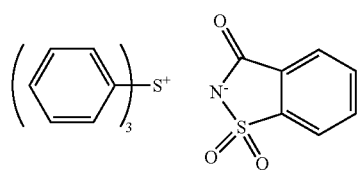
(z21) 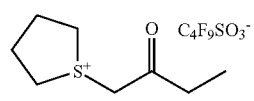
(z22) 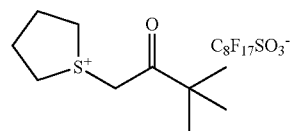
(z23) 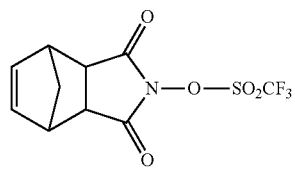
(z24) 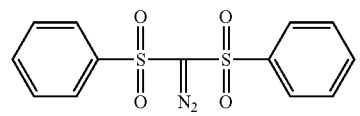
(z25) 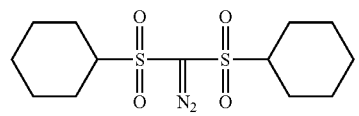
(z26) 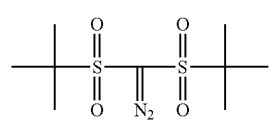
(z27) 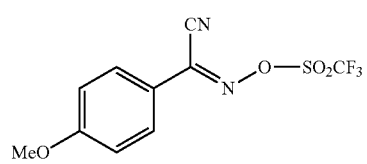

-continued
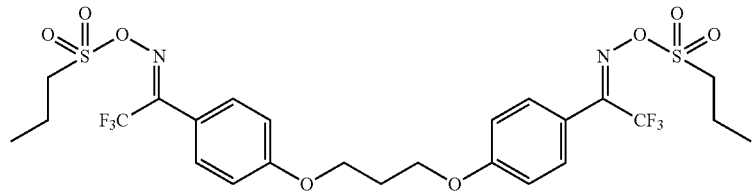 (z28)
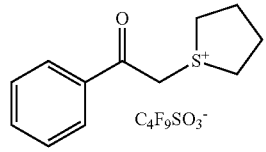 (z29)
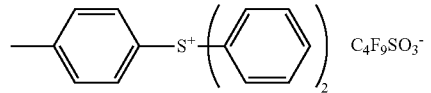 (z30)
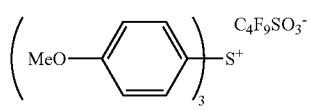 (z31)
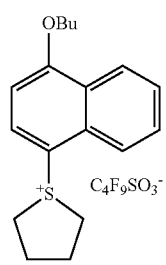 (z32)
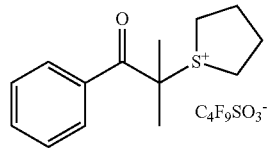 (z33)
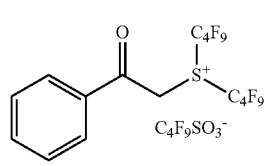 (z34)
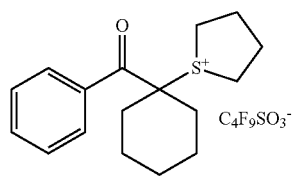 (z35)
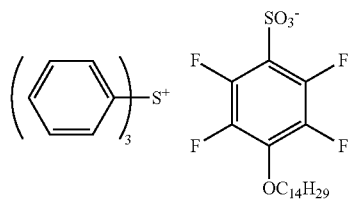 (z36)
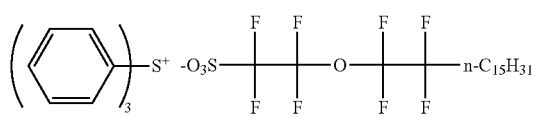 (z37)
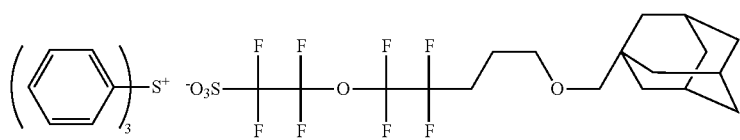 (z38)
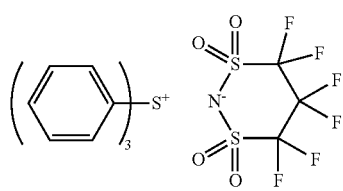 (z39)
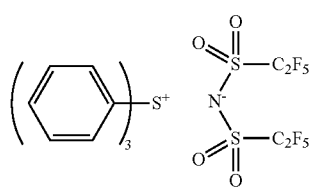 (z40)

-continued
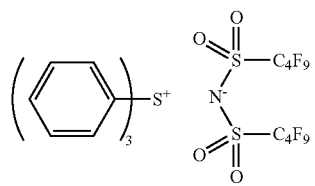 (z41)
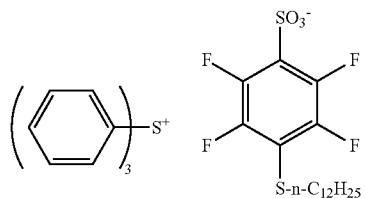 (z42)
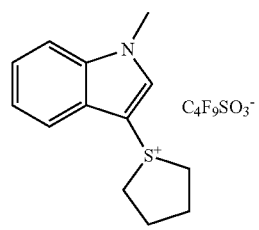 (z43)
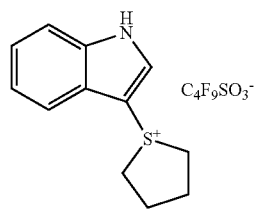 (z44)
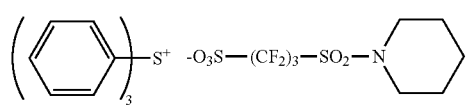 (z45)
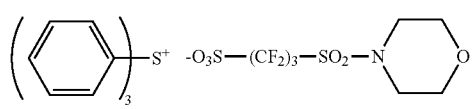 (z46)
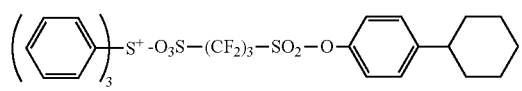 (z47)
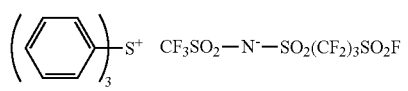 (z48)
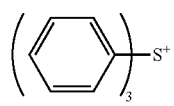 (z49)
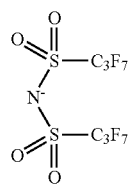 (z50)
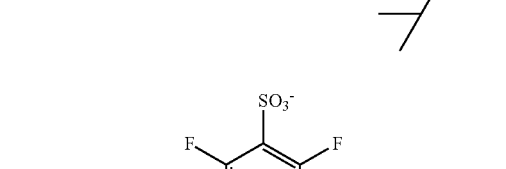 (z51)
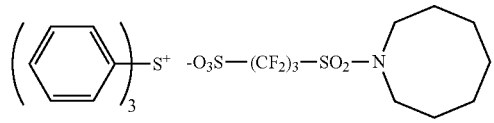 (z52)
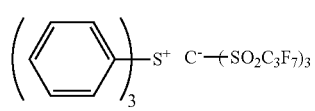 (z54)
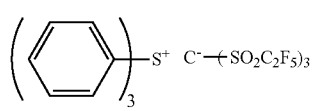 (z55)
(a53)
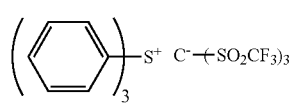 (z56)
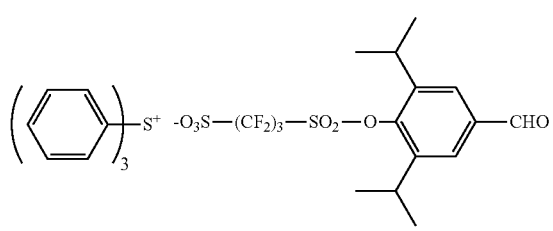 (z57)

-continued
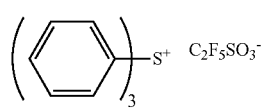 (z58)
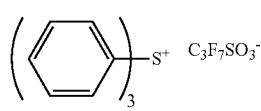 (z59)
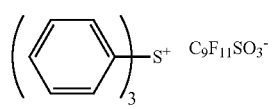 (z60)
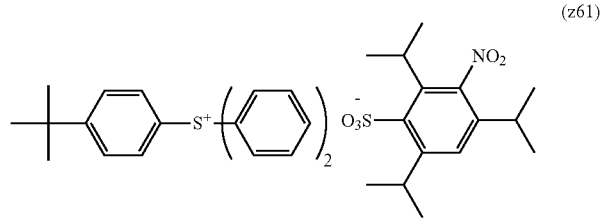 (z61)
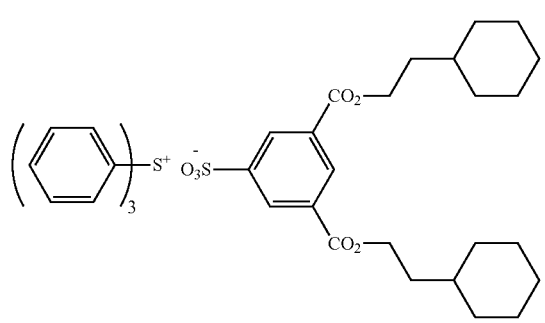 (z62)
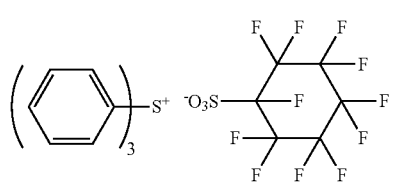 (z63)
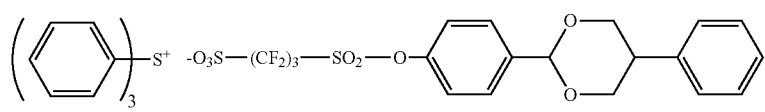 (z64)
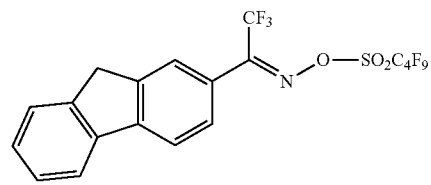 (z65)
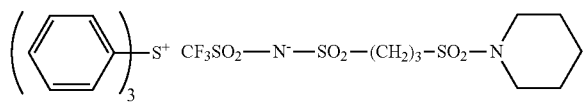 (z66)
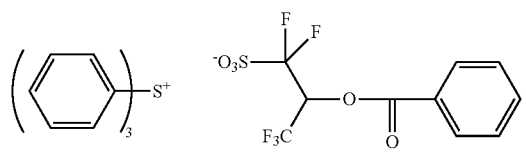 (z67)
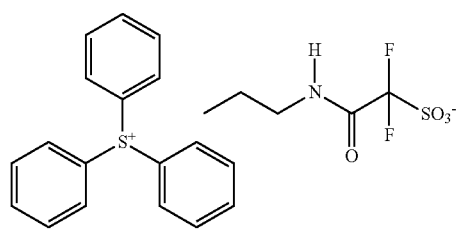 (z68)
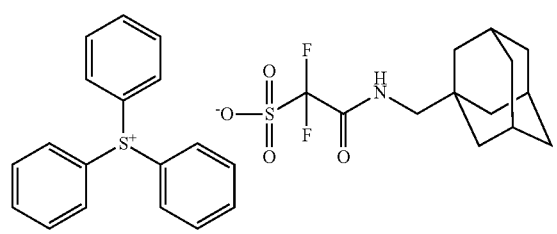 (z69)
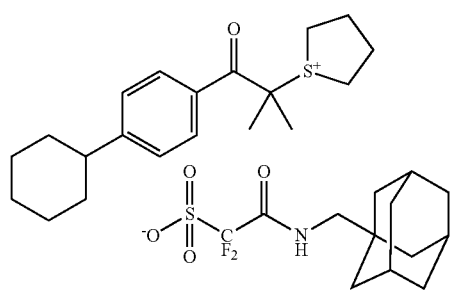 (z70)

-continued
(z71)
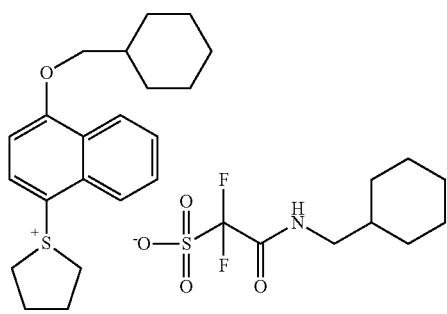
(z72)
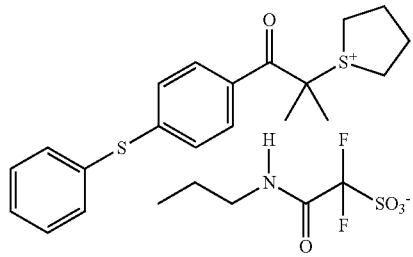
(z73)
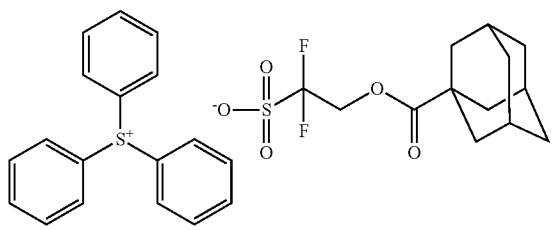
(z74)
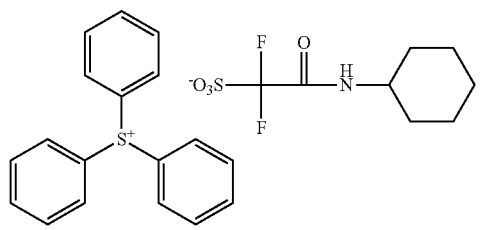
(z75)
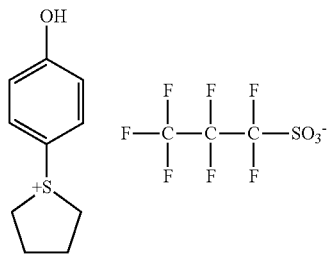
(z76)
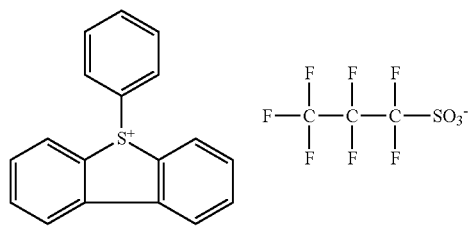
(z77)
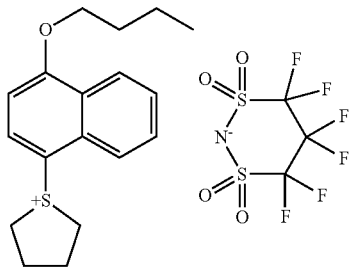
(z78)
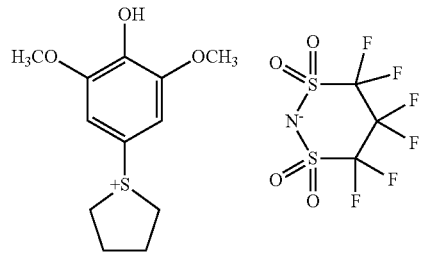
(z79)
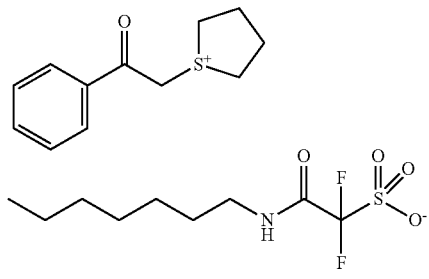
(z80)
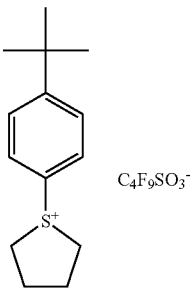

-continued
(z81)
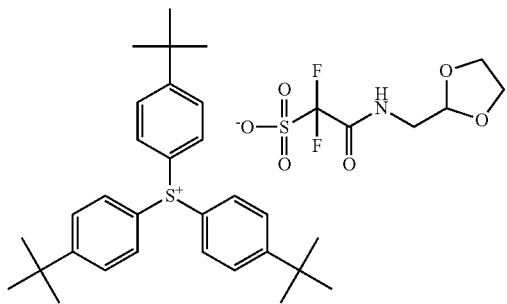
(z82)
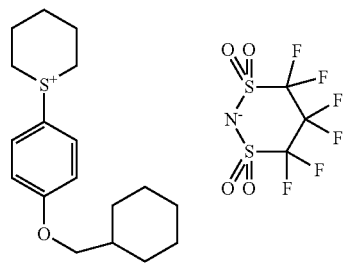
(z83)
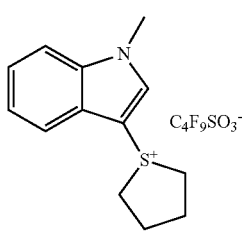
(z84)
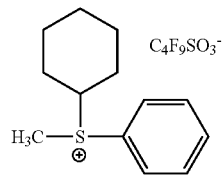
(z85)
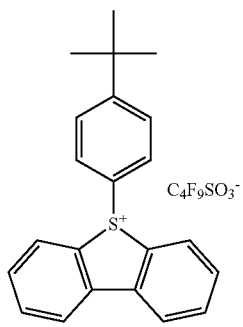
(z86)
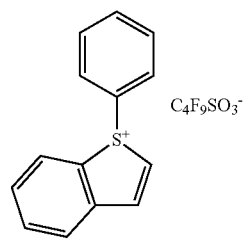
(z87)
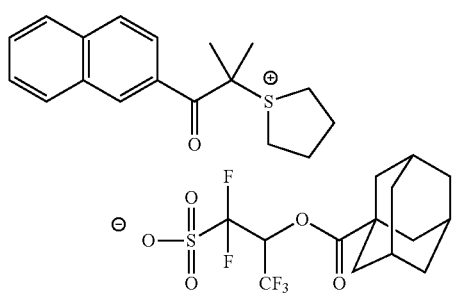
(z88)
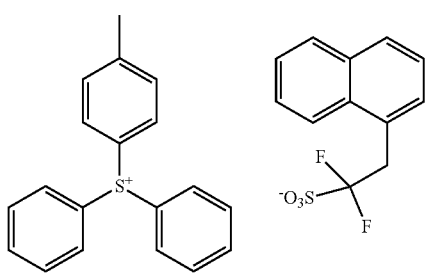
(z89)
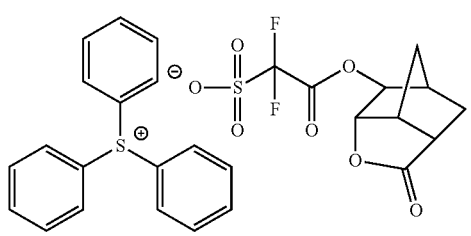
(z90)
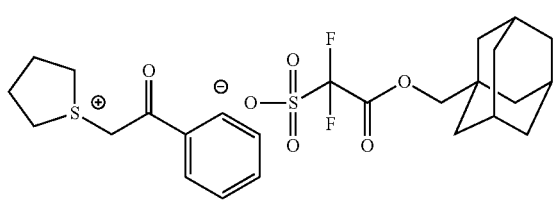
(z91)
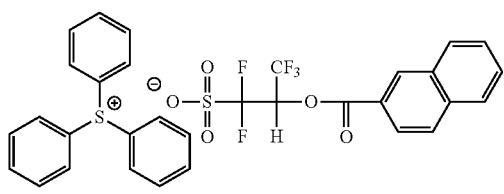
(z92)
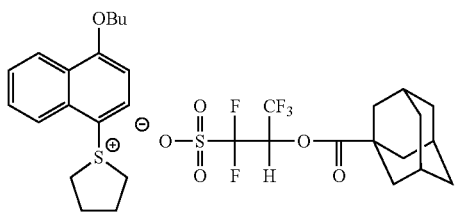

-continued
(z93)
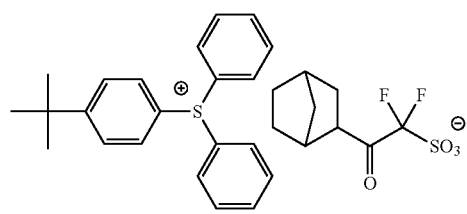
(z94)
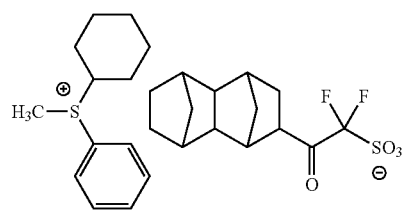
(z95)
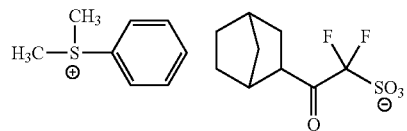
(z96)
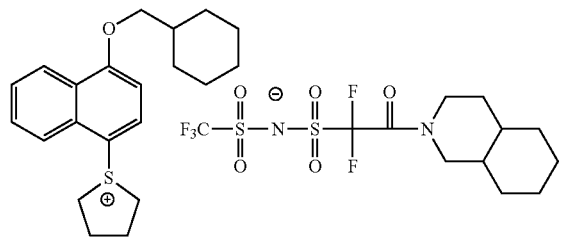
(z97)
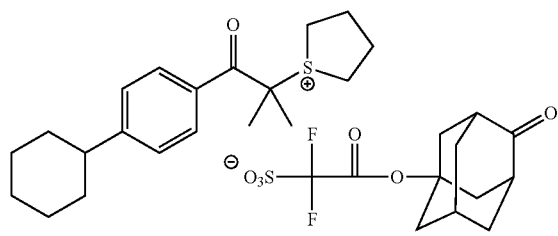
(z98)
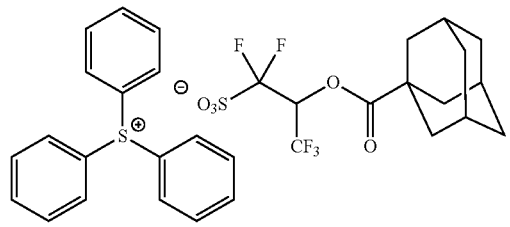
(z99)
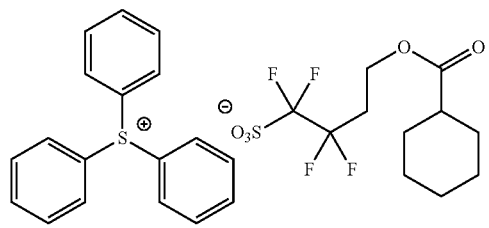
(z100)
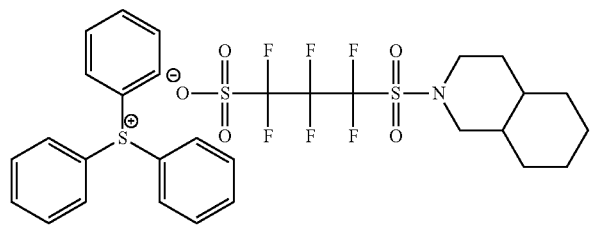
(z101)
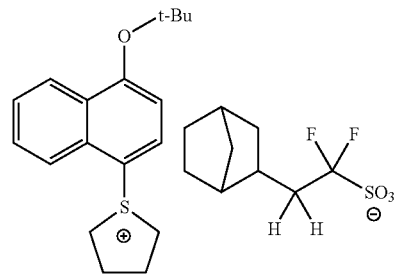
(z102)
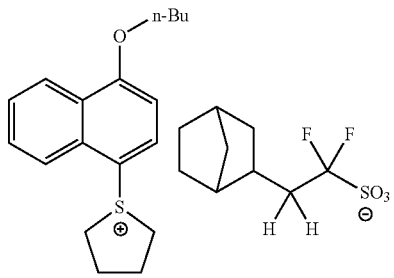
(z103)
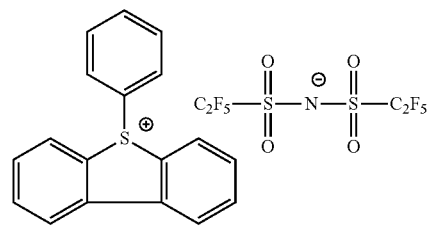
(z104)
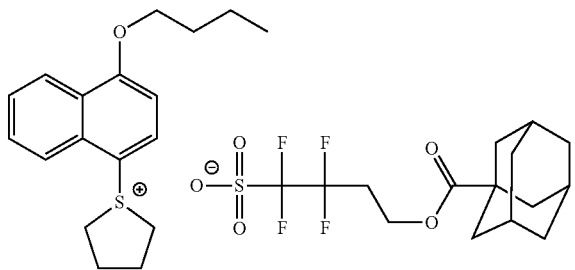

-continued
(z105)
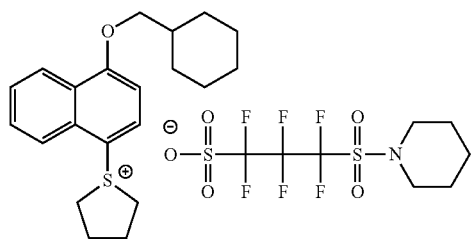
(z106)
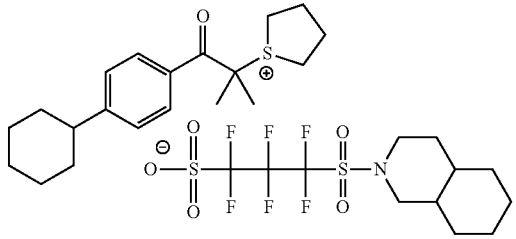
(z107)
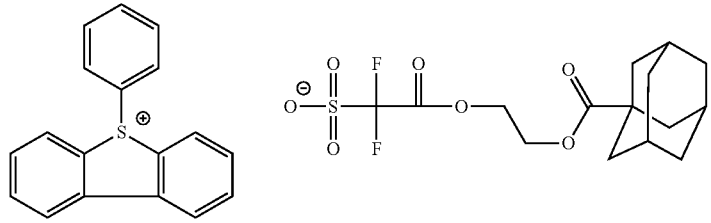
(z108)
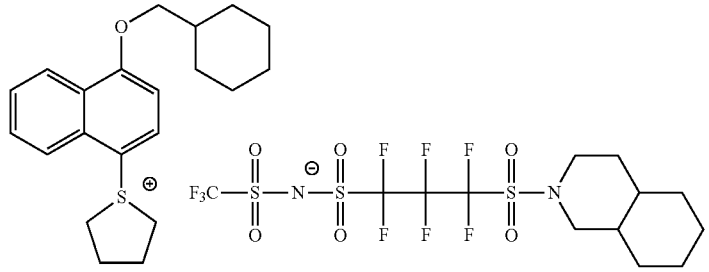
(z109)
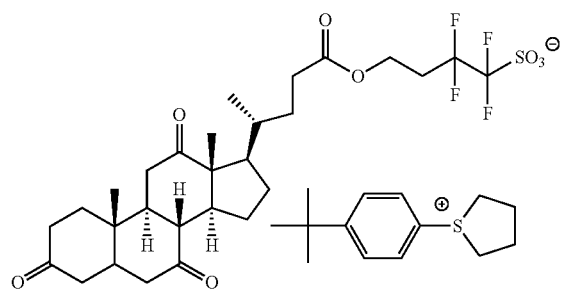
(z110)
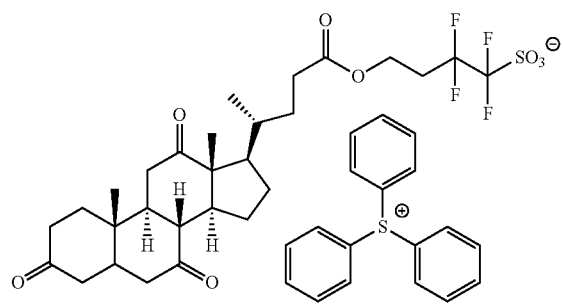
(z111)
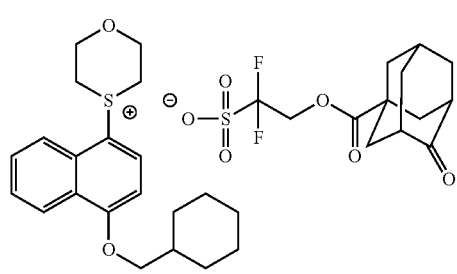
(z112)
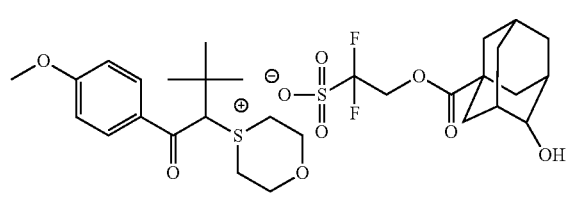
(z113)
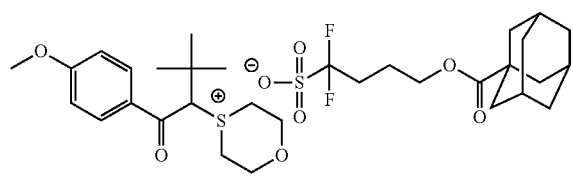
(z114)
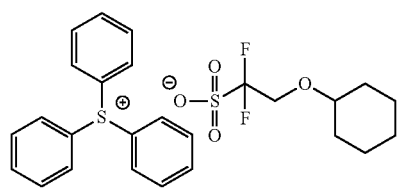

-continued
(z115)
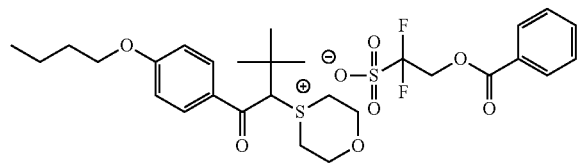
(z116)
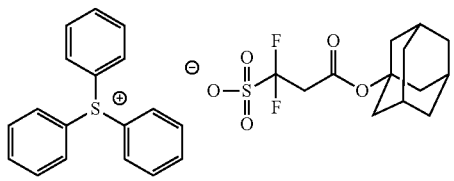
(z117)
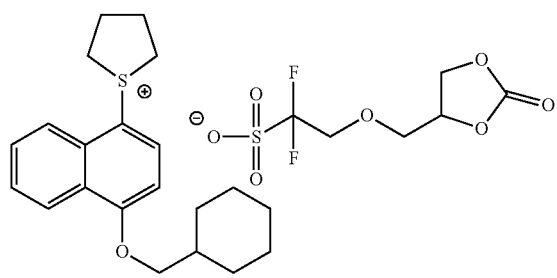
(z118)
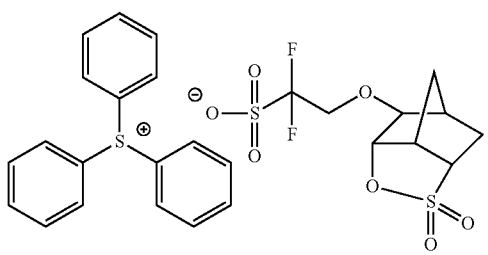
(z119)
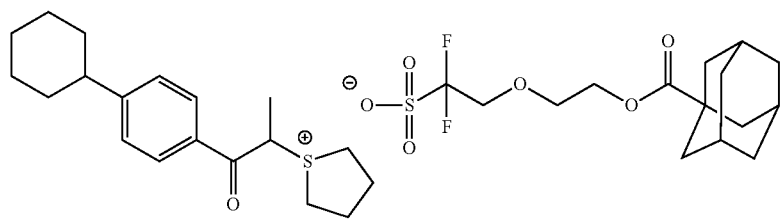
(z120)
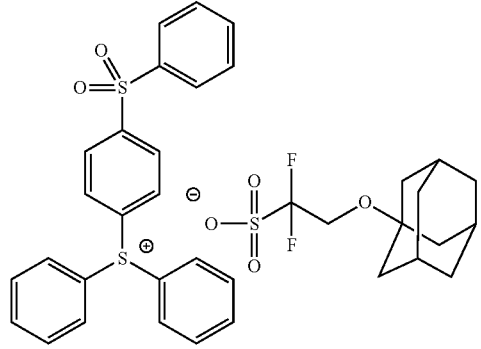
(z121)
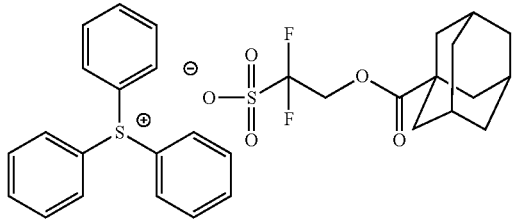
(z122)
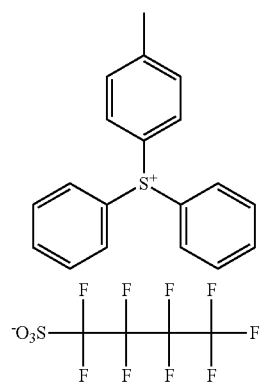
(z123)
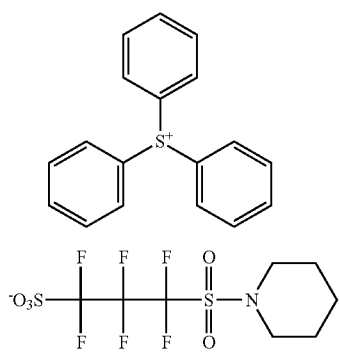

(z124) 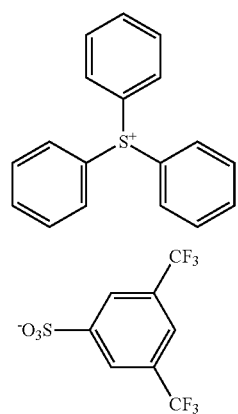
(z125) 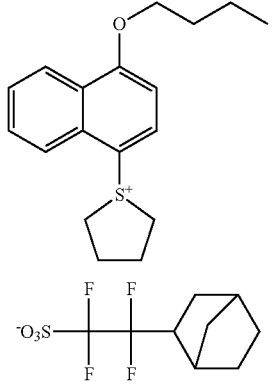
(z126) 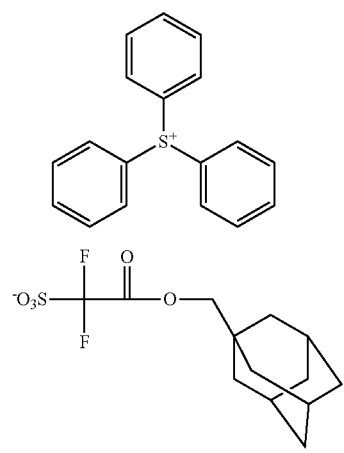
(z127) 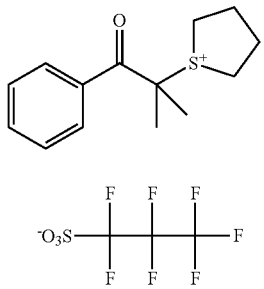
(z128) 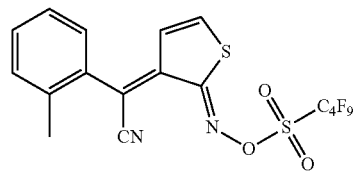
In addition, particularly preferred examples of the compounds (B) which have an anion which is represented by any of General Formulas (B-1) to (B-3) described above will be given below; however, the present invention is not limited thereto.
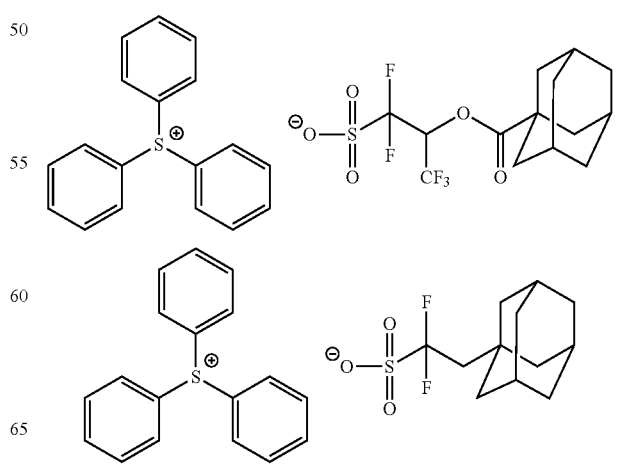

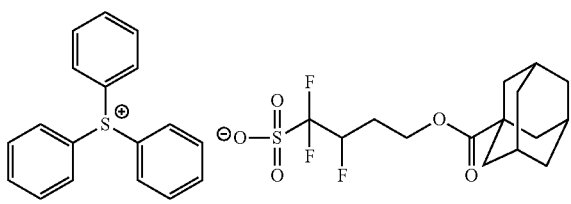
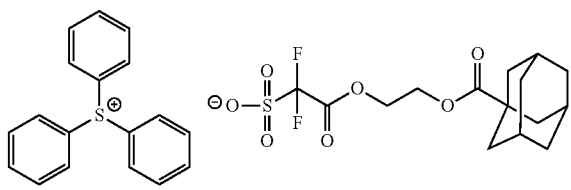
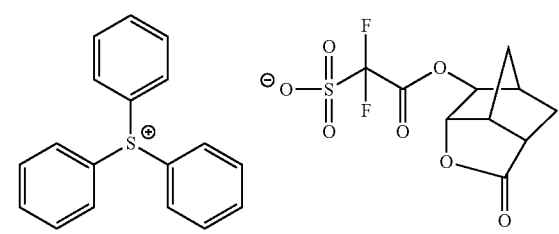
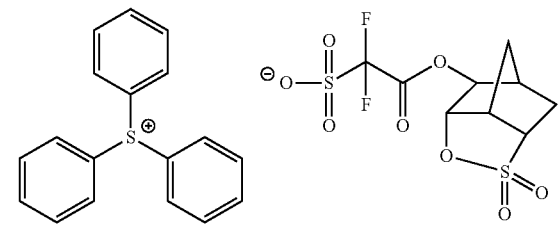
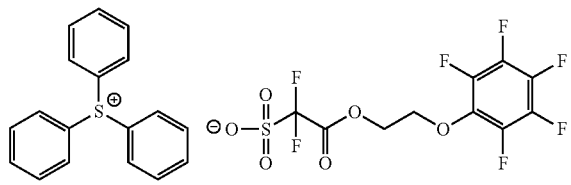
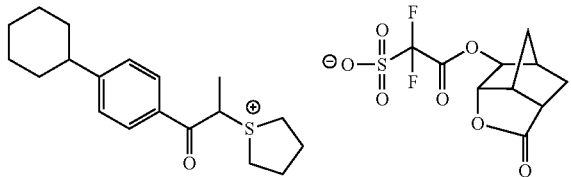
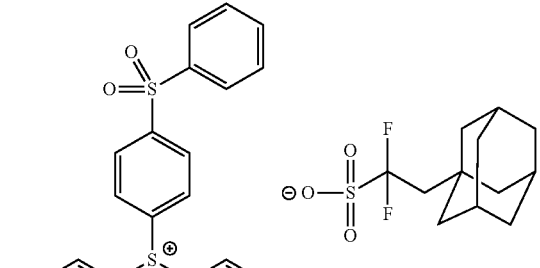

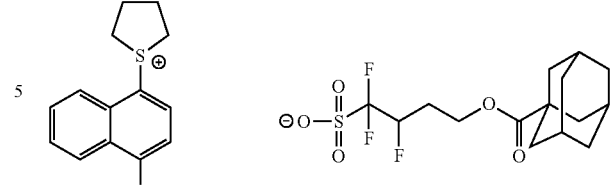
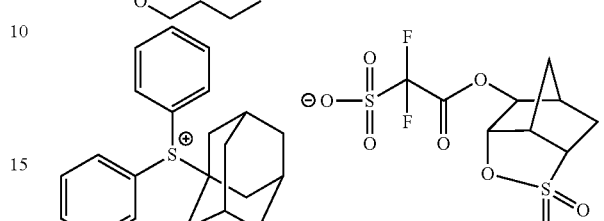
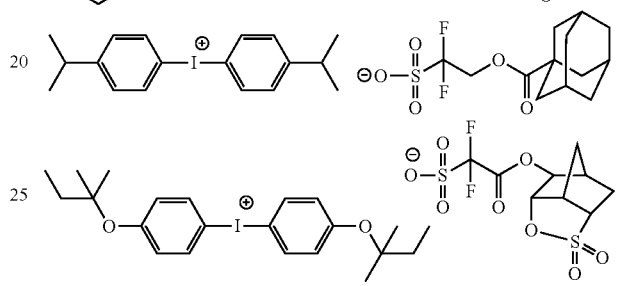
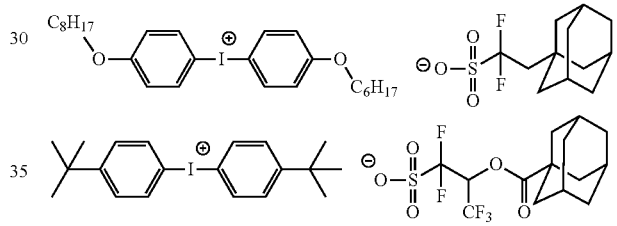
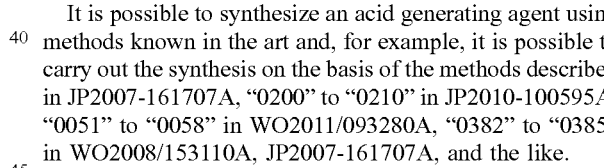
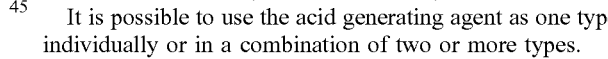

It is possible to synthesize an acid generating agent using methods known in the art and, for example, it is possible to carry out the synthesis on the basis of the methods described in JP2007-161707A, "0200" to "0210" in JP2010-100595A, "0051" to "0058" in WO2011/093280A, "0382" to "0385" in WO2008/153110A, JP2007-161707A, and the like.

It is possible to use the acid generating agent as one type individually or in a combination of two or more types.

The content of compounds which generate an acid when irradiated with actinic rays or radiation (apart from a case of being represented by General Formula (ZI-3) or (ZI-4) described above) in the composition is preferably 0.1 mass % to 30 mass % on the basis of the total solid content of the composition, more preferably 0.5 mass % to 25 mass %, even more preferably 3 mass % to 20 mass %, and particularly preferably 3 mass % to 15 mass %.

In addition, in a case where the acid generating agent is represented by General Formula (ZI-3) or (ZI-4) described above, the content thereof is preferably 5 mass % to 35 mass % on the basis of the total solid content of the composition, more preferably 6 mass % to 30 mass %, and particularly preferably 6 mass % to 25 mass %.

[3] (C) Solvent

The resin compositions (1) to (3) in the present invention each preferably contain a solvent and examples thereof include alkylene glycol monoalkyl ether carboxylate, alkylene glycol monoalkyl ether, alkyl lactate ester, alkyl alkoxypropionate, cyclic lactone (preferably with 4 to 10 carbon atoms), a monoketone compound which may have a ring (preferably with 4 to 10 carbon atoms), alkylene carbonate (for example, propylene carbonate and the like), alkoxy acetate alkyl, and organic solvents such as alkyl pyruvate.

Specific examples of the solvents include the solvents described in "0441" to "0455" in US2008/0187860A.

In the present invention, a mixed solvent where a solvent which contains a hydroxyl group in the structure as an organic solvent and a solvent which does not contain a hydroxyl group are mixed may be used.

It is possible to appropriately select the exemplary compounds described above as a solvent which contains a hydroxyl group and a solvent which does not contain a hydroxyl group; however, the solvent which contains a hydroxyl group is preferably alkylene glycol monoalkyl ether, alkyl lactate, and the like, and more preferably propylene glycol monomethyl ether (PGME, also called 1-methoxy-2-propanol) and ethyl lactate. In addition, the solvent which does not contain a hydroxyl group is preferably alkylene glycol monoalkyl ether acetate, alkyl alkoxy propionate, a monoketone compound which may contain a ring, cyclic lactone, alkyl acetate, and the like, particularly preferably propylene glycol monomethyl ether acetate (PGMEA, also called 1-methoxy-2-acetoxy propane), propylene glycol monomethyl ether propionate, ethyl ethoxypropionate, 2-heptanone, γ-butyrolactone, cyclohexanone, and butyl acetate among these, and most preferably propylene glycol monomethyl ether acetate, ethylethoxy propionate, and 2-heptanone.

The mixing ratio (mass) of the solvent which contains a hydroxyl group and the solvent which does not contain a hydroxyl group is 1/99 to 99/1, preferably 10/90 to 90/10, and more preferably 20/80 to 60/40. A mixed solvent which contains the solvent which does not contain a hydroxyl group at 50 mass % or more is particularly preferred in terms of coating uniformity.

The solvent preferably includes propylene glycol monomethyl ether acetate and is preferably a propylene glycol monomethyl ether acetate independent solvent or a mixed solvent of two or more types which contains propylene glycol monomethyl ether acetate.

In the present invention, from the point of view of suppressing generation of intermixing on an interface between a lower layer and an upper layer or the like, examples of the solvent also favorably include alcohol which does not have an oxygen atom other than a hydroxyl group, ester with 7 or more carbon atoms, ether which does not have an oxygen atom other than an ether bond, and the like. For example, by using the solvent as a solvent of the resin composition (3) which forms the upper layer, since the solvent does not dissolve the lower layer by having an appropriate polarity even while dissolving solid components in the resin composition (3), it is also possible to create a form which is able to more reliably suppress the generation of intermixing. In addition, the resin composition (2) which forms the lower layer being hydrophobic with respect to the solvent of the resin composition (3) is effective for suppressing the intermixing generation.

It is particularly preferred that the solvent which is contained in the resin composition (3) which forms the upper layer is an alcohol which does not contain an oxygen atom other than a hydroxyl group, an ester with 7 or more carbon atoms, or an ether which does not have an oxygen atom other than an ether bond and that the resin which is contained in the resin composition (2) is a resin which is configured by (meth)acrylate-based repeating units (preferably a resin which is configured by the repeating units which are all (meth)acrylate-based repeating units).

The alcohol which does not have an oxygen atom other than a hydroxyl group is preferably a monovalent alcohol which does not have an oxygen atom other than a hydroxyl group. The number of carbon atoms of the alcohol which does not have an oxygen atom other than a hydroxyl group is preferably 1 to 20, more preferably 3 to 15, even more preferably 4 to 12, and particularly preferably 5 to 10. Specific examples thereof include 4-methyl-2-pentanol and the like.

The ester with 7 or more carbon atoms is preferably an ester with 7 or more carbon atoms which does not have an oxygen atom other than one ester bond. The number of carbon atoms of the ester with 7 or more carbon atoms is preferably 7 to 20, more preferably 7 to 15, and even more preferably 7 to 12, and particularly preferably 7 to 10. Specific examples thereof include isobutyl isobutyrate and the like.

Examples of the ether which does not have an oxygen atom other than an ether bond include dialkyl ether, alkylaryl ether, and the like. The number of carbon atoms of the ether which does not have an oxygen atom other than an ether bond is preferably 3 to 20, more preferably 4 to 15, and even more preferably 5 to 12. Specific examples thereof include diisoamyl ether and the like.

The solvents (that is, the alcohol which does not have an oxygen atom other than a hydroxyl group, the ester with 7 or more carbon atoms, and the ether which does not have an oxygen atom other than an ether bond) preferably weighs 30 mass % or more in all of the solvents which are contained in the resin composition (3), more preferably weighs 50 mass % or more, and even more preferably weighs 80 mass % or more.

Here, the preferred aspect as the solvent (C) is as described above; however, apart from the aspect described above, needless to say, it is also possible to use any solvent (and composition components) as long as the solvent is able to suppress intermixing and the like to a practical level.

[4] Basic Compound (N)

The actinic ray-sensitive or radiation-sensitive resin compositions (1) and (3) in the present invention each preferably contain a basic compound (N).

In addition, the resin composition (2) in the present invention may or may not contain the basic compound (N); however, in particular, in a case where the resin composition (2) contains a resin of which, due to a polarity being increased by an action of an acid, a solubility decreases with respect to a developer which includes an organic solvent, the resin composition (2) preferably contains the basic compound (N).

Examples of a basic compound preferably include compounds which have a structure which is shown by Formulas (A) to (E) below.

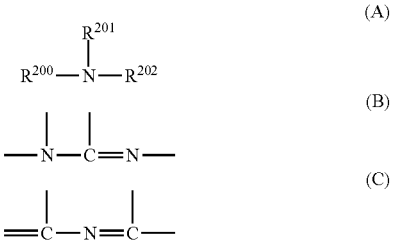

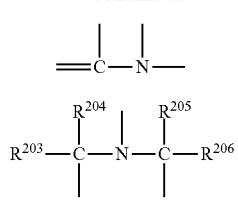

In General Formulas (A) and (E), $R^{200}$, $R^{201}$, and $R^{202}$ may be the same or may be different and represent a hydrogen atom, an alkyl group (preferably with 1 to 20 carbon atoms), a cycloalkyl group (preferably with 3 to 20 carbon atoms), or an aryl group (with 6 to 20 carbon atoms), and, here, $R^{201}$ and $R^{202}$ may bond with each other to form a ring. $R^{203}$, $R^{204}$, $R^{205}$, and $R^{206}$ may be the same or may be different and represent an alkyl group with 1 to 20 carbon atoms.

Regarding the alkyl group described above, an alkyl group which has a substituent group is preferably an aminoalkyl group with 1 to 20 carbon atoms, a hydroxyalkyl group with 1 to 20 carbon atoms, or a cyanoalkyl group with 1 to 20 carbon atoms.

The alkyl groups in General Formulas (A) and (E) are preferably unsubstituted.

Preferred specific examples of the basic compound (N) include guanidine, aminopyrrolidine, pyrazole, pyrazoline, piperazine, aminomorpholine, aminoalkyl morpholine, piperidine, and the like, and more preferred specific examples thereof include compounds which have an imidazole structure, a diazabicyclo structure, an onium hydroxide structure, an onium carboxylate structure, a trialkylamine structure, an aniline structure, or a pyridine structure, an alkylamine derivative which has a hydroxyl group and/or an ether bond, an aniline derivative which has a hydroxyl group and/or an ether bond, and the like.

Examples of the compound which has an imidazole structure include imidazole, 2,4,5-triphenyl imidazole, benzimidazole, and the like. Examples of the compound which has a diazabicyclo structure include 1,4-diazabicyclo[2,2,2]octane, 1,5-diazabicyclo[4,3,0]nona-5-ene, 1,8-diazabicyclo[5,4,0]undeca-7-ene, and the like. Examples of the compound which has an onium hydroxide structure include triarylsulfonium hydroxide, phenacyl sulfonium hydroxide, sulfonium hydroxide which has a 2-oxoalkyl group, specifically, triphenyl sulfonium hydroxide, tris(t-butylphenyl) sulfonium hydroxide, bis(t-butylphenyl) iodonium hydroxide, phenacyl thiophenium hydroxide, 2-oxopropyl thiophenium hydroxide, and the like. The compound which has an onium carboxylate structure is a compound where an anion section of a compound which has an onium hydroxide structure is carboxylate and examples thereof include acetate, adamantane-1-carboxylate, perfluoroalkyl carboxylate, and the like. Examples of the compound which has a trialkylamine structure include tri(n-butyl)amine, tri(n-octyl)amine, and the like. Examples of the compound which has an aniline structure include 2,6-diisopropyl aniline, N,N-dimethyl aniline, N,N-dibutyl aniline, N,N-dihexyl aniline, and the like. Examples of the alkylamine derivative which has a hydroxyl group and/or an ether bond include ethanol amine, diethanol amine, triethanol amine, tris(methoxyethoxyethyl)amine, and the like. Examples of an aniline derivative which has a hydroxyl group and/or an ether bond include N,N-bis(hydroxyethyl)aniline and the like.

Examples of a preferred basic compound further include an amine compound which has a phenoxy group, an ammonium salt compound which has a phenoxy group, an amine compound which has a sulfonic acid ester group, and an ammonium salt compound which has a sulfonic acid ester group.

With regard to the amine compound which has a phenoxy group, the ammonium salt compound which has a phenoxy group, the amine compound which has a sulfonic acid ester group, and the ammonium salt compound which has a sulfonic acid ester group, at least one alkyl group is preferably bonded with a nitrogen atom. In addition, it is preferred to have an oxygen atom in the alkyl chain and that oxyalkylene groups are formed therein. The number of the oxyalkylene groups in the molecule is one or more, preferably 3 to 9, and more preferably 4 to 6. Among the oxyalkylene groups, the structures of —$CH_2CH_2O$—, —$CH(CH_3)CH_2O$—, or —$CH_2CH_2CH_2O$— is preferred.

Specific examples of the amine compound which has a phenoxy group, the ammonium salt compound which has a phenoxy group, the amine compound which has a sulfonic acid ester group, and the ammonium salt compound which has a sulfonic acid ester group include the compounds (C1-1) to (C3-3) which are exemplified in "0066" in US2007/0224539A; however, the present invention is not limited thereto.

In addition, as one type of the basic compound, it is also possible to use a nitrogen-containing organic compound which has a group which is desorbed by an action of an acid. Examples of the compound include the compound which is represented by General Formula (F) below. Here, the compound which is represented by General Formula (F) below exhibit effective basicity in the system due to the group which is desorbed by an action of an acid being desorbed.

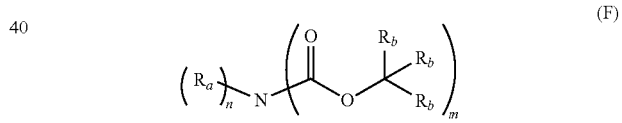

In General Formula (F), $R_a$ independently indicates a hydrogen atom, an alkyl group, a cycloalkyl group, an aryl group, or an aralkyl group. In addition, when n=2, two of $R_a$ may be the same or may be different and may bond with each other to form a divalent heterocyclic ring hydrocarbon group (preferably with 20 or less carbon atoms) or a derivative thereof.

$R_b$ independently indicates a hydrogen atom, an alkyl group, a cycloalkyl group, an aryl group, or an aralkyl group. However, in —$C(R_b)(R_b)(R_b)$, when one or more $R_b$ are hydrogen atoms, at least one of the remaining $R_b$ is a cyclopropyl group or a 1-alkoxyalkyl group.

At least two of $R_b$ may bond with each other to form an alicyclic hydrocarbon group, an aromatic hydrocarbon group, a heterocyclic ring hydrocarbon group, or the derivative thereof.

n represents an integer of 0 to 2 and m represents an integer of 1 to 3 and n+m=3.

Specific examples of the compound which is represented by General Formula (F) will be shown below.

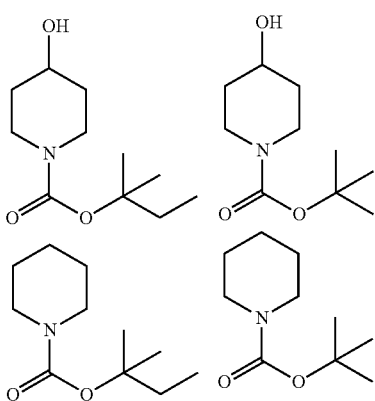

It is possible to synthesize the compound which is represented by General Formula (F) described above, for example, on the basis of the method described in JP2009-199021A.

In addition, it is also possible to use a compound which has an amine oxide structure as the basic compound (N). As specific examples of the compound, it is possible to use triethylamine pyridine N-oxide, tributylamine N-oxide, triethanolamine N-oxide, tris(methoxyethyl)amine N-oxide, tris(2-(methoxymethoxy)ethyl)amine=oxide, 2,2',2"-nitrilotriethyl propionate N-oxide, N-2-(2-methoxyethoxy) methoxyethyl morpholine N-oxide, and other amine oxide compounds which are exemplified in JP2008-102383A.

In addition, as the basic compound (N), it is also possible to use compounds which generate an acid anion which has a basic structure in the molecule by being decomposed when irradiated with actinic rays or radiation, such as the compounds in (A-1) to (A-44) in US2010/0233629A and the compounds in (A-1) to (A-23) in US2012/0156617A. Among these compounds, examples of compounds which may be particularly preferably used will be given below.

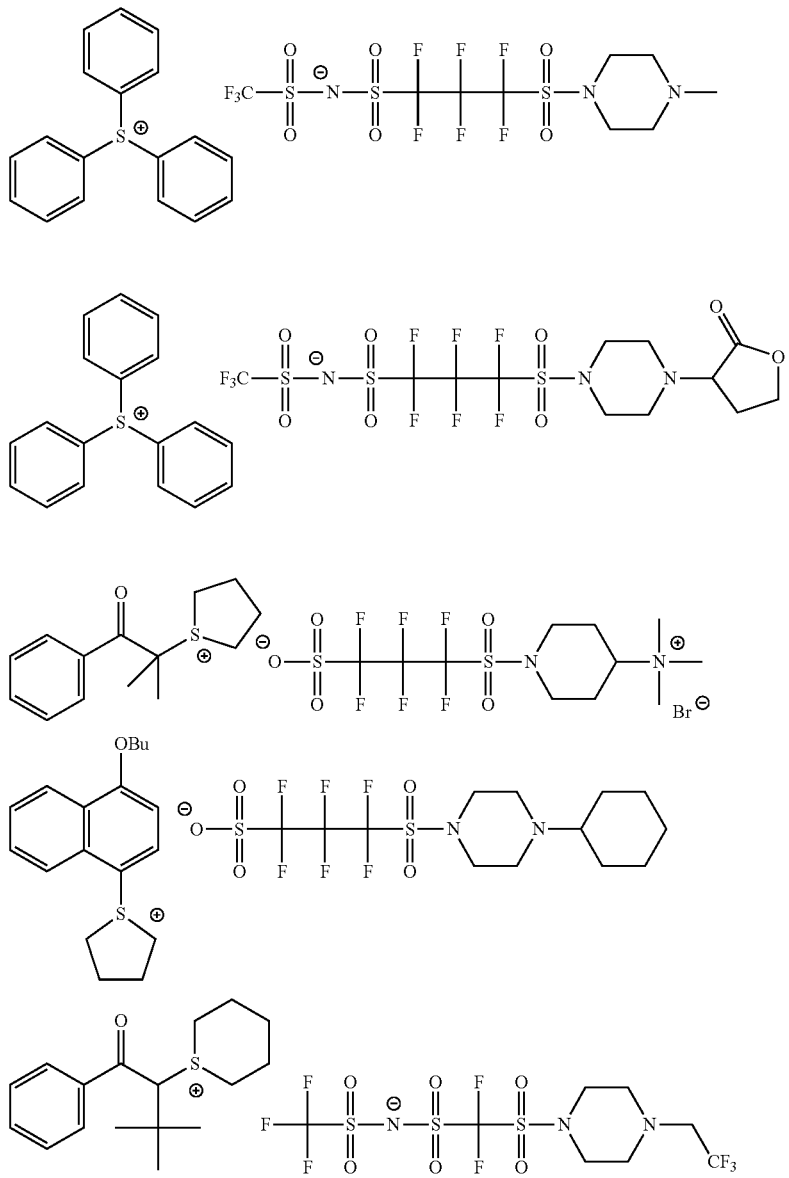

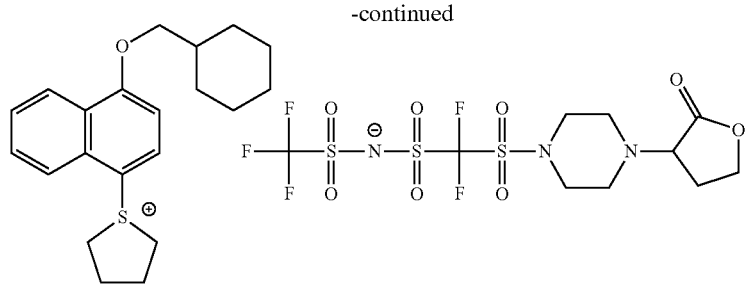

In addition, the compound of the present invention may include an onium salt which is represented by General Formula (6A) or (6B) below as the basic compound (N). The onium salt is expected to control the diffusion of the generated acid in a resist system in relation to the acid strength of a photoacid generator which is generally used for a resist composition.

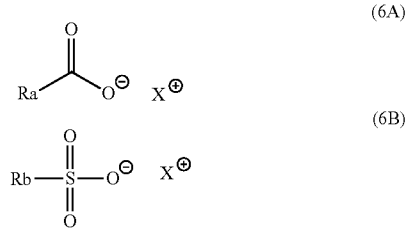

In General Formula (6A),

Ra represents an organic group. However, organic groups where a fluorine atom is substituted with a carbon atom which is directly bonded with a carboxylic acid group in the formula are excluded.

$X^+$ represents an onium cation.

In General Formula (6B),

Rb represents an organic group. However, organic groups where a fluorine atom is substituted with a carbon atom which is directly bonded with a sulfonic acid group in the formula are excluded.

$X^+$ represents an onium cation.

With regard to the organic group which is represented by Ra and Rb, an atom which is directly bonded with the carboxylic acid group or the sulfonic acid group in the formula is preferably a carbon atom. However, in this case, in order to make an acid which is relatively weak in comparison to the acid which is generated from the photoacid generator described above, a fluorine atom is not substituted with a carbon atom which is directly bonded with a sulfonic acid group or a carboxylic atom group.

Examples of the organic group which is represented by Ra and Rb include an alkyl group with 1 to 20 carbon atoms, a cycloalkyl group with 3 to 20 carbon atoms, an aryl group with 6 to 30 carbon atoms, an aralkyl group with 7 to 30 carbon atoms, a heterocyclic ring group with 3 to 30 carbon atoms, and the like. With regard to the groups, some or all of hydrogen atoms may be substituted.

Examples of a substituent group which the alkyl group, the cycloalkyl group, the aryl group, the aralkyl group, and the heterocyclic ring group described above may have include a hydroxyl group, a halogen atom, an alkoxy group, a lactone group, an alkylcarbonyl group, and the like.

Examples of an onium cation which is represented by $X^+$ in General Formulas (6A) and (6B) include a sulfonium cation, an ammonium cation, an iodonium cation, a phosphonium cation, diazonium cation, and the like, and among these, a sulfonium cation is more preferred.

As the sulfonium cation, for example, an arylsulfonium cation which has at least one aryl group is preferred and a triarylsulfonium cation is more preferred. The aryl group may have a substituent group and a phenyl group is preferred as the aryl group.

Examples of the sulfonium cation and the iodonium cation also preferably include a sulfonium cation structure site in the compounds (ZI-1), (ZI-2), (ZI-3), and (ZI-4) as the compound (B) described above.

Specific structures of the onium salt which is represented by General Formula (6A) or (6B) will be shown below.

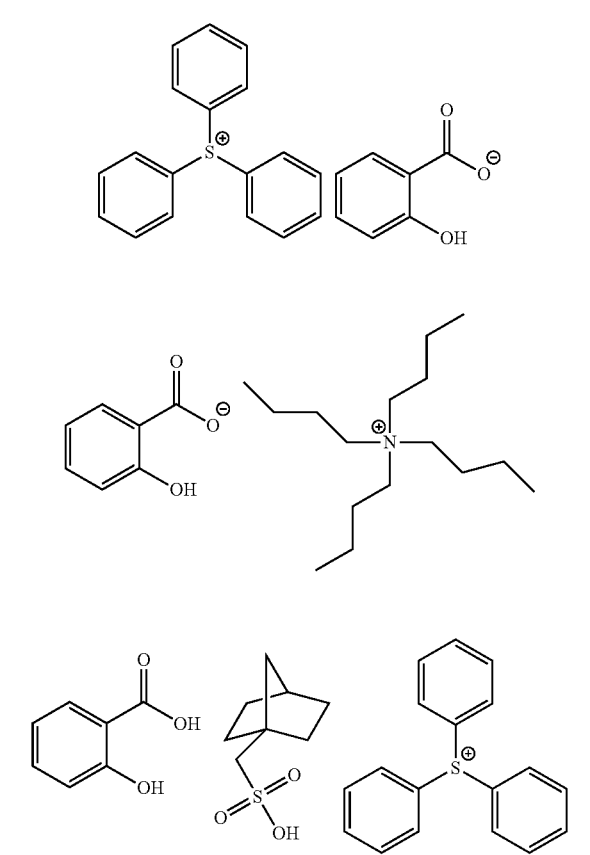

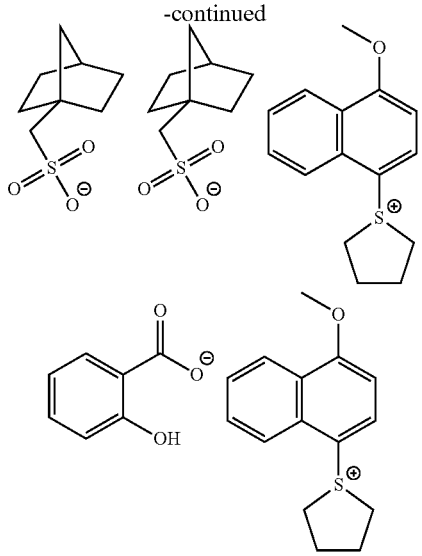

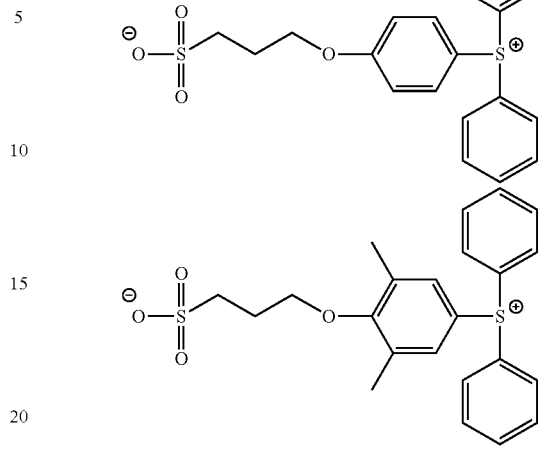

Furthermore, with regard to the chemical amplification resist composition in the present invention, it is also possible to preferably use compounds (also referred to below as "betaine compounds") which have both an onium salt structure and an acid anion structure in one molecule such as the compounds which are included in Formula (I) in JP2012-189977A, the compounds which are represented by Formula (I) in JP2013-6827A, the compounds which are represented by Formula (I) in JP2013-8020A, and the compounds which are represented by Formula (I) in JP 2012-252124A. Examples of the onium salt structure include sulfonium, iodonium, and ammonium structures and a sulfonium or iodonium salt structure is preferred. In addition, an acid anion structure is preferably a sulfonic acid anion or a carboxylic acid anion. Examples of the compounds include the following.

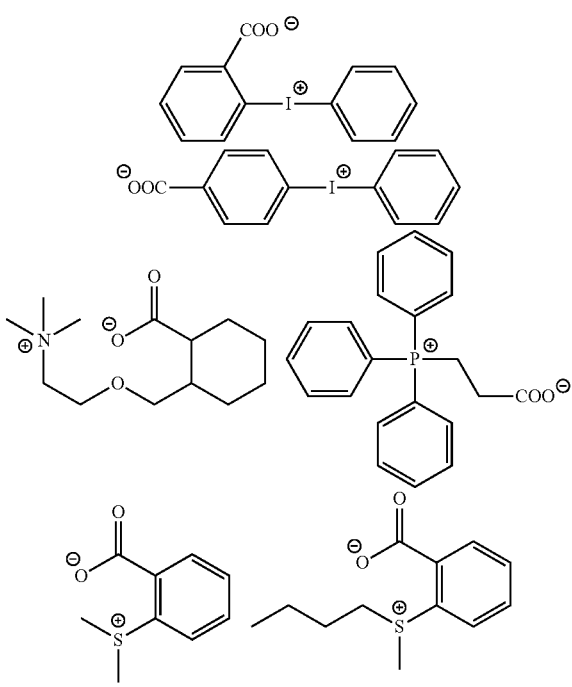

The molecular weight of the basic compound (N) is preferably 250 to 2,000 and more preferably 400 to 1,000. From the point of view of further reduction of the LWR and local uniformity of the pattern dimensions, the molecular weight of the basic compound is preferably 400 or more, more preferably 500 or more, and even more preferably 600 or more.

The basic compound (N) is used individually or two or more types are used together.

The resin compositions (1) to (3) in the present invention may or may not contain the basic compound (N); however, when contained, the usage amount of the basic compounds (N) is generally 0.001 mass % to 10 mass % on the basis of the solid content of the resin composition and preferably 0.01 mass % to 5 mass %.

[5] Hydrophobic Resin (D)

The resin compositions (1) to (3) in the present invention may each contain a hydrophobic resin (also referred to below as a "hydrophobic resin (D)" or simply a "resin (D)") particularly when being applied to liquid immersion exposure. Here, the hydrophobic resin (D) is preferably different from the resin (A).

Due to this, in a case where the hydrophobic resin (D) is unevenly distributed on a film surface layer and the liquid immersion medium is water, it is possible to improve the static/dynamic contact angle of the resist film surface with respect to water and improve the liquid immersion liquid conformance. In addition, in a case of performing the pattern forming of the present invention by EUV exposure, it is also possible to apply the hydrophobic resin (D) with an expectation of so-called outgas suppression and the like.

The hydrophobic resin (D) is preferably designed so as to be unevenly distributed on the interface as described above; however, unlike a surfactant, it is not necessary to have a hydrophilic group in the molecule and the hydrophobic resin (D) may not contribute to the even mixing of polar/non-polar substances.

The hydrophobic resin (D) preferably has any one or more types of any of a "fluorine atom", a "silicon atom", and a "$CH_3$ partial structure which is contained in a side chain portion of a resin" from the point of view of being unevenly distributed on the film surface layer and more preferably has two or more types.

In a case where the hydrophobic resin (D) contains a fluorine atom and/or a silicon atom, the fluorine atom and/or the silicon atom described above in the hydrophobic resin (D) may be included in the main chain of the resin or may be included in a side chain.

In a case where the hydrophobic resin (D) includes a fluorine atom, a resin which has an alkyl group which has a fluorine atom, a cycloalkyl group which has a fluorine atom, or an aryl group which has a fluorine atom as the partial structure which has a fluorine atom is preferred.

The alkyl group (preferably with 1 to 10 carbon atoms and more preferably with 1 to 4 carbon atoms) which has a fluorine atom is a straight-chain or branched alkyl group where at least one hydrogen atom is substituted with a fluorine atom and may further have a substituent group other than a fluorine atom.

The cycloalkyl group which has a fluorine atom is a monocyclic or polycyclic cycloalkyl group where at least one hydrogen atom is substituted with a fluorine atom and may further have a substituent group other than a fluorine atom.

Examples of the aryl group which has a fluorine atom include an aryl group where at least one hydrogen atom is substituted with a fluorine atom such as a phenyl group and a naphthyl group and the aryl group may further have a substituent group other than a fluorine atom.

Examples of the alkyl group which has a fluorine atom, the cycloalkyl group which has a fluorine atom, and the aryl group which has a fluorine atom preferably include groups which are represented by General Formulas (F2) to (F4) below; however, the present invention is not limited thereto.

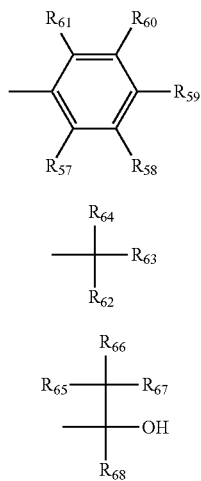

In General Formulas (F2) to (F4), $R_{57}$ to $R_{68}$ each independently represent a hydrogen atom, a fluorine atom, or an alkyl group (straight-chain or branched). However, at least one of $R_{57}$ to $R_{61}$, at least one of $R_{62}$ to $R_{64}$, and at least one of $R_{65}$ to $R_{68}$ each independently represent a fluorine atom or an alkyl group (preferably with 1 to 4 carbon atoms) where at least one hydrogen atom is substituted with a fluorine atom.

$R_{57}$ to $R_{61}$ and $R_{65}$ to $R_{67}$ are preferably all fluorine atoms. $R_{62}$, $R_{63}$, and $R_{68}$ are preferably an alkyl group (preferably with 1 to 4 carbon atoms) where at least one hydrogen atom is substituted with a fluorine atom and more preferably a perfluoroalkyl group with 1 to 4 carbon atoms. $R_{62}$ and $R_{63}$ may form a ring by linking with each other.

Specific examples of the group which is represented by General Formula (F2) include a p-fluorophenyl group, a pentafluorophenyl group, a 3,5-di(trifluoromethyl)phenyl group, and the like.

Specific examples of the group which is represented by General Formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro (trimethyl)hexyl group, a 2,2,3,3-tetrafluorocyclobutyl group, a perfluorocyclohexyl group, and the like. A hexafluoroisopropyl group, a heptafluoroisopropyl group, a hexafluoro(2-methyl)isopropyl group, an octafluoroisobutyl group, a nonafluoro-t-butyl group, and a perfluoroisopentyl group are preferred, and a hexafluoroisopropyl group and a heptafluoroisopropyl group are more preferred.

Specific examples of a group which is represented by General Formula (F4) include —C(CF$_3$)$_2$OH—, —C(C$_2$F$_5$)$_2$OH—, —C(CF$_3$)(CH$_3$)OH, —CH(CF$_3$)OH, and the like, and —C(CF$_3$)$_2$OH is preferred.

A partial structure which includes a fluorine atom may be directly bonded with a main chain and may be further bonded with a main chain via a group which is selected from a group formed of an alkylene group, a phenylene group, an ether bond, a thioether bond, a carbonyl group, an ester bond, an amide bond, an urethane bond, and an ureylene bond, or a group where two or more thereof are combined.

Specific examples of a repeating unit which has a fluorine atom will be shown below; however, the present invention is not limited thereto.

In the specific examples, $X_1$ represents a hydrogen atom, —CH$_3$, —F, or —CF$_3$. $X_2$ represents —F or —CF$_3$.

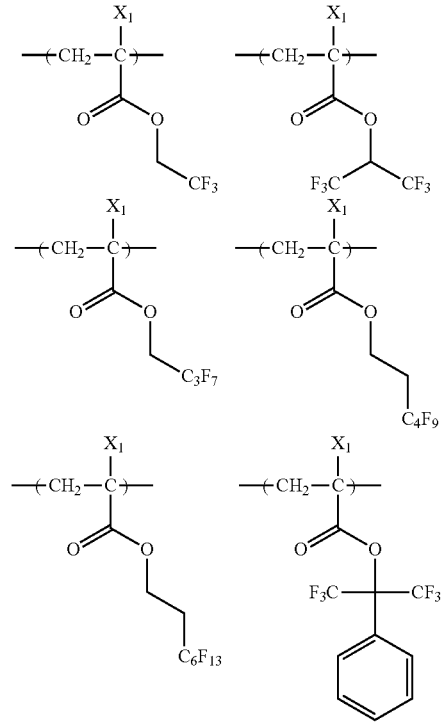

-continued

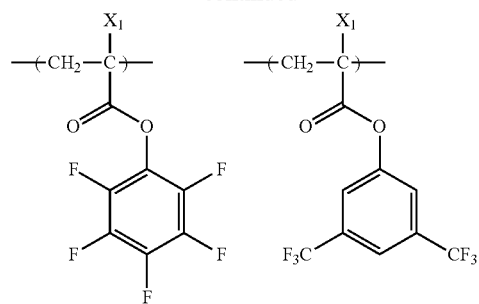
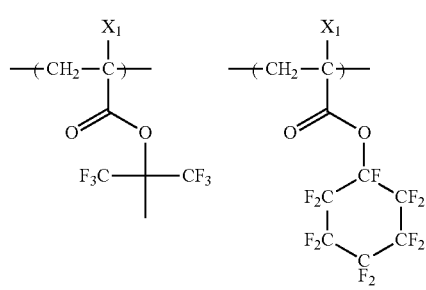
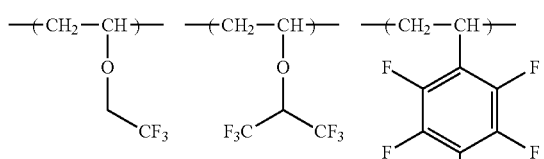
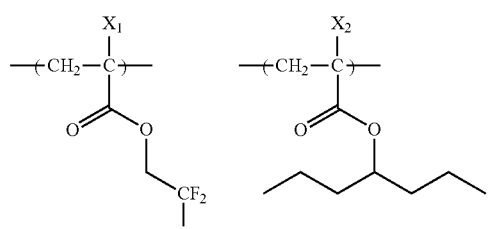
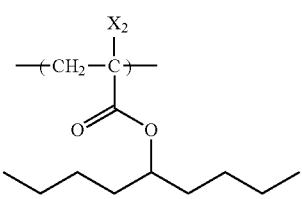
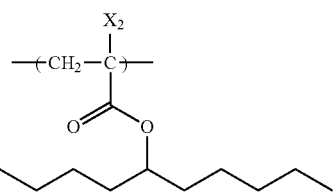
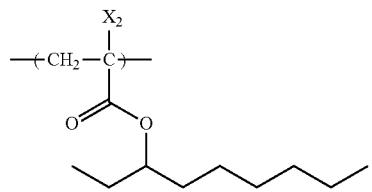

-continued

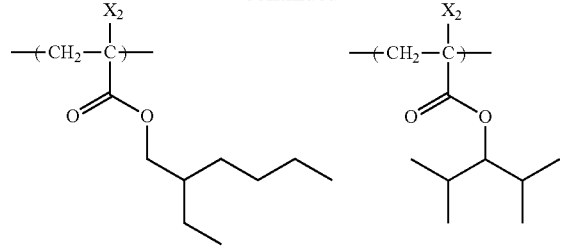
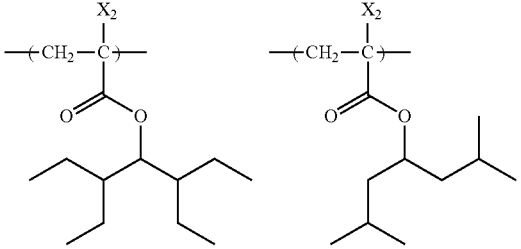
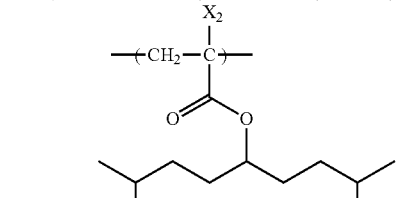
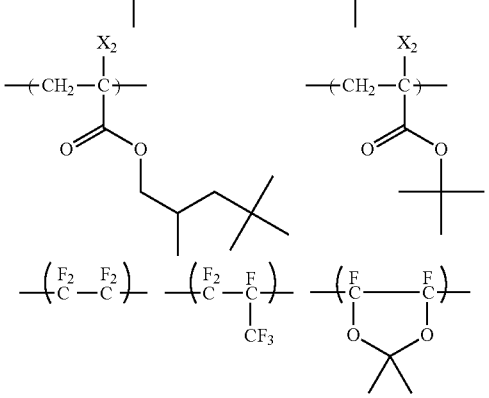
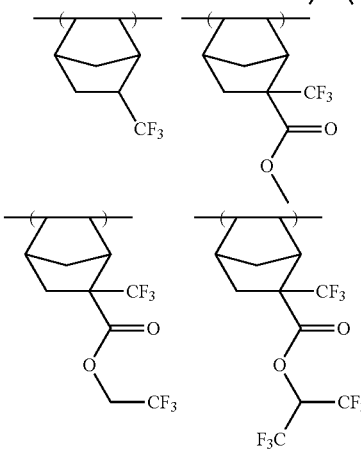

The hydrophobic resin (D) may contain a silicon atom. As a partial structure which has a silicon atom, a resin which has an alkylsilyl structure (preferably a trialkylsilyl group) or a cyclic siloxane structure is preferred.

Examples of the alkylsilyl structure or the cyclic siloxane structure specifically include groups which are represented by General Formulas (CS-1) to (CS-3) below and the like.

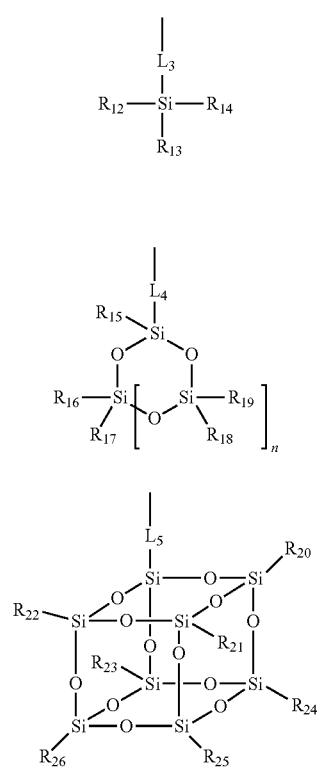

(CS-1)

(CS-2)

(CS-3)

In General Formulas (CS-1) to (CS-3), $R_{12}$ to $R_{26}$ each independently represent a straight-chain or branched alkyl group (preferably with 1 to 20 carbon atoms) or a cycloalkyl group (preferably with 3 to 20 carbon atoms).

$L_3$ to $L_5$ represent a single bond or a divalent linking group. Examples of a divalent bonding group include one, or a combination (the total number of carbon atoms is preferably 12 or less) of two or more groups selected from a group formed of an alkylene group, a phenylene group, an ether bond, a thioether bond, a carbonyl group, an ester bond, an amide bond, an urethane bond, and an urea bond.

n represents an integer of 1 to 5. n is preferably an integer of 2 to 4.

Specific examples of a repeating unit which has a group which is represented by General Formulas (CS-1) to (CS-3) will be given below; however, the present invention is not limited thereto. Here, in the specific examples, $X_1$ represents a hydrogen atom, —$CH_3$, —F, or —$CF_3$.

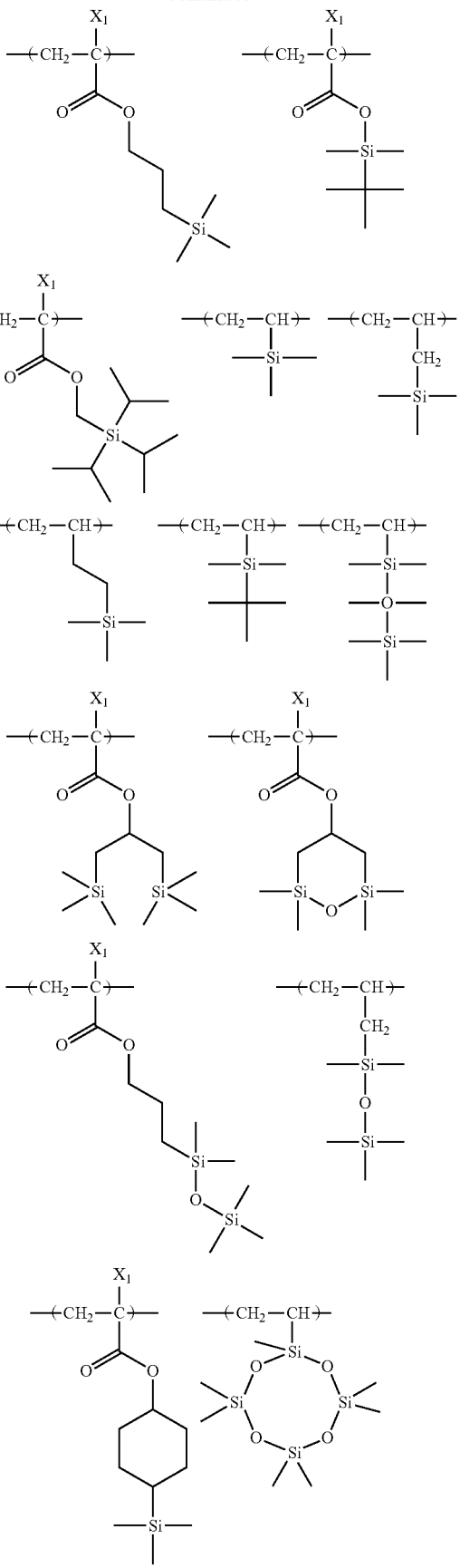

-continued

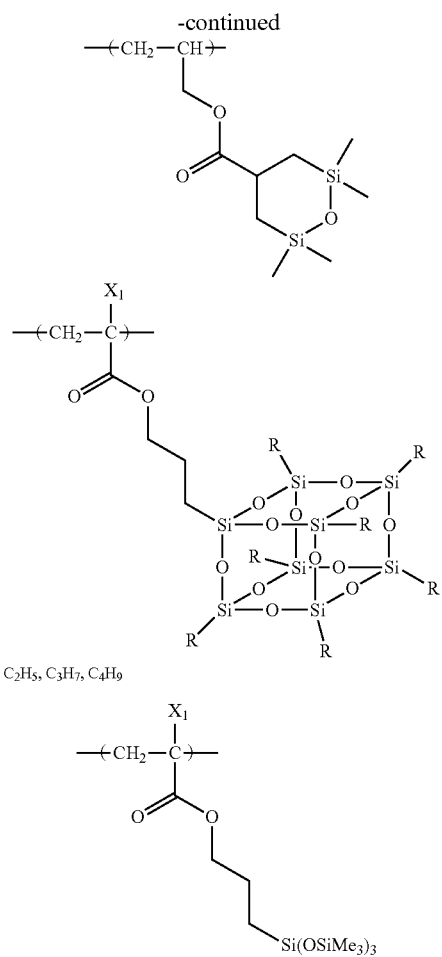

R = CH₃, C₂H₅, C₃H₇, C₄H₉

In addition, as described above, the hydrophobic resin (D) also preferably includes a CH₃ partial structure in a side chain portion.

Here, the CH₃ partial structure of an ethyl group, a propyl group, and the like is encompassed in the CH₃ partial structure (also simply referred to below as a "side chain CH₃ partial structure") of the side chain portion in the resin (D).

On the other hand, a methyl group which is directly bonded with a main chain of the resin (D) (for example, an α-methyl group of a repeating unit which has a methacrylic acid structure) is not encompassed in the CH₃ partial structure in the present invention since the contribution to the surface uneven distribution of the resin (D) is small due to the influence of the main chain.

In more detail, in a case where the resin (D) includes, for example, a repeating unit which is derived from a monomer which has a polymerizable site which has a carbon-carbon double bond such as a repeating unit which is represented by General Formula (M) below and, in a case where $R_{11}$ to $R_{14}$ are CH₃ "itself", the CH₃ is not encompassed in the CH₃ partial structure of the side chain portion in the present invention.

On the other hand, a CH₃ partial structure which is present via a certain atom from a C—C main chain corresponds to the CH₃ partial structure in the present invention. For example, in a case where $R_{11}$ is an ethyl group (CH₂CH₃), the resin (D) has "one" CH₃ partial structure in the present invention.

In General Formula (M) described above, $R_{11}$ to $R_{14}$ each independently represent a side chain portion.

Examples of $R_{11}$ to $R_{14}$ of the side chain portion include a hydrogen atom, a monovalent organic group, and the like.

Examples of the monovalent organic group regarding $R_{11}$ to $R_{14}$ include an alkyl group, a cycloalkyl group, an aryl group, an alkyloxycarbonyl group, a cycloalkyloxycarbonyl group, an aryloxycarbonyl group, an alkylaminocarbonyl group, a cycloalkylaminocarbonyl group, an arylaminocarbonyl group, and the like and the groups may further have a substituent group.

The hydrophobic resin (D) is preferably a resin which has a repeating unit which has a CH₃ partial structure in a side chain portion and preferably has at least one type of a repeating unit (x) out of a repeating unit which is represented by General Formula (II) below and a repeating unit which is represented by General Formula (III) below as the repeating unit.

Detailed description will be given below of the repeating unit which is represented by General Formula (II).

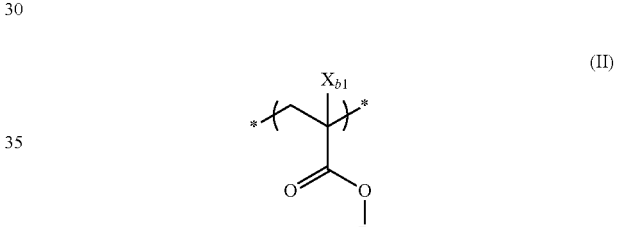

In General Formula (II) described above, $X_{b1}$ represents a hydrogen atom, an alkyl group, a cyano group, and a halogen atom and $R_2$ represents an organic group which has one or more CH₃ partial structures and which is stable with respect to an acid. Here, in more detail, the organic group which is stable with respect to an acid is preferably an organic group which does not have the "group which generates a polar group by being decomposed by an action of an acid" described in the resin (A).

The alkyl group of $X_{b1}$ is preferably an alkyl group with 1 to 4 carbon atoms and examples thereof include a methyl group, an ethyl group, a propyl group, a hydroxymethyl group, a trifluoromethyl group, and the like; however, a methyl group is preferred.

$X_{b1}$ is preferably a hydrogen atom or a methyl group.

Examples of $R_2$ include an alkyl group, a cycloalkyl group, an alkenyl group, a cycloalkenyl group, an aryl group, and an aralkyl group which have one or more CH₃ partial structures. The cycloalkyl group, the alkenyl group, the cycloalkenyl group, the aryl group, and the aralkyl group described above may further have an alkyl group as a substituent group.

$R_2$ is preferably an alkyl group or an alkyl-substituted cycloalkyl group which has one or more CH₃ partial structures.

The organic group as $R_2$ which has one or more CH₃ partial structure and which is stable in an acid preferably has 2 or more to 10 or less CH₃ partial structures and more preferably 2 or more to 8 or less CH₃ partial structures.

An alkyl group in $R_2$ which has one or more CH₃ partial structures is preferably a branched alkyl group with 3 to 20 carbon atoms.

A cycloalkyl group in $R_2$ which has one or more CH₃ partial structures may be monocyclic or may be polycyclic. In detail, examples thereof include a group with 5 or more carbon atoms which has a monocyclo, bicyclo, tricyclo, tetracyclo structure and the like. The number of carbon atoms is preferably 6 to 30 and the number of carbon atoms is particularly preferably 7 to 25.

An alkenyl group in $R_2$ which has one or more CH₃ partial structures is preferably a straight-chain or branched alkenyl group with 1 to 20 carbon atoms and more preferably a branched alkenyl group.

An aryl group in $R_2$ which has one or more CH₃ partial structures is preferably an aryl group with 6 to 20 carbon atoms and examples thereof include a phenyl group and a naphthyl group, and a phenyl group is preferred.

An aralkyl group in $R_2$ which has one or more CH₃ partial structures is preferably an aralkyl group with 7 to 12 carbon atoms and examples thereof include a benzyl group, a phenethyl group, a naphthylmethyl group, and the like.

Preferred specific examples of a repeating unit which is represented by General Formula (II) will be given below. Here, the present invention is not limited thereto.

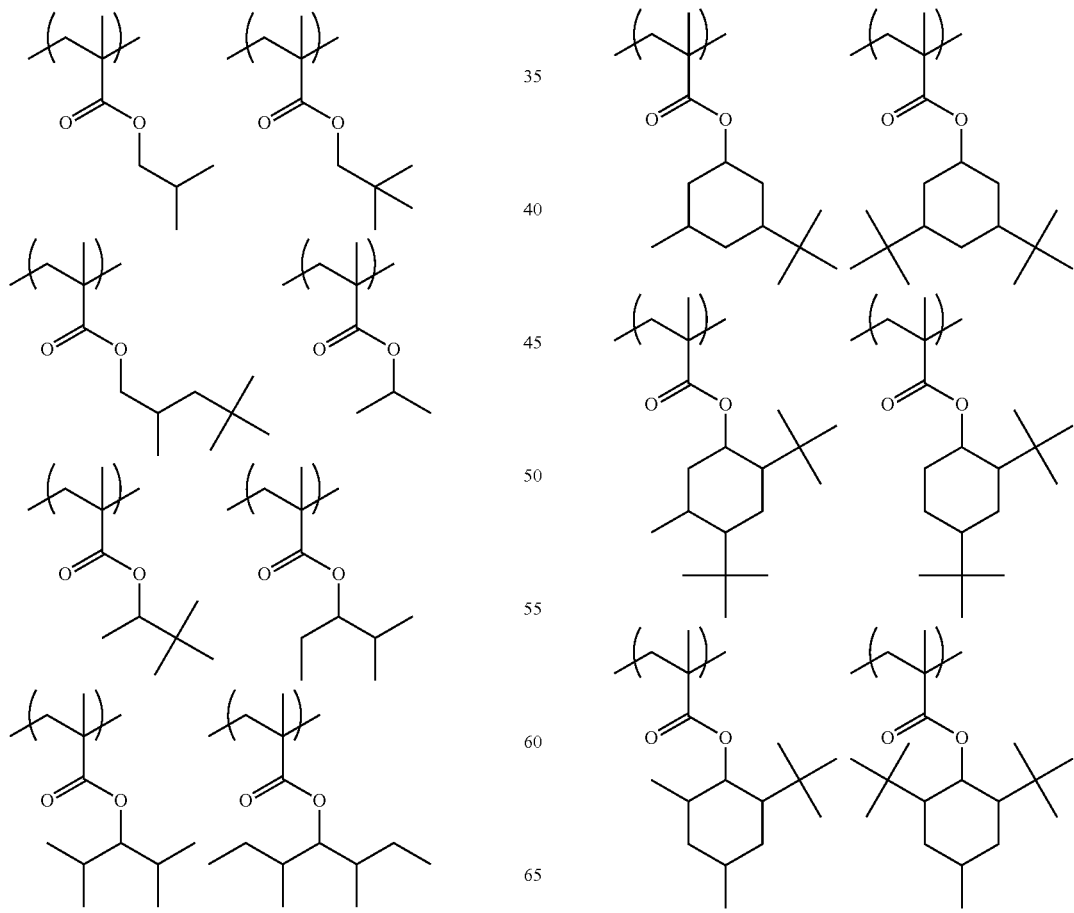

-continued

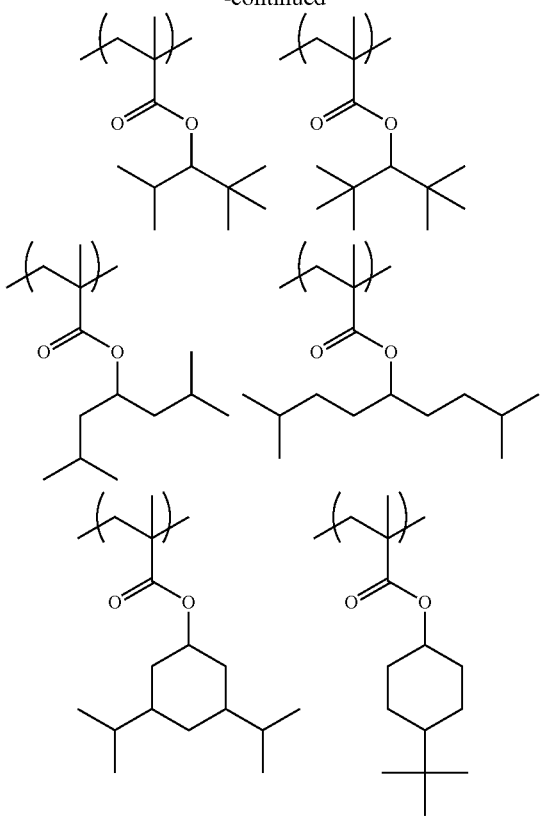

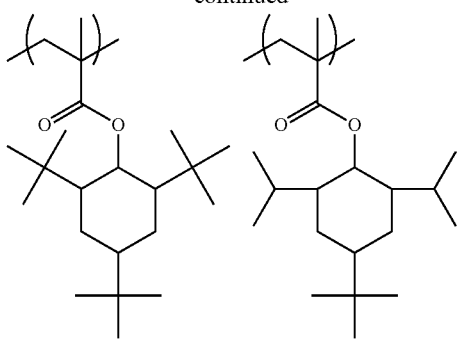
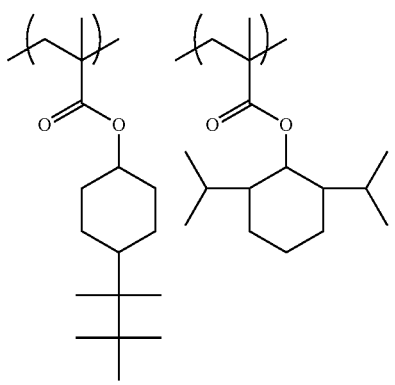
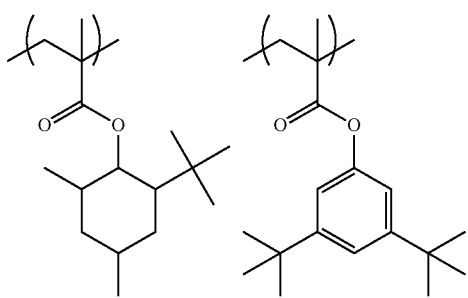
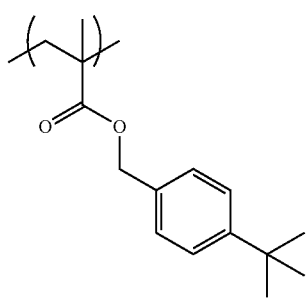

The repeating unit which is represented by General Formula (II) is preferably a repeating unit which is stable in an acid (acid non-decomposable) and, specifically, preferably a repeating unit which does not have a group which generates a polar group when decomposed by the action of an acid.

Detailed description will be given below of the repeating unit which is represented by General Formula (III).

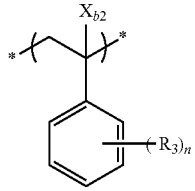

(III)

In General Formula (III) described above, $X_{b2}$ represents a hydrogen atom, an alkyl group, a cyano group, or a halogen atom, $R_3$ represents an organic group which has one or more $CH_3$ partial structures and which is stable with respect to an acid, and n represents an integer of 1 to 5.

An alkyl group of $X_{b2}$ is preferably an alkyl group with 1 to 4 carbon atoms and examples thereof include a methyl group, an ethyl group, a propyl group, a hydroxymethyl group, a trifluoromethyl group, or the like, and a hydrogen atom is preferred.

$X_{b2}$ is preferably a hydrogen atom.

Since $R_3$ is an organic group which is stable with respect to an acid, in more detail, $R_3$ is preferably an organic group which does not have the "group which generates a polar group by being decomposed by the action of an acid" described in the resin (A) above.

Examples of $R_3$ include an alkyl group which has one or more $CH_3$ partial structures.

The organic group as $R_3$ which has one or more $CH_3$ partial structures and which is stable in an acid preferably has 1 or more to 10 or less $CH_3$ partial structures, more preferably has 1 or more to 8 or less $CH_3$ partial structures, and even more preferably has 1 or more to 4 or less $CH_3$ partial structures.

An alkyl group in $R_3$ which has one or more $CH_3$ partial structures is preferably a branched alkyl group with 3 to 20 carbon atoms.

n represents an integer of 1 to 5, more preferably represents an integer of 1 to 3, and even more preferably represents 1 or 2.

Preferred specific examples of a repeating unit which is represented by General Formula (III) will be given below. Here, the present invention is not limited thereto.

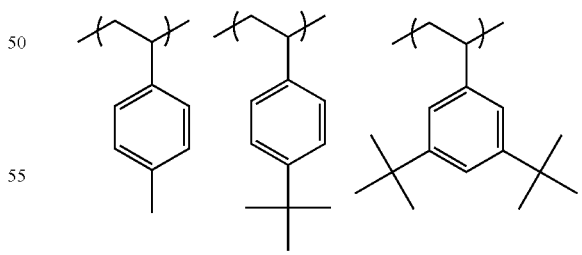
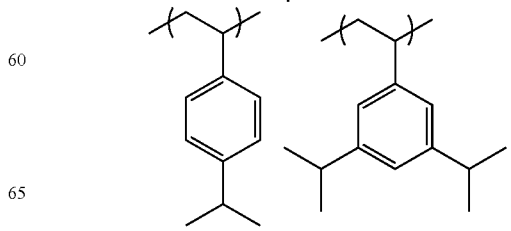

-continued

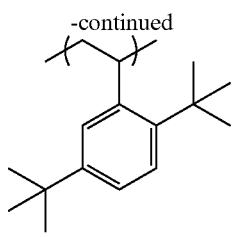

The repeating unit which is represented by General Formula (III) is preferably a repeating unit which is stable in an acid (acid non-decomposable) and, specifically, preferably a repeating unit which does not have a group which generates a polar group by being decomposed by the action of an acid.

In a case where the resin (D) includes a $CH_3$ partial structure in a side chain portion and, moreover, in a case of not having a fluorine atom and a silicon atom in particular, the content of at least one type of repeating units (x) out of the repeating unit which is represented by General Formula (II) and the repeating unit which is represented by General Formula (III) is preferably 90 mol % or more with respect to the total amount of repeating units of the resin (C), and more preferably 95 mol % or more. The content is generally 100 mol % or less with respect to the all of the repeating units of the resin (C).

By the resin (D) containing 90 mol % or more of at least one type of repeating units (x) out of the repeating unit which is represented by General Formula (II) and the repeating unit which is represented by General Formula (III) with respect to all of the repeating units of the resin (D), the surface free energy of the resin (C) increases. As the result thereof, the resin (D) is not easily unevenly distributed on the surface of the resist film and it is possible to reliably improve the static/dynamic contact angle of the resist film with respect to water to improve the liquid immersion conformance.

In addition, (i) even in a case of including a fluorine atom and/or a silicon atom or (ii) even in a case of including a $CH_3$ partial structure in a side chain portion, the hydrophobic resin (D) may have at least one group which is selected from a group of (x) to (z) below.

(x) acid group
(y) group which has a lactone structure, an acid anhydride group, or an acid imide group
(z) group which is decomposed by an action of an acid Examples of an acid group (x) include a phenolic hydroxyl group, a carboxylic acid group, a fluorinated alcohol group, a sulfonic acid group, a sulfonamide group, a sulfonylimide group, an (alkylsulfonyl) (alkylcarbonyl) methylene group, an (alkylsulfonyl) (alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, a tris(alkylsulfonyl)methylene group, and the like.

Examples of a preferred acid group include a fluorinated alcohol group (preferably hexafluoroisopropanol), a sulfonimide group, and a bis(alkylcarbonyl)methylene group.

Examples of a repeating unit which has an acid group (x) include a repeating unit where an acid group is directly bonded with the main chain of a resin such as a repeating unit by an acrylic acid and a methacrylic acid, or a repeating unit where an acid group is bonded with the main chain of a resin via a linking group and, moreover, it is also possible to use a polymerization initiator or a chain transfer agent which has an acid group during the polymerization and introduce the polymerization initiator or the chain transfer agent to the terminal of a polymer chain, and either case is preferred. A repeating unit which has an acid group (x) may have at least either of a fluorine atom and a silicon atom.

The content of the repeating unit which has an acid group (x) is preferably 1 mol % to 50 mol % with respect to all of the repeating units in the hydrophobic resin (D), more preferably 3 mol % to 35 mol %, and even more preferably 5 mol % to 20 mol %.

Specific examples of the repeating unit which has an acid group (x) will be shown below; however, the present invention is not limited thereto. In the formula, Rx represents a hydrogen atom, $CH_3$, $CF_3$, or $CH_2OH$.

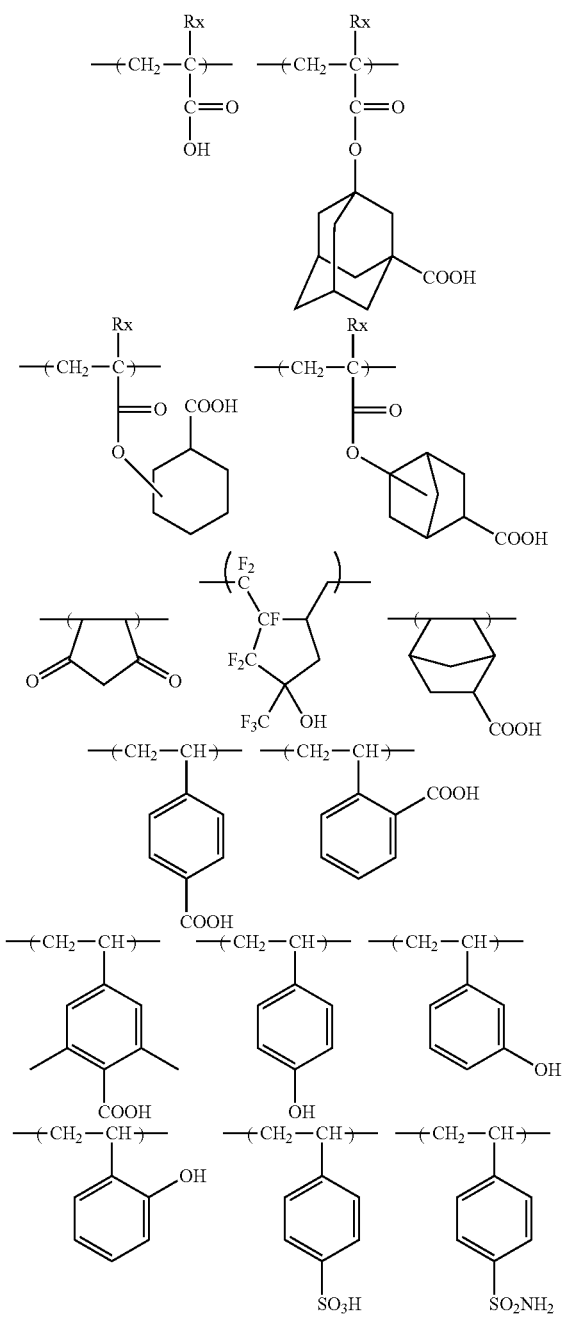

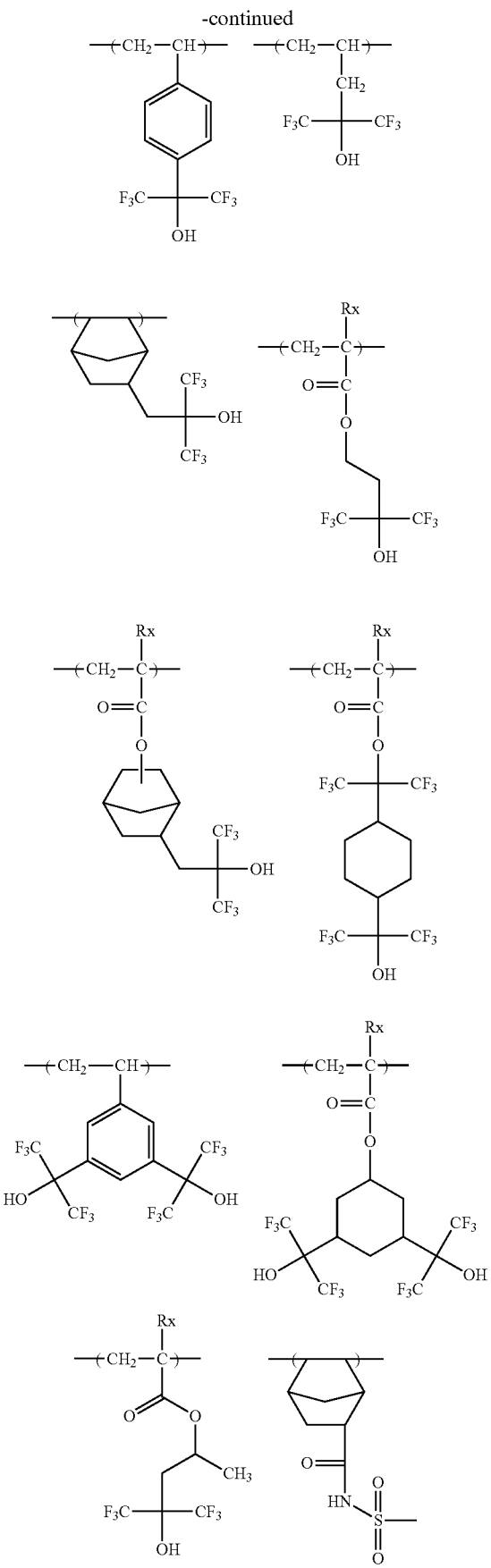
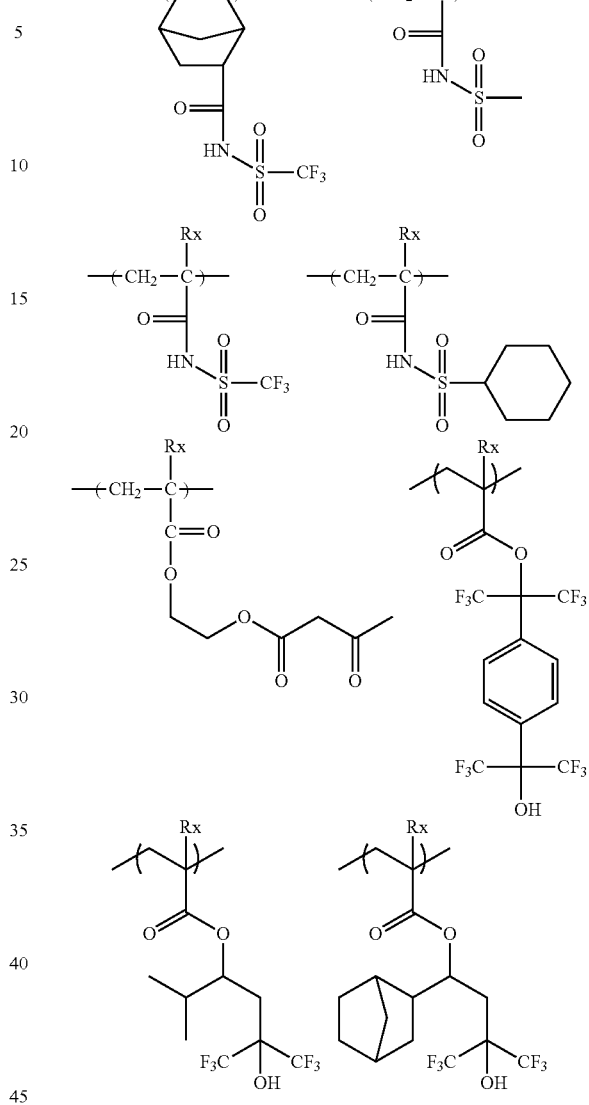

As a group which has a lactone structure, an acid anhydride group, or an acid imide group (y), a group which has a lactone structure is particularly preferred.

The repeating unit which includes the groups is, for example, a repeating unit where the groups are directly bonded with the main chain of a resin such as a repeating unit using acrylic acid ester and methacrylic acid ester. Alternatively, the repeating unit may be a repeating unit where the groups are bonded with the main chain of a resin via a linking group. Alternatively, for the repeating unit, a polymerization initiator or a chain transfer agent which has this group may be used during the polymerization and introduced to a terminal of a resin.

Examples of a repeating unit which has a group which has a lactone structure include the same examples as the repeating unit which has the lactone structure which was previously described in the section about the acid-decomposable resin (A).

The content of a repeating unit which has a group which has a lactone structure, an acid anhydride group, or an acid imide group is preferably 1 mol % to 100 mol % on the basis of all of the repeating units in the hydrophobic resin (D), more preferably 3 mol % to 98 mol %, and even more preferably 5 mol % to 95 mol %.

Examples of a repeating unit which has a group (z) which is decomposed by the action of an acid in the hydrophobic resin (D) include the same examples as the repeating units which have an acid-decomposable group which were exemplified for the resin (A). The repeating unit which has a group (z) which is decomposed by the action of an acid may have at least either of a fluorine atom and a silicon atom. The content of the repeating units which have a group (z) which is decomposed by an action of an acid in the hydrophobic resin (D) is preferably 1 mol % to 80 mol % with respect to all of the repeating units in the resin (D), more preferably 10 mol % to 80 mol %, and even more preferably 20 mol % to 60 mol %.

The hydrophobic resin (D) may further have a repeating unit which is represented by General Formula (III) below.

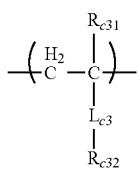

(III)

In General Formula (III), $R_{c31}$ represents a hydrogen atom, an alkyl group (may be substituted with a fluorine atom or the like), a cyano group, or a —$CH_2$—O—$Rac_2$ group. In the formula, $Rac_2$ represents a hydrogen atom, an alkyl group, or an acyl group. $R_{c31}$ is preferably a hydrogen atom, a methyl group, a hydroxymethyl group, and a trifluoromethyl group and particularly preferably a hydrogen atom and a methyl group.

$R_{c32}$ represents an alkyl group, a cycloalkyl group, an alkenyl group, a cycloalkenyl group, or a group which has an aryl group. These groups may be substituted with a group which has a fluorine atom and a silicon atom.

$L_{c3}$ represents a single bond or a divalent linking group.

The alkyl group of $R_{c32}$ in General Formula (III) is preferably a straight-chain or branched alkyl group with 3 to 20 carbon atoms.

The cycloalkyl group is preferably a cycloalkyl group with 3 to 20 carbon atoms.

The alkenyl group is preferably an alkenyl group with 3 to 20 carbon atoms.

The cycloalkenyl group is preferably a cycloalkenyl group with 3 to 20 carbon atoms.

The aryl group is preferably an aryl group with 6 to 20 carbon atoms and more preferably a phenyl group and a naphthyl group, and these may have a substituent group.

$R_{c32}$ is preferably an unsubstituted alkyl group or an alkyl group which is substituted with a fluorine atom.

The divalent linking group of $L_{c3}$ is preferably an alkylene group (preferably with 1 to 5 carbon atoms), an ether bond, a phenylene group, and an ester bond (a group which is represented by —COO—).

The content of the repeating units which are represented by General Formula (III) is preferably 1 mol % to 100 mol % on the basis of all of the repeating units in the hydrophobic resin, more preferably 10 mol % to 90 mol %, and even more preferably 30 mol % to 70 mol %.

The hydrophobic resin (D) also preferably further has a repeating unit which is represented by General Formula (CII-AB) below.

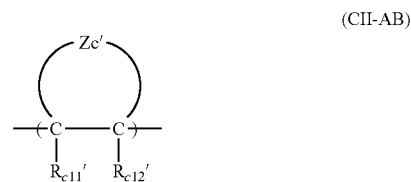

(CII-AB)

In Formula (CII-AB), $R_{c11}'$ and $R_{c12}'$ each independently represent a hydrogen atom, a cyano group, a halogen atom, or an alkyl group.

Zc' includes two bonded carbon atoms (C—C) and represents an atomic group for forming an alicyclic structure.

The content of the repeating units which are represented by General Formula (CII-AB) is preferably 1 mol % to 100 mol % on the basis of all of the repeating units in the hydrophobic resin, more preferably 10 mol % to 90 mol %, and even more preferably 30 mol % to 70 mol %.

Specific examples of the repeating units which are represented by General Formulas (III) and (CII-AB) below will be given below; however, the present invention is not limited thereto. In the formulas, Ra represents H, $CH_3$, $CH_2OH$, $CF_3$, or CN.

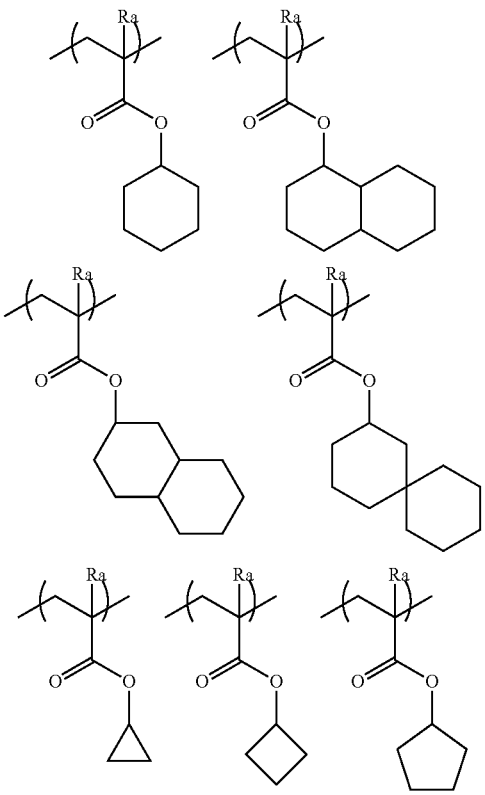

-continued

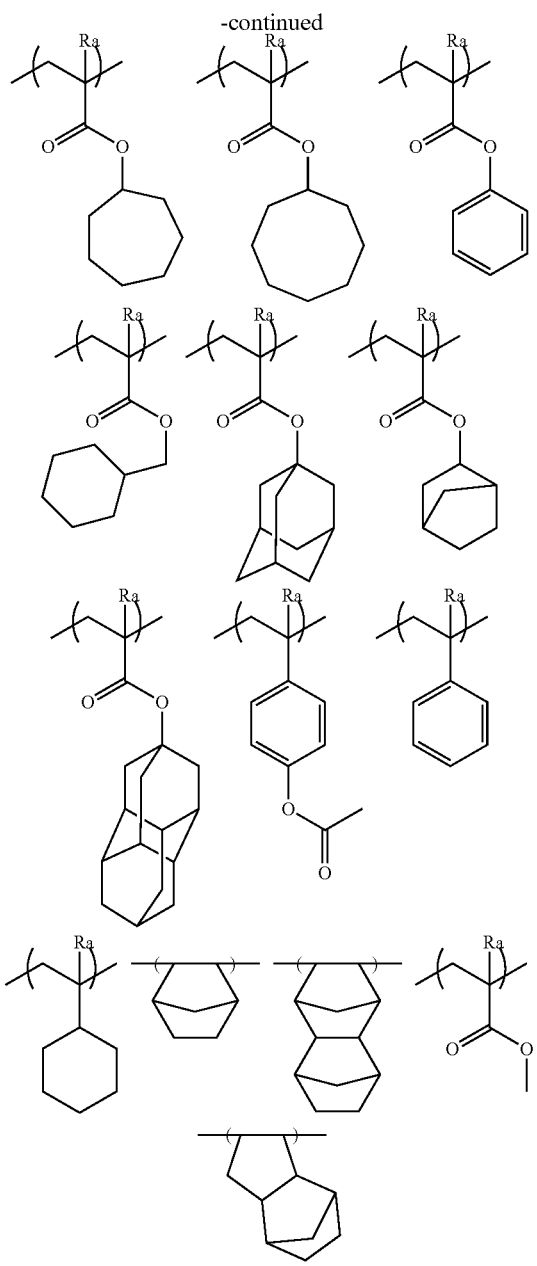

In a case where the hydrophobic resin (D) has a fluorine atom, the content of the fluorine atoms is preferably 5 mass % to 80 mass % with respect to the weight average molecular weight of the hydrophobic resin (D) and more preferably 10 mass % to 80 mass %. In addition, the repeating unit which includes a fluorine atom is preferably 10 mol % to 100 mol % in all of the repeating units which are included in the hydrophobic resin (D) and more preferably 30 mol % to 100 mol %.

In a case where the hydrophobic resin (D) has a silicon atom, the content of the silicon atoms is preferably 2 mass % to 50 mass % with respect to the weight average molecular weight of the hydrophobic resin (D) and more preferably 2 mass % to 30 mass %. In addition, the repeating unit which includes a silicon atom is preferably 10 mol % to 100 mol % in all of the repeating units which are included in the hydrophobic resin (D) and more preferably 20 mol % to 100 mol %.

On the other hand, particularly in a case where the resin (D) includes a $CH_3$ partial structure in a side chain portion, a form in which the resin (D) substantially does not contain a fluorine atom and a silicon atom is also preferred and, in this case, specifically, the content of the repeating units which have a fluorine atom or a silicon atom is preferably 5 mol % or less with respect to all of the repeating units in the resin (D), more preferably 3 mol % or less, even more preferably 1 mol % or less, and ideally 0 mol %, that is, a fluorine atom and a silicon atom are not contained. In addition, the resin (D) is preferably substantially only formed by repeating units which are only configured by atoms selected from a carbon atom, an oxygen atom, a hydrogen atom, a nitrogen atom, and a sulfur atom. In more detail, repeating units which are only configured by atoms selected from a carbon atom, an oxygen atom, a hydrogen atom, a nitrogen atom, and a sulfur atom are preferably 95 mol % or more in all of the repeating units of the resin (D), more preferably 97 mol % or more, even more preferably 99 mol % or more, and ideally 100 mol %.

The weight average molecular weight of the hydrophobic resin (D) in standard polystyrene conversion is preferably 1,000 to 100,000, more preferably 1,000 to 50,000, and even more preferably 2,000 to 15,000.

In addition, the hydrophobic resin (D) may be used as one type or a plurality thereof may be used together.

The content of the hydrophobic resin (D) in the composition is preferably 0.01 mass % to 10 mass % with respect to the total solid content in the composition of the present invention, more preferably 0.05 mass % to 8 mass %, and even more preferably 0.1 mass % to 7 mass %.

While the hydrophobic resin (D) naturally has few impurities such as metals in the same manner as the resin (A), the residual monomers or oligomer components are preferably 0.01 mass % to 5 mass %, more preferably 0.01 mass % to 3 mass %, and even more preferably 0.05 mass % to 1 mass %. Due to this, it is possible to obtain an actinic ray-sensitive or radiation-sensitive resin composition where there is no foreign matter in the liquid and there is no change in the sensitivity over time or the like. In addition, from the viewpoint of the resolution, the resist shape, the side wall of the resist pattern, the roughness, and the like, the molecular weight distribution (Mw/Mn, also referred to as the dispersity) is preferably in a range of 1 to 5, more preferably 1 to 3, and even more preferably in a range of 1 to 2.

It is also possible to use various types of commercially available products of the hydrophobic resin (D) or to synthesize the hydrophobic resin (D) according to normal methods (for example, radical polymerization). Examples of typical synthesizing methods include a collective polymerization method for performing polymerization by dissolving monomers and an initiator in a solvent and heating the result, a dripping polymerization method for dropwise adding a solution of monomers and an initiator to a heated solvent over 1 hour to 10 hours, and the like, and the dripping polymerization method is preferred.

The reaction solvent, the polymerization initiator, the reaction conditions (temperature, concentration, and the like), and the purifying method after reaction are the same as for the content described for the resin (A); however, in the synthesis of the hydrophobic resin (D), the reaction concentration is preferably 30 mass % to 50 mass %.

Specific examples of the hydrophobic resin (D) will be shown below. In addition, the molar fraction of repeating units in each resin (corresponding to each repeating unit in order from the left), the weight average molecular weight, and the dispersity will be shown in the table below.

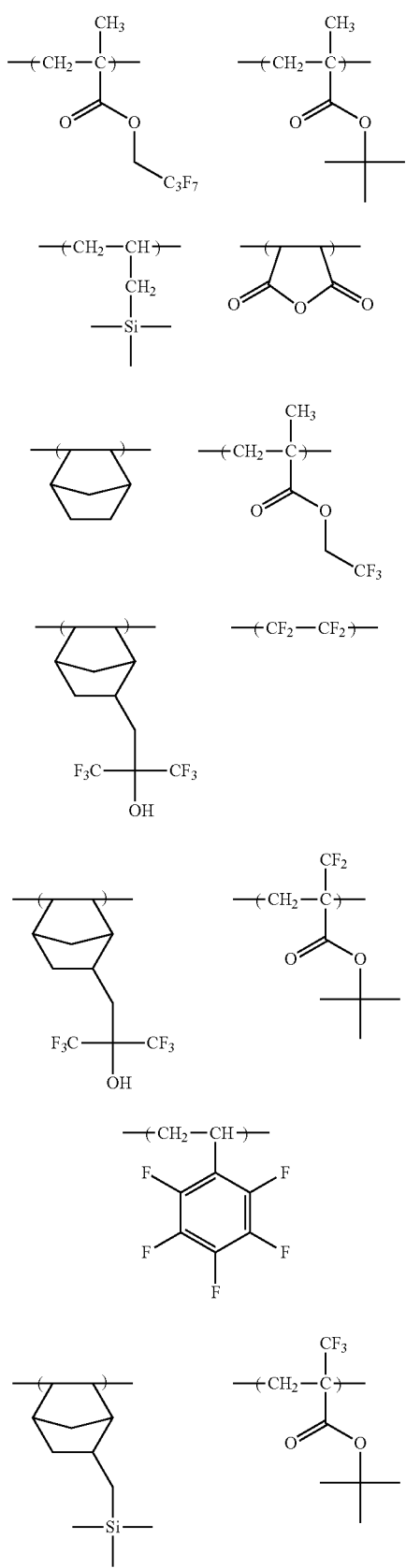

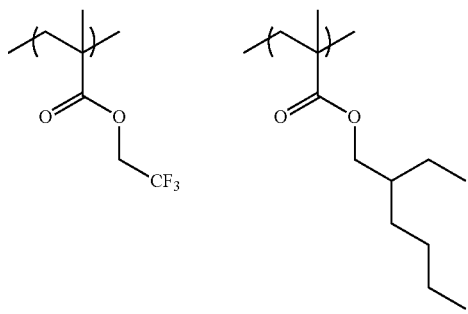 (HR-13)
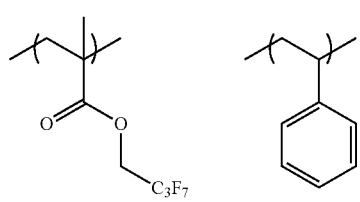 (HR-14)
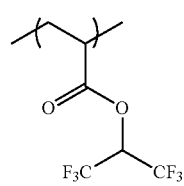 (HR-15)
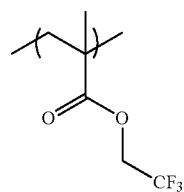 (HR-16)
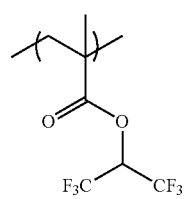 (HR-17)
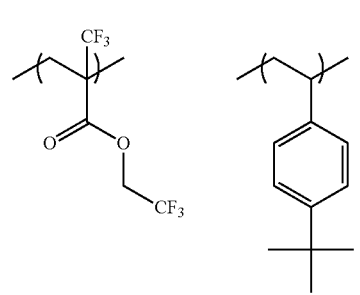 (HR-18)
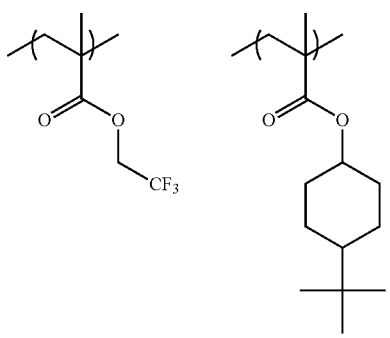 (HR-19)
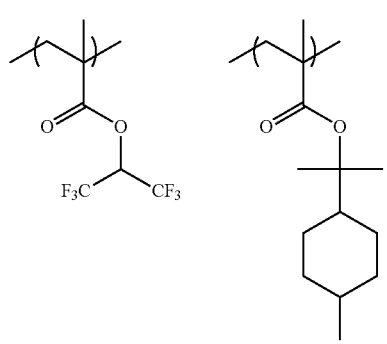 (HR-20)
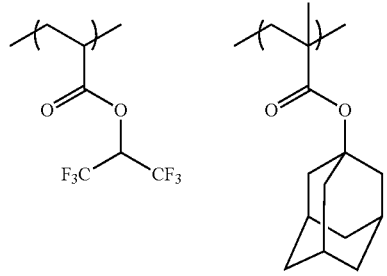 (HR-21)
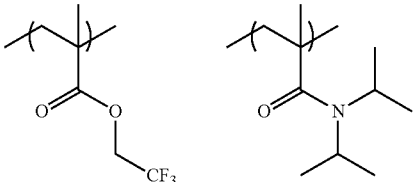 (HR-22)
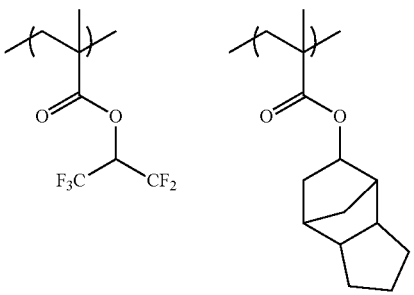 (HR-23)

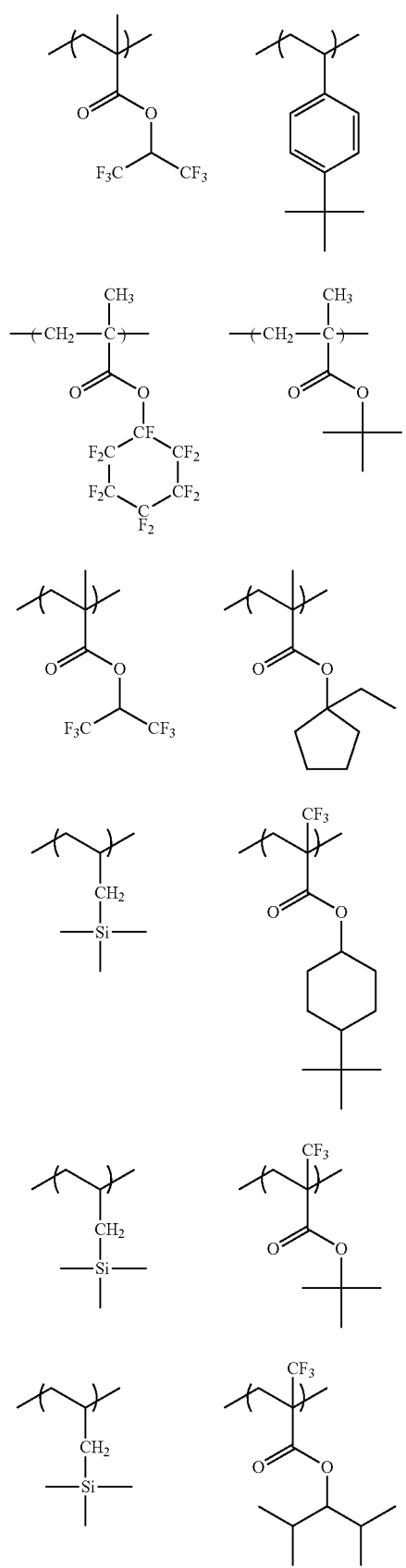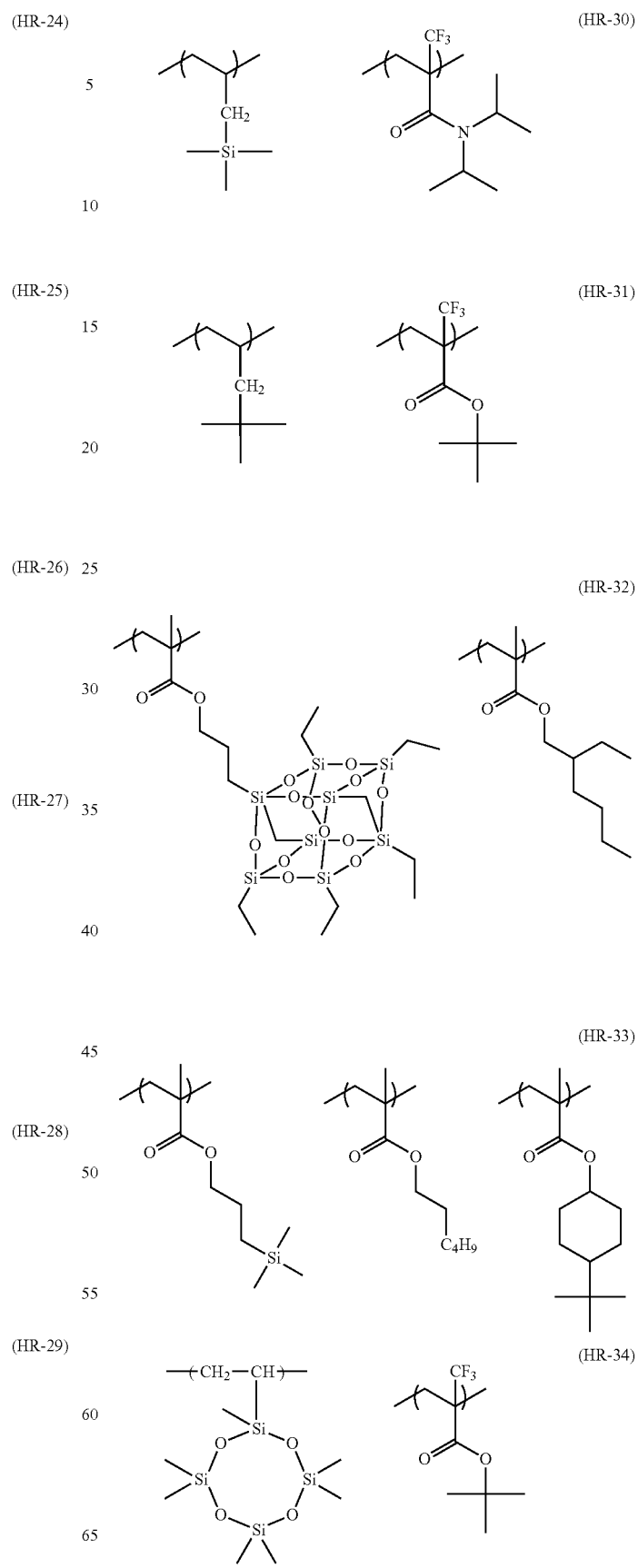

(HR-35)
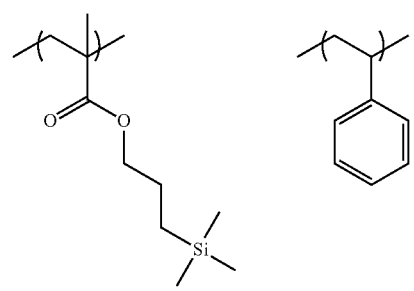
(HR-36)
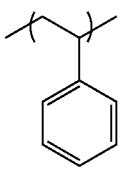
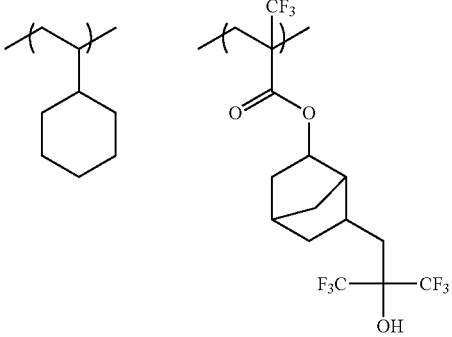
(HR-37)
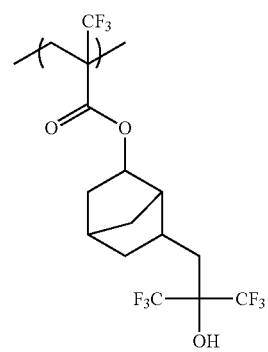
(HR-38)
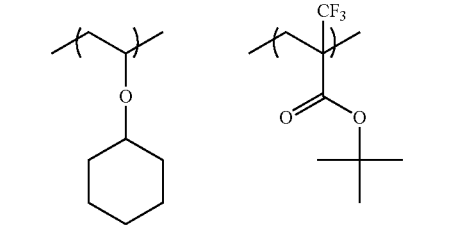
(HR-39)
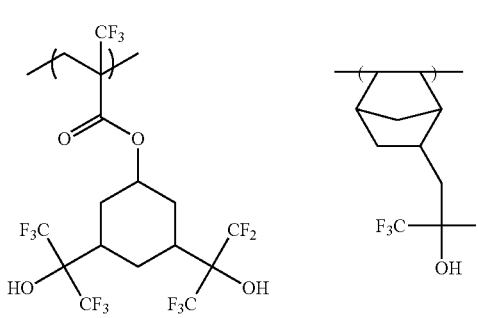
(HR-40)
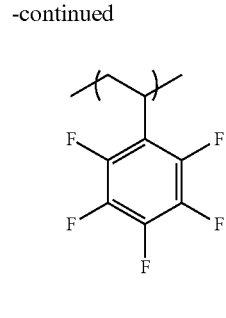
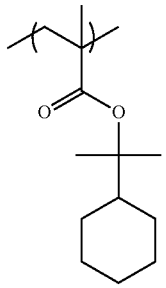
(HR-41)
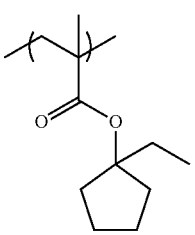
(HR-42)
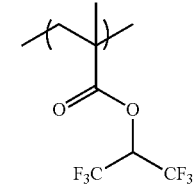
(HR-43)
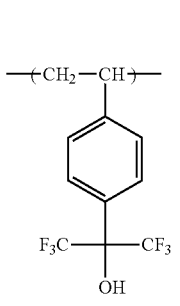
(HR-44)

(HR-45)
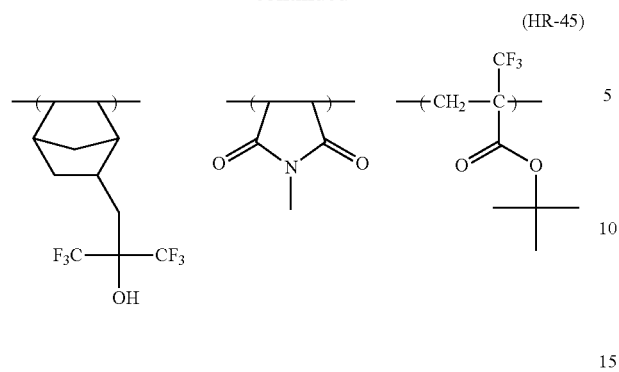
(HR-50)
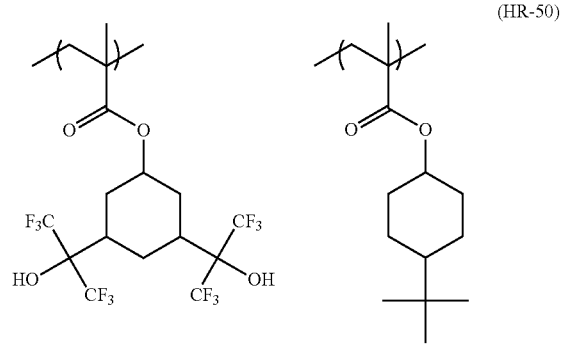
(HR-46)
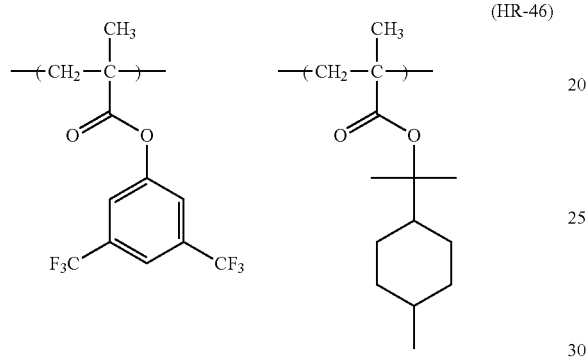
(HR-51)
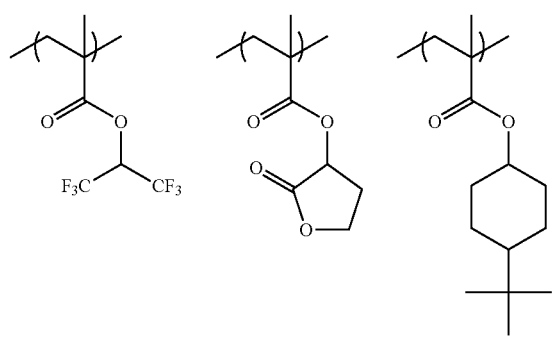
(HR-47)
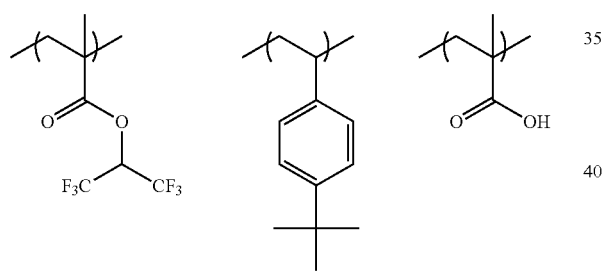
(HR-52)
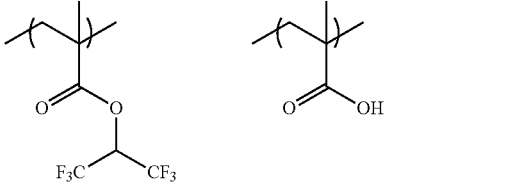
(HR-48)
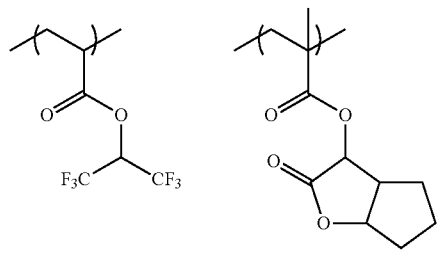
(HR-53)
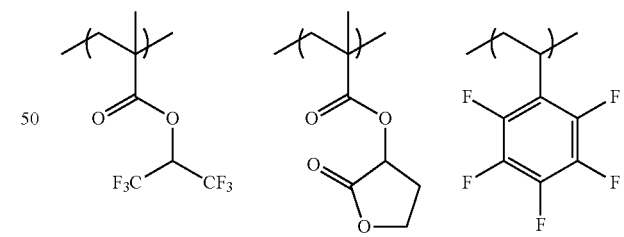
(HR-49)
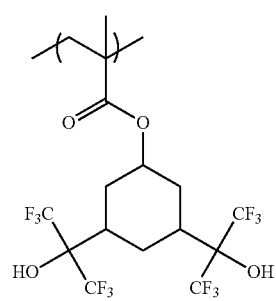
(HR-54)
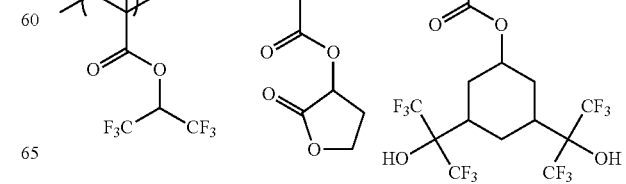

(HR-55)
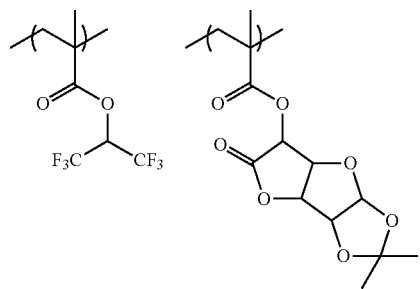
(HR-56)
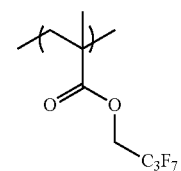 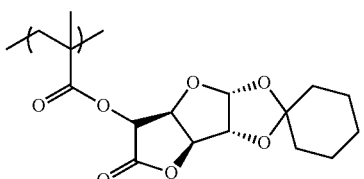
(HR-57)
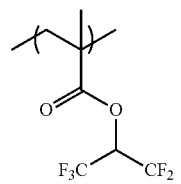 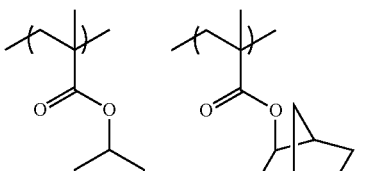
(HR-58)
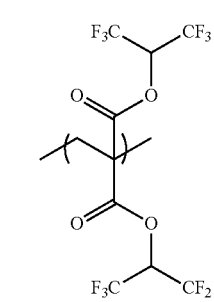 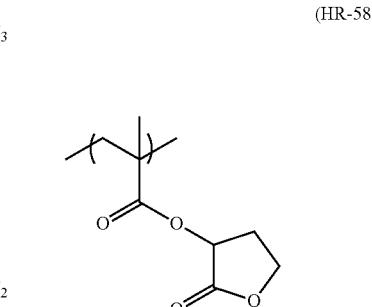
(HR-59)
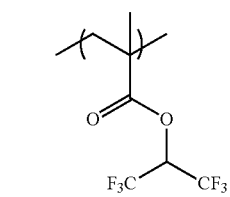
(HR-60)
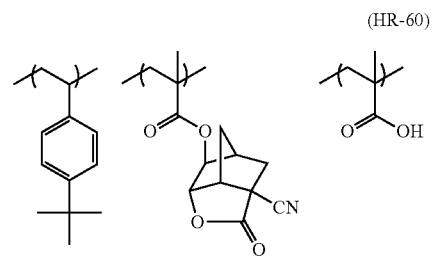
(HR-61)
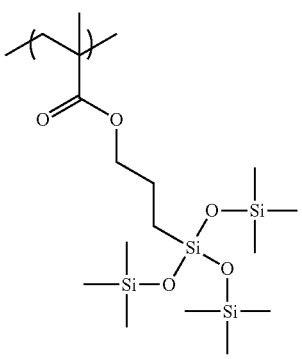 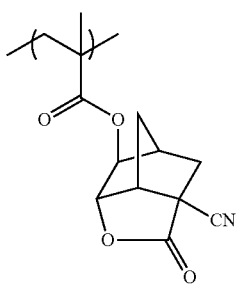
(HR-62)
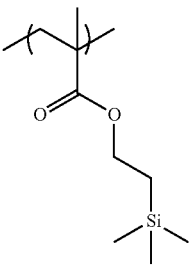 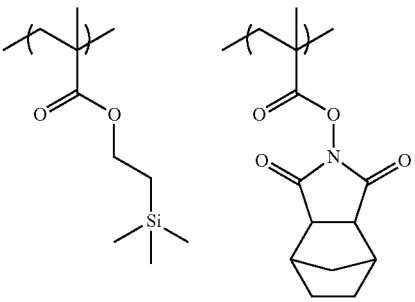
(HR-63)
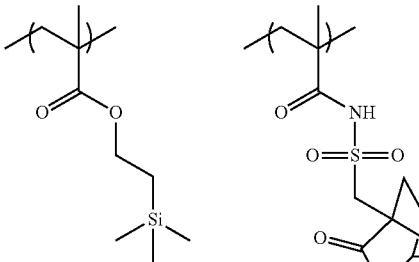
(HR-64)
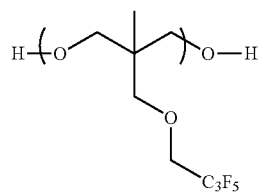

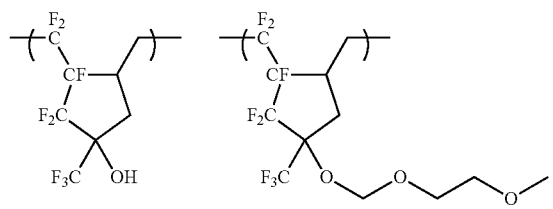
(HR-65)
TABLE 1
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
TABLE 1-continued
| Resin | Composition | Mw | Mw/Mn |
|---|---|---|---|
| HR-63 | 80/20 | 7000 | 1.7 |
| HR-64 | 100 | 5500 | 1.8 |
| HR-65 | 50/50 | 9500 | 1.9 |
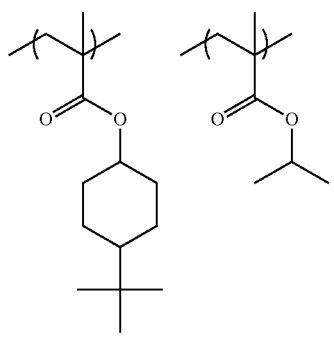
(C-1)
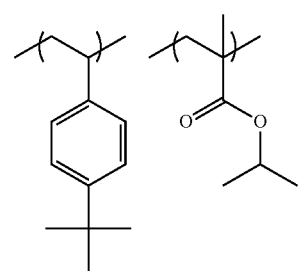
(C-2)
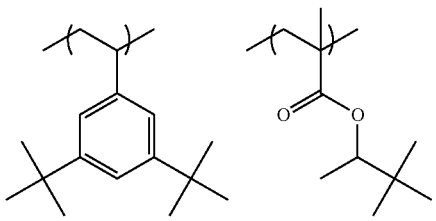
(C-3)
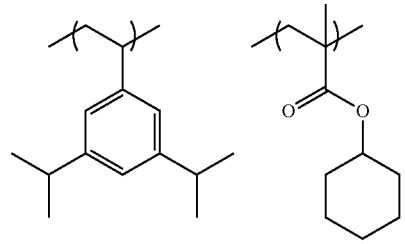
(C-4)
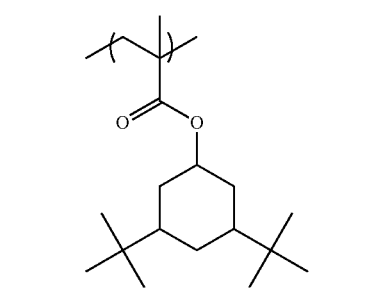
(C-5)

(C-6) 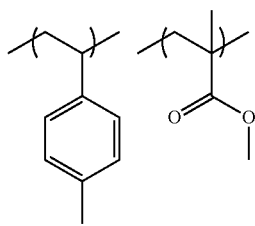
(C-7) 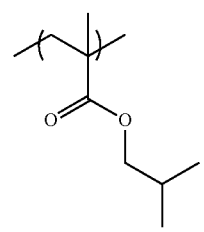
(C-8)
(C-9) 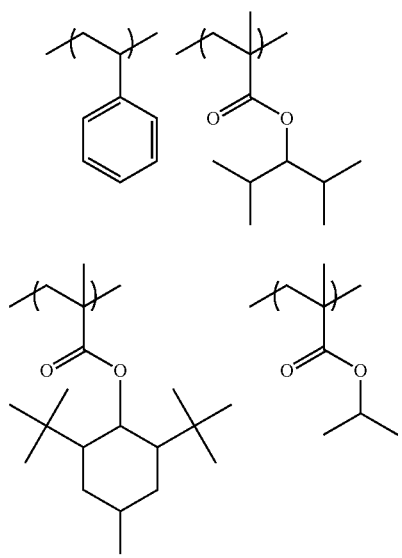
(C-10) 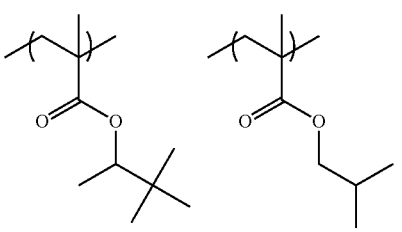
(C-11) 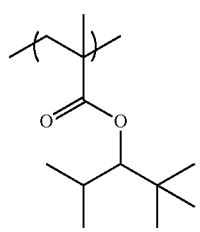
(C-12) 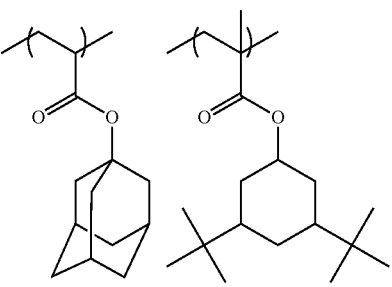
(C-13) 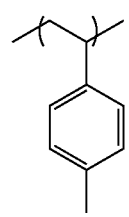
(C-14) 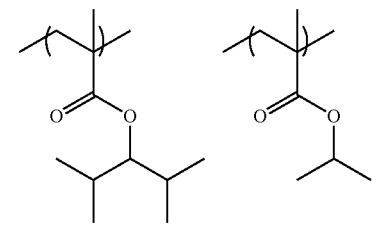
(C-15) 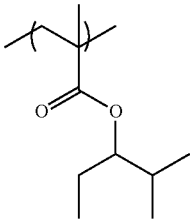
(C-16) 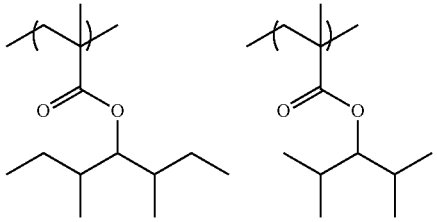
(C-17) 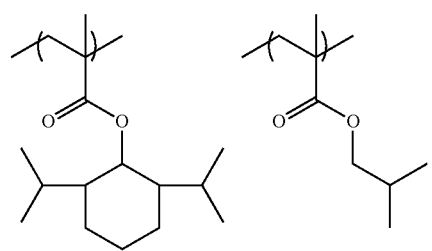

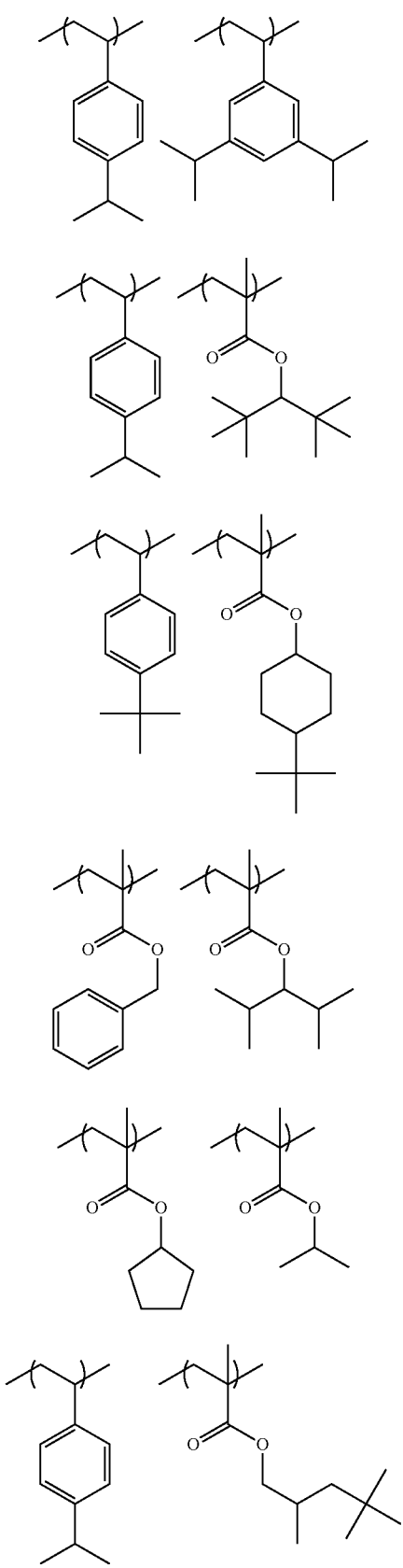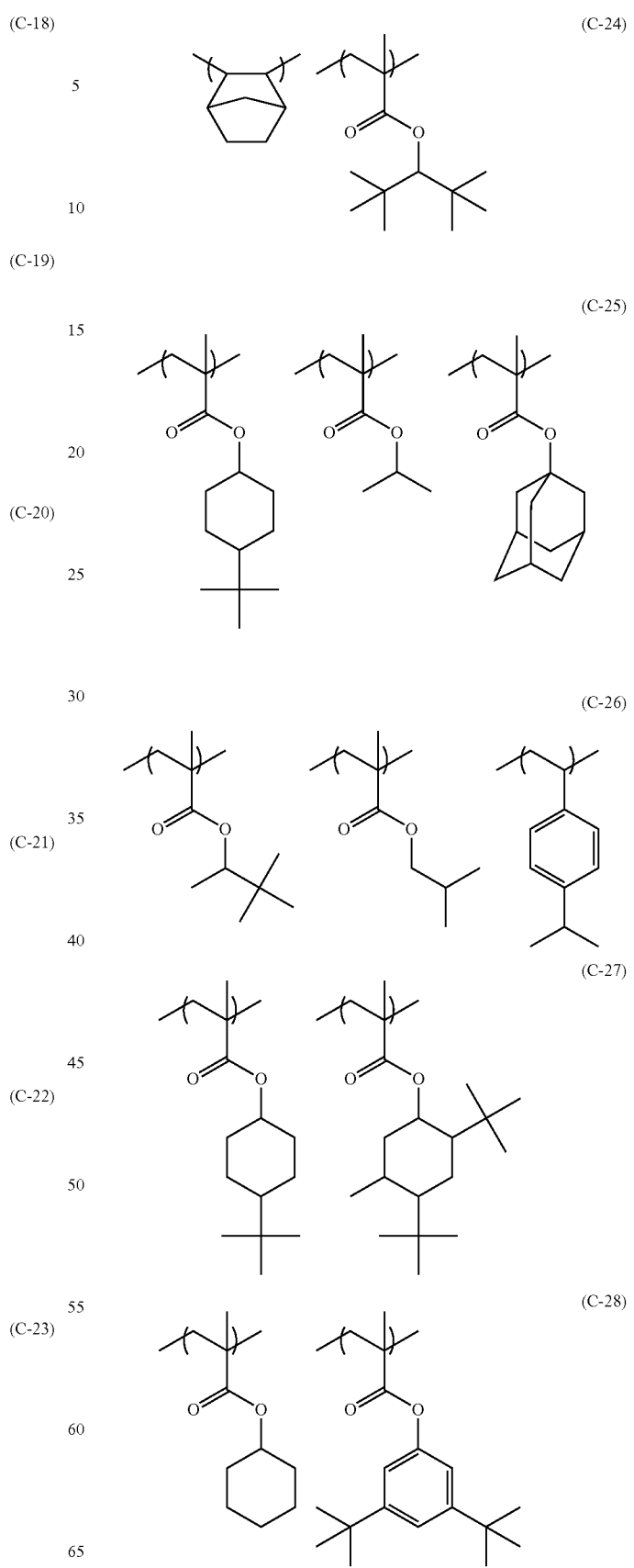

-continued
(D-1)
(D-2)
(D-3)
(D-4)
(D-5)
(D-6)
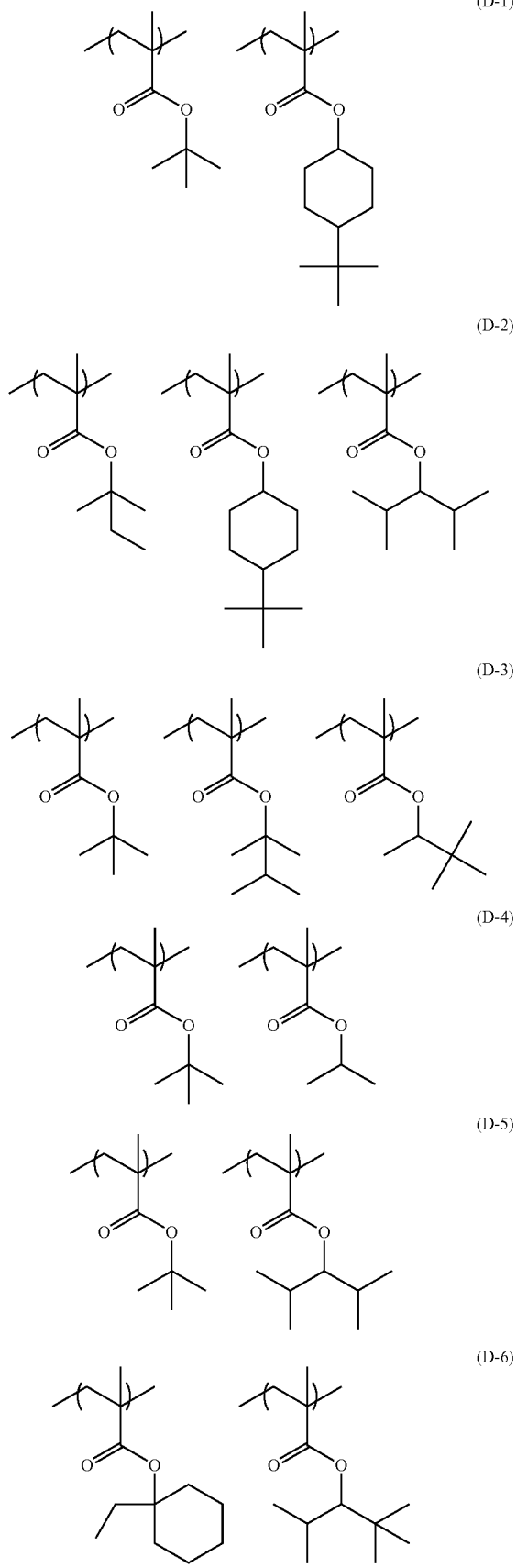
-continued
(D-7)
(D-8)
(D-9)
(D-10)
(D-11)
(D-12)
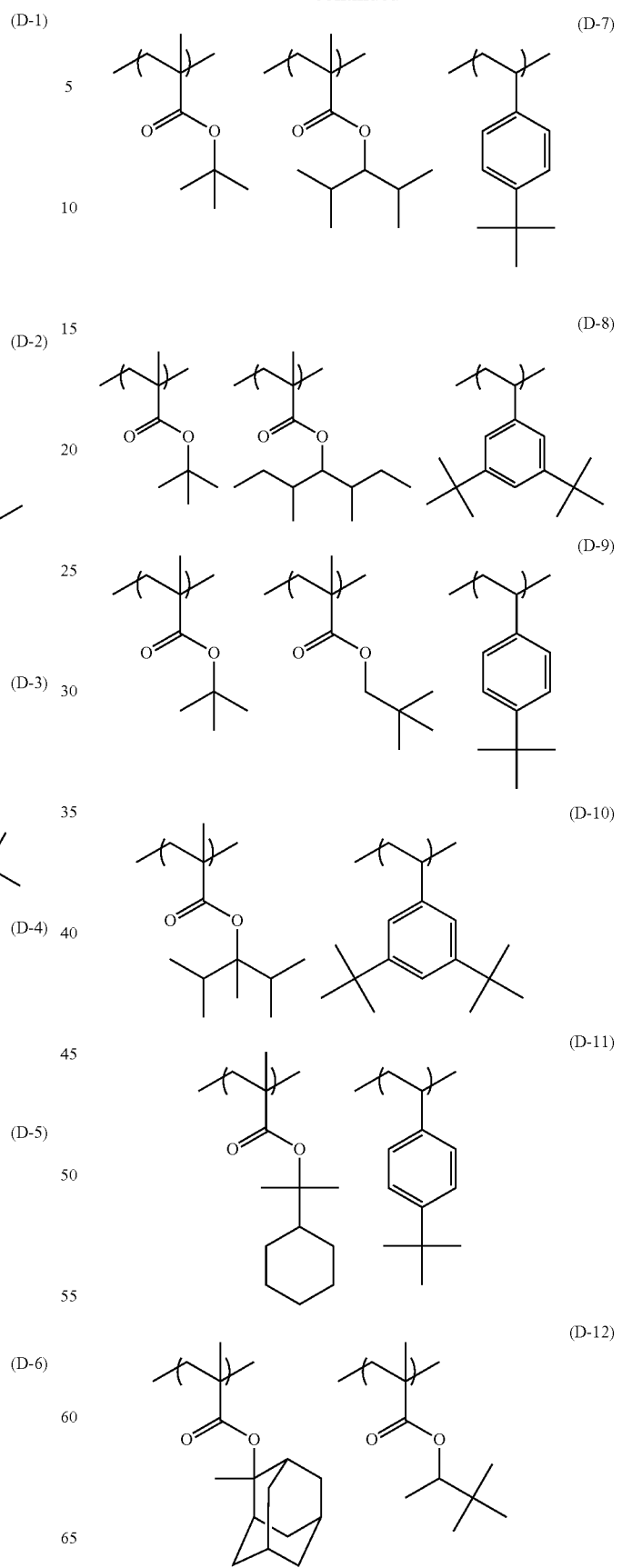

-continued

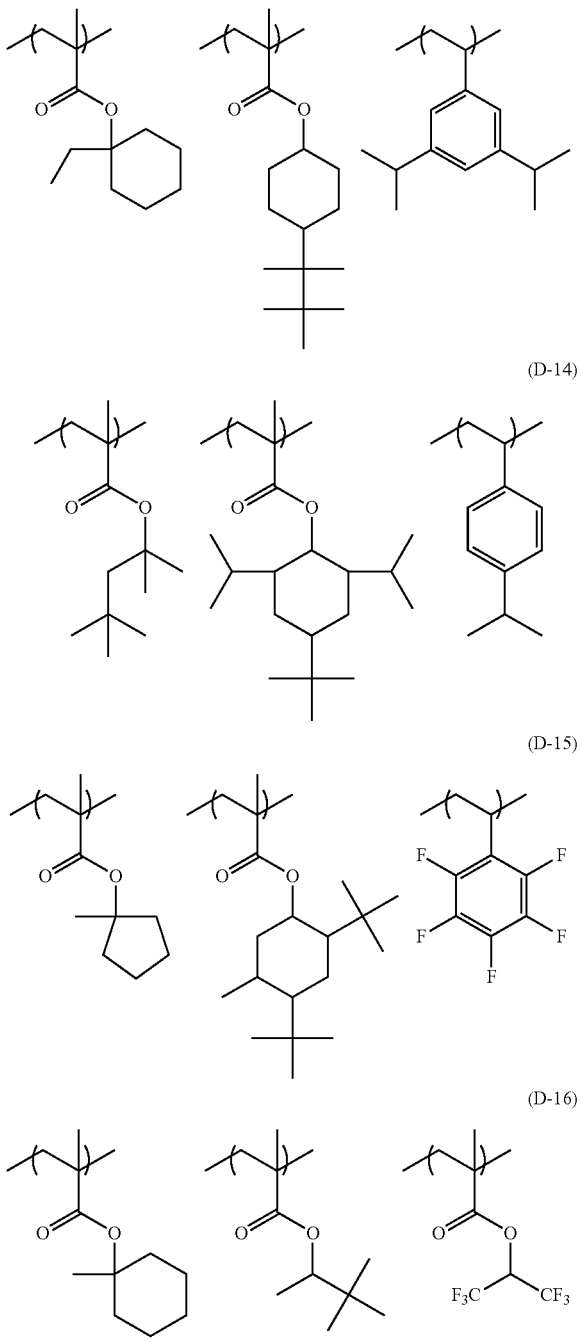

(D-13)
(D-14)
(D-15)
(D-16)

TABLE 2

| Resin | Composition | Mw | Mw/Mn |
|---|---|---|---|
| C-1 | 50/50 | 9600 | 1.74 |
| C-2 | 60/40 | 34500 | 1.43 |
| C-3 | 30/70 | 19300 | 1.69 |
| C-4 | 90/10 | 26400 | 1.41 |
| C-5 | 100 | 27600 | 1.87 |
| C-6 | 80/20 | 4400 | 1.96 |
| C-7 | 100 | 16300 | 1.83 |
| C-8 | 5/95 | 24500 | 1.79 |
| C-9 | 20/80 | 15400 | 1.68 |

TABLE 2-continued

| Resin | Composition | Mw | Mw/Mn |
|---|---|---|---|
| C-10 | 50/50 | 23800 | 1.46 |
| C-11 | 100 | 22400 | 1.57 |
| C-12 | 10/90 | 21600 | 1.52 |
| C-13 | 100 | 28400 | 1.58 |
| C-14 | 50/50 | 16700 | 1.82 |
| C-15 | 100 | 23400 | 1.73 |
| C-16 | 60/40 | 18600 | 1.44 |
| C-17 | 80/20 | 12300 | 1.78 |
| C-18 | 40/60 | 18400 | 1.58 |
| C-19 | 70/30 | 12400 | 1.49 |
| C-20 | 50/50 | 23500 | 1.94 |
| C-21 | 10/90 | 7600 | 1.75 |
| C-22 | 5/95 | 14100 | 1.39 |
| C-23 | 50/50 | 17900 | 1.61 |
| C-24 | 10/90 | 24600 | 1.72 |
| C-25 | 50/40/10 | 23500 | 1.65 |
| C-26 | 60/30/10 | 13100 | 1.51 |
| C-27 | 50/50 | 21200 | 1.84 |
| C-28 | 10/90 | 19500 | 1.66 |

TABLE 3

| Resin | Composition | Mw | Mw/Mn |
|---|---|---|---|
| D-1 | 50/50 | 16500 | 1.72 |
| D-2 | 10/50/40 | 18000 | 1.77 |
| D-3 | 5/50/45 | 27100 | 1.69 |
| D-4 | 20/80 | 26500 | 1.79 |
| D-5 | 10/90 | 24700 | 1.83 |
| D-6 | 10/90 | 15700 | 1.99 |
| D-7 | 5/90/5 | 21500 | 1.92 |
| D-8 | 5/60/35 | 17700 | 2.10 |
| D-9 | 35/35/30 | 25100 | 2.02 |
| D-10 | 70/30 | 19700 | 1.85 |
| D-11 | 75/25 | 23700 | 1.80 |
| D-12 | 10/90 | 20100 | 2.02 |
| D-13 | 5/35/60 | 30100 | 2.17 |
| D-14 | 5/45/50 | 22900 | 2.02 |
| D-15 | 15/75/10 | 28600 | 1.81 |
| D-16 | 25/55/20 | 27400 | 1.87 |

[6] Surfactant (F)

The resin compositions (1) to (3) in the present invention may or may not each further contain a surfactant and, when contained, fluorine and/or silicon-based surfactants (a fluorine-based surfactant, a silicon-based surfactant, and a surfactant which has both a fluorine atom and a silicon atom) or two or more types thereof are more preferably contained.

By the resin compositions (1) to (3) in the present invention (particularly the resin compositions (1) and (3)) containing a surfactant, it is possible to impart a resist pattern with adhesiveness and fewer developing defects with a favorable sensitivity and resolution while using an exposure light source of 250 nm or less, particularly 220 nm or less.

Examples of the fluorine-based and/or silicon-based surfactants include the surfactants described in paragraph "0276" in US2008/0248425A and the fluorine-based and/or silicon-based surfactants are, for example, Eftop EF301 and EF303 (produced by Shin-Akita Kasei Co., Ltd.), Fluorad FC430, 431, and 4430 (produced by Sumitomo 3M Ltd.), Megafac F171, F173, F176, F189, F113, F110, F177, F120, and R08 (produced by DIC Corporation.), Surflon S-382, SC101, 102, 103, 104, 105, 106, and KH-20 (produced by Asahi Glass Co., Ltd.), Troyzol S-366 (produced by Troy Chemical Industries, Inc.), GF-300 and GF-150 (produced by Toagosei Co., Ltd.), Surflon S-393 (produced by Seimi Chemical Co., Ltd.), Eftop EF121, EF122A, EF122B, RF122C, EF125M, EF135M, EF351, EF352, EF801, EF802, and EF601 (produced by Jemco Inc.), PF636, PF656, PF6320, and PF6520 (produced by OMNOVA Solutions Inc.), FTX-204G, 208G, 218G, 230G, 204D, 208D, 212D, 218D, and 222D (produced by Neos Corporation.), and the like. In addition, it is also possible to use polysiloxane polymer KP-341 (produced by Shin-Etsu Chemical Co., Ltd.) as a silicon-based surfactant.

In addition, as a surfactant, other than the surfactants known in the art as shown above, it is possible to use a surfactant which uses a polymer which has a fluoro aliphatic group which is derived from a fluoro aliphatic compound which is produced by a telomerization method (also referred to as a telomer method) or an oligomerization method (also referred to as an oligomer method). It is possible to synthesize the fluoro aliphatic compound using the method described in JP2002-90991A.

Examples of surfactants which correspond to those described above include Megafac F178, F-470, F-473, F-475, F-476, and F-472 (produced by DIC Corporation.), a copolymer of acrylate (or methacrylate) which has a $C_6F_{13}$ group and (poly(oxyalkylene))acrylate (or methacrylate), a copolymer of acrylate (or methacrylate) which has a $C_3F_7$ group, (poly(oxyethylene))acrylate (or methacrylate), and (poly(oxypropylene))acrylate (or methacrylate), and the like.

In addition, in the present invention, it is also possible to use other surfactants than the fluorine-based and/or the silicon-based surfactants described in paragraph "0280" in US2008/0248425A.

The surfactants may be used individually or may also be used in a combination of several thereof.

The resin compositions (1) to (3) in the present invention may each contain or may not contain a surfactant; however, when a surfactant is contained, the usage amount of the surfactant is preferably 0.0001 mass % to 2 mass % with respect to the total amount of the resin composition (excluding a solvent) and more preferably 0.0005 mass % to 1 mass %.

[7] Other Additive (G)

The resin compositions (1) to (3) in the present invention may or may not each contain carboxylic acid onium salt. Examples of the carboxylic acid onium salt include the examples described in paragraphs "0605" and "0606" in US2008/0187860A.

It is possible to synthesize these carboxylic acid onium salts by reacting sulfonium hydroxide, iodonium hydroxide, ammonium hydroxide, and carboxylic acid with an appropriate silver oxide in the solvent.

In a case where the resin compositions (1) to (3) contain carboxylic acid onium salt, the content thereof is generally 0.1 mass % to 20 mass % with respect to the total solid content of the resin composition, preferably 0.5 mass % to 10 mass %, and more preferably 1 mass % to 7 mass %.

It is possible to, as necessary, further contain a compound (for example, a phenol compound with molecular weight of 1,000 or less, or an alicyclic or aliphatic compound which has a carboxyl group), which promotes solubility with respect to an acid proliferating agent, a dye, a plasticizer, a photosensitizer, a light absorption agent, an alkali-soluble resin, a dissolution inhibitor, and a developer or the like in the resin compositions (1) to (3).

It is possible for a person skilled in the art to easily synthesize a phenol compound with a molecular weight of 1,000 or less with reference to, for example, the methods described in JP1992-122938A (JP-H4-122938A), JP1990-28531A (JP-H2-28531A), U.S. Pat. No. 4,916,210A, EP219294A, and the like.

Specific examples of an alicyclic or aliphatic compound which has a carboxyl group include a carbonic acid derivative which has a steroid structure such as cholic acid, deoxycholic acid, and lithocholic acid, an adamantane carbonic acid derivative, adamantane dicarbonic acid, cyclohexane carbonic acid, cyclohexane dicarbonic acid, and the like; however, the present invention is not limited thereto.

The resin compositions (1) to (3) in the present invention are preferably used with a film thickness of 30 nm to 250 nm from the point of view of improving the resolution power and more preferably used with a film thickness of 30 nm to 200 nm. It is possible to set the film thickness by setting the concentration of solid contents in the composition to an appropriate range to have a suitable viscosity and improving the coating property and film-forming property.

The solid content concentrations of the resin compositions (1) to (3) in the present invention are each generally 1.0 mass % to 10 mass %, preferably 2.0 mass % to 5.7 mass %, and more preferably 2.0 mass % to 5.3 mass %. By setting the solid content concentration to these ranges, it is possible to uniformly coat the resist solution on a substrate and, moreover, it is possible to form a resist pattern with excellent line width roughness. The reason is not clear; however, it is considered that, by setting the solid content concentration to 10 mass % or less and preferably 5.7 mass % or less, the aggregation of materials, particularly the photoacid generator, in the resist solution is suppressed and, as the result, it is possible to form a uniform resist film.

The solid content concentration is the weight percentage of the weight of other resist components excluding the solvent with respect to the total weight of the actinic ray-sensitive or radiation-sensitive resin compositions.

The resin compositions (1) to (3) in the present invention are prepared by dissolving the components described above in a predetermined organic solvent, preferably the mixed solvent.

Here, during the preparation, a step for reducing metal impurities in the composition to the ppb level using an ion-exchange film, a step for filtering impurities such as various types of particles using an appropriate filter, a degassing step, and the like may be performed. Specific description of the steps is given in JP2012-88574A, JP2010-189563A, 2001-12529A, JP2001-350266A, JP2002-99076A, JP1993-307263A (JP-H5-307263A), JP2010-164980A, WO2006/121162A, JP2010-243866A, JP2010-020297A, and the like.

In particular, a filter which is suitably used in the step for filtering is preferably made of polytetrafluoroethylene, made of polyethylene, or made of nylon with a pore size of 0.1 µm or less, more preferably 0.05 µm or less, and even more preferably 0.03 µm or less.

In addition, the resin compositions (1) to (3) of the present invention preferably have a low moisture content. In detail, the moisture content is preferably 2.5 mass % or less of the total weight of the composition, more preferably 1.0 mass % or less, and even more preferably 0.3 mass % or less.

Favorable specific examples of the resin composition (1) in the present invention will be given below.

In more detail, the favorable specific examples of the resin composition (1) below are obtained by dissolving 3.8 mass % of the components shown in Table 4 in the total solid content using the solvent shown in the same table and preparing the resin compositions by filtering each resin composition using a polyethylene filter with a pore size of 0.1 µm.

TABLE 4

| Resin composition | Resin | Mass/g | Combined Resin | Mass/g | Acid generating agent | Mass/g | Combined acid generating agent | Mass/g | Basic compound | Mass/g | Combined basic compound | Mass/g | Surfactant | Mass/g | Additive | Mass/g | Solvent | Ratio (mass ratio) |
|---|---|---|---|---|---|---|---|---|---|---|---|---|---|---|---|---|---|---|
| Ar-01 | Pol-A-01 | 10 | — | — | PAG-A1 | 0.3 | PAG-A2 | 0.2 | N-1 | 0.02 | N-5 | 0.01 | W-1 | 0.03 | 1b | 0.05 | SL-A1/SL-A4 | 80/20 |
| Ar-02 | Pol-A-02 | 10 | — | — | PAG-A8 | 0.3 | PAG-A9 | 0.2 | N-2 | 0.02 | N-6 | 0.01 | — | — | 4b | 0.05 | SL-A1/SL-A4 | 70/30 |
| Ar-03 | Pol-A-03 | 10 | — | — | PAG-A11 | 0.3 | PAG-A12 | 0.2 | N-2 | 0.03 | — | — | W-2 | 0.03 | 2b | 0.05 | SL-A1/SL-A5 | 98/2 |
| Ar-04 | Pol-A-04 | 10 | — | — | PAG-A5 | 0.3 | PAG-A6 | 0.2 | N-1 | 0.02 | N-8 | 0.01 | W-3 | 0.03 | 3b | 0.05 | SL-A1/SL-A2 | 80/20 |
| Ar-05 | Pol-A-05 | 10 | — | — | PAG-A10 | 0.3 | PAG-A9 | 0.2 | N-9 | 0.03 | — | — | — | — | 1b | 0.05 | SL-A1 | 100 |
| Ar-06 | Pol-A-06 | 10 | — | — | PAG-A12 | 0.5 | — | — | N-3 | 0.03 | — | — | W-1 | 0.03 | 4b | 0.05 | SL-A1/SL-A3 | 70/30 |
| Ar-07 | Pol-A-01 | 8 | Pol-A-07 | 2 | PAG-A2 | 0.5 | — | — | N-3 | 0.02 | N-7 | 0.01 | — | — | 4b | 0.05 | SL-A1/SL-A2 | 80/20 |
| Ar-08 | Pol-A-07 | 10 | — | — | PAG-A7 | 0.3 | PAG-A2 | 0.2 | N-4 | 0.02 | N-5 | 0.01 | W-4 | 0.03 | 3b | 0.05 | SL-A1/SL-A5 | 95/5 |
| Ar-09 | Pol-A-08 | 10 | — | — | PAG-A8 | 0.3 | PAG-A4 | 0.2 | N-1 | 0.03 | — | — | — | — | 2b | 0.05 | SL-A1/SL-A3 | 80/20 |
| Ar-10 | Pol-A-09 | 8 | Pol-A-08 | 2 | PAG-A13 | 0.3 | PAG-A12 | 0.2 | N-3 | 0.02 | N-6 | 0.01 | W-1 | 0.03 | 1b | 0.05 | SL-A1/SL-A2 | 90/10 |
| Ar-11 | Pol-A-10 | 10 | — | — | PAG-A1 | 0.3 | PAG-A3 | 0.2 | N-8 | 0.03 | — | — | — | — | 1b | 0.05 | SL-A1/SL-A3 | 65/35 |
| Ar-12 | Pol-A-11 | 10 | — | — | PAG-A7 | 0.3 | PAG-A9 | 0.2 | N-2 | 0.03 | — | — | W-1 | 0.03 | 2b | 0.05 | SL-A1/SL-A4 | 70/30 |
| Ar-13 | Pol-A-12 | 10 | — | — | PAG-A5 | 0.3 | PAG-A12 | 0.2 | N-2 | 0.02 | N-6 | 0.01 | — | — | 4b | 0.05 | SL-A1/SL-A3 | 70/30 |
| Ar-14 | Pol-A-13 | 10 | — | — | PAG-A8 | 0.3 | PAG-A9 | 0.2 | N-1 | 0.02 | N-7 | 0.01 | W-6 | 0.03 | 4b | 0.05 | SL-A1/SL-A4 | 65/35 |
| Ar-15 | Pol-A-14 | 10 | — | — | PAG-A12 | 0.5 | — | — | N-3 | 0.03 | — | — | W-5 | 0.03 | 2b | 0.05 | SL-A1/SL-A4 | 55/45 |
| Ar-16 | Pol-A-15 | 10 | — | — | PAG-A10 | 0.3 | PAG-A9 | 0.2 | N-1 | 0.02 | N-9 | 0.01 | — | — | 1b | 0.05 | SL-A1/SL-A4 | 90/10 |
| Ar-17 | Pol-A-16 | 10 | — | — | PAG-A6 | 0.5 | — | — | N-4 | 0.02 | N-7 | 0.01 | — | — | 3b | 0.05 | SL-A1 | 100 |
| Ar-18 | Pol-A-17 | 10 | — | — | PAG-A7 | 0.3 | PAG-A2 | 0.2 | N-4 | 0.03 | — | — | — | — | 4b | 0.05 | SL-A1/SL-A4 | 80/20 |
| Ar-19 | Pol-A-18 | 10 | — | — | PAG-A11 | 0.3 | PAG-A4 | 0.2 | N-2 | 0.02 | N-8 | 0.01 | W-4 | 0.03 | 1b | 0.05 | SL-A1/SL-A3 | 65/35 |
| Ar-20 | Pol-A-19 | 10 | — | — | PAG-A6 | 0.5 | — | — | N-3 | 0.02 | N-7 | 0.01 | — | — | 1b | 0.05 | SL-A1 | 100 |
| Ar-21 | Pol-A-20 | 10 | — | — | PAG-A1 | 0.3 | PAG-A9 | 0.2 | N-4 | 0.03 | — | — | — | — | 4b | 0.05 | SL-A1/SL-A4 | 95/5 |
| Ar-22 | Pol-A-01 | 10 | — | — | PAG-A1 | 0.5 | — | — | N-1 | 0.02 | N-6 | 0.01 | — | — | 3b | 0.05 | SL-A1/SL-A4 | 85/15 |
| Ar-23 | Pol-A-02 | 10 | — | — | PAG-A8 | 0.5 | — | — | N-6 | 0.03 | — | — | W-6 | 0.03 | 2b | 0.05 | SL-A1/SL-A4 | 80/20 |
| Ar-24 | Pol-A-03 | 10 | — | — | PAG-A11 | 0.5 | — | — | N-3 | 0.03 | — | — | — | — | 4b | 0.05 | SL-A1/SL-A5 | 95/5 |
| Ar-25 | Pol-A-07 | 10 | — | — | PAG-A5 | 0.5 | — | — | N-2 | 0.02 | N-9 | 0.01 | W-1 | 0.03 | 4b | 0.05 | SL-A1/SL-A3 | 70/30 |
| Ar-26 | Pol-A-08 | 10 | — | — | PAG-A10 | 0.5 | — | — | N-1 | 0.02 | N-8 | 0.01 | W-1 | 0.03 | 4b | 0.05 | SL-A1/SL-A4 | 70/30 |
| Ar-27 | Pol-A-09 | 10 | — | — | PAG-A13 | 0.5 | — | — | N-4 | 0.03 | — | — | — | — | 2b | 0.05 | SL-A1/SL-A4 | 95/5 |
| Ar-28 | Pol-A-10 | 10 | — | — | PAG-A10 | 0.5 | — | — | N-2 | 0.02 | N-9 | 0.01 | W-3 | 0.03 | 1b | 0.05 | SL-A1/SL-A4 | 90/10 |
| Ar-29 | Pol-A-11 | 10 | — | — | PAG-A7 | 0.5 | — | — | N-7 | 0.03 | — | — | — | — | 1b | 0.05 | SL-A1/SL-A4 | 95/5 |
| Ar-30 | Pol-A-12 | 10 | — | — | PAG-A10 | 0.5 | — | — | N-3 | 0.03 | — | — | — | — | 1b | 0.05 | SL-A1/SL-A4 | 95/5 |
| Ar-31 | Pol-A-03 | 10 | — | — | PAG-A14 | 0.5 | — | — | N-3 | 0.03 | — | — | W-1 | 0.03 | 1b | 0.05 | SL-A1/SL-A3 | 70/30 |
| Ar-32 | Pol-A-21 | 10 | — | — | PAG-A11 | 0.3 | PAG-A12 | 0.2 | N-1 | 0.03 | — | — | — | — | 2b | 0.05 | SL-A1/SL-A4 | 95/5 |

<Resin (A)>
The resins in Table 4 are as follows.

TABLE 5

| Resin | Unit-1 | Molar fraction (%) | Unit-2 | Molar fraction (%) | Unit-3 | Molar fraction (%) | Unit-4 | Molar fraction (%) | Unit-5 | Molar fraction (%) | Weight average molecular weight (Mw) | Dispersity |
|---|---|---|---|---|---|---|---|---|---|---|---|---|
| Pol-A-01 | Unit A-1 | 30 | Unit B-3 | 40 | Unit C-1 | 25 | Unit A-9 | 5 | — | — | 11200 | 1.6 |
| Pol-A-02 | Unit A-1 | 40 | Unit B-1 | 50 | Unit C-2 | 10 | — | — | — | — | 9600 | 1.6 |
| Pol-A-03 | Unit A-2 | 45 | Unit B-2 | 40 | Unit C-3 | 5 | Unit A-7 | 5 | Unit A-10 | 5 | 9800 | 1.7 |
| Pol-A-04 | Unit A-3 | 40 | Unit C-4 | 50 | Unit A-5 | 10 | — | — | — | — | 10500 | 1.6 |
| Pol-A-05 | Unit A-5 | 40 | Unit C-5 | 60 | — | — | — | — | — | — | 20300 | 1.8 |
| Pol-A-06 | Unit A-1 | 40 | Unit C-6 | 55 | Unit A-6 | 5 | — | — | — | — | 15300 | 1.7 |
| Pol-A-07 | Unit A-2 | 40 | Unit B-4 | 20 | Unit C-7 | 35 | Unit A-8 | 5 | — | — | 9400 | 1.8 |
| Pol-A-08 | Unit A-3 | 35 | Unit B-5 | 25 | Unit C-8 | 35 | Unit A-4 | 5 | — | — | 13200 | 1.6 |
| Pol-A-09 | Unit A-2 | 30 | Unit B-6 | 35 | Unit C-9 | 35 | — | — | — | — | 11400 | 1.9 |
| Pol-A-10 | Unit A-1 | 30 | Unit C-10 | 65 | Unit A-4 | 5 | — | — | — | — | 13200 | 1.6 |
| Pol-A-11 | Unit A-5 | 35 | Unit C-4 | 65 | — | — | — | — | — | — | 16900 | 1.7 |
| Pol-A-12 | Unit A-2 | 25 | Unit C-3 | 65 | Unit A-10 | 10 | — | — | — | — | 14400 | 1.8 |
| Pol-A-13 | Unit A-3 | 50 | Unit B-7 | 10 | Unit C-9 | 40 | — | — | — | — | 8400 | 1.6 |
| Pol-A-14 | Unit A-4 | 20 | Unit B-6 | 40 | Unit C-10 | 40 | — | — | — | — | 10900 | 1.9 |
| Pol-A-15 | Unit A-2 | 35 | Unit B-5 | 25 | Unit C-6 | 40 | — | — | — | — | 11000 | 1.7 |
| Pol-A-16 | Unit A-2 | 30 | Unit C-3 | 70 | — | — | — | — | — | — | 15200 | 1.6 |
| Pol-A-17 | Unit A-1 | 20 | Unit C-8 | 70 | Unit A-8 | 10 | — | — | — | — | 13100 | 1.8 |
| Pol-A-18 | Unit A-6 | 20 | Unit C-9 | 70 | Unit A-9 | 10 | — | — | — | — | 9900 | 1.6 |
| Pol-A-19 | Unit A-2 | 45 | Unit B-7 | 10 | Unit C-7 | 45 | — | — | — | — | 10400 | 1.6 |
| Pol-A-20 | Unit A-7 | 20 | Unit C-6 | 80 | — | — | — | — | — | — | 11200 | 1.8 |
| Pol-A-21 | Unit A-1 | 40 | Unit B-3 | 50 | Unit B-6 | 10 | — | — | — | — | 10600 | 1.7 |

The repeating units in the resins in Table 5 described above are as follows.

Unit A-1

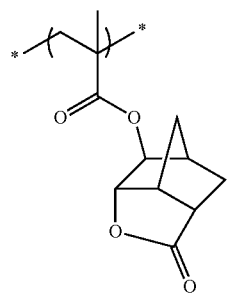

Unit A-2

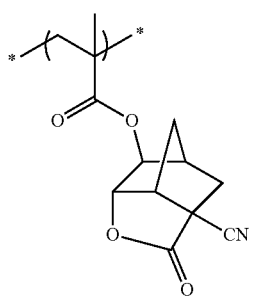

Unit A-3

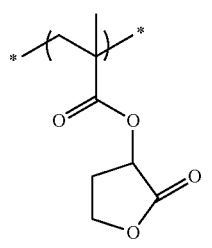

Unit A-4

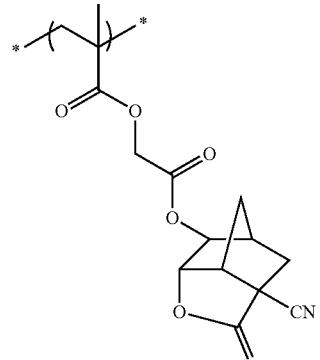

Unit A-5

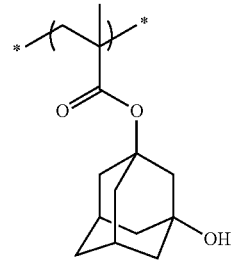

Unit A-6

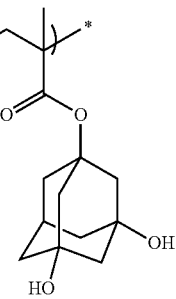

Unit A-7
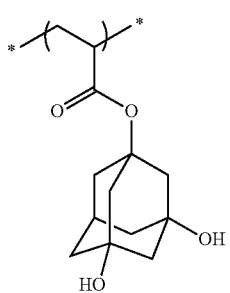
Unit A-8
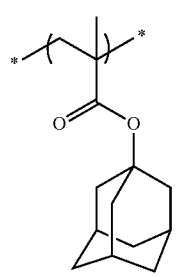
Unit A-9
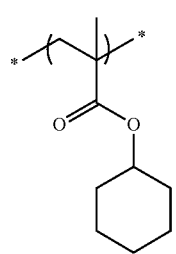
Unit A-10
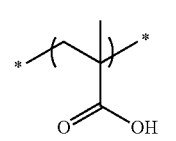
Unit B-1
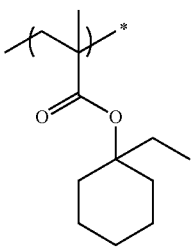
Unit B-2
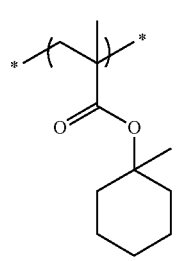
Unit B-3
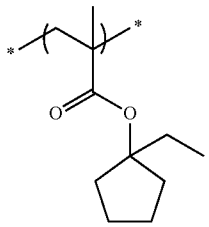
Unit B-4
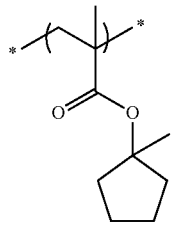
Unit B-5
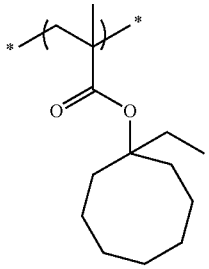
Unit B-6
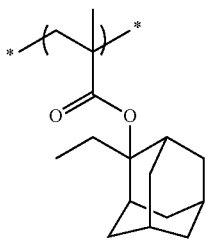
Unit B-7
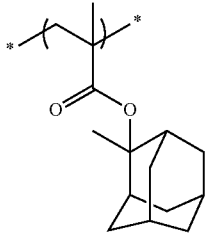
Unit C-1
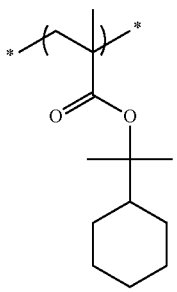

-continued
Unit C-2
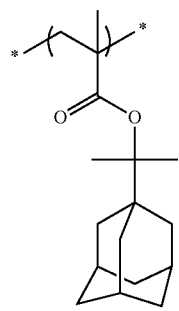
Unit C-3
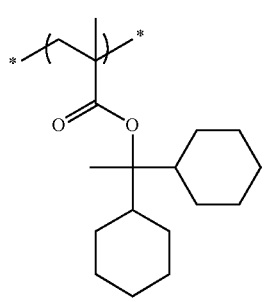
Unit C-4
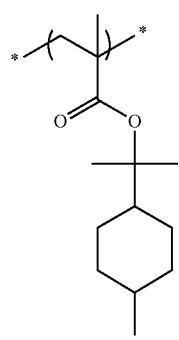
Unit C-5
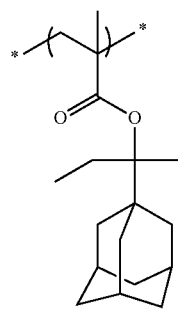
Unit C-6
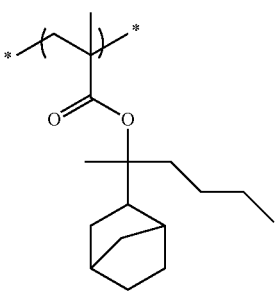
-continued
Unit C-7
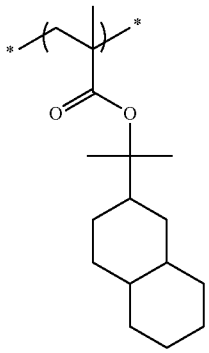
Unit C-8
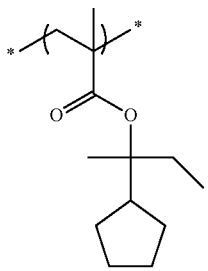
Unit C-9
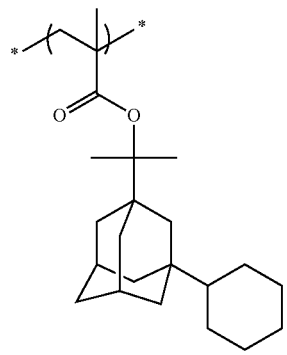
Unit C-10
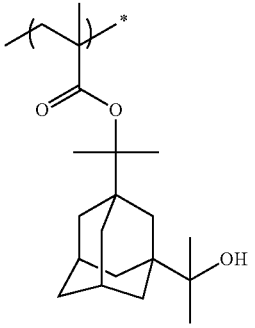
<Acid Generating Agent (B)>
The acid generating agents in Table 4 described above are as follows.

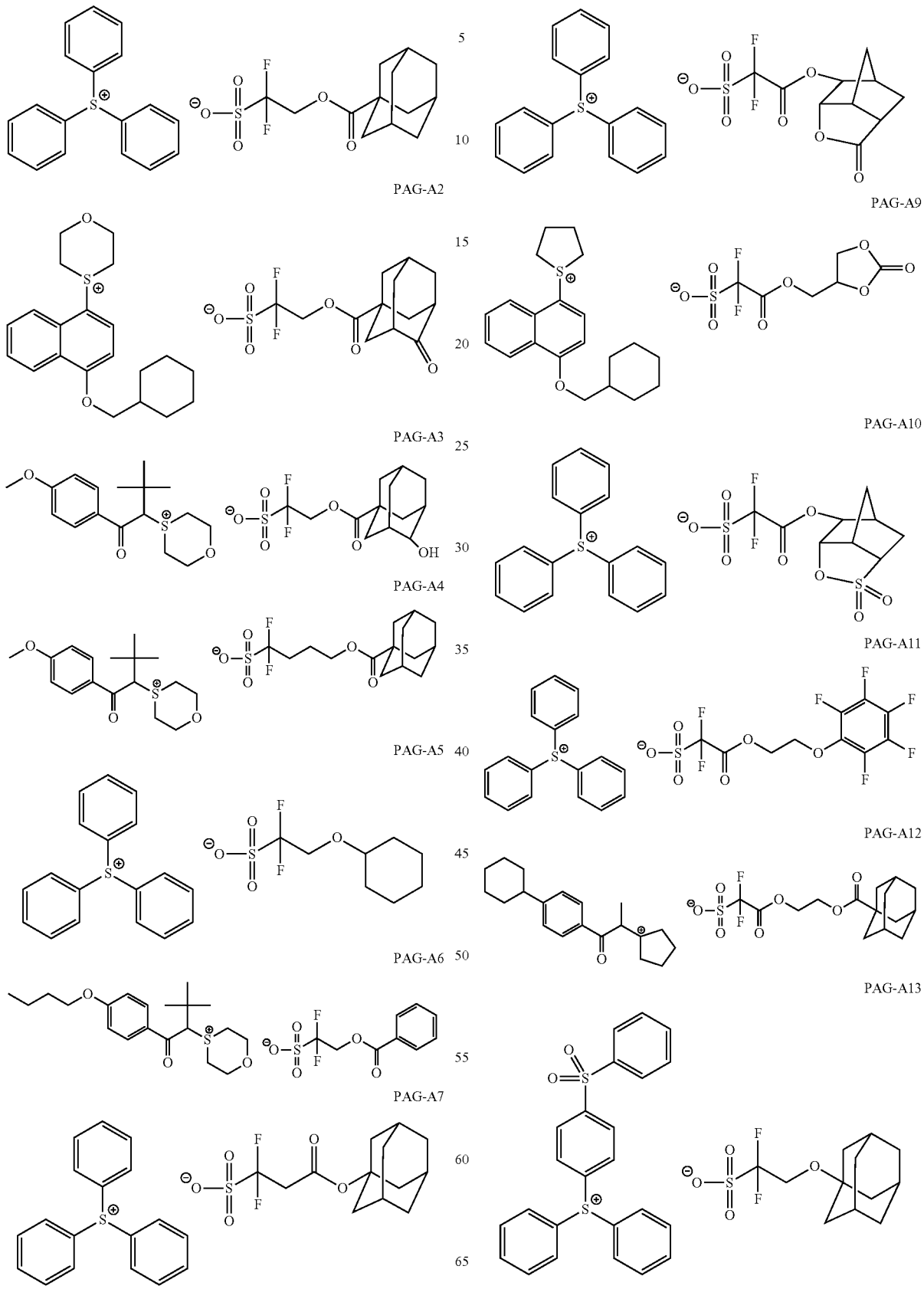

PAG-A14
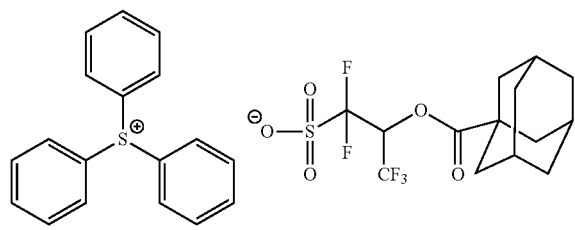
<Basic Compound (N)>
The basic compounds in Table 4 described above are as follows.
N-1
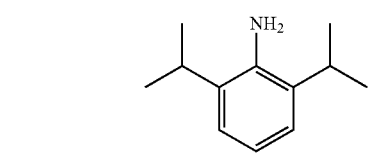
N-2
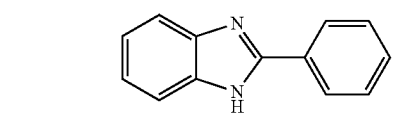
N-3
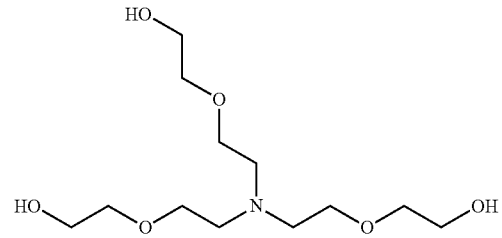
N-4
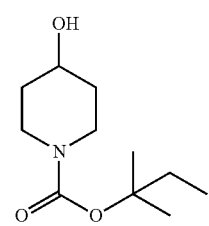
N-5
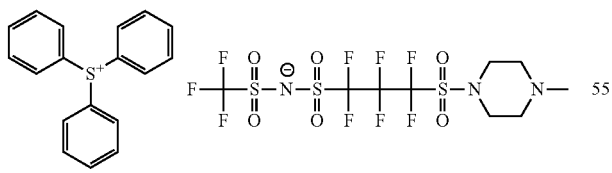
N-6
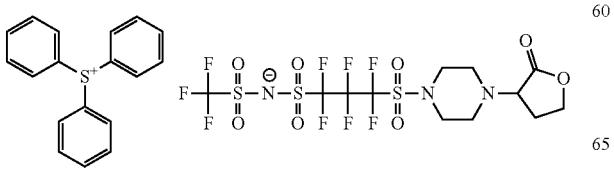
N-7
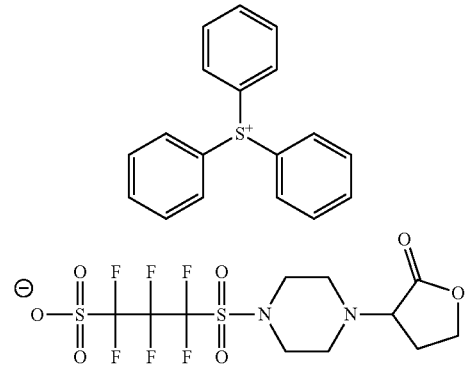
N-8
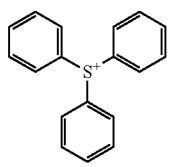
N-9
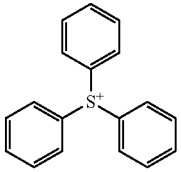
<Hydrophobic Resin (D)>
The additives (hydrophobic resins) in Table 4 described above are as follows (the ratio of the repeating units of the resin is molar fraction).
(1b)
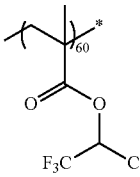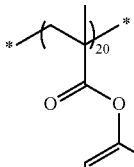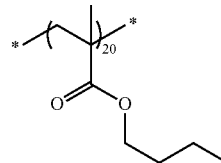
Mw: 9900
Mw/Mn: 1.60

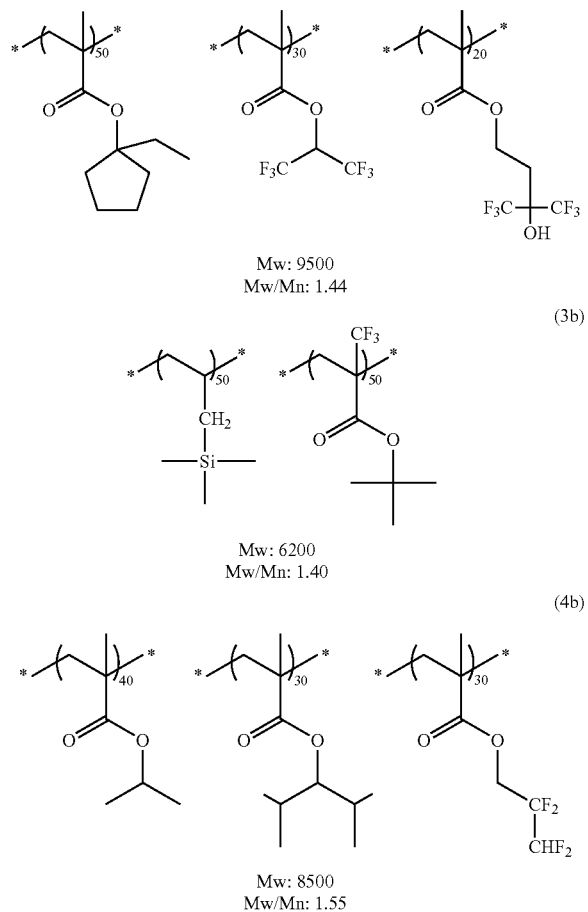

Mw: 9500
Mw/Mn: 1.44

Mw: 6200
Mw/Mn: 1.40

Mw: 8500
Mw/Mn: 1.55

<Surfactant>

The surfactants in Table 4 described above are as follows.

W-1: Megafac F176 (produced by DIC Corporation; fluorine-based)

W-2: Megafac R08 (produced by DIC Corporation; fluorine and silicon-based)

W-3: Polysiloxane polymer KP-341 (produced by Shin-Etsu Chemical Co., Ltd.; silicon-based)

W-4: Troyzol S-366 (produced by Troy Chemical Industries, Inc.)

W-5: KH-20 (produced by Asahi Glass Co., Ltd.)

W-6: PolyFox PF-6320 (produced by OMNOVA Solutions Inc.; fluorine-based)

<Solvent>

The solvents in Table 4 described above are as follows.

SL-A1: Propylene glycol monomethyl ether acetate (PGMEA)

SL-A2: Ethyl lactate

SL-A3: Propylene glycol monomethyl ether (PGME)

SL-A4: Cyclohexanone

SL-A5: γ-butyrolactone

Favorable specific examples of the resin composition (2) in the present invention will be given below.

In more detail, the resin composition (2) below is obtained by dissolving 3.8 mass % of the components shown in the table below in the total solid content using the solvent shown in the same table and preparing the resin compositions by filtering each resin composition using a polyethylene filter with a pore size of 0.1 μm. Here, in Table 6, the content (mass %) of all of the resin with respect to the total solid content of the composition may be obtained by taking away the total (mass %) of the content of the solid content other than the resins in the composition from 100 mass %.

TABLE 6

| Resin composition | Resin-A (weight ratio) | Resin-B (weight ratio) | Acid generating agent-A (mass %) | Acid generating agent-B (mass %) | Basic compound-A (mass %) | Basic compound-B (mass %) | Surfactant (mass %) | Solvent (weight ratio) |
|---|---|---|---|---|---|---|---|---|
| R-1 | Pol-B-1 (100) | — | — | — | — | — | — | SL-1/SL-5 (70/30) |
| R-2 | Pol-B-2 (100) | — | — | — | — | — | W-1 (0.30) | SL-1/SL-3 (80/20) |
| R-3 | Pol-B-3 (80) | Pol-B-1 (20) | — | — | — | — | W-2 (0.30) | SL-1 (100) |
| R-4 | Pol-B-4 (100) | — | — | — | N-1 (0.05) | N-2 (0.04) | W-6 (0.30) | SL-1/SL-4 (90/10) |
| R-5 | Pol-B-5 (50) | Pol-B-6 (50) | — | — | N-2 (0.12) | — | — | SL-1/SL-6 (95/5) |
| R-6 | Pol-B-6 (100) | — | — | — | N-3 (0.32) | — | W-5 (0.30) | SL-2/SL-7 (98/2) |
| R-7 | Pol-B-7 (100) | — | PAG-1 (5.8) | — | N-4 (0.18) | N-5 (0.10) | — | SL-1/SL-5 (70/30) |
| R-8 | Pol-B-8 (100) | — | PAG-2 (6.2) | — | N-5 (0.44) | — | W-6 (0.40) | SL-1/SL-5 (70/30) |
| R-9 | Pol-B-1 (30) | Pol-B-7 (70) | PAG-3 (7.2) | — | — | — | W-6 (0.30) | SL-1 (100) |
| R-10 | Pol-B-1 (100) | — | PAG-5 (4.3) | PAG-4 (6.2) | — | — | W-6 (0.20) | SL-2 (100) |
| R-20 | Pol-B-17 (100) | — | — | — | — | — | — | SL-1/SL-5 (70/30) |
| R-21 | Pol-B-18 (100) | — | — | — | — | — | W-1 (0.30) | SL-1/SL-3 (80/20) |
| R-22 | Pol-B-19 (100) | — | — | — | — | — | — | SL-1/SL-5 (80/20) |

TABLE 6-continued

| Resin composition | Resin-A (weight ratio) | Resin-B (weight ratio) | Acid generating agent-A (mass %) | Acid generating agent-B (mass %) | Basic compound-A (mass %) | Basic compound-B (mass %) | Surfactant (mass %) | Solvent (weight ratio) |
|---|---|---|---|---|---|---|---|---|
| R-23 | Pol-B-20 (100) | — | — | — | — | — | W-1 (0.30) | SL-1/SL-3 (80/20) |
| R-24 | Pol-B-21 (100) | — | — | — | N-1 (0.15) | N-2 (0.15) | W-6 (0.30) | SL-1/SL-4 (90/10) |
| R-25 | Pol-B-19 (40) | Pol-B-22 (60) | PAG-1 (8.2) | — | N-3 (0.32) | — | — | SL-1/SL-6 (95/5) |
| R-26 | Pol-B-19 (100) | — | PAG-2 (9.1) | — | N-1 (0.05) | N-5 (3.5) | — | SL-1/SL-5 (50/50) |
| R-27 | Pol-B-20 (50) | Pol-B-21 (50) | PAG-5 (7.5) | — | — | — | — | SL-1 (100) |

Favorable specific examples of the resin composition (3) in the present invention will be given below.

In more detail, the following favorable specific examples of the resin composition (3) are obtained by dissolving 3.8 mass % of the components shown in Table 7 in the total solid content using the solvent shown in the same table and preparing the resin compositions filtering each resin composition using a polyethylene filter with a pore size of 0.1 μm. Here, in Table 7, the content (mass %) of all of the resins with respect to the total solid content of the composition may be obtained by taking away the total (mass %) of the content of the solid content other than the resins in the composition from 100 mass %.

TABLE 7

| Resin composition | Resin-A (weight ratio) | Resin-B (weight ratio) | Acid generating agent-A (mass %) | Acid generating agent-B (mass %) | Basic compound-A (mass %) | Basic compound-B (mass %) | Additive (mass %) | Solvent (weight ratio) |
|---|---|---|---|---|---|---|---|---|
| R-11 | Pol-B-9 (100) | — | PAG-1 (4.2) | PAG-6 (3.5) | N-1 (0.33) | — | W-6 (0.30) | SL-8 (100) |
| R-12 | Pol-B-10 (100) | — | PAG-2 (5.0) | PAG-7 (9.5) | N-2 (0.27) | — | W-6 (0.30) | SL-8/SL-9 (90/10) |
| R-13 | Pol-B-11 (40) | Pol-B-13 (60) | PAG-6 (5.3) | — | N-3 (0.28) | — | W-6 (0.30) | SL-9 (100) |
| R-14 | Pol-B-12 (100) | — | PAG-8 (8.2) | — | N-4 (0.20) | N-5 (1.0) | — | SL-8/SL-1 (90/10) |
| R-15 | Pol-B-13 (100) | — | PAG-1 (2.5) | PAG-8 (6.5) | — | — | W-4 (0.30) | SL-8/SL-5 (90/10) |
| R-16 | Pol-B-14 (100) | — | — | — | N-2 (0.19) | — | W-3 (0.30) | SL-10 (100) |
| R-17 | Pol-B-15 (50) | Pol-B-16 (50) | — | — | N-5 (2.2) | — | — | SL-8 (100) |
| R-18 | Pol-B-16 (100) | — | — | — | — | — | W-6 (0.30) | SL-8/SL-1 (90/10) |
| R-19 | Pol-B-9 (100) | — | — | — | — | — | W-1 (0.30) | SL-8 (100) |
| R-28 | Pol-B-23 (100) | — | PAG-6 (5.2) | PAG-7 (5.2) | N-4 (0.28) | — | — | SL-8 (100) |
| R-29 | Pol-B-24 (100) | — | PAG-8 (6.3) | — | N-5 (5.2) | — | — | SL-8/SL-9 (90/10) |
| R-30 | Pol-B-24 (20) | Pol-B-25 (80) | PAG-2 (5.5) | PAG-4 (8.2) | — | — | W-4 (0.30) | SL-8/SL-5 (90/10) |
| R-31 | Pol-B-26 (100) | — | — | — | N-2 (0.62) | — | W-3 (0.30) | SL-10 (100) |
| R-32 | Pol-B-23 (100) | — | — | — | — | — | W-6 (0.30) | SL-8/SL-1 (90/10) |
| R-33 | Pol-B-27 (100) | — | PAG-6 (10.5) | — | N-3 (0.32) | — | — | SL-1/SL-5 (70/30) |

<Resin (A)>
The resins in Tables 6 and 7 are as follows.

TABLE 8

| | Unit 1 | Unit 2 | Unit 3 | Unit 4 | Composition ratio (molar fraction) | Weight average molecular weight (Mw) | Dispersity |
|---|---|---|---|---|---|---|---|
| Pol-B-1 | unit-1 | unit-5 | unit-22 | — | 45/10/45 | 12000 | 1.6 |
| Pol-B-2 | unit-2 | unit-5 | unit-18 | unit-24 | 30/10/50/10 | 7000 | 1.6 |
| Pol-B-3 | unit-3 | unit-19 | unit-25 | — | 40/40/20 | 10000 | 1.6 |
| Pol-B-4 | unit-4 | unit-7 | unit-20 | — | 60/10/30 | 8000 | 1.6 |
| Pol-B-5 | unit-4 | unit-6 | unit-21 | — | 40/20/40 | 16000 | 1.8 |

TABLE 8-continued

|  | Unit 1 | Unit 2 | Unit 3 | Unit 4 | Composition ratio (molar fraction) | Weight average molecular weight (Mw) | Dispersity |
|---|---|---|---|---|---|---|---|
| Pol-B-6 | unit-11 | unit-23 | — | — | 25/75 | 20000 | 1.9 |
| Pol-B-7 | unit-1 | unit-3 | unit-16 | unit-22 | 20/20/10/50 | 14000 | 1.6 |
| Pol-B-8 | unit-3 | unit-18 | — | — | 70/30 | 10000 | 1.6 |
| Pol-B-9 | unit-7 | unit-18 | — | — | 30/70 | 14000 | 1.6 |
| Pol-B-10 | unit-7 | unit-16 | unit-18 | — | 30/20/50 | 16000 | 1.7 |
| Pol-B-11 | unit-5 | unit-9 | unit-23 | unit-26 | 20/10/45/25 | 22000 | 1.9 |
| Pol-B-12 | unit-8 | unit-10 | unit-18 | — | 30/20/50 | 12000 | 1.6 |
| Pol-B-13 | unit-3 | unit-12 | unit-14 | unit-27 | 10/20/40/30 | 14000 | 1.7 |
| Pol-B-14 | unit-13 | unit-18 | — | — | 40/60 | 15000 | 1.8 |
| Pol-B-15 | unit-14 | unit-21 | — | — | 40/60 | 11000 | 1.6 |
| Pol-B-16 | unit-15 | unit-17 | unit-21 | unit-27 | 30/30/20/20 | 9000 | 1.6 |
| Pol-B-17 | unit-1 | unit-5 | unit-23 | — | 40/10/50 | 12000 | 1.7 |
| Pol-B-18 | unit-7 | unit-16 | unit-18 | unit-22 | 30/10/50/10 | 15000 | 1.8 |
| Pol-B-19 | unit-1 | unit-5 | unit-22 | — | 50/10/40 | 10000 | 1.6 |
| Pol-B-20 | unit-2 | unit-5 | unit-18 | unit-24 | 30/10/50/10 | 7000 | 1.6 |
| Pol-B-21 | unit-3 | unit-19 | unit-25 | — | 35/35/30 | 15000 | 1.7 |
| Pol-B-22 | unit-4 | unit-9 | unit-20 | — | 60/10/30 | 18000 | 1.8 |
| Pol-B-23 | unit-5 | unit-18 | — | — | 20/80 | 23000 | 1.9 |
| Pol-B-24 | unit-3 | unit-16 | unit-18 | — | 10/25/65 | 14000 | 1.7 |
| Pol-B-25 | unit-4 | unit-10 | unit-23 | unit-26 | 20/20/35/25 | 9000 | 1.6 |
| Pol-B-26 | unit-5 | unit-10 | unit-18 | — | 30/20/50 | 15000 | 1.7 |
| Pol-B-27 | unit-1 | unit-6 | unit-21 | — | 35/5/60 | 10000 | 1.6 |

The repeating units in the resins in Table 8 described above are as follows.

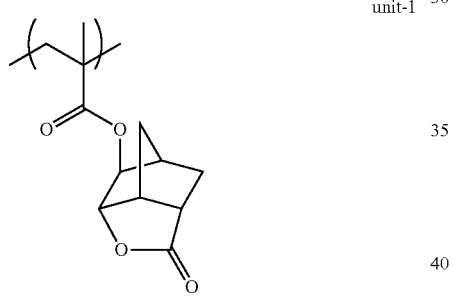

unit-1

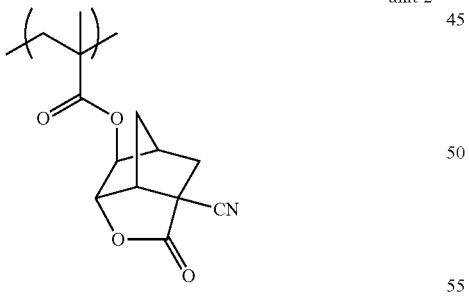

unit-2

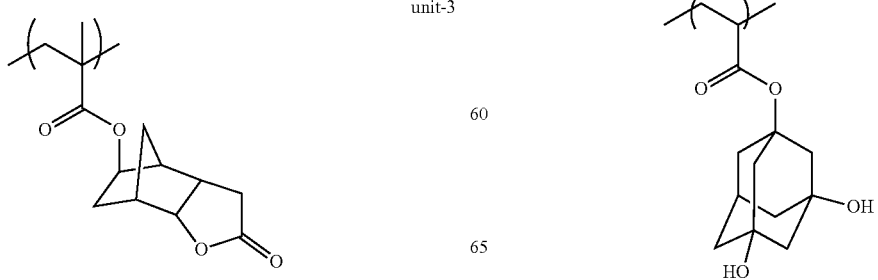

unit-3

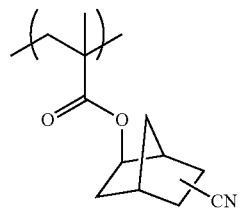

unit-4

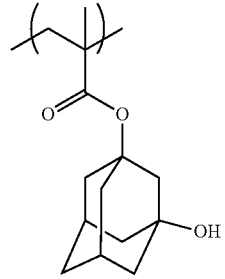

unit-5

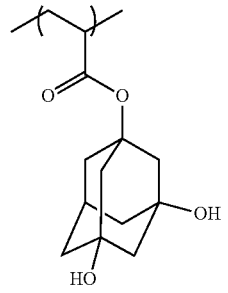

unit-6 unit-7 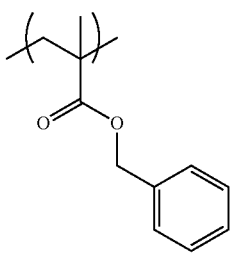
unit-8 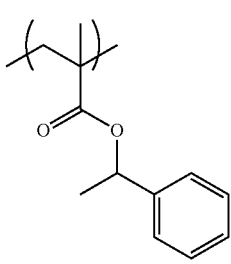
unit-9 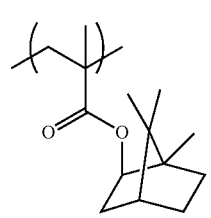
unit-10 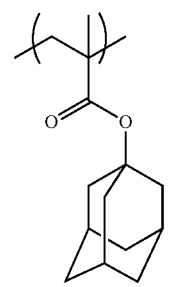
unit-11 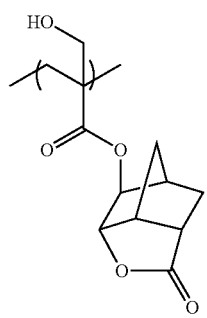
unit-12 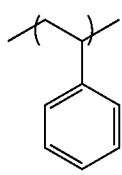
unit-13 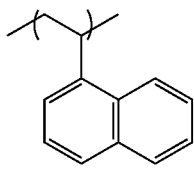
unit-14 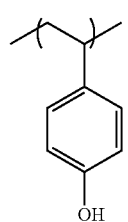
unit-15 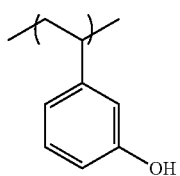
unit-16 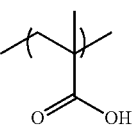
unit-17 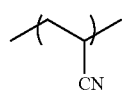
unit-18 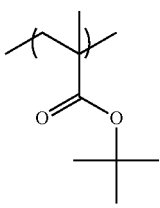
unit-19 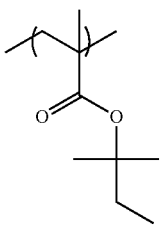
unit-20 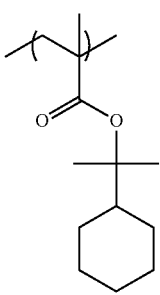

unit-21 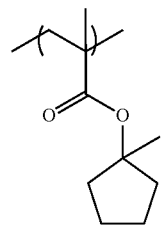
unit-22 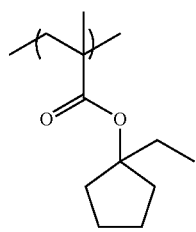
unit-23 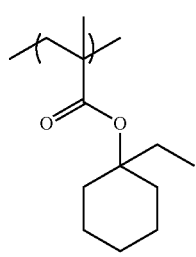
unit-24 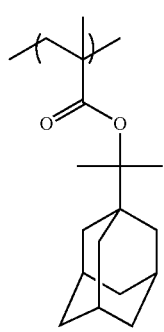
unit-25 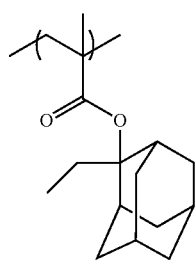
unit-26 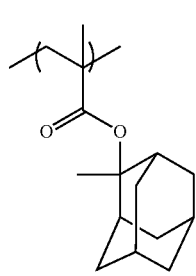
unit-27 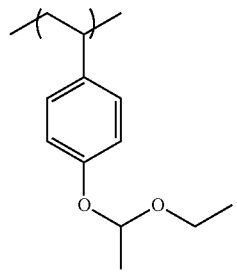
<Acid Generating Agent (B)>
The acid generating agents in Tables 6 and 7 described above are as follows.
PAG-1
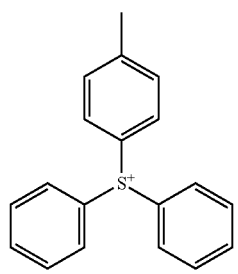
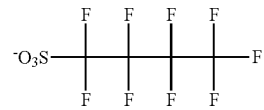
PAG-2
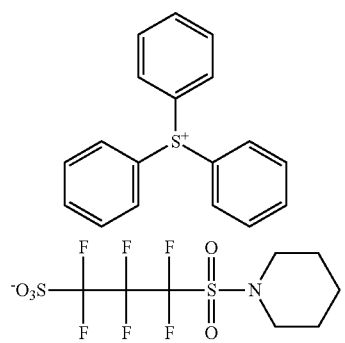
PAG-3
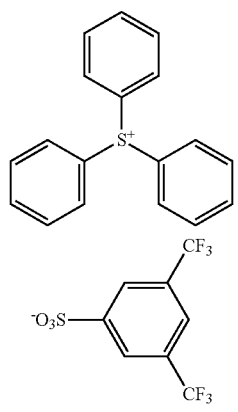

PAG-4

PAG-5

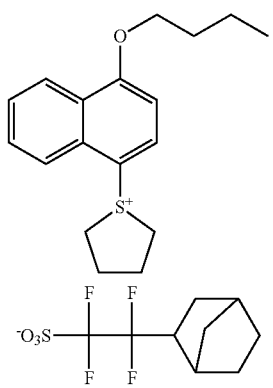

PAG-6

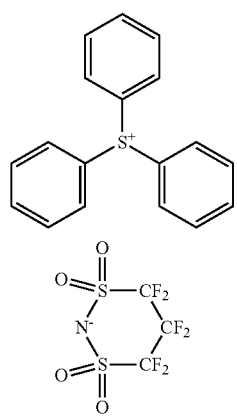

PAG-7

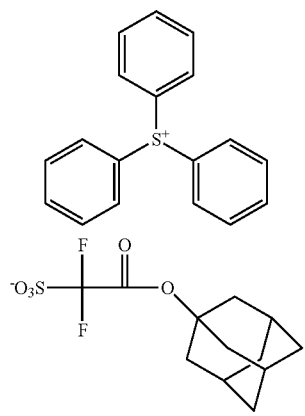

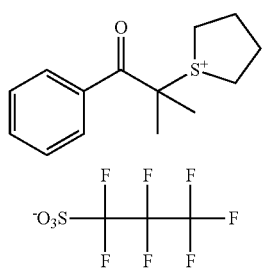

PAG-8

<Basic Compound (N)>

The basic compounds (N-1) to (N-5) in Tables 6 and 7 described above are the same as the basic compounds (N-1) to (N-5) in Table 4 described above.

<Surfactant>

The surfactants (W-1) to (W-6) in Tables 6 and 7 described above are the same as the surfactants (W-1) to (W-6) in Table 4 described above.

<Solvent>

The solvents in Tables 6 and 7 described above are as below.

SL-1: Propylene glycol monomethyl ether acetate (PGMEA)
SL-2: Propylene glycol monomethyl ether propionate
SL-3: Ethyl lactate
SL-4: Propylene glycol monomethyl ether (PGME)
SL-5: Cyclohexanone
SL-6: γ-butyrolactone
SL-7: Propylene carbonate
SL-8: 4-methyl-2-pentanol
SL-9: Isobutyl isobutyrate
SL-10: Diisoamyl ether The specific examples of the resin composition (3) described above are also preferred as specific examples of the resin composition (1).

The pattern which is formed by the pattern formation method of the present invention described above is useful as a resist pattern in a semiconductor resist manufacturing process and the like.

In addition, in particular, in a case where the pattern which is formed by the pattern formation method of the present invention has conductivity due to at least one of the resin compositions (1) to (3) containing a known conductive material or the like, this pattern is also useful as a wiring pattern.

In addition, the pattern which is formed by the pattern formation method of the present invention is also useful as a member which configures a micro electromechanical system (MEMS) (that is, a pattern for a member of a micro electromechanical system).

Furthermore, the pattern which is formed by the pattern formation method of the present invention is also useful as a mold, for example, which is able to form a functional material into a predetermined shape when the functional material is embedded in the pattern.

The present invention also relates to an electronic device manufacturing method which includes the pattern formation method or the etching method of the present invention described above, and to an electronic device which is manufactured by this manufacturing method.

The electronic device of the present invention is favorably mounted on electrical and electronic equipment (household electrical appliances, OA and media-related apparatuses, optical equipment, telecommunication equipment, and the like).

Examples (Forming First Film)

An organic anti-reflection film ARC29SR (manufactured by Nissan Chemical Industries, Ltd.) was coated on a silicon wafer, baking was carried out at 205° C. for 60 seconds, and an anti-reflection film with a film thickness of 95 nm was formed. The resin composition (1) described in the section "Forming First Pattern" in Table 9 was coated thereon, first heating (PB 1) was carried out at the temperature and for the time described in Table 9, and a film with a film thickness of 100 nm was formed.

(Forming First Negative Type Resist Pattern)

Pattern exposure (first exposure) was carried out on the first film via a mask using an ArF excimer laser scanner (manufactured by ASML Holding N.V.: PAS1100) or a KrF excimer laser scanner (manufactured by ASML Holding N.V.: PAS850). Next, second heating (PEB 1) was carried out at the temperature and for the time described in Table 9. Subsequently, by carrying out developing using the organic-based developer described in Table 9 and carrying out rinsing using the rinsing liquid described in Table 9 (here, rinsing was not carried out for the examples for which there is no description of a rinsing liquid in the "pattern forming step" in Table 9), a line and space pattern (a first negative type resist pattern) which has the film thickness described in Table 9 was obtained.

(Heating First Negative Type Resist Pattern)

Third heating (freezing) was carried out at 200° C. for 60 seconds on the line and space pattern which was obtained as described above.

(Forming Lower Layer)

The resin composition (2) described in Tables 10 and 11 with reference to the process described in the section "Forming Second Pattern" in Table 9 was embedded in the space section of the first negative type resist pattern described above, fourth heating (PB 2) was carried out at the temperature and for the time described in the section "Lower Layer" in Tables 10 and 11, and a lower layer which had the film thickness described in the section "Lower Layer" in Tables 10 and 11 was formed.

(Forming Upper Layer)

The resin composition (3) described in Tables 10 and 11 with reference to the process described in the section "Forming Second Pattern" in Table 9 was coated on the lower layer, fifth heating (PB 3) was carried out at the temperature and for the time described in the section "Upper Layer" in Tables 10 and 11, and an upper layer which had the film thickness described in the section "Upper Layer" in Tables 10 and 11 was formed.

(Second Negative Type Resist Pattern Forming)

Pattern exposure (second exposure) was carried out on the upper layer via a mask using an ArF excimer laser scanner (manufactured by ASML Holding N.V.: PAS1100) or a KrF excimer laser scanner (manufactured by ASML Holding N.V.: PAS850). Here, the second exposure is the exposure of a line and space pattern and is carried out such that the line direction in the pattern is orthogonal to the line direction in the line and space pattern of the first exposure described above. Next, sixth heating (PEB 2) was carried out at the temperature and for the time described in Tables 10 and 11. Subsequently, by carrying out developing using the organic-based developer described in Tables 10 and 11 and carrying out rinsing using the rinsing liquid described in Tables 10 and 11 (here, rinsing was not carried out for the examples where there is no description of a rinsing liquid in the "pattern forming step" in Tables 10 and 11), a line and space pattern (a second negative type resist pattern) where the line direction is orthogonal to the line direction in the first negative type resist pattern was obtained.

Here, the organic-based developer is a liquid which may remove a part of the lower layer and the developing in the forming of the second negative type resist pattern and the removal of a part of the lower layer are carried out in a series of steps.

TABLE 9

| | | | | Forming first pattern | | | | | | |
|---|---|---|---|---|---|---|---|---|---|---|
| Example | Resin composition (1) | Light source | PB1 | Film thickness of resist film/nm | PEB1 | Developer | Rinsing liquid | Film thickness of first pattern/nm | Forming second pattern Process | Light source |
| 1 | R-11 | KrF | 120° C./60 s | 100 | 100° C./60 s | Butyl acetate | — | 85 | B-Kr-1 | KrF |
| 2 | R-13 | KrF | 100° C./50 s | 100 | 100° C./50 s | Butyl acetate | 1-hexanol | 85 | B-Kr-1 | KrF |
| 3 | R-11 | KrF | 120° C./60 s | 100 | 100° C./60 s | Butyl acetate | — | 85 | B-Kr-8 | KrF |
| 4 | Ar-01 | ArF | 90° C./60 s | 100 | 95° C./60 s | Butyl acetate | — | 85 | B-Kr-1 | KrF |
| 5 | Ar-02 | ArF | 100° C./60 s | 100 | 100° C./60 s | Butyl acetate | 1-hexanol | 85 | B-Kr-1 | KrF |
| 6 | Ar-01 | ArF | 90° C./60 s | 100 | 95° C./60 s | Butyl acetate | — | 85 | B-Kr-8 | KrF |
| 7 | R-28 | ArF | 100° C./60 s | 100 | 100° C./40 s | Butyl acetate | 1-hexanol | 85 | B-Kr-1 | KrF |
| 8 | R-29 | ArF | 100° C./60 s | 100 | 100° C./40 s | Butyl acetate | — | 85 | B-Kr-1 | KrF |
| 9 | R-28 | ArF | 100° C./60 s | 100 | 100° C./40 s | Butyl acetate | 1-hexanol | 85 | B-Kr-8 | KrF |
| 10 | R-11 | KrF | 120° C./60 s | 100 | 100° C./60 s | Butyl acetate | — | 85 | B-Ar-1 | ArF |
| 11 | R-13 | KrF | 100° C./50 s | 100 | 100° C./50 s | Butyl acetate | 1-hexanol | 85 | B-Ar-1 | ArF |
| 12 | R-11 | KrF | 120° C./60 s | 100 | 100° C./60 s | Butyl acetate | — | 85 | B-Ar-8 | ArF |
| 13 | Ar-01 | ArF | 90° C./60 s | 100 | 95° C./60 s | Butyl acetate | — | 85 | B-Ar-1 | ArF |
| 14 | Ar-07 | ArF | 100° C./60 s | 100 | 100° C./60 s | Butyl acetate | 1-hexanol | 85 | B-Ar-1 | ArF |
| 15 | Ar-01 | ArF | 90° C./60 s | 100 | 95° C./60 s | Butyl acetate | — | 85 | B-Ar-8 | ArF |
| 16 | R-28 | ArF | 100° C./60 s | 100 | 100° C./40 s | Butyl acetate | 1-hexanol | 85 | B-Ar-1 | ArF |
| 17 | R-29 | ArF | 100° C./60 s | 100 | 100° C./40 s | Butyl acetate | — | 85 | B-Ar-1 | ArF |
| 18 | R-28 | ArF | 100° C./60 s | 100 | 100° C./40 s | Butyl acetate | 1-hexanol | 85 | B-Ar-8 | ArF |

The resin composition (1) described above was used for the resin composition (1) in Table 9. In addition, "s" in the sections PB 1 and PEB 1 represents "seconds".

TABLE 10

| | Lower layer | | | Upper layer | | | | | |
|---|---|---|---|---|---|---|---|---|---|
| Process | Resin composition (2) | PB2 | Film thickness/ nm | Resin composition (3) | PB3 | Film thickness/ nm | PEB2 | Developer | Rinsing liquid |
| B-Kr-1 | R-1 | 100° C./60 s | 80 | R-11 | 120° C./60 s | 100 | 100° C./60 s | D-1 | — |
| B-Kr-2 | R-8 | 100° C./60 s | 80 | R-12 | 100° C./60 s | 140 | 115° C./50 s | D-2 | — |
| B-Kr-3 | R-2 | 100° C./50 s | 80 | R-13 | 100° C./50 s | 130 | 100° C./50 s | D-1 | D-7 |
| B-Kr-4 | R-7 | 90° C./60 s | 80 | R-16 | 90° C./60 s | 180 | 90° C./60 s | D-1 | D-6 |
| B-Kr-5 | R-5 | 100° C./60 s | 80 | R-14 | 100° C./60 s | 90 | 100° C./60 s | D-2 | — |
| B-Kr-6 | R-7 | 105° C./60 s | 80 | R-15 | 100° C./60 s | 100 | 80° C./60 s | D-1 | — |
| B-Kr-7 | R-3 | 80° C./60 s | 80 | R-11 | 80° C./60 s | 130 | 125° C./60 s | D-3 | — |
| B-Kr-8 | R-2 | 100° C./60 s | 80 | R-11 | 100° C./60 s | 130 | 80° C./60 s | D-2 | — |
| B-Kr-9 | R-7 | 100° C./90 s | 80 | R-17 | 85° C./90 s | 180 | 100° C./60 s | D-1 | — |
| B-Kr-10 | R-6 | 100° C./60 s | 80 | R-12 | 100° C./60 s | 100 | 85° C./90 s | D-1 | D-5 |
| B-Kr-11 | R-1 | 100° C./60 s | 80 | R-13 | 100° C./60 s | 100 | 100° C./60 s | D-3 | — |
| B-Kr-12 | R-5 | 140° C./60 s | 80 | R-14 | 140° C./60 s | 90 | 140° C./60 s | D-2 | — |
| B-Kr-13 | R-2 | 100° C./60 s | 80 | R-14 | 105° C./60 s | 140 | 100° C./60 s | D-3 | — |
| B-Kr-14 | R-7 | 100° C./40 s | 80 | R-15 | 100° C./40 s | 130 | 100° C./40 s | D-2 | — |
| B-Kr-15 | R-8 | 105° C./60 s | 80 | R-18 | 130° C./60 s | 140 | 100° C./60 s | D-1 | D-4 |
| B-Kr-16 | R-10 | 100° C./60 s | 80 | R-11 | 100° C./60 s | 100 | 100° C./40 s | D-1 | D-4 |
| B-Kr-17 | R-1 | 120° C./60 s | 80 | R-13 | 120° C./60 s | 100 | 130° C./60 s | D-1 | — |
| B-Kr-18 | R-9 | 100° C./60 s | 80 | R-12 | 100° C./60 s | 90 | 110° C./60 s | D-1 | — |
| B-Kr-19 | R-9 | 100° C./60 s | 80 | R-11 | 100° C./60 s | 90 | 120° C./60 s | D-3 | — |
| B-Kr-20 | R-5 | 100° C./60 s | 80 | R-12 | 120° C./60 s | 100 | 100° C./60 s | D-3 | — |
| B-Kr-21 | R-10 | 110° C./30 s | 80 | R-13 | 110° C./30 s | 140 | 105° C./50 s | D-2 | — |
| B-Kr-22 | R-1 | 100° C./60 s | 80 | R-14 | 100° C./60 s | 140 | 90° C./50 s | D-1 | D-4 |
| B-Kr-23 | R-8 | 100° C./60 s | 80 | R-12 | 100° C./60 s | 100 | 100° C./60 s | D-2 | — |
| B-Kr-24 | R-8 | 100° C./60 s | 80 | R-19 | 100° C./50 s | 130 | 100° C./80 s | D-1 | — |
| B-Kr-25 | R-9 | 90° C./60 s | 80 | R-14 | 90° C./50 s | 100 | 90° C./60 s | D-1 | — |
| B-Kr-26 | R-3 | 95° C./60 s | 80 | R-12 | 105° C./60 s | 100 | 100° C./60 s | D-2 | — |
| B-Kr-27 | R-4 | 100° C./80 s | 80 | R-12 | 100° C./60 s | 130 | 100° C./80 s | D-3 | — |
| B-Kr-28 | R-10 | 100° C./60 s | 80 | R-14 | 100° C./60 s | 100 | 100° C./60 s | D-2 | — |
| B-Kr-29 | R-7 | 95° C./60 s | 80 | R-14 | 90° C./60 s | 100 | 90° C./60 s | D-2 | — |
| B-Kr-30 | R-8 | 100° C./60 s | 80 | R-11 | 100° C./60 s | 130 | 100° C./80 s | D-3 | D-4 |

TABLE 11

| | Lower layer | | | Upper layer | | | | | |
|---|---|---|---|---|---|---|---|---|---|
| Process | Resin composition (2) | PB2 | Film thickness/ nm | Resin composition (3) | PB3 | Film thickness/ nm | PEB2 | Developer | Rinsing liquid |
| B-Ar-1 | R-22 | 100° C./60 s | 80 | R-28 | 120° C./60 s | 70 | 105° C./60 s | D-1 | — |
| B-Ar-2 | R-25 | 100° C./60 s | 80 | R-28 | 130° C./60 s | 40 | 115° C./50 s | D-2 | — |
| B-Ar-3 | R-26 | 90° C./60 s | 80 | R-31 | 90° C./60 s | 40 | 90° C./60 s | D-1 | D-6 |
| B-Ar-4 | R-24 | 100° C./60 s | 80 | R-29 | 100° C./60 s | 50 | 100° C./60 s | D-2 | — |
| B-Ar-5 | R-26 | 105° C./60 s | 80 | R-30 | 100° C./60 s | 90 | 80° C./60 s | D-1 | — |
| B-Ar-6 | R-22 | 80° C./60 s | 80 | R-28 | 80° C./60 s | 80 | 125° C./60 s | D-3 | — |
| B-Ar-7 | R-23 | 100° C./60 s | 80 | R-29 | 90° C./60 s | 40 | 100° C./60 s | D-3 | — |
| B-Ar-8 | R-25 | 105° C./60 s | 80 | R-30 | 100° C./40 s | 50 | 110° C./60 s | D-2 | — |
| B-Ar-9 | R-26 | 105° C./60 s | 80 | R-32 | 130° C./60 s | 50 | 100° C./60 s | D-1 | D-4 |
| B-Ar-10 | R-27 | 100° C./60 s | 80 | R-28 | 100° C./60 s | 70 | 100° C./40 s | D-1 | D-4 |
| B-Ar-11 | R-27 | 110° C./30 s | 80 | R-29 | 100° C./40 s | 60 | 105° C./50 s | D-2 | — |
| B-Ar-12 | R-23 | 100° C./60 s | 80 | R-29 | 90° C./60 s | 60 | 90° C./50 s | D-1 | D-4 |
| B-Ar-13 | R-26 | 100° C./60 s | 80 | R-28 | 100° C./60 s | 60 | 100° C./60 s | D-2 | D-4 |
| B-Ar-14 | R-24 | 100° C./60 s | 80 | R-28 | 130° C./60 s | 50 | 100° C./80 s | D-3 | D-4 |

The resin compositions (2) and (3) described above were used for the resin compositions (2) and (3) in Table 10 and Table 11.

The developers and the rinsing liquids in Table 10 and Table 11 are as shown below.

[Developer and Rinsing Liquid]

D-1: Butyl acetate
D-2: Pentyl acetate
D-3: 2-heptanone
D-4: 4-methyl-2-pentanol
D-5: Decane
D-6: Octane
D-7: 1-hexanol The "s" in the sections of PB 2, PB 3, and PEB 2 represents "seconds" in Table 10 and Table 11.

Figure 4:
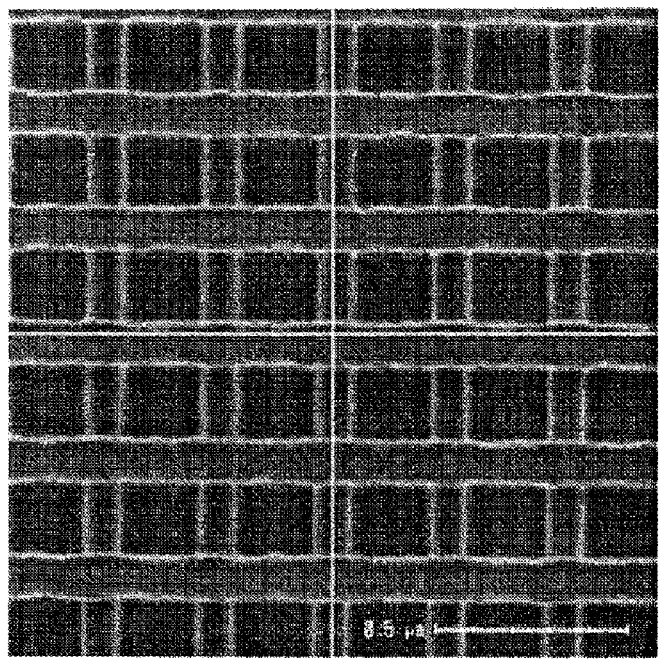
FIG. 4 is a diagram which shows an observation result of a pattern formed in an electron micrograph according to an Example.

When the patterns which were obtained by the pattern formation method in Examples 1 to 18 were confirmed using a scanning electron microscope (S9380 manufactured by Hitachi Ltd.), as shown in FIG. 4, it was understood that a laminated pattern was formed by the second negative type resist pattern which is a line and space pattern (for example, a line and space pattern with pitch of 300 nm) being formed on the first negative type resist pattern which is a line and space pattern (for example, a line and space pattern with pitch of 300 nm) in a state where the line direction is orthogonal to the line direction in the first negative type resist pattern.

In addition, in Examples 1 to 18, in a case where the process (refer to Table 9) in the forming of the second pattern was substituted with the other processes described in Table 10 and Table 11, the same laminated pattern as described above was also formed.

In addition, in Examples 4 to 18, in a case where the ArF excimer laser scanner (manufactured by ASML Holding N.V.: PAS1100) was substituted with an ArF excimer laser liquid immersion scanner (manufactured by ASML Holding N.V.: XT1700i) and ArF liquid immersion exposure using ultra-pure water as the immersion liquid was carried out, the same laminated pattern as described above was also formed.

Figure 5:
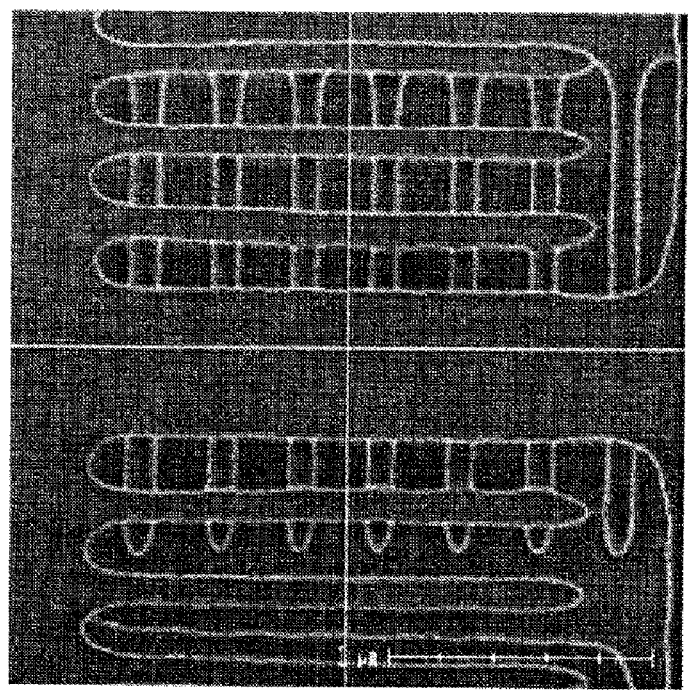
FIG. 5 is a diagram which shows an observation result of another pattern in an electron micrograph.
Figure 6:
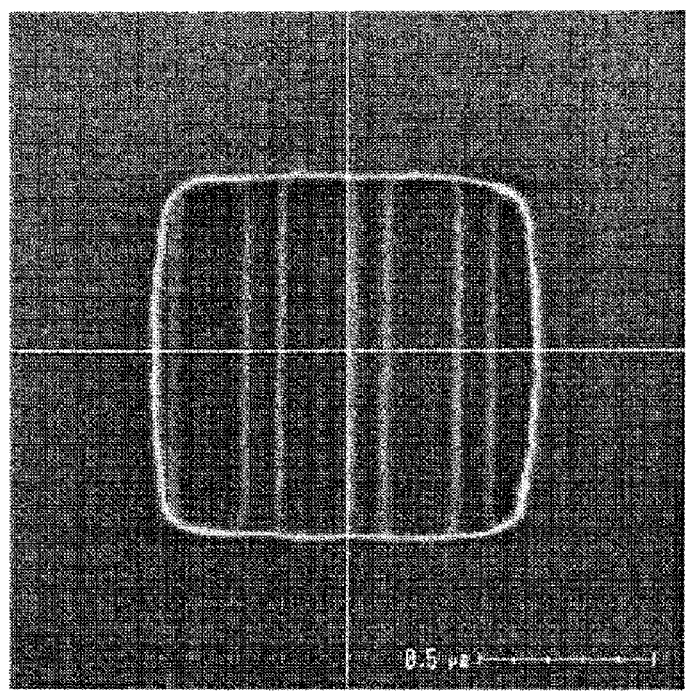
FIG. 6 is a diagram which shows an observation result of another pattern in an electron micrograph.

In addition, by changing the mask pattern in the forming of the first negative type resist pattern, the mask pattern in the forming of the second negative type resist pattern, and the like, as shown in FIG. 5 and FIG. 6 (diagrams which show the results of observation with a scanning electron microscope (S9380 manufactured by Hitachi Ltd.)), it was possible to form various types of laminated patterns (for example, having complex shape).

Figure 7:
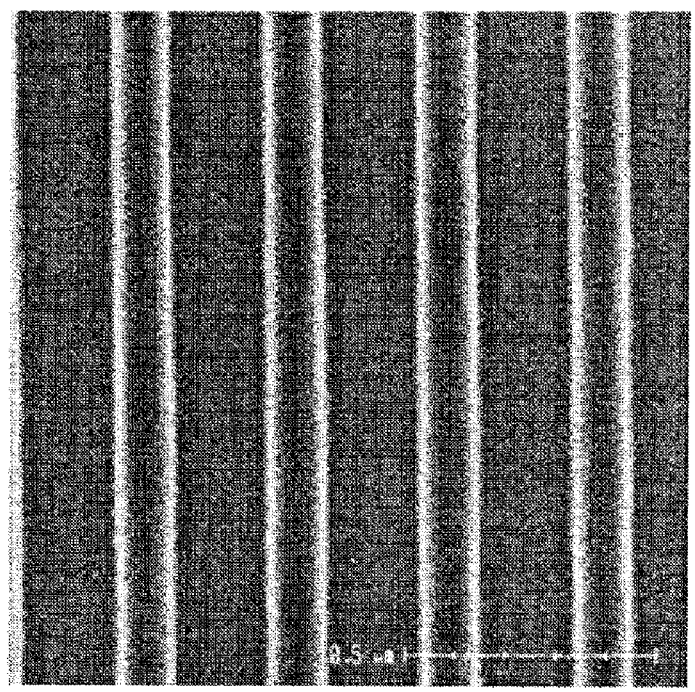
FIG. 7 is a diagram which shows an observation result of a first negative type pattern in an electron micrograph.
Figure 8:
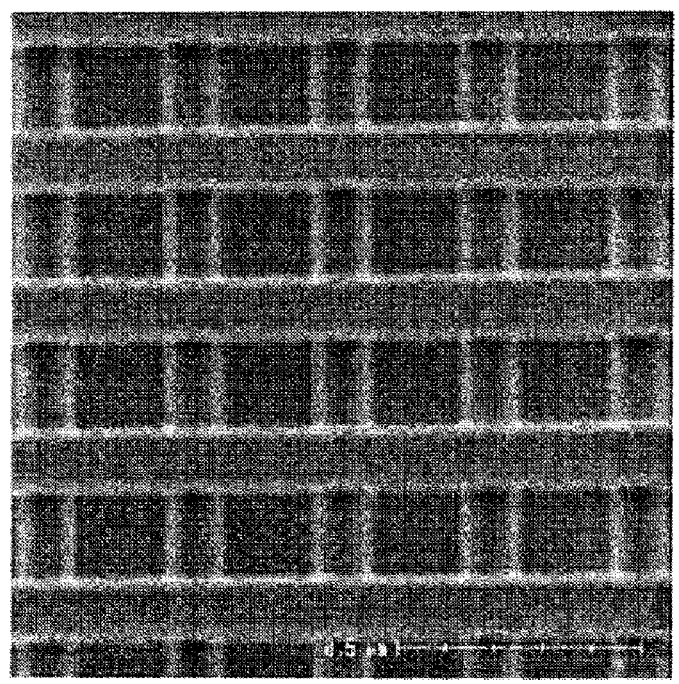
FIG. 8 is a diagram which shows an observation result of a second negative type pattern in an electron micrograph.
Figure 9:
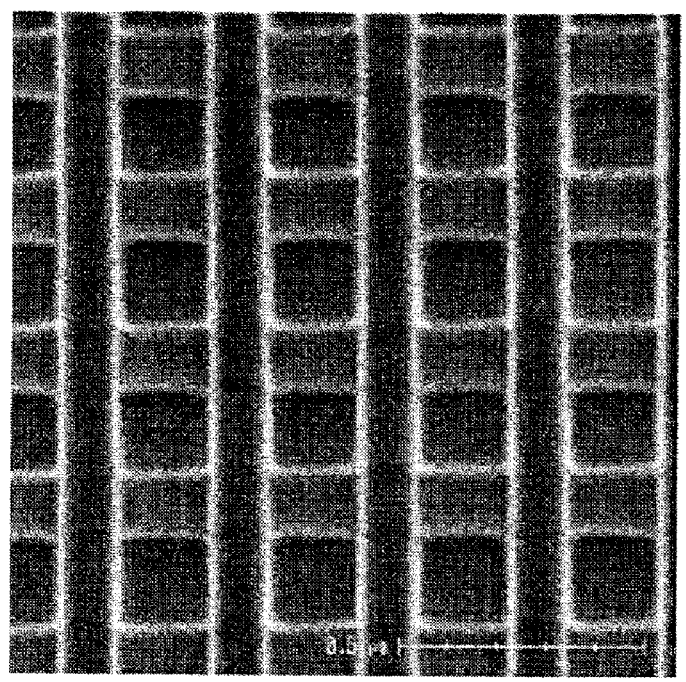
FIG. 9 is a diagram which shows an observation result of a third negative type pattern in an electron micrograph.

In addition, according to the present invention, it is also possible to form a laminated pattern which is formed by the second negative type resist pattern (refer to FIG. 8) which is a line and space pattern being formed on the first negative type resist pattern (refer to FIG. 7) which is a line and space pattern in a state where the line direction is orthogonal to the line direction of the first negative type pattern and, moreover, the third negative type resist pattern (refer to FIG. 9) which is a line and space pattern being formed on the second negative type resist pattern in a state where the line direction is orthogonal to the line direction in the second negative type resist pattern. Here, FIG. 7, FIG. 8, and FIG. 9 are all diagrams which show the results of observation of the negative type resist pattern with a scanning electron microscope (S9380 manufactured by Hitachi Ltd.)).

As described above, according to the present invention, it is understood that it is possible to form a fine (for example, the dimensions of the hole diameters, the dot diameters, the space widths, the line widths, and the like are 500 nm or less) pattern which has a laminated structure with various shapes.

Therefore, according to the present invention, by using the pattern described above as a mask, it is possible to form fine patterns (for example, a pattern of which the dimensions of the hole diameters, the dot diameters, the space widths, the line widths, and the like are 500 nm or less) with various shapes by etching and the like on a substrate.

INDUSTRIAL APPLICABILITY

According to the present invention, there is provided a pattern formation method which is able to form a fine (for example, the dimensions of the hole diameters, the dot diameters, the space widths, the line widths, and the like are 500 nm or less) pattern which has a laminated structure with various shapes and patterns which are produced thereby, as well as an etching method, and an electronic device manufacturing method, which use the above.

Description was given of the present invention in detail and also with reference to specific embodiments; however, it is clear to persons skilled in the art that it is possible to add various changes or modifications without departing from the spirit and the range of the present invention.

The present application is based on the Japanese patent (JP2013-158741A) which was applied for on Jul. 31, 2013 and the content is included here as a reference.

EXPLANATION OF REFERENCES

10, 30, 70 SUBSTRATE
11, 12, 14, 51, 52 FIRST NEGATIVE TYPE PATTERN
15, 55 LOWER LAYER
20, 60 UPPER LAYER
21, 61 SECOND NEGATIVE TYPE PATTERN
31, 71 HOLE PATTERN
101, 102, 103, 104 LINE AND SPACE PATTERN

What is claimed is:

1. A pattern formation method comprising the following steps in the sequence set forth:
    a step (i) for forming a first negative type pattern by performing steps (i-1), (i-2), and (i-3) below on a substrate in this order,
    the step (i-1) for forming a first film on the substrate, using an actinic ray-sensitive or radiation-sensitive resin composition (1) which contains a first resin of which, due to a polarity being increased by an action of an acid, a solubility decreases with respect to a developer which includes an organic solvent,
    the step (i-2) for exposing the first film to light, and
    the step (i-3) for developing the exposed first film using a developer which includes an organic solvent;
    a step (iii) for forming a lower layer including the first negative type pattern by embedding a resin composition (2) which contains a second resin in space sections of the first negative type pattern on the substrate;
    a step (iv) for forming an upper layer on the lower layer using an actinic ray-sensitive or radiation-sensitive resin composition (3) which contains a third resin of which, due to a polarity being increased by an action of an acid, a solubility decreases with respect to a developer which includes an organic solvent;
    a step (v) for exposing the upper layer to light;
    a step (vi) for developing the upper layer using a developer which includes an organic solvent and forming a second negative type pattern on the lower layer; and
    a step (vii) for removing the resin composition (2) which contains the second resin from the lower layer without removing the first negative type pattern and the second negative type pattern.

2. The pattern formation method according to claim 1, wherein the step (i) for forming the first negative type pattern includes a plurality of pattern forming steps each performing the steps (i-1), (i-2), and (i-3) in this order.

3. The pattern formation method according to claim 2, further comprising:
    a heating step between one pattern forming step performing the steps (i-1), (i-2), and (i-3) in this order and a successive pattern forming step forming the steps (i-1), (i-2) and (i-3) in this order.

4. The pattern formation method according to claim 1, further comprising:
    a heating step (ii) between the step (i) and the step (iii).

5. The pattern formation method according to claim 1, further comprising:
    a heating step after step (vi).

6. The pattern formation method according to claim 1, wherein at least one of exposure in the step (i-2) and exposure in the step (v) is exposure using a KrF excimer laser or an ArF excimer laser.

7. The pattern formation method according to claim 1, wherein a film thickness of the first film is 20 nm to 160 nm.

8. The pattern formation method according to claim 1, wherein a film thickness of the lower film is 20 nm to 160 nm.

9. An etching method for performing an etching process with respect to the substrate by setting a pattern formed by the pattern formation method according to claim 1, as a mask.

10. An electronic device manufacturing method, comprising:

the pattern formation method according to claim 1.

* * * * *